United States Patent [19]

Wiggins, Jr. et al.

[11] 4,209,836

[45] Jun. 24, 1980

[54] SPEECH SYNTHESIS INTEGRATED CIRCUIT DEVICE

[75] Inventors: Richard H. Wiggins, Jr., Dallas; George L. Brantingham, Lubbock, both of Tex.

[73] Assignee: Texas Instruments Incorporated, Dallas, Tex.

[21] Appl. No.: 901,393

[22] Filed: Apr. 28, 1978

Related U.S. Application Data

[63] Continuation-in-part of Ser. No. 807,461, Jun. 17, 1977, abandoned.

[51] Int. Cl.2 .......................... G06F 15/34; G10L 1/08

[52] U.S. Cl. ................................ 364/718; 179/1 SA; 179/1 SC; 179/1 SM; 364/513

[58] Field of Search ....................... 364/513, 718, 723; 179/1 SA, 1 SC, 1 SM

[56] References Cited

U.S. PATENT DOCUMENTS

| | | | |
|---|---|---|---|
| 3,975,587 | 8/1976 | Dunn et al. | 179/1 SA |
| 3,979,557 | 9/1976 | Schulman et al. | 179/1SA |
| 4,022,974 | 5/1977 | Kohut et al. | 179/1 SM |
| 4,051,331 | 9/1977 | Strong et al. | 179/1 SA X |
| 4,058,676 | 11/1977 | Wilkes et al. | 179/1 SA |
| 4,070,709 | 1/1978 | Roberts et al. | 179/1 SA X |

*Primary Examiner*—Jerry Smith
*Attorney, Agent, or Firm*—Mel Sharp; Stephen S. Sadacca; Andrew J. Dillon

[57] ABSTRACT

Disclosed is an integrated circuit device or chip which digitally synthesizes human speech using a linear predictive filter. This device may be implemented using conventional processing techniques. For instance, when implemented in conventional P-channel MOS technology, the disclosed device or chip has an active area of approximately 45,000 square mils.

11 Claims, 41 Drawing Figures

302
TO FIG. 10
TO STAGE 0 MULTIPLIER
TO STAGE 1 MULTIPLIER
MULTIPLIER STAGE 2
MULTIPLIER STAGE 3
MULTIPLIER STAGE 4 TO FIG. 10
P-P
301
313
312a
312b
312c
312d
32-1
32-2
32-3
32-4
32-5
32-6
32-7
32-8
32-9
32-10
"A"
"B"
"C"

Y - DECODE 1/64 DIFFUSION SELECT

ROM ADDRESS BUFFERS 625

SPEECH SYNTHESIS INTEGRATED CIRCUIT DEVICE

BACKGROUND OF THE INVENTION

This is a continuation-in-part of U.S. patent application Ser. No. 807,461, filed June 17, 1977 and entitled "Lattice Filter for Waveform or Speech Synthesis Circuits Using Digital Logic," and now abandoned.

This invention relates to the implementation of a digital speech synthesis circuit onto a minature electronic semiconductor device or chip.

Several techniques are known in the prior art for digitizing human speech. For example, pulse code modulation, differential pulse code modulation, adaptive predictive coding, delta modulation, channel vocoders, cepstrum vocoders, format vocoders, voice excited vocoders and linear predictive coding techniques of speech digitalization are known. The techniques are briefly explained in "Voice Signals: Bit by Bit" on pages 28–34 of the October 1973 issue of IEEE Spectrum.

In certain applications and particularly those in which the digitized speech is to be stored in a memory tend to use the linear predictive coding technique because it produces very high quality speech using rather low data rates. Linear predictive coding systems usually make use of a multi-stage digital filter. In the past, the digital filter has typically been implemented by appropriately programming a large scale digital computer. However, there has been a proposal for implementing a speech synthesis chip which is discussed in "Progress in the Development of Digital Vocoder Employing an Itakura Adaptive Predictor" published in "Telecommunications Conference Records", IEEE publication no. 73 (1973). In U.S. patent application Ser. No. 807,461, filed June 17, 1977 and now abandoned, of which this patent is a continuation-in-part, there is taught a particularly useful digital filter for a speech synthesis circuit, which digital filter may be implemented on an integrated circuit using standard MOS or equivalent technology. A theoretical discussion of linear predictive coding can be found in "Speech Analysis and Synthesis by Linear Prediction of the Speech Wave" at Volumn 50, number 2 (part 2) of The Journal of the Acoustical Society of America.

Disclosed herein is a talking learning aid which utilizes speech synthesis technology for producing human speech. A complete talking learning aid is disclosed, so, in addition to describing the speech synthesis circuits in detail, this patent also discloses the details of the learning aid's controller and the Read-Only-Memory devices used to store the digitized speech. Of course, those practicing the present invention may wish to practice the invention in conjunction with a talking learning aid, such as that described herein, other learning aids or in any other application wherein the generation of human speech from digital data is desirable. Using the techniques described in the aforementioned U.S. patent application Ser. No. 807,461 now abandoned and the teachings of this patent permit those desiring to make use of digital speech technology to do so with one, or a small number, of relatively inexpensive integrated circuit devices.

This invention relates to a small size integrated circuit or chip for digitally synthesizing human speech, as previously mentioned. An object of this invention was to improve speech synthesis technology. Another object was to implement a digital speech synthesis chip on a small size integrated circuit, which chip can be produced using conventional fabrication techniques. It was yet another object of this invention to bring digital speech synthesis technology into a price range where the ordinary consumer may take advantage of it.

The foregoing objects are achieved as is now described. The speech synthesis chip includes a linear predictive filter, excitation generations, circuits for receiving and analyzing inputted digital data and appropriate timing circuitry, all of which are integrated on a single semiconductor chip. This chip when produced using conventional P-channel MOS technology and using conventional design rules can be easily manufactured on a chip whose active area, that is, the area boundering the many transistors and inteconnecting lines providing the aforementioned circuits, is approximately 45,000 mils. Further, as should be readily apparent to those skilled in the art, this chip will have a manufacturing cost of under five dollars when manufactured in quantity yet will synthesize human speech at a quality level essentially equivalent to that of an expensive, approximately programmed, large scale computer. Of course, the size of the chip may be affected by (1) the processing technology selected, (2) the design rules followed, (3) future improvements to integrated circuit manufacturing technology and (4) modifications made to the disclosed design.

BRIEF DESCRIPTION OF THE DRAWINGS

The novel features believed characteristic of the invention are set forth in the appended claims. The invention itself, however, as well as a preferred mode of use, further objects and advantages thereof, will be best understood by reference to the following detailed description of an illustrative embodiment when read in conjunction with the accompanying drawings, wherein:

GENERAL DESCRIPTION

Figure 1:
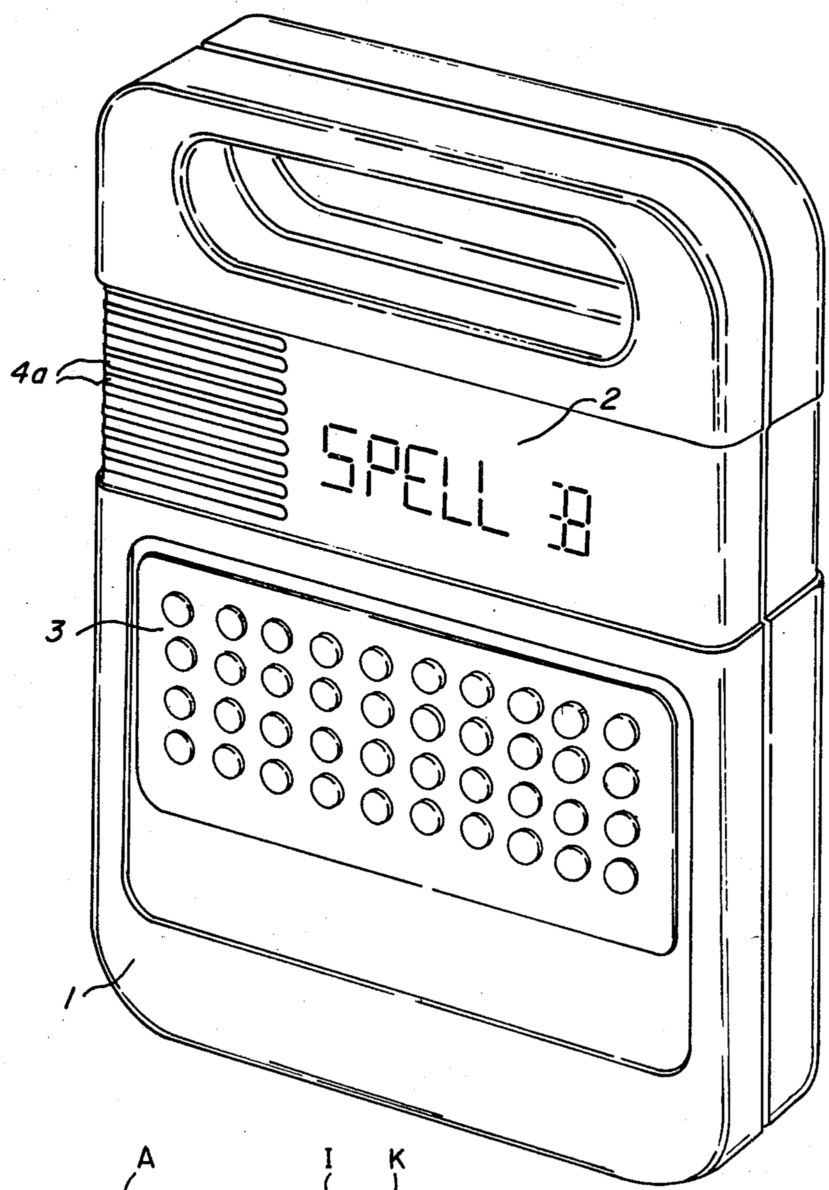
FIG. 1 is a front view of a talking learning aid.

FIG. 1 is a front view of a talking learning aid of the type which may embody the present invention. The learning aid includes a case 1 which encloses electronic circuits preferably implemented on integrated circuits (not shown in this figure). These circuits are coupled to a display 2, a keyboard 3 and a speaker 4 or other voice coil means (also not shown in FIG. 1). However, the openings 4a are shown behind which speaker 4 is preferably mounted. The display is preferably of the vacuum fluorescent type in the embodiment to be described; however, it will be appreciated by those skilled in the art that other display means, such as arrays of light emitting diodes, liquid crystal devices, electrochromic devices, gas discharge devices or other displays means alternatively may be used if desired. Also, in this embodiment, as a matter of design choice, the display has eight character positions. The keyboard 3 of the learning aid of this embodiment has forty key switch positions, twenty-six of which are used to input the letters of the alphabet into the learning aid. Of the remaining fourteen key switch positions, five are utilized for mode keys (on/spelling mode, learn mode, word guesser game mode, code breaker mode and random letter mode), another five are used to control functions performed by the learning aid in its modes (enter, say again, replay, erase and go) and the remaining four are used for an apostrophe key, a blank space key, a word list select key and an off key. The words spoken by the learning aid, as well as the correct spelling of those words, are stored as digital information in one or more Read-Only-Memories.

The learning aid depicted in FIG. 1 may be battery powered or powered from a source of external electrical power, as desired. The case is preferably made from injection molded plastic and the keyboard switches may be provided by two 5 by 8 arrays of key switches of the type disclosed in U.S. Pat. No. 4,005,293, if desired. Of course, other types of case materials or switches alternatively may be used.

Having described the outward appearance of the learning aid, the modes in which the learning aid may operate will be first described followed by a description of the block diagrams and detailed logic diagrams of the various electronic circuits used to implement the learning aid of FIG. 1.

MODES OF OPERATION

The learning aid of this embodiment has five modes of operation which will be subsequently described. It will be evident to those skilled in the art, however, that these modes of operation may be modified, reduced in number or expanded in capability. As a matter of design choice, the present talking and learning aid is provided with the following modes of operation.

The first mode, the spelling mode, is automatically entered when the "on" key is depressed. In the spelling mode the learning aid randomly selects ten words from a selected word list and at a selected difficulty category within the selected word list. The word list may be changed by depressing the "word list select" key which is coupled to a software implemented flip flop circuit which flips each time the "word list select" key is depressed. The word list select flip flop then determines, as will be seen, which pair of read-only-memories from which the ten words will be randomly selected. Each word list preferably includes words arranged in four levels of difficulty. This embodiment of the learning automatically enters the least difficult level of difficulty. The fact that the least difficulty level has been selected is shown by displaying "SPELL A" in display 2. The level difficulty may be increased by depressing the B, C or D keys, and display 2 will show, in response, "SPELL B", "SPELL C" or "SPELL D", respectively. Having selected the word list and level difficulty, the "go" key is depressed upon which the learning aid commences to randomly select ten words and to say the word "spell" followed by the first randomly selected word. A dash, that being segment D in display 2 (FIG. 2), comes up in the left hand most character position. At this time the student may either (1) enter his or her spelling of the word and then depress the "enter" key or (2) depress the "say again" key. The student may also depress the "erase" key if he or she realizes that the spelling being inputted is incorrect before having depressed the "enter" key; the student may then again try to input the correct spelling. The "say again" key causes the word to be spoken by the learning aid again. In some embodiments a subsequent depression of the "say again" key may cause the selected word to be repeated once more, however, then at a slower rate. As the student enters his or her spelling of the word using the alphabet keys at keyboard 3, the inputted spelling appears at display 2 and the shifts from left to right as the letters are inputted. Following the depression the "enter" key, the learning aid compares the student's spelling with a correct spelling, which is stored in one of the Read-Only-Memories, and verbally indicates to the student whether the student spelling was correct or incorrect. The verbal response is also stored as digital information in a Read-Only-Memory. Of course, a visual response may likewise or alternatively be used, if desired. In this embodiment the student is given two opportunities to spell the word correctly and if the student has still failed to correctly spell the word, the learning aid then verbally (via speaker 4) and visually (via display 2) spells the word for the student and goes on to the next word from the group of ten randomly selected words.

At the end the test of the spelling of the ten randomly selected words, the learning aid then verbally and visually indicates the number of right and wrong answers. Further, in order to give the student additional reinforcement, the learning aid preferably gives a audible response which is a function of the correctness of the spellings. In this embodiment the learning aid plays a tune, the number of notes of which is a function of the correctness of the student's spellings for the group of selected words. The use of the "enter", "say again", "erase", and "go" function keys has just been described with reference to the spelling mode of operation. There is an additional function key, "replay", whose function has not yet been described. The "replay" key causes the learning aid to repeat the group of ten randomly selected words after the group has been completed or causes the learning aid to start over with the first word of the group of ten words if it is depressed during the progression through the group. Alternatively, at the end of a group of ten words, the student may depress the "go" which initiates the random selection of another group of ten words from the selected word list.

An exemplary set of spell mode problems is shown in Table I; exemplary key depressions, which a student might make during the exemplary set of problems, are listed along with the responses made by the learning aid at display 2 and speaker 4.

The learn mode is entered by depressing the "learn" key. In the learn mode, after the "go" key is depressed the learning aid randomly selects ten words from the selected word list at the selected difficulty level and then proceeds to display the first randomly selected word at display 2 and approximately one second later to speak "say it". Approximately two seconds thereafter the learning proceeds to pronounce the word shown in display 2. During this interval the student is given the opportunity to try to pronounce the word spelled at display 2; the learning aid then goes on to demonstrate how the word should be pronounced. After going through the ten randomly selected words the learning automatically returns to the aforementioned spell mode, but the ten words tested during the spell mode are the ten words previously presented during the learn mode. While in the learn mode the "say again", "erase", "repeat" and "enter" keys are invalid. The difficulty level is selected as in the spelling mode, but in the learn mode the learning aid displays the various levels as "SAY IT A", "SAY IT B", etc. Depressing the "go" key causes the learning aid to select another group of ten words in the learn mode. An exemplary set of learn mode problems are set forth in Table II.

The word guesser mode is entered by depressing the "word guesser" mode key. In the word guesser mode the learning aid randomly selected a word from the selected word list and displays dashes in a number of character positions at display 2, the number of character positions corresponding to the number of letters in the randomly selected word. Thus, if the learning aid randomly selects the word "course" for instance, then the dashes will appear in six of the eight character positions in display 2, starting with the left most position and proceeding to the right for six character positions. The dash is shown in the characters of the display by energizing the D segments in those character positions (see FIG. 2). The child may then proceed to enter his or her guesses of the letters in the randomly selected word by depressing the letter keys at keyboard 2. For a correct choice, the learning aid gives an audible response of four tones and shows every place the chosen letter occurs in the randomly selected word. Once letters have been correctly guessed, they remain in the display until the end of the game. For incorrect guesses the learning aid preferably makes no response, but may alternatively say something like "incorrect guess." In this embodiment the child is given six incorrect guesses. Upon the seventh incorrect guess the learning says "I win". On the other hand, if the child correctly guesses all the letters before making seven incorrect guesses the learning aid speaks "you win" and gives an audible response of four tones. Thus, in the word guesser mode, the learning aid permits the child to play the traditional spelling game known as "hangman" either by himself or herself or along with other children. Exemplary word guesser problems are set forth in Table III.

The disclosed learning aid has another mode of operation known as "code breaker" which is entered by depressing the "code breaker" mode key. In this mode the child may enter any word of his or her choice and upon depressing the "enter key" the letters in the display are exchanged according to a predetermined code. Thus, in the code breaker mode the learning aid may be used to encode words selected by the child. Further in the code breaker mode the learning aid may be used to decode the encoded words by entering the encoded word and depressing the "enter key".

Another mode with which the learning aid may be provided is the "random letter" mode which is entered by depressing the "random letter" key. In the random letter mode the learning automatically displays in response to depression of the "go" key a randomly selected letter of the alphabet in the first character position of display 2. The letters of the alphabet occur in approximate proportion to as they occur in the english language; thus, the more commonly letters are displayed more frequently than uncommonly used letters. If the "go" key is again depressed then another randomly selected letter is displayed in the first character position and the previously selected letter moves right to the second character position and so forth in response to further depressions of the "random letter" key.

Figure 2:
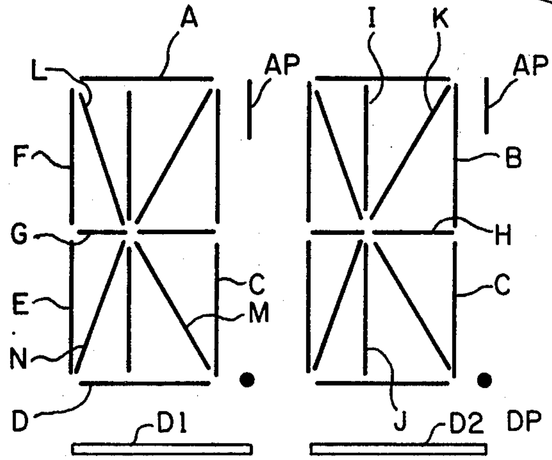
FIG. 2 depicts the segment details of the display.

Referring now to FIG. 2, there is shown a preferred arrangement of the segments of display 2. Display 2 preferably has eight character positions each of which is provided by a sixteen segment character has fourteen segments arranged somewhat like a "British flag" with an additional two segments for an apostrophe and a decimal point. In FIG. 2, segments a-n are arranged more or less in the shape of the "British flag" while segment ap provides apostrophe and segment dpt provides a decimal point. Segment conductors Sa through Sn, Sdp and Sap are respectively coupled to segments a through n, dpt and ap in the eight character positions of display 2. Also, for each character position, there is a common electrode, labeled as D1-D8. When display 2 is provided by a vacuum fluorescent display device, the segments electrodes are provided anodes in the vacuum fluorescent display device while each common electrode is preferably provided by a grid associated with each character position. By appropriately multiplexing signals on the segment conductors (Sa-Sn, Sdpt and Sap) with signals on the character common electrodes (D1-D8) the display may be caused to show the various letters of the alphabet, a period, and an apostrophe and various numerals. For instance, by appropriately energizing segment conductors A,B,C,E and F when character common electrode D1 is appropriately energized the letter A is actuated in the first character position of display 2. Further, by appropriate strobing segment conductors A,B,C,D,H,I and J when character common electrode D2 is appropriately energized, the letter B is caused to be actuated in the second character position of display 2. It should be evident to those skilled in the art that the other letters of the alphabet as well as the apostrophe, period and numerals may be formed by appropriate energization of appropriate segment conductors and common electrodes. In operation, the character common electrodes D1–D8 are sequentially energized with an appropriate voltage potential as selected segment conductors are energized to their appropriate voltage potential to produce a display of characters at display 2. Of course, the segment electrodes could alternatively be sequentially energized as the digit electrodes are selectively energized in producing a display at display 2.

BLOCK DIAGRAM OF THE LEARNING AID

Figure 3:
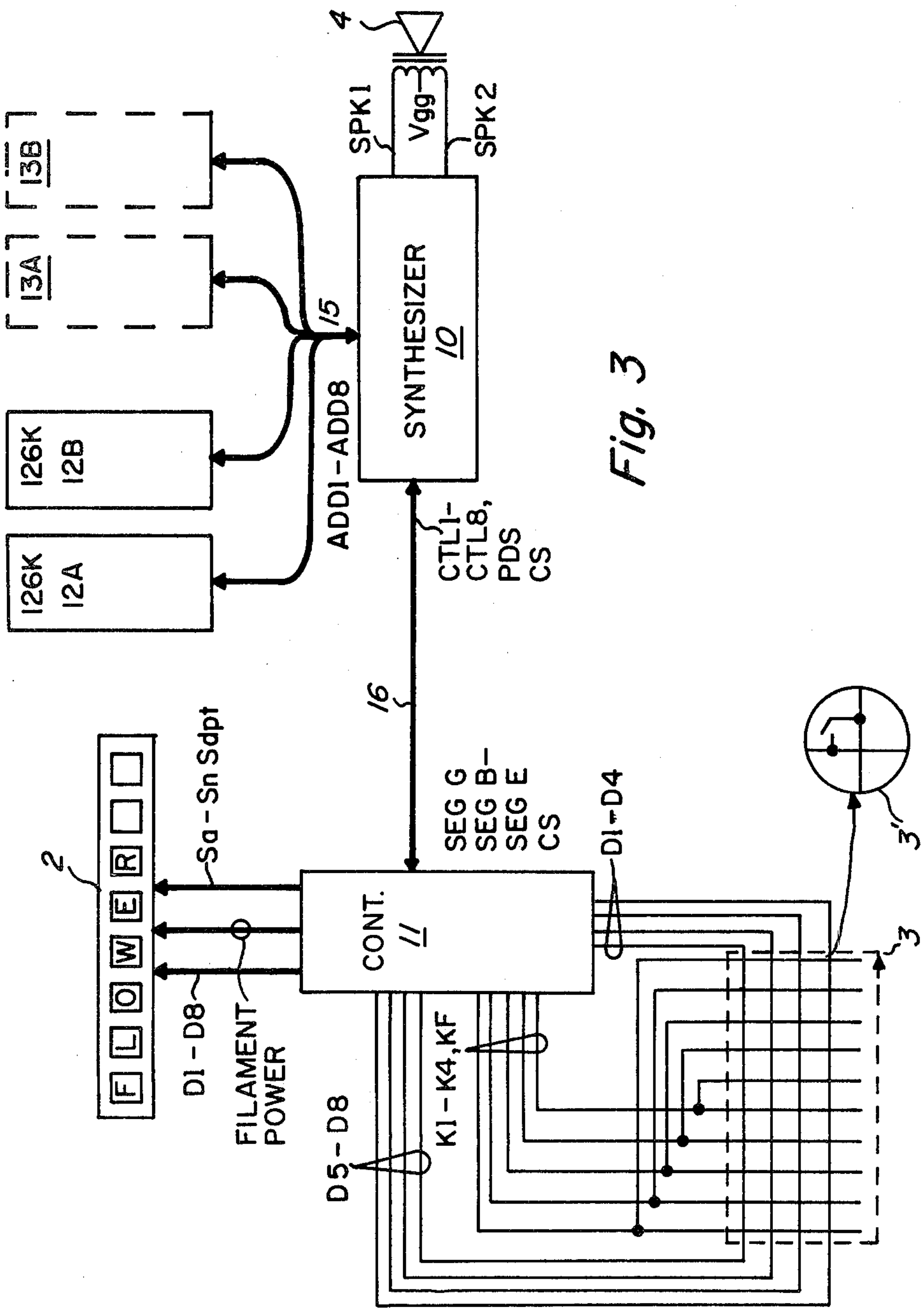
FIG. 3 is a block diagram of the major components preferably making up the learning aid.

FIG. 3 is a block diagram of the major components making up the disclosed embodiment of a speaking learning aid. The electronics of the disclosed learning aid may be divided into three major functional groups, one being a controller 11, another being a speech synthesizer 10, and another being a read-only-memory (ROM) 12. In the embodiment disclosed, these major electronic functional groups are each integrated on separate integrated circuit chips except for the ROM functional group which is integrated onto two integrated circuit chips. Thus, the speech synthesizer 10 is preferably implemented on a single integrated circuit denoted by the box labeled 10 in FIG. 3 while the controller is integrated on a separate integrated circuit denoted by a box 11 in FIG. 3. The word list for the learning aid is stored in the ROM functional group 12, which stores both the correct spellings of the words as well as frames of digital coding which are converted by speech synthesizer 10 to an electrical signal which drives speaker or other voice coil means 4. In the embodiment disclosed, ROM functional group 12 is preferably provided with 262,144 bits of storage. As a matter of design choice, the 262,144 20 bits of data is divided between two separate read-only-memory chips, represented in FIG. 3 at numerals *12a* and *12b*. The memory capacity of ROM functional group 12 is a design choice; however, using the data compression features which are subsequentially discussed with reference to FIG. 6, the 262,144 bits of read-only-memory may be used to store on the order of 250 words of spoken speech and their correct spellings as well as various tones, praise phrases and correction phases spoken by the learning aid.

As is discussed with reference to FIG. 1, the "word list select" key causes the learning aid to select words from another word list. In FIG. 3, the basic word list used with the learning aid is stored in ROMs *12a* and *12b* along with their spellings and appropriate phraseology which the learning aid speaks during its different modes of operation. The second word list, which may be selected by depressing the "word list select" key, is preferably stored in another pair of ROMs *13a* and *13b*. In FIG. 3 these are depicted by dashed lines because these read-only-memories are preferably plugged into the learning aid by a person using the system (of course, when children use the system it is preferable that an adult change the read-only-memories since children may not have the required manual dexterity) rather than normally packaged with the learning aid. In this manner many different "libraries" of word lists may be made available for use with the learning aid.

Of course, the number of chips on which the learning aid is implemented is a design choice and as large scale integration techniques are improved (using electron beam etching and other techniques), the number of integrated circuit chips may be reduced from four to as few as a single chip.

Synthesizer chip 10 is interconnected with the read-only-memories via data path 15 and is interconnected with controller 11 via data path 16. The controller 11, which may be provided by an appropriately programmed microprocessor type device, preferably actuates display 2 by providing segment information on segment conductors Sa–Sn, Sdpt and Sap along with character position information on connectors D1–D8. In the embodiment herein disclosed, controller 11 preferably also provides filament power to display 2 when a vacuum fluorescent device is used therefor. Of course, if a liquid crystal, electrochromographic, light emitting diode or gas discharge display were used such filament power would not be required. One technique for generating filament power on a controller chip is described in U.S. patent application Ser. No. 843,017 filed Oct. 17, 1977. Controller 11 also scans keyboard 3 for detecting key depressions thereat. Keyboard 3 has forty switch positions which are shown in representative form in FIG. 3, the switch locations occurring where the conductors cross within the dashed line at numeral 3 in FIG. 3. A switch closure causes the conductors shown as crossing in FIG. 3 to be coupled together. At numeral 3' the switch occurring at a crossing of conductors at numeral 3 is shown in detail. In addition to actuating display 2 and sensing key depression at keyboard 3, controller 11 also perform such functions as providing addresses for addressing ROMs *12a* and *12b* (via synthesizer 10), comparing the correct spellings from ROMs *12a* or *12b* with spellings inputted by a student at keyboard 3, and other such functions which will become apparent. Addresses from controller 11 are transmitted to ROMs *12a–b* by synthesizer 10 because, as will be seen, synthesizer 10 preferably is equipped with buffers capable of addressing a plurality of read-only-memories. Preferably, only one of the pairs of ROMs will output information in response to this addressing because of a chip select signal which is transmitted from synthesizer 10 to all the Read-Only-Memories. Controller 11, in this embodiment, transmits addresses to the ROMs via synthesizer 10 so that only synthesizer 10 output buffers need be sized to transmit addresses to a plurality of ROMs simultaneously. Of course, controller 11 output buffers could also be sized to transmit information to a plurality of read-only-memories simultaneously and thus in certain embodiments it may be desirable to also couple controller 11 directly to the ROMs.

As will be seen, synthesizer chip 10 synthesizes human speech or other sounds according to frames of data stored in ROMs *12a–12b* or *13a–13b*. The synthesizer 10 employs a digital lattice filter of the type described in U.S. patent application Ser. No.807,461, filed June 17, 1977. U.S. patent application Ser. No. 807,461, since abandoned and continued in U.S. patent application Ser. No. 905,328, filed May 12, 1978, is hereby incorporated herein by reference. The following discussion of the speech synthesizer assumes that the reader has a basic understanding of the operation of the lattice filter described in U.S. patent application Ser. No. 807,461, since abandoned and continued in U.S. patent application Ser. No. 905,328, filed May 12, 1978; therefore, the reader is encouraged to read that patent before delving into the following detailed discussion of the speech synthesizer. As will also be seen, synthesizer 10 also includes a digital to analog (D to A) converter for converting the digital output from the lattice filter to analog signals for driving speaker 4 or other voice coil means with those analog signals. Synthesizer 10 also includes timing, control and data storage and data compression systems which will be subsequently described in detail.

SYNTHESIZER BLOCK DIAGRAM

Figure 4A:
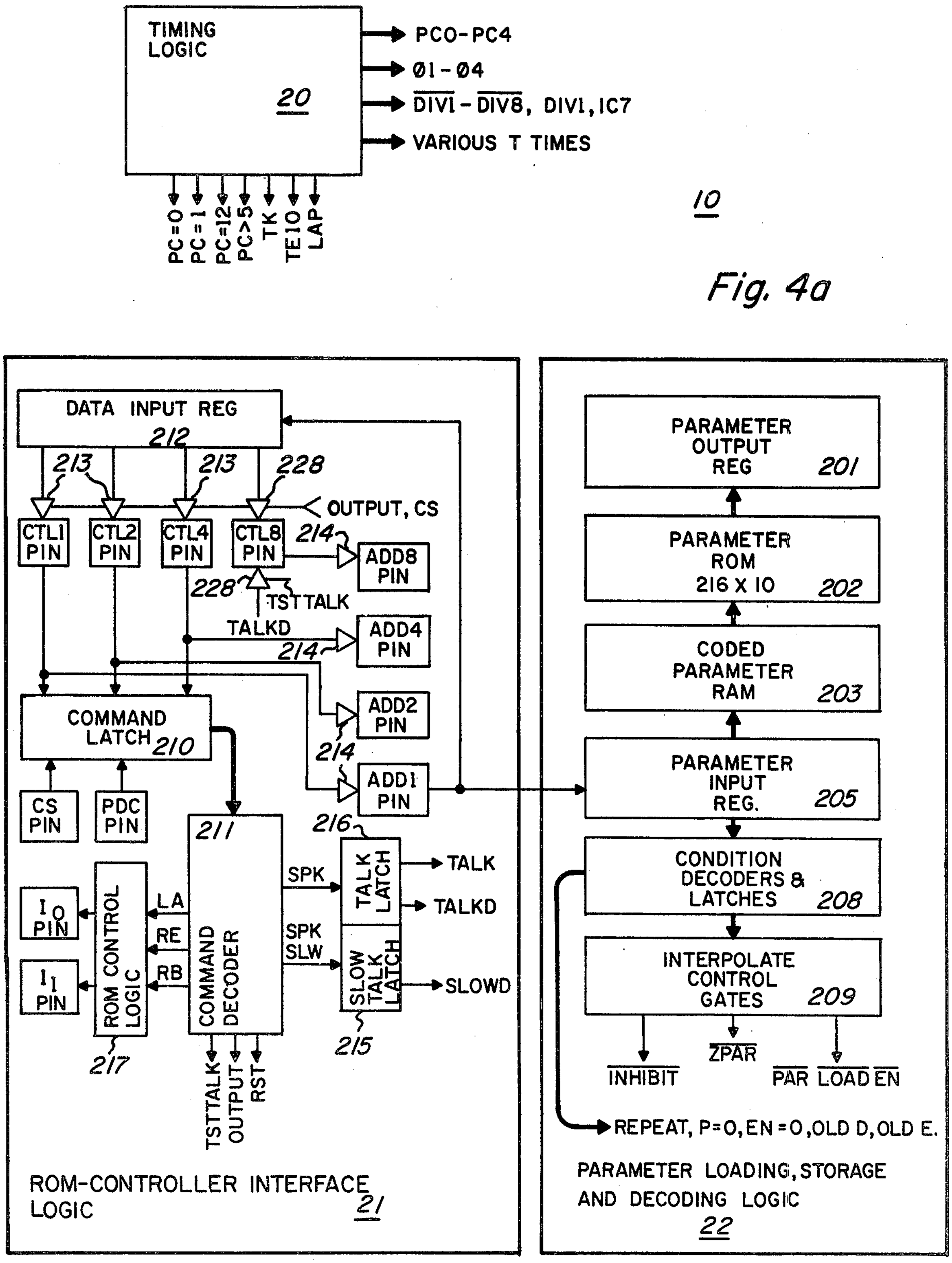
FIGS. 4*a* and 4*b* form a composite block diagram (when placed side by side) of the speech synthesizer chip.
Figure 4B:
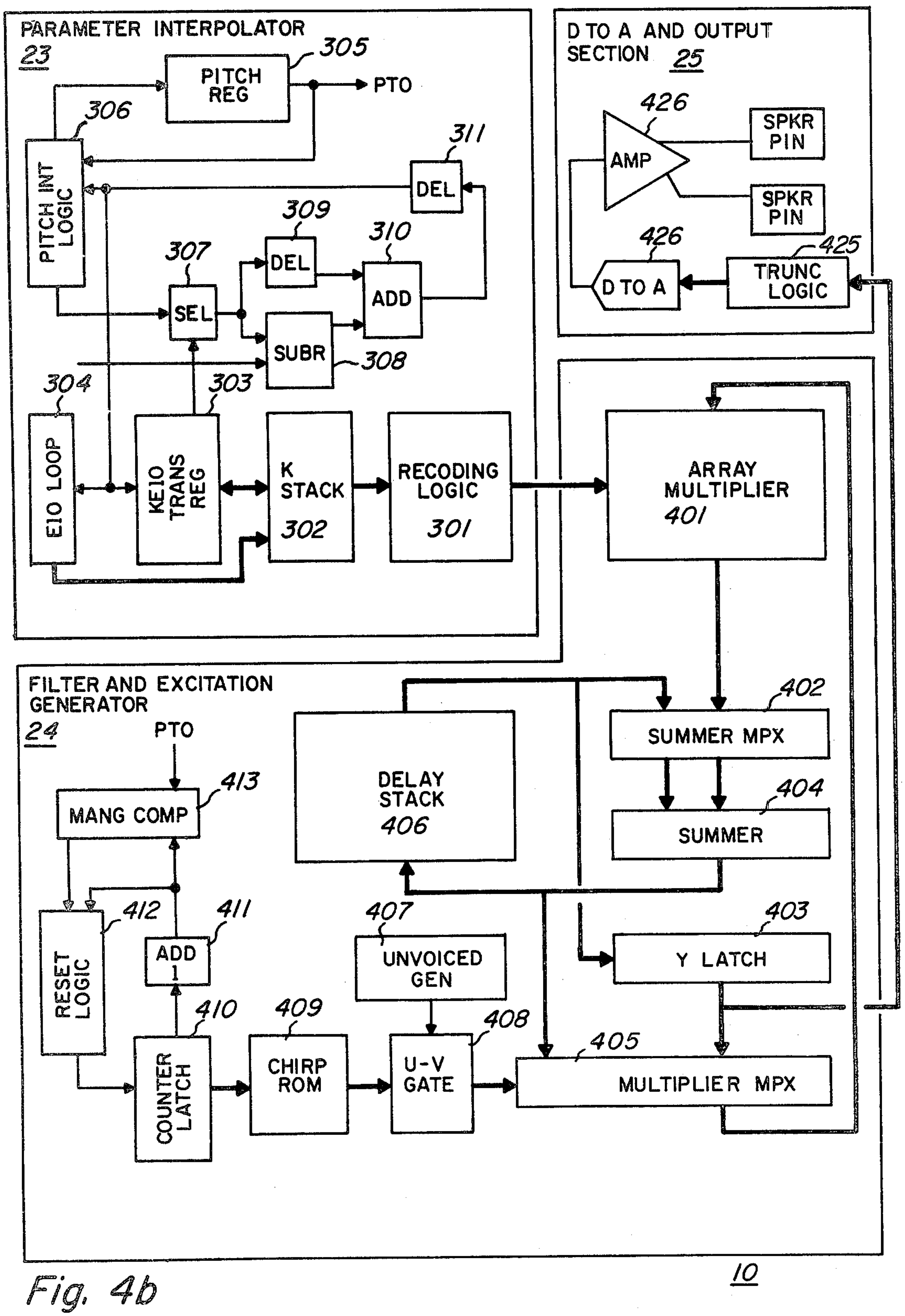

FIGS. 4a and 4b form a composite block diagram of the synthesizer 10. Synthesizer 10 is shown as having six major functional blocks, all but one of which are shown in greater detail in block diagram form in FIGS. 4a and 4b. The six major functional blocks are timing logic 20; ROM-Controller interface logic 21; parameter loading, storage and decoding logic 22; parameter interprelater 23; filter and excitation generator 24 and D to A and output section 25. Subsequentially, these major functional blocks will be described in detail with respect to FIGS. 5a-b, 6, 7a-b, 8a-c, 9a-b, 10a-d and 11a-b.

Rom/Controller Interface Logic

Referring again to FIGS. 4a and 4b, ROM/Controller interface logic 21 couples synthesizer 10 to read-only-memories 12a and 12b and to controller 11. The control 1-8 (CTL1-CTL8), chip select (CS) and processor data clock (PDC) pins are coupled, in this embodiment, to the controller while the address 1-8 (ADD1-ADD8) and instruction 0-1 (I0-I1) pins are connected to ROMs 12a and 12b (as well as ROMs 13a-13b, if used). ROM/Controller interface logic 21 sends address information from controller 11 to the Read-Only-Memories 12a-12b and preferably returns digital information from the ROMs back to the controller 12; logic 21 also brings data back from the ROMs for use by synthesizer 10 and initiates speech. A Chip Select (CS) signal enables tristate buffers, such as buffers 213, and a three bit command latch 210. A Processor Data Clock (PDC) signal sets latch 210 to hold the data appearing at CTL1-CTL4 pins from the controller. Command latch 210 stores a three bit command from controller 11, which is decoded by command decoder 211. Command decoder 211 is responsive to eight commands which are: speak (SPK) or speak slowly (SPKSLOW) for causing the synthesizer to access data from the Read-Only-Memory and speak in response thereto either at a normal rate or at a slow rate; a reset (RST) command for resetting the synthesizer to zero; a test talk (TTALK) so that the controller can assertain whether or not the synthesizer is still speaking; a load address (LA) where four bits are received from the controller chip at the CTL1-CTL8 pins and transferred to the ROMs as an address digit via the ADD1-ADD8 pins and associated buffers 211; a read and branch (RB) command which causes the Read-Only-Memory to take the contents of the present and subsequent address and use that for a branch address; a read (RE) command which causes the Read-Only-Memory to output one bit of data on ADD1, which data shifts into a four bit data input register 212; and an output command which transfers four bits of data in the data input register 212 to controller 11 via buffers 213 and the CTL1-CTL8 pins. Once the synthesizer 10 has commenced speaking in response to a SPK or SPKSLOW command it continues speaking until ROM interface logic 21 encounters a RST command or an all ones gate 207 (see FIGS. 7a-7b) detects an "energy equal to fifteen" code and resets talk latch 216 in response thereto. As will be seen, an "energy equal to 15" code is used as the last frame of data in a plurality of frames of data for generating words, phases or sentences. The LA, RE and RB commands decoded by decoder 211 are re-encoded via ROM control logic 217 and transmitted to the read-only-memory via the instruction (I0-I1) pins.

The processor Data Clock (PDC) signal serves other purposes than just setting latch 210 with the data on CTL1-CTL4. It signals that an address is being transferred via CTL1-CTL8 after an LA or output command has been decoded or that the TTALK test is to be performed and outputted on pin CTL8. A pair of latches 218A and B (FIGS. 7a-7b) associated with decoder 211 disable decoder 211 when the aforementioned LA, TSTTALK and OUTPUT commands have been decoded and a subsequent PDC occurs so that the data then on pins CTL1-CTL8 is not decoded.

A TALK latch 216 is set in response to a decoded SPK or SPKSLW command and is reset: (1) during a power up clear (PUC) which automatically occurs whenever the synthesizer is energized; (2) by a decoded RST command or (3) by an "energy equals fifteen" code in a frame of speech data. The TALKD output is delayed output to permit all speech parameters to be inputed into the synthesizer before speech is attempted. The talk slow latch 215 is set in response to a decoded SPKSLOW command and reset in the same manner as latch 216. The SLOWD output is similarly a delayed output to permit all the parameters to be inputted into the synthesizer before speech is attempted.

Parameter Loading, Storage and Decoding Logic

The parameter loading, storage and decoding logic 22 includes a six bit long parameter input register 205 which receives serial data from the read-only-memory via pin ADD1 in response to a RE command outputted to the selected read-only-memory via the instruction pins. A coded parameter random access memory (RAM) 203 and condition decoders and latches 208 are connected to receive the data inputted into the parameter input register 205. As will be seen, each frame of speech data is inputted in three to six bit portions via parameter input register 205 to RAM 203 in a coded format where the frame is temporarily stored. Each of the coded parameters stored in RAM 203 are converted to a ten bit parameter by parameter ROM 202 and temporarily stored in a parameter output register 201.

As will be discussed with respect to FIG. 6, the frames of data may be either wholly are partially inputted into parameter input register 205, depending upon the length of the particular frame being inputted. Condition decoders and latches 208 are responsive to particular portions of the frame of data for setting repeat, pitch equal zero, energy equal zero, old pitch and old energy latches. The function of these latches will be discussed subsequently with respect to FIGS. 7a-7b. The condition decoders and latches 208 as well as various timing signals are used to control various interpolation control gates 209. Gates 209 generate an inhibit signal when interpolation is to be inhibited, a zero parameter signal when the parameter is to be zeroed and a parameter load enable signal which, amoung other things, permits data in parameter input register 205 to be loaded into the coded parameter RAM 203.

Parameter Interpolater

The parameters in parameter output registers 201 are applied to the parameter interpolator functional block 23. The inputted K1–K10 speech parameters, including speech energy are stored in a K-stack 302 and E10 loop 304, while the pitch parameter is stored in a pitch register 305. The speech parameters and energy are applied via recoding logic 301 to array multiplier 401 in the filter and excitation generator 24. As will be seen, however, when a new parameter is loaded into parameter output register 201 it is not immediately inserted into K-stack 302 or E10 loop 304 or register 305 but rather the corresponding value in K-stack 302, E10 loop 304 or register 305 goes through eight interpolation cycles during which a portion of the difference between the present value in the K-stack, E10 loop 305 or register 305 and the target value of that parameter in parameter output register 201 is added to the present value in K-stack 203, E10 loop 304 or register 305.

Essentially the same logic circuits are used to perform the interpolation of pitch, energy and the K1–K10 speech parameters. The target value from the parameter output register 201 is applied along with the present value of the corresponding parameter to a subtractor 308. A selector 307 selects either the present pitch from pitch logic 306 or present energy or K coefficient data from KE10 transfer register 303, according to which parameter is currently in parameter output register 201, and applies the same to subtractor 308 and a delay circuit 309. As will be seen, delay circuit 309 may provide anywhere between zero delay to three bits of delay. The output of delay circuit 309 as well as the output of subtractor 308 is supplied to an adder 310 whose output is applied to a delay circuit 311. When the delay associated with delay circuit 309 is zero the target value of the particular parameter in parameter output register 201 is effectively inserted into K-stack 302, E10 loop 304 or pitch register 305, as is appropriate. The delay in delay circuit 311 is three to zero bits, being three bits when the delay in the delay circuit 309 is zero bits, whereby the total delay through selector, 307 delay, 309 and 311, adder 310 and subtractor 308 is constant. By controlling the delays in delay circuit 309 and 311, either all, $\frac{1}{2}$, $\frac{1}{4}$ or $\frac{1}{8}$ of the difference outputted from subtractor 308 (that being the difference between the target value and the present value) is added back into the present value of the parameter. By controlling the delays in the fashion set forth in Table IV, a relatively smooth eight step parameter interpolation is accomplished.

U.S. patent application Ser. No. 807,461, since abandoned and continued in U.S. patent application Ser. No. 905,328, filed May 12, 1978, discusses with reference to FIG. 7 thereof a speech synthesis filter wherein speech coefficients K1–K9 are stored in the K-stack continuously, until they are updated, while the K10 coefficient and the speech energy (referred to by the letter A in U.S. patent application Ser. No. 807,461, since abandoned and continued in U.S. patent application Ser. No. 905,328, filed May 12, 1978) are periodically exchanged. In parameter interpolator 23, speech coefficients K1–K9 are likewise stored in stack 302, until they are updated, whereas the energy parameter and the K10 coefficient effectively exchange places in K-stack 302 during a twenty time period cycle of operations in the filter and excitation generator 24. To accomplish this function, E10 loop 304 stores both the energy parameter and the $K_{10}$ coefficient and alternately inputs the same into the appropriate location in K-stack 302. KE10 transfer register 303 is either loaded with the K10 or energy parameter from E10 loop 304 or the appropriate K1–K9 speech coefficient from K-stack 302 for interpolation by logics 307–311.

As will be seen, recoding logic 301 preferably performs a Booth's algorithm on the data from K-stack 302, before such data is applied to array multiplier 401. Recoding logic 301 thereby permits the size of the array multiplier 401 to be reduced compared to the array multiplier described in U.S. patent application Ser. No. 807,461, since abandoned and continued in U.S. patent application Ser. No. 905,328, filed May 12, 1978.

Filter and Excitation Generator

The filter excitation generator 24 includes the array multiplier 401 whose output is connected to a summer multiplexer 402. The output of summer multiplexer 402 is coupled to the input of summer 404 whose output is coupled to a delay stack 406 and multiplier multiplexer 405. The output of the delay stack is applied as an input to summer multiplexer 402 and to Y latch 403. The output of Y latch 403 is coupled to an input of multiplier multiplexer 405 along with truncation logic 501. The output of multiplier multiplexer 405 is applied as an input to array multiplier 401. As will be seen filter and excitation generator 24 make use of the lattice filter described in U.S. patent application Ser. No. 807,461, since abandoned and continued in U.S. patent application Ser. No. 905,328, filed May 12, 1978. Various minor interconnections are not shown in FIG. 4*b* for sake of clarity, but which will be described with reference to FIGS. 10*a*, 10*b*, 11*a* and 11*b*. The arrangement of the foregoing elements generally agrees with the arrangement shown in FIG. 7 of U.S. patent application Ser. No. 807,461, since abandoned and continued in U.S. patent application Ser. No. 905,328, filed May 12, 1978; thus array multiplier 401 corresponds to element 30′, summer multiplexer 402 corresponds to elements 37*b′*, 37*c′* and 37*d′*, gates 414 (FIGS. 11*a* and 11*b*) correspond to element 33′, delay stack 406 corresponds to elements 34′ and 35′, Y latch 403 corresponds to element 36′ and multiplier multiplexer 405 corresponds to elements 38*a′*, 38*b′*, 38*c′* and 38*d′*.

The voice excitation data is supplied from unvoiced/voice gate 408. As will be subsequently described in greater detail, the parameters inserted into parameter input gate 205 are supplied in a compressed data format. According to the data compression scheme used, when the coded pitch parameter is equal zero in input register 205, it is interpreted as an unvoiced condition by condition decoders and latches 208. Gate 408 responds by supplying randomized data from unvoiced generator 407 as the excitation input on line 414. When the coded pitch parameter is of some other value, however, it is decoded by parameter ROM 202, loaded into parameter output register 201 and eventually inserted into pitch register 305, either directly or by the interpolation scheme previously described. Based on the period indicated by the number in pitch register 305, voiced excitation is derived from chirp ROM 409. As discussed in U.S. patent application Ser. No. 807,461, since abandoned and continued in U.S. patent application Ser. No. 905,328, filed May 12, 1978, the voiced excitation signal may be an impulse function or some other repeating function such as a repeating chirp function. In this embodiment, a chirp has been selected as this tends to reduce the "fuzziness" from the speech generated (because it apparently more closely models the action of the vocal cards than does a impulse function) which chirp is repetitively generated by chirp ROM 409.

Chirp ROM 409 is addressed by counter latch 410, whose address is incremented in an add one circuit 411. The address in counter latch 410 continues to increment in add one circuit 411, recirculating via reset logic 412 until magnitude comparator 413, which compares the magnitude of the address being outputted from add one circuit 411 and the contents of the pitch register 305, indicates that the value in counter latch 410 then compares with or exceeds the value in pitch register 305, at which time reset logic 412 zeroes the address in counter 410. Beginning at address zero and extending through approximately fifty addresses is the chirp function in chirp ROM 409. Counter latch 410 and chirp ROM 409 are set up so that addresses larger than fifty do not cause any portion of the chirp function to be outputted from chirp ROM 409 to UV gate 408. In this manner the chirp function is repetitively generated on a pitch related period during voiced speech.

SYSTEM TIMING

Figure 5:
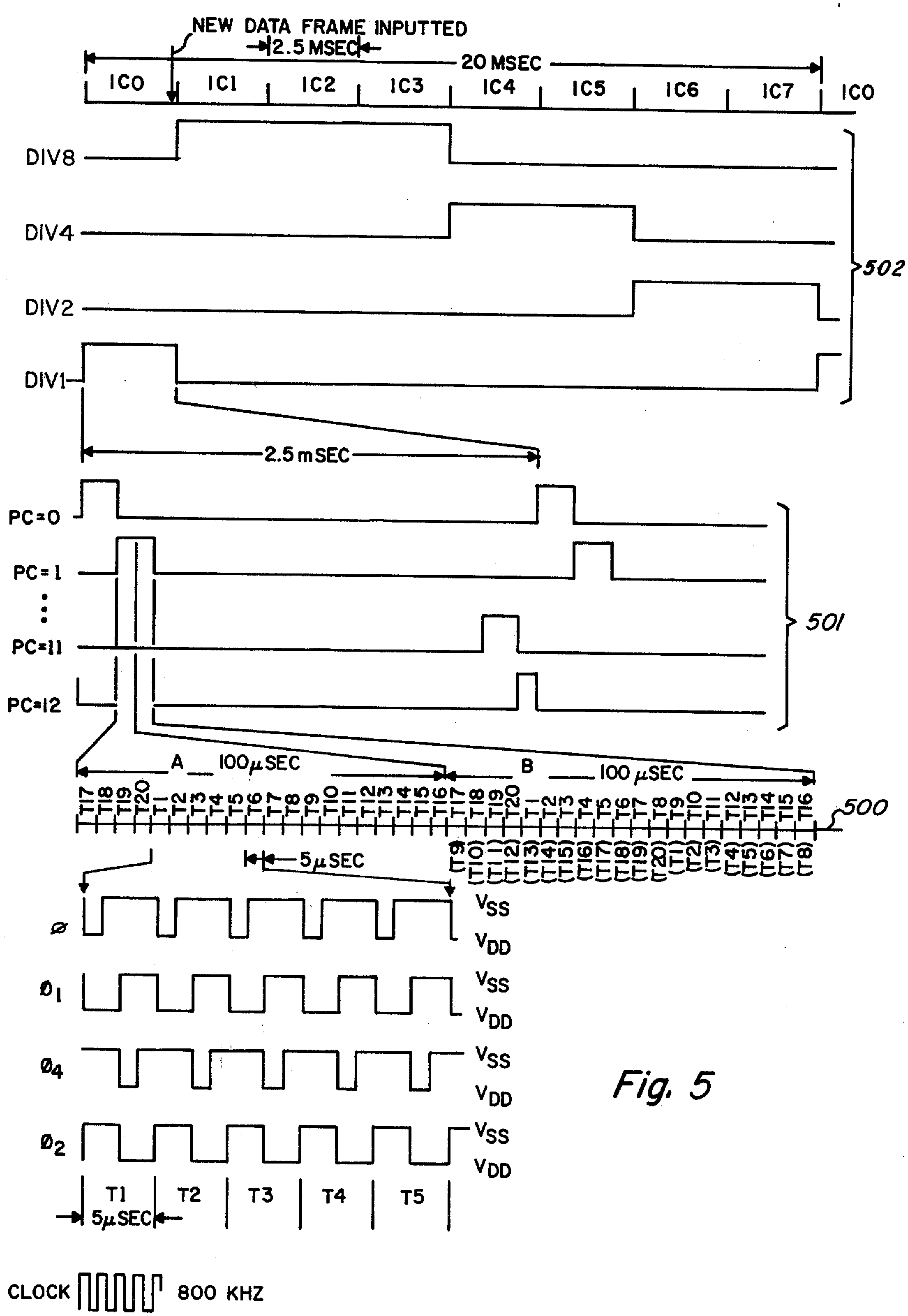
FIG. 5 is a timing diagram of various timing signals preferably used on the synthesizer.

FIG. 5 depicts the timing relationships between the occurrences of the various timing signals generated on synthesizer chip 10. Also depicted are the timing relationships with respect to the time new frames of data are inputted to synthesizer chip 10, the timing relationship with respect to the interpolations performed on the inputted parameters, the timing relations with respect to the foregoing with the time periods of the lattice filter and the relationship of all the foregoing to the basic clock signals.

The synthesizer is preferably implemented using precharged, conditional discharge type logics and therefore FIG. 5 shows clocks Φ1–Φ4 which may be appropriately used with such precharge-conditional discharge logic. There are two main clock phases ($\phi 1$ and $\phi 2$) and two precharge clock phases (Φ3 and Φ4). Phase Φ3 goes low during the first half of phase Φ1 and serves as a precharge therefor. Phase Φ4 goes low during the first half of phase Φ2 and serves as a precharge therefore. A set of clocks Φ1–Φ4 required to clock one bit of data and thus correspond to one time period.

The time periods are labeled T1–T20 and each preferably has a time period on the order of five microseconds. Selecting a time period on the order of five microseconds permits, as will be seen, data to be outputted from the digital filter at a ten kilohertz rate (i.e., at a 100 microsecond period) which provides for a frequency response of five kilohertz in the D to A output section 25 (FIG. 4*b*). It will be appreciated by those skilled in the art, however, that depending on the frequency response which is desired and depending upon the number of Kn speech coefficients used, and also depending upon the type of logics used, that the periods or frequencies of the clocks and clock phases shown in FIG. 5 may be substantially altered, if desired.

As is explained in U.S. patent application Ser. No. 807,461, since abandoned and continued in U.S. patent application Ser. No. 905,328, filed May 12, 1978, one cycle time of the lattice filter in filter excitation generator 24, preferably comprises twenty time periods, T1–T20. For reasons not important here, the numbering of these time periods differs between this application and U.S. patent application Ser. No. 807,461, since abandoned and continued in U.S. patent application Ser. No. 905,328, filed May 12, 1978. To facilitate the reader's understanding of the differences in the numbering of the time periods, both numbering schemes are shown at the time period time line 500 in FIG. 5. At time line 500, the time periods, T1–T20 which are not enclosed in parenthesis identify the time periods according to the convention used in this application. On the other hand, the time periods convention used in U.S. patent application Ser. No. 807,461, since abandoned and continued in U.S. patent application Ser. No. 905,328, filed May 12, 1978. Thus, time period T17 is equivalent to time period (T9).

At numeral 501 is depicted the parameter count (PC) timing signals. In this embodiment there are thirteen PC signals, PC=0 through PC=12. The first twelve of these, PC=0 through PC=11 correspond to times when the energy, pitch, and K1–K10 parameters, respectively, are available in parameter output register 201. Each of the first twelve PC's comprise two cycles, which are labeled A and B. Each such cycle starts at time period T17 and continues to the following T17. During each PC the target value from the parameter output register 201 is interpolated with the existing value in K-stack 302 in parameter interpolator 23. During the A cycle, the parameter being interpolated is withdrawn from the K-stack 302, E10 loop 304 or register 305, as appropriate, during an appropriate time period. During the B cycle the newly interpolated value is reinserted in the K-stack (or E10 loop or pitch register). The thirteenth PC, PC=12, is provided for timing purposes so that all twelve parameters are interpolated once each during a 2.5 milliseconds interpolation period.

As was discussed with respect to the parameter interpolator 23 of FIG. 4*b* and Table IV, eight interpolations are performed for each inputting of a new frame of data from ROMs 12*a–b* into synthesizer 10. This is seen at numeral 502 of FIG. 5 where timing signals DIV 1, DIV 2, DIV 4 and DIV 8 are shown. These timing signals occur during specific interpolation counts (IC) as shown. There are eight such interpolation counts, IC0–IC7. New data is inputted from the ROMs 12*a–b* into the synthesizer during IC0. These new target values of the parameters are then used during the next eight interpolation counts, IC1 through IC0; the existing parameters in the pitch register 305 K-stack 302 and E10 loop 304 are interpolated once during each interpolation count. At the last interpolation count, IC0, the present value of the parameters in the pitch register 305, K-stack 302 and E10 loop 304 finally attain the target values previously inputted toward the last IC0 and thus new targe values may then again be inputted as a new frame of data. Inasmuch as each interpolation count has a period of 2.5 milliseconds, the period at which new data frames are inputted to the synthesizer chip is 20 microseconds or equivalent to a frequency of 50 hertz. The DIV 8 signal corresponds to those interpolation counts in which one-eighth of the difference produced by subtractor 308 is added to the present values in adder 310 whereas during DIV 4 one-fourth of the difference is added in, and so on. Thus, during DIV 2, ½ of the difference from subtractor 308 is added to the present value of the parameter in adder 310 and lastly during DIV 1 the total difference is added in adder 310. As has been previously mentioned, the effect of this interpolation scheme can be seen in Table IV.

PARAMETER DATA COMPRESSION

It has been previously mentioned that new parameters are inputted to the speech synthesizer at a 50 hertz rate. It will be subsequently seen that in parameter interpolator and excitation generator 24 (FIG. 4*b*) the pitch data, energy data and K1–Kn parameters are stored and utilized as ten bit digital binary numbers. If each of these twelve parameters were updated with a ten bit binary number at a fifty hertz rate from an external source, such as ROMs 12*a* and 12*b*, this would require a $12\times10\times50$ or 6,000 hertz bit rate. Using the data compression techniques which will be explained, we reduce this bit rate required for synthesizer 10 to on the order of 1,000 to 1,200 bits per second. And more importantly, it has been found that the speech compression schemes herein disclosed do not appreciably degrade the quality of speech generated thereby in comparison to using the data uncompressed.

Figure 6:
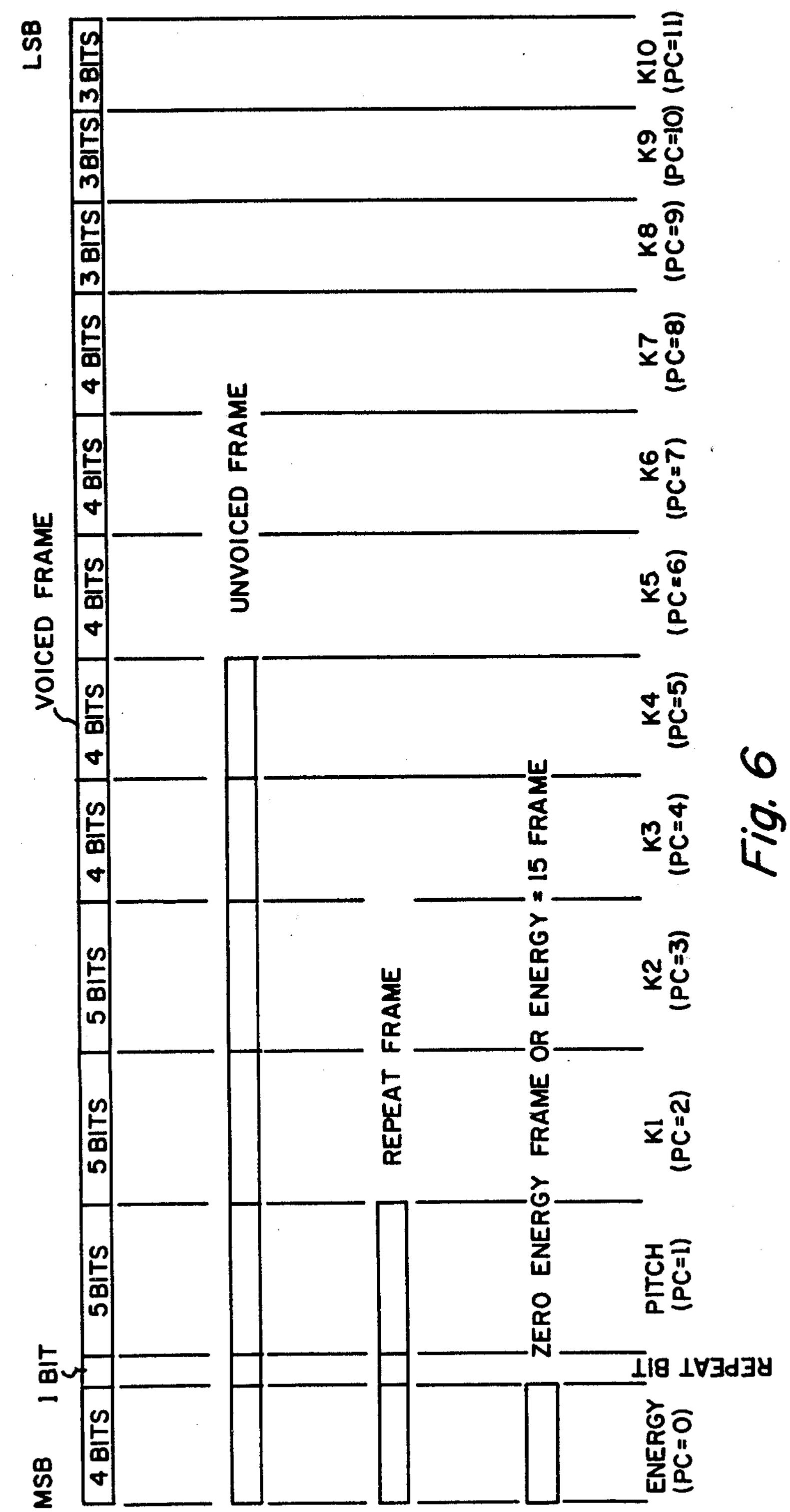
FIG. 6 pictorially shows the data compression scheme preferably used to reduce the data rate required by the synthesizer.

The data compression scheme used is pictorially shown in FIG. 6. Referring now to FIG. 6, it can be seen that there is pictorially shown four different lengths of frames of data. One, labeled voiced frame, has a length of 49 bits while another entitled unvoiced frame, has a length of 28 bits while still another called "repeat frame" has a length of ten bits and still another which may be alternatively called zero energy frame or energy equals fifteen frame has the length of but four bits. The "voiced frame" supplies four bits of data for a coded energy parameter as well as coded four bits for each of five speech parameters K3 through K7. Five bits of data are reserved for each of three coded parameters, pitch, K1 and K2. Additionally, three bits of data are provided for each of three coded speech parameters K8–K10 and finally another bit is reserved for a repeat bit.

In lieu of inputting ten bits of binary data for each of the parameters, a coded parameter is inputted which is converted to a ten bit parameter by addressing parameter ROM 202 with the coded parameter. Thus, coefficient K1, for example, may have any one of thirty-two different values, according to the five bit code for K1, each one of the thirty-two values being a ten bit numerical coefficient stored in parameter ROM 202. Thus, the actual values of coefficients K1 and K2 may have one of thirty-two different values while the actual values of coefficients K3 through K7 may be one of sixteen different values and the values of coefficients K8 through K9 may be one of eight different values. The coded pitch parameter is five bits long and therefore may have up to thirty-two different values. However, only thirty-one of these reflect actual pitch values, a pitch code of 00000 being used to signify an unvoiced frame of data. The coded energy parameter is four bits long and therefore would normally have sixteen available ten bit values; however, a coded energy parameter equal to 0000 indicates a silent frame such as occur as pauses in and between words, sentences and the like. A coded energy parameter equal to 1111 (energy equals fifteen), on the other hand, is used to signify the end of a segment of spoken speech, thereby indicating that the synthesizer is to stop speaking. Thus, of the sixteen codes available for the coded energy parameter, fourteen are used to signify different ten bit speech energy levels.

Coded coefficients K1 and K2 have more bits than coded coefficients K3–K7 which in turn have more bits than coded coefficients K8 through K10 because coefficient K1 has a greater effect on speech than K2 which has a greater effect on speech than K3 and so forth through the lower order coefficients. Thus given the greater significance of coefficients K1 and K2 than coefficients K8 through K10, for example, more bits are used in coded format to define coefficients K1 and K2 than K3–K7 or K8–K10.

Also it has been found that voiced speech data needs more coefficients to correctly model speech than does unvoiced speech and therefore when unvoiced frames are encountered, coefficients K5 through K10 are not updated, but rather are merely zeroed. The synthesizer realizes when an unvoiced frame is being outputted because the uncoded pitch parameter is equal to 00000.

It has also been found that during speech there often occur instances wherein the parameters do not significantly change during a twenty millisecond period; particularly, the K1–K10 coefficients will often remain nearly unchanged. Thus, a repeat frame is used wherein new energy and new pitch are inputted to the synthesizer, however, the K1–K10 coefficients previously inputted remain unchanged. The synthesizer recognizes the ten bit repeat frame because the repeat bit between energy and pitch then comes up whereas it is normally off. As previously mentioned, there occur pauses between speech or at the end of speech which are preferably indicated to the synthesizer; such pauses are indicated by a coded energy frame equal to zero, at which time the synthesizer recognizes that only four bits are to be sampled for that frame. Similarly, only four bits are sampled when an "energy equals fifteen." Using coded values for the speech in lieu of actual values, alone would reduce the data rate to $48\times50$ or 2400 bits per second. By additionally using variable frame lengths, as shown in FIG. 6, the data rate may be further reduced to on the order of one thousand to twelve hundred bits per second, depending on the speaker and on the material spoken.

The effect of this data compression scheme can be seen from Table V where the coding for the word "HELP" is shown. Each line represents a new frame of data. As can be seen, the first part of the word "HELP", "HEL", is mainly voiced while the "P" is unvoiced. Also note the pause between "HEL" and "P" and the advantages of using the repeat bit. Table VI sets forth the encoded and decoded speech parameter. The 3, 4 or 5 bit code appears as a hexadecimal number in the left-hand column, while the various decoded parameter values are shown as ten bit, two's complement numbers expressed as hexadecimal numbers in tabular form under the various parameters. The decoded speech parameter are stored in ROM 203. The repeat bit is shown in Table V between the pitch and K parameters for sake of clarity; preferably, according to the embodiment of FIG. 6, the repeat bit occurs just before the most significant bit (MSB) of the pitch parameter.

SYNTHESIZER LOGIC DIAGRAMS

The various portions of the speech synthesizer of FIGS. 4*a* and 4*b* will now be described with reference to FIGS. 7*a* through 14*b* which, depict, in detail, the logic circuits implemented on a semiconductor chip, for example, to form the synthesizer 10. The following discussion, with reference to the aforementioned drawings, refers to logic signals available at many points in the circuit. It is to be remembered that in P channel MOS devices a logical zero corresponds to a negative voltage, that is, Vdd, while a logical one refers to a zero voltage, that is, Vss. It should be further remembered that P-channel MOS transistors depicted in the aforementioned figures are conductive when a logical zero, that is, a negative voltage, is applied at their respective gates. When a logic signal is referred to which is unbarred, that is, has no bar across the top of it, the logic signal is to be interpreted as "TRUE" logic; that is, a binary one indicates the presence of the signal (Vss) whereas a binary zero indicates the lack of the signal (Vdd). Logic signal names including a bar across the top thereof are "FALSE" logic; that is, a binary zero (Vdd voltage) indicates the presence of the signal whereas a binary one (Vss voltage) indicates that the signal is not present. It should also be understood that a numeral three in clocked gates indicates that phase Φ3 is used as a precharge whereas a four in a clocked gate indicates that phase Φ4 is used as a precharge clock. An "S" in the gate indicates that the gate is statically operated.

Timing Logic Diagram

Figure 7A:
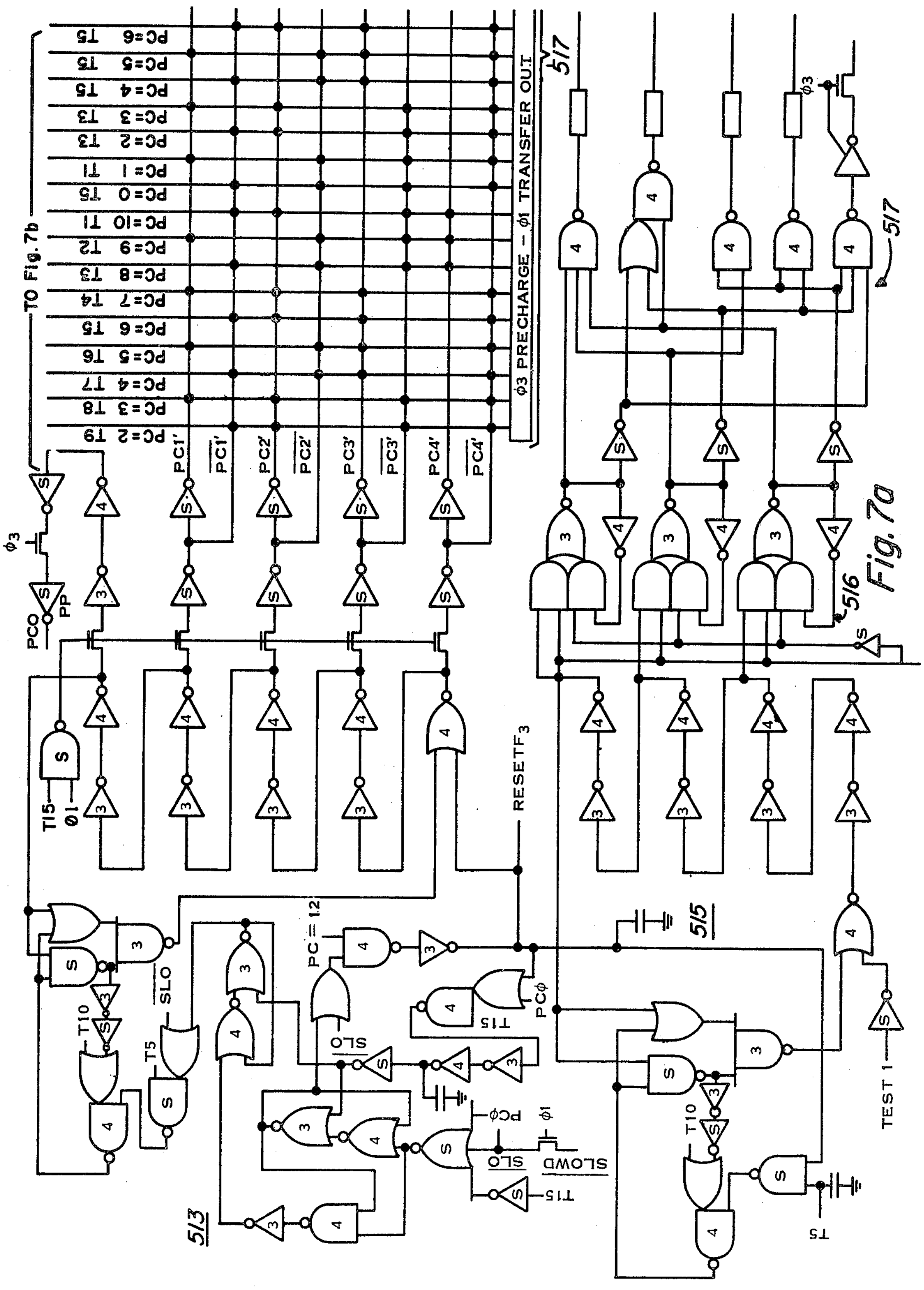
FIGS. 7*a* and 7*b* form a composite logic diagram of the synthesizer's timing circuits.
Figure 7A:
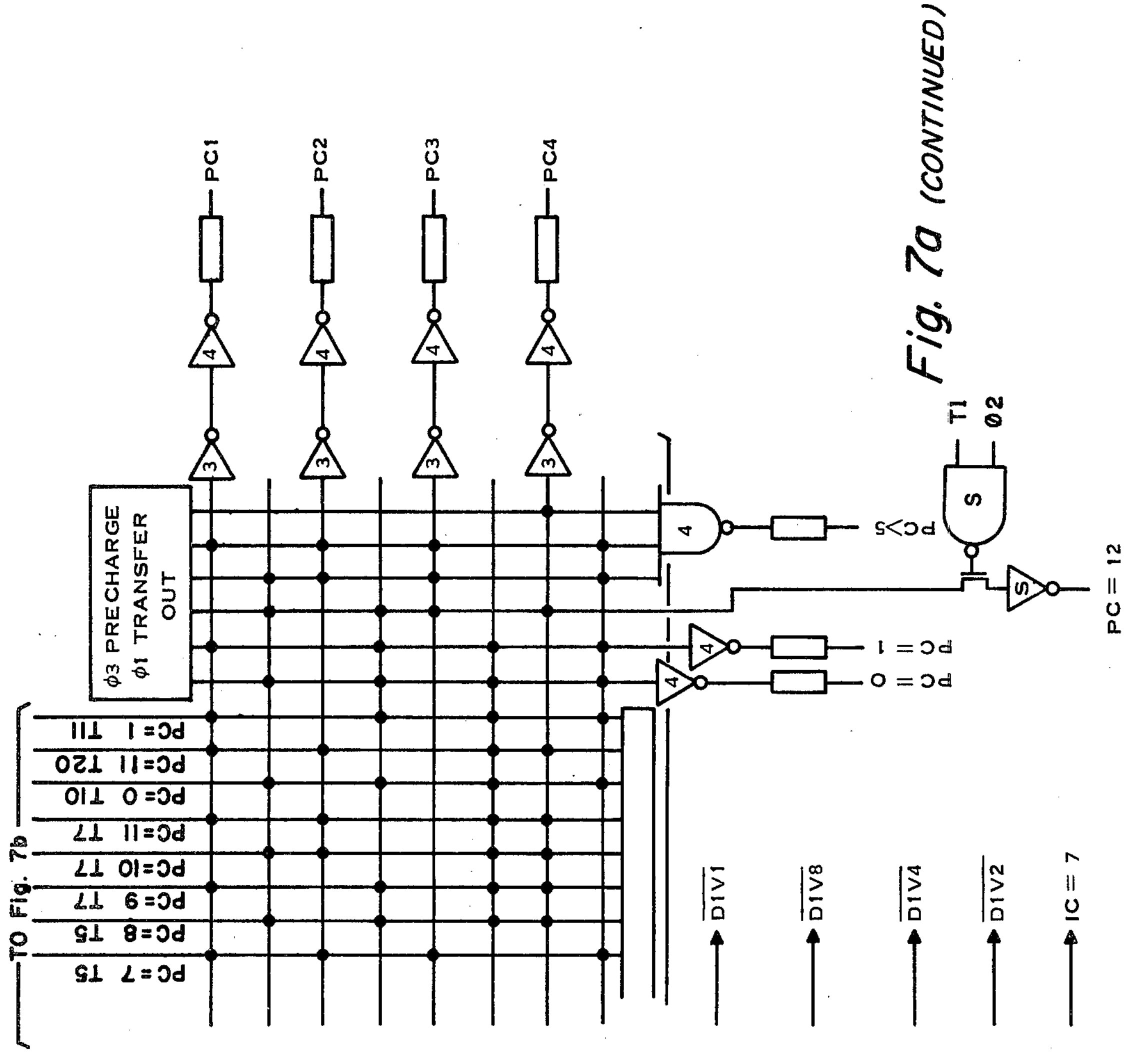
Figure 7B:
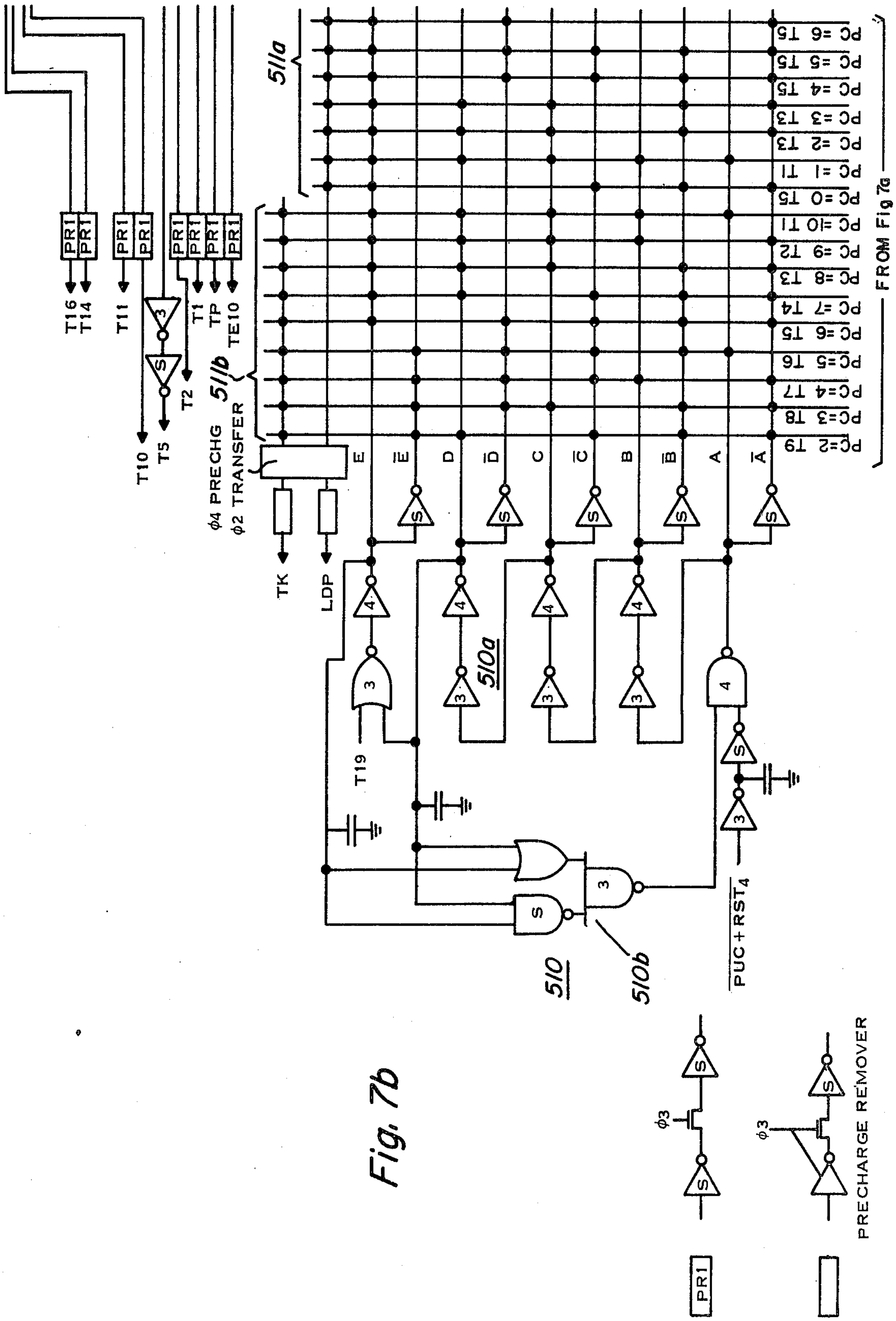
Figure 7B:
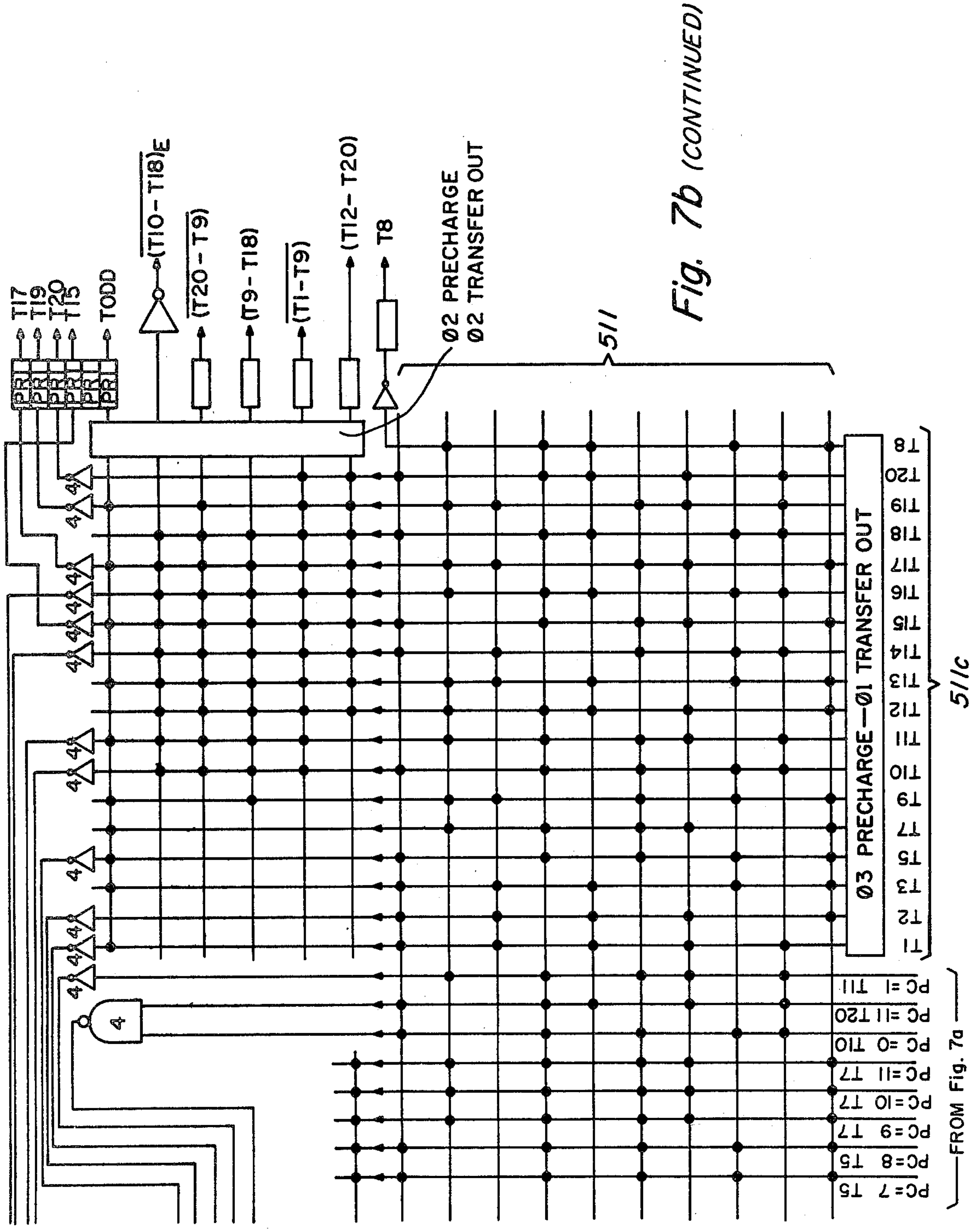

Referring now to FIGS. 7*a* and 7*b*, they form a composite, detailed logic diagram of the timing logic for synthesizer 10. Counter 510 is a pseudorandom shift counter including a shift register 510*a* and feed back logic 510*b*. The counter 510 counts into pseudorandom fashion and the TRUE and FALSE outputs from shift register 510*a* are supplied to the input section 511 of a timing PLA. The various T time periods decoded by the timing PLA are indicated adjacent to the output lines thereof. Section 511*c* of the timing PLA is applied to an output timing PLA 512 generating various combinations and sequences of time period signals, such as T odd, $\overline{T10}$–$\overline{T18}$, and so forth. Sections 511*a* and 511*b* of timing PLA 511 will be described subsequently.

The parameter count in which the synthesizer is operating is maintained by a parameter counter 513. Parameter counter 513 includes an add one circuit and circuits which are responsive to SLOW and SLOW D. In SLOW, the parameter counter repeats the A cycle of the parameter count twice (for a total of three A cycles) before entering the B cycle. That is, the period of the parameter count doubles so that the parameters applied to the lattice filter are updated and interpolated at half the normal rate. To assure that the inputted parameters are interpolated only once during each parameter count during SLOW speaking operations each parameter count comprises three A cycles followed by one B cycle. It should be recalled that during the A cycle the interpolation is begun and during the B cycle the interpolated results are reinserted back into either K-stack 302, E10 loop 304 or pitch register 305, as appropriate. Thus, merely repeating the A cycle has no effect other than to recalculate the same value of a speech parameter but since it is only reinserted once back into either K-stack 302, E10 loop 304 or pitch register 305 only the results of the interpolation immediately before the B cycle are retained.

Inasmuch as parameter counter 513 includes an add one circuit, the results outputted therefrom, PC1–PC4, represent in binary form, the particluar parameter count in which the synthesizer is operating. Output PC0 indicates in which cycle, A or B, the parameter count is. The parameter counter outputs PC1–PC4 are decoded by timing PLA 514. The particular decimal value of the parameter count is decoded by timing PLA 514 which is shown in adjacent to the timing PLA 514 with nomenclature such as PC=0, PC=1, PC=7 and so forth. The relationship between the particular parameters and the value of PC is set forth in FIG. 6. Output portions 511*a* and 511*b* of timing PLA 511 are also interconnected with outputs from timing PLA 514 whereby the Transfer K (TK) signal goes high during T9 of PC=2 or T8 of PC=3 or T7 of PC=4 and so forth through T1 of PC=10. Similarly, a LOAD Parameter (LDP) timing signal goes high during T5 of PC=0 or T1 of PC=1 or T3 of PC=2 and so forth through T7 of PC=11. As will be seen, signal TK is used in controlling the transfer of data from parameter output register 201 to subtractor 308, which transfer occurs at different T times according to the particular parameter count the parameter counter 513 is in to assure that the appropriate parameter is being outputted from KE10 transfer register 303. Signal LDP is, as will be seen, used in combination with the parameter input register to control the number of bits which are inputted therein according to the number of bits associated with the parameter then being loaded according to the number of bits in each coded parameter as defined in FIG. 6.

Interpolation counter 515 includes a shift register and an add one circuit for binary counting the particular interpolation cycle in which the synthesizer 10 is operating. The relationship between the particular interpolation count in which the synthesizer is operating and the DIV1, DIV2, DIV4 and DIV8 timing signals derived therefrom is explained in detail with reference to FIG. 6 and therefore additional discussion here would be superfluous. It will be noted, however, that interpolation counter 515 includes a three bit latch 516 which is loaded at TI. The output of three bit latch 516 is decoded by gates 517 for producing the aforementioned DIV1 through DIV8 timing signals. Interpolation counter 515 is responsive to a signal RESETF from parameter counter 513 for permitting interpolation counter 515 to increment only after PC=12 has occurred.

ROM/Controller Interface Logic Diagram

Figure 8A:
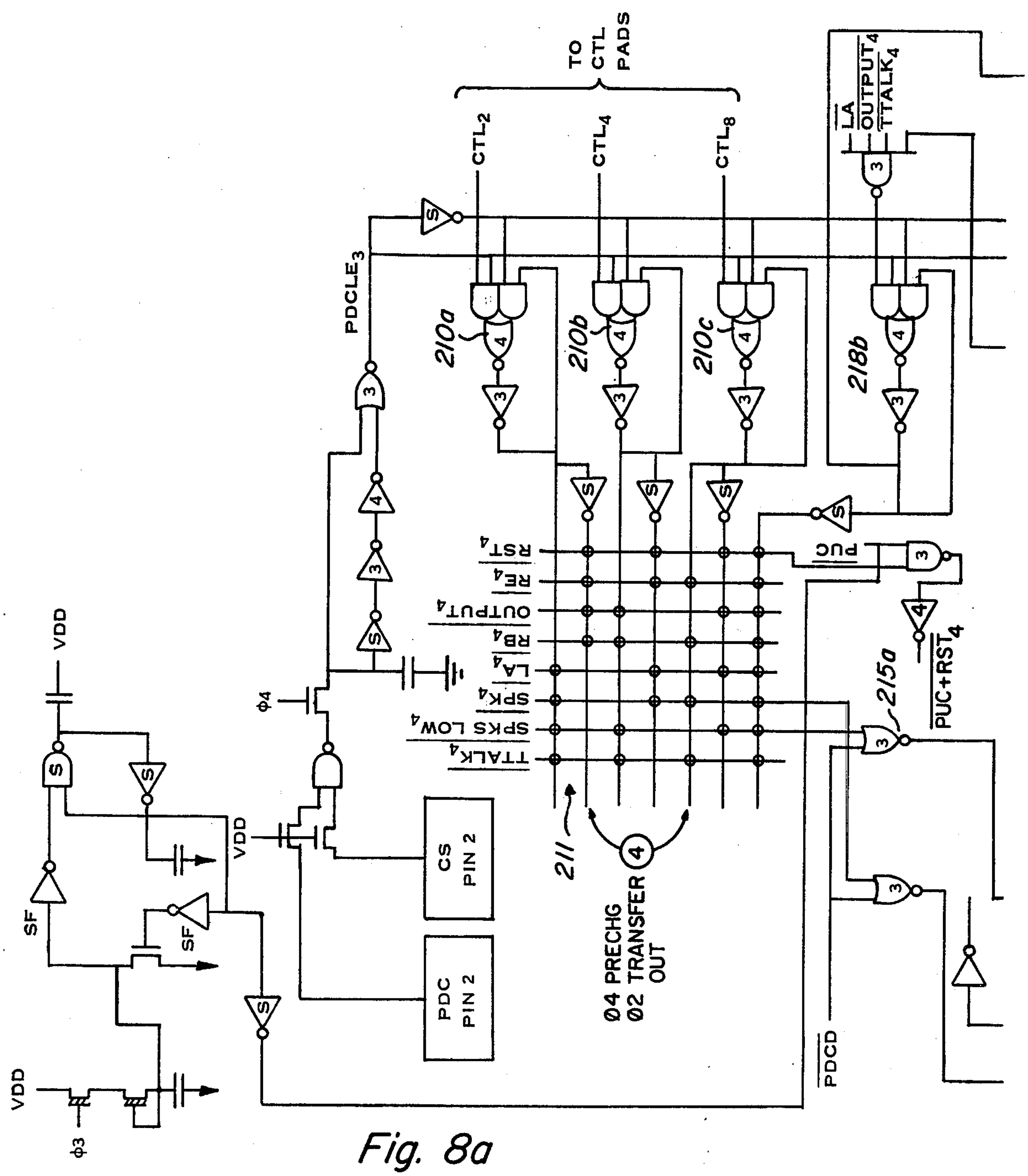
FIGS. 8*a*, 8*b* and 8*c* form a composite logic diagram of the synthesizer's ROM Controller interface logics.
Figure 8A:
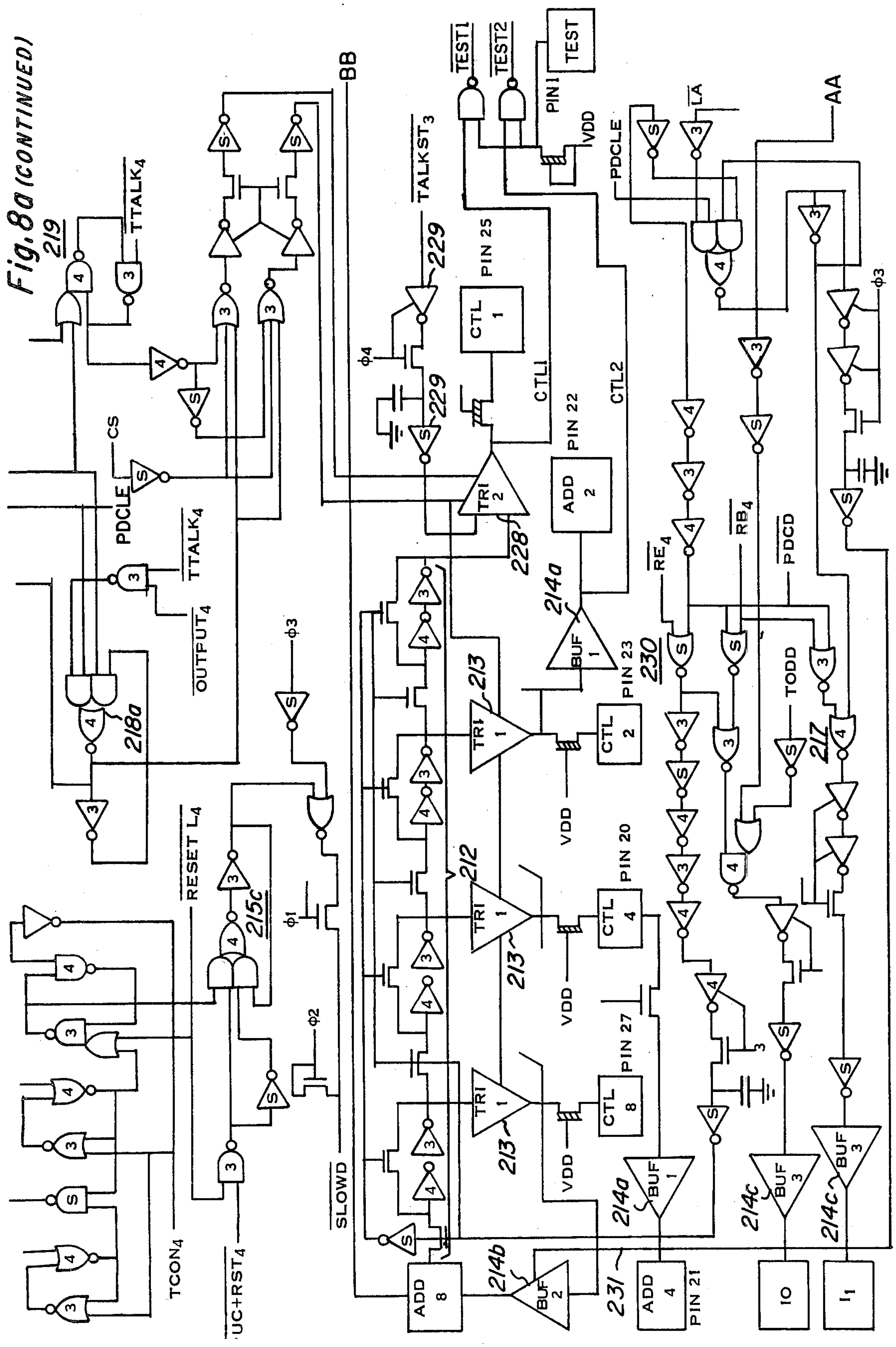
Figure 8B:
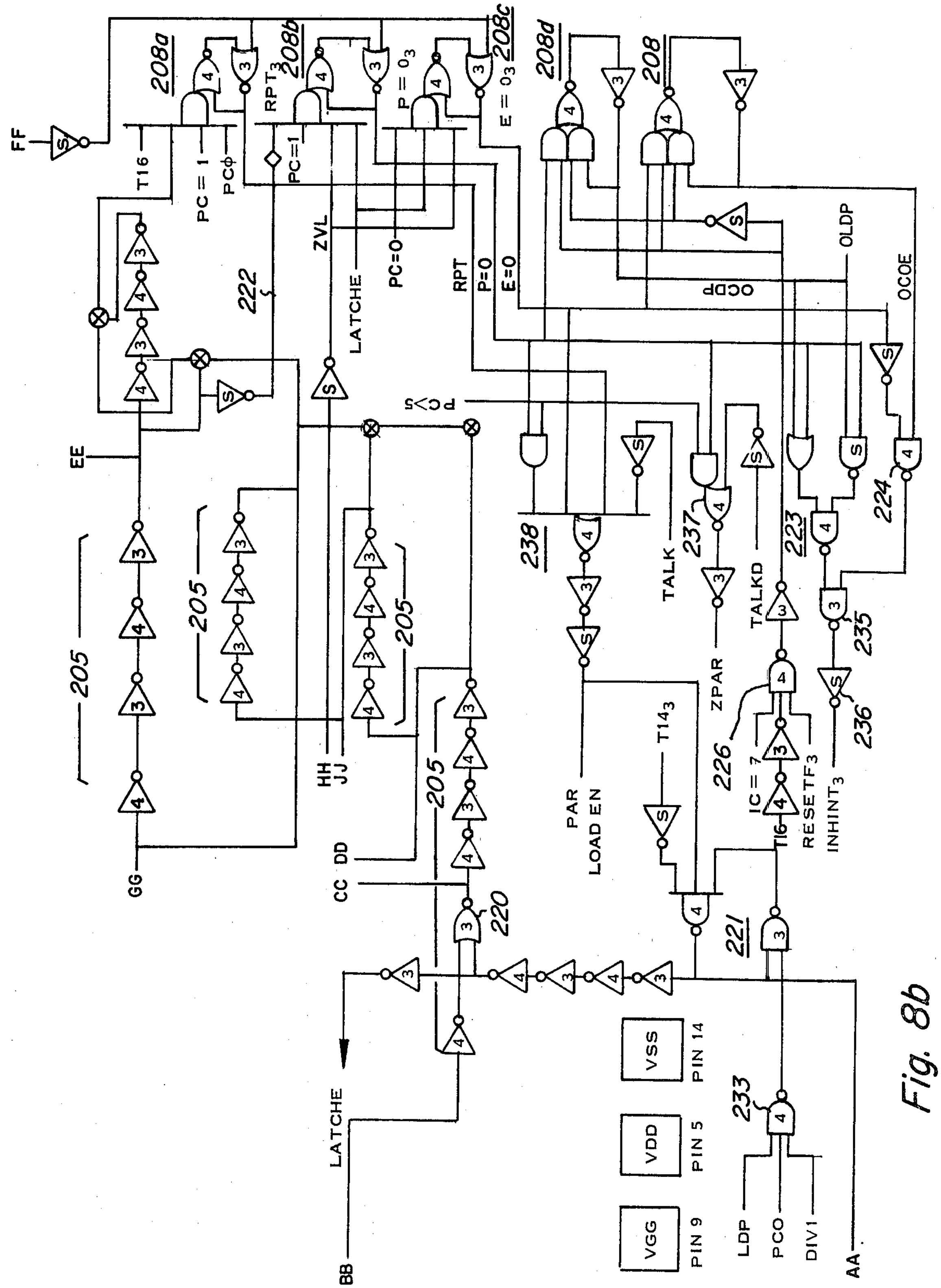
Figure 8B:
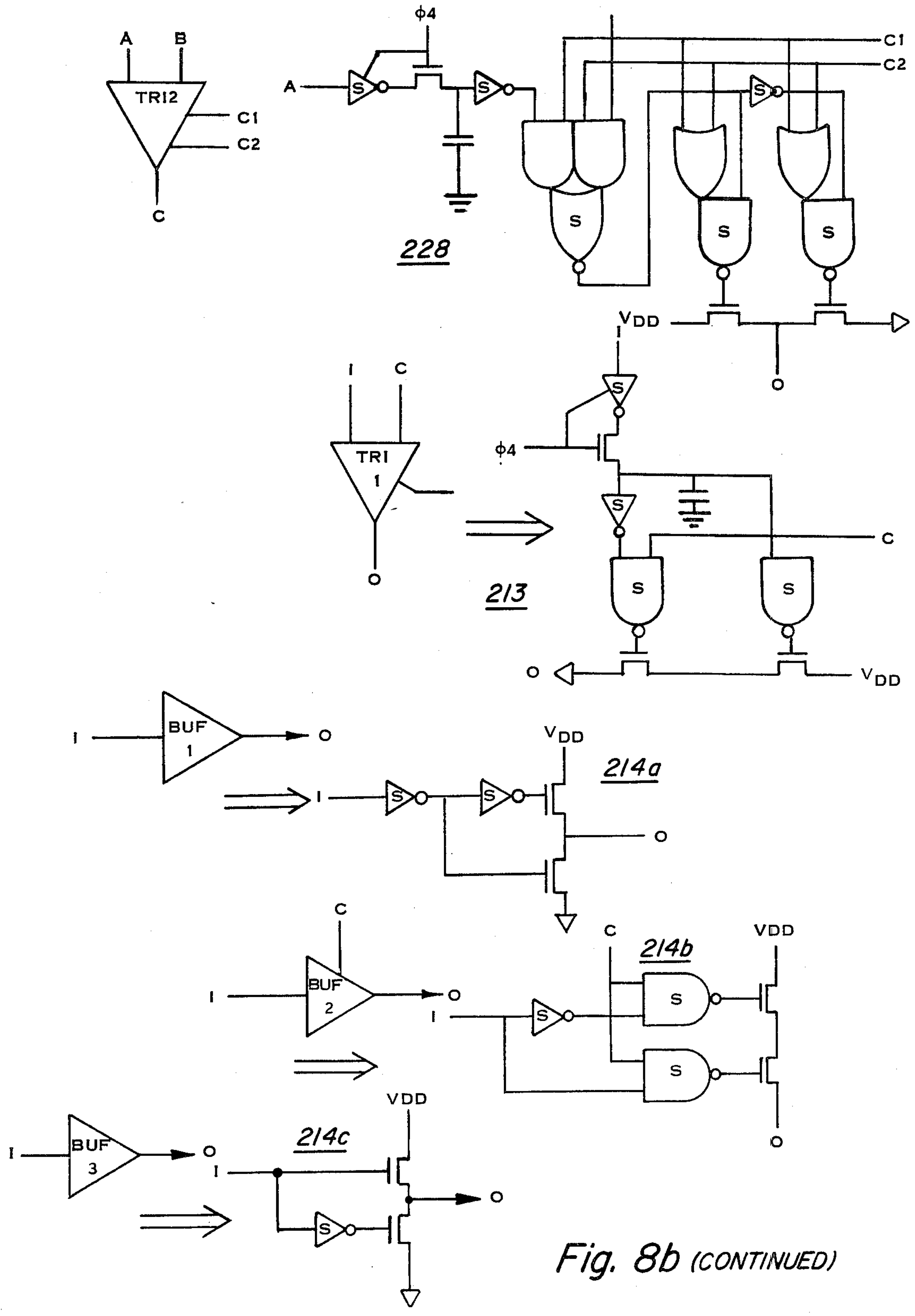
Figure 8C:
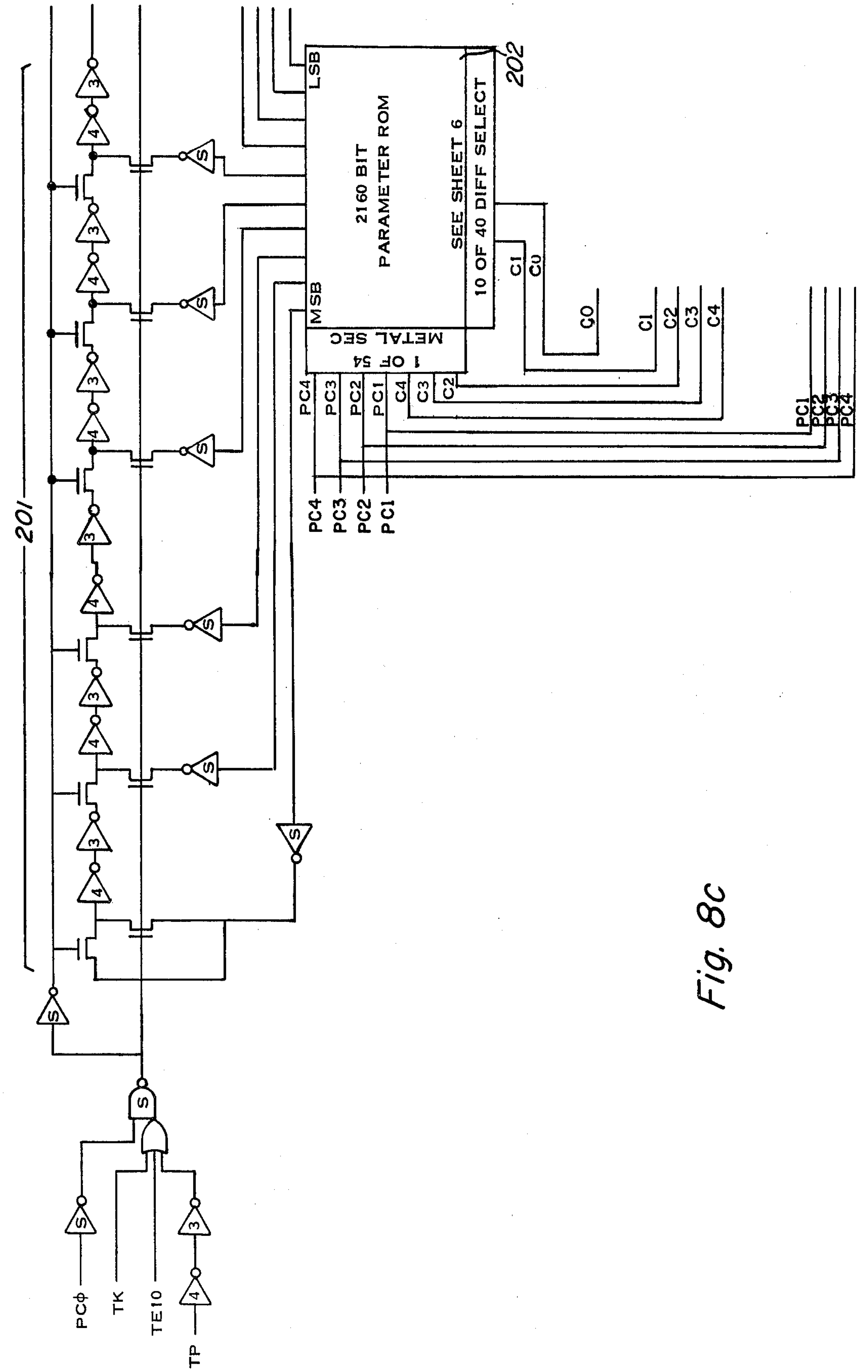
Figure 8C:
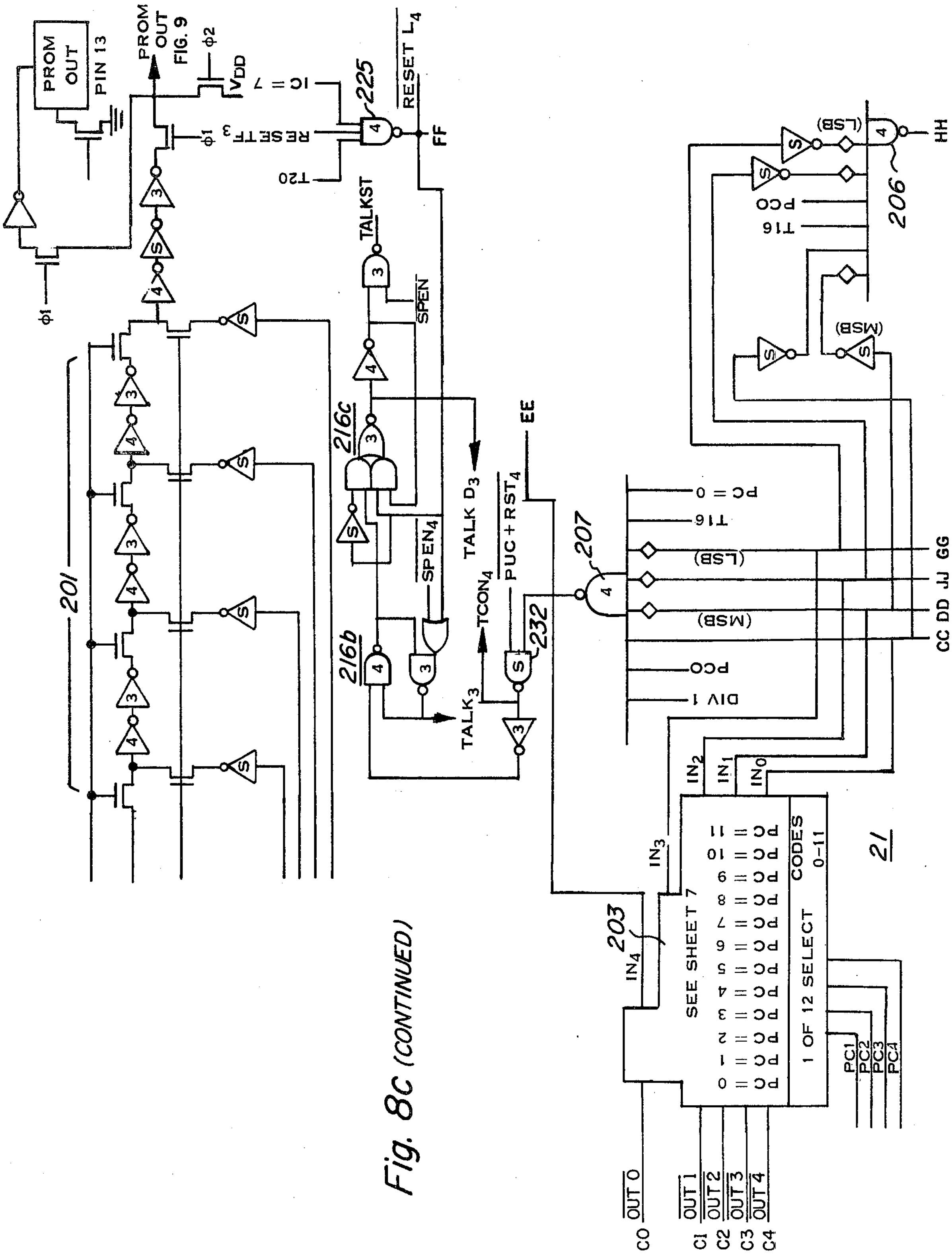

Turning now to FIGS. 8*a*, 8*b* and 8*c*, which form a composite diagram, there is shown a detailed logic diagram of ROM/Controller interface logic 21. Parameter input register 205 is coupled, at its input to address pin ADD8. Register 205 is a six bit shift register, most of the stages of which are two bits long. The stages are two bits long in this embodiment inasmuch as ROMs 12*a* and b output, as will be seen, data at half the rate at which data is normally clocked in synthesizer 10. At the input of parameter input register 205 is a parameter input control gate 220 which is responsive to the state of a latch 221. Latch 221 is set in response to LDP, PC0 and DIV1 all being a logical one. It is reset at T14 and in response to parameter load enable from gate 238 being a logical zero. Thus, latch 221 permits gate 220 to load data only during the A portion (as controlled by PC0) of the appropriate parameter count and at an appropriate T time (as controlled by LDP) of IC0 (as controlled by DIV1) provided parameter load enable is at a logical one. Latch 221 is reset by T14 after the data has been inputted into parameter register 205.

The coded data in parameter input register 205 is applied on lines IN0–IN4 to coded parameter RAM 203, which is addressed by PC1–PC4 to indicate which coded parameter is then being stored. The contents of register 205 is tested by all one's gate 207, all zeroes gate 206 and repeat latch 208*a*. As can be seen, gate 206 tests for all zeroes in the four least significant bits of register 205 whereas gate 207 tests for all ones in those bits. Gate 207 is also responsive to PC0, DIV1, T16 and PC=0 so that the zero condition is only tested during the time that the coded energy parameter is being loaded into parameter RAM 203. The repeat bit occurs in this embodiment immediately in front of the coded pitch parameter; therefore, it is tested during the A cycle of PC=1. Pitch latch **208*b* is set in response to all zeroes in the coded pitch parameter and is therefore responsive to not only gate 206 but also the most significant bit of the pitch data on line 222 as well as PC=1. Pitch latch 208*b*** is set whenever the loaded coded pitch parameter is a 00000 indicating that the speech is to be unvoiced.

Energy=0 latch **208*c* is responsive to the output of gate 206 and PC=0 for testing whether all zeroes have been inputted as the coded energy parameter and is set in response thereto. Old pitch latch 208*d* stores the output of the pitch=0 latch 208*b* from the prior frame of speech data while old energy latch 208*e* stores the output of energy=0 latch 208*c* from the prior frame of speech data. The contents of old pitch latch 208*d* and pitch=0 latch 208*b* are compared in comparison gates 223 for the purpose of generating an INHIBIT signal. As will be seen, the INHIBIT signal inhibits interpolations and this is desirable during changes from voiced to unvoiced or unvoiced to voiced speech so that the new speech parameters are automatically inserted into K-stack 302, E10 loop 304 and pitch register 305 as opposed to being more slowly interpolated into those memory elements. Also, the contents of old energy latch 208*e* and energy=0 latch 208*c* is tested by NAND gate 224 for inhibiting interpolation for a transition from a non-speaking frame to a speaking frame of data. The outputs of NAND gate 224 and gates 223 are coupled to a NAND gate 235 whose output is inverted to INHIBIT by an inverter 236. Latches 208*a*–208*c* are reset by gate 225 and latches 208*d* and 208*e* are reset by gate 226. When the excitation signal is unvoiced, the K5–K10 coefficients are set to zero, as aforementioned. This is accomplished, in part, by the action of gate 237 which generates a ZPAR signal when pitch is equal to zero and when the parameter counter is greater than five, as indicated by PC 5 from PLA 514**.

Also shown in FIGS. **8*a–c* is a command latch 210 which comprises three latches 210*a, b,*** and *c* which latch in the data at CTL2, 4 and 8 in response to a processor data clock (PDC) signal in conjunction with a chip select (CS) signal. The contents of command latch 210 is decoded by command decoder 211 unless disabled by latches **218*a* and 218*b*. As previously mentioned, these latches are responsive to decoded LA, output and TTALK commands for disabling decoder 211 from decoding what ever data happens to be on the CTL2–CTL8 pins when subsequent PDC signals are received in conjunction with the LA, output and TTALK commands. A decoded TTALK command set TTALK latch 219. The output of TTALK latch 219, which is reset by a Processor Data Clock Leading Edge (PDCLE) signal or by an output from latch 218*b*, controls along with the output of latch 218*a* NOR gates 227*a*** and *b*. The output of NOR gate **227*a* is a logical one if TTALK latch 219 is set, thereby coupling pins CTL1 to the talk latch via tristate buffer 228 and inverters 229. Tristate latch 228 is shown in detail on the right side of FIGS. 8*a–c*. NOR gate 227*b*, on the other hand, outputs a logical one if an output code has been detected, setting latch 228*a* and thereby connecting pins CTL1 to the most significant bit of data input register 212**.

Data is shifted into data input register 212 from address pin 8 in response to a decoded read command by logics 230. RE, RB and LA instructions are outputted to ROM via instruction pins $I_0$–$I_1$ from ROM control logic 217 via buffers **214*c*. The contents of data input register 212 is outputted to CTL1–CTL4 pins via buffers 213 and to the aforementioned CTL1 pin via buffer 228 when NOR gate 227*b* inputs a logical one. CTL1–CTL4 pins are connected to address pins ADD1–ADD4 via buffers 214*a* and CTL8 pin is connected to ADD8 pin 8 via a control buffer 214*b* which is disabled when addresses are being loaded on the ADD1–ADD8 pins by the signal on line 231**.

The Talk latch 216 shown in FIGS. **8*a–c* preferably comprises, three latches 216*a*, 216*b* and 216*c*. Latch 216*a* is set in response to a decoded SPK command and generates, in response thereto, a speak enable (SPEN) signal. AS will be seen, SPEN is also generated in response to a decoded SPKSLOW command by latch 215*a*. Latch 216*b* is set in response to speak enable during IC7 as controlled by gate 225. Latches 216*a* and 216*b* are reset in response to (1) a decoded reset command, (2) an energy equals fifteen code or (3) on a power-up clear by gate 232. Talk delayed latch 216*c* is set with the contents of latch 216*b* at the following IC7 and retains that data through eight interpolation counts. As was previously mentioned, the talk delayed latch permits the speech synthesizer to continue producing speech data for eight interpolation cycles after a coded energy=0 condition has been detected setting latch 208*c*. Likewise, slow talk latch 215 is implemented with latches 215*a*, 215*b* and 215*c*. Latch 215*a* enables the speak enable signal while latches 215*b* and 215*c* enable the production of the SLOWD signal in much the same manner as latches 216*b* 21*d* 216*c*** enable the production of the TALKD signal.

Considering now, briefly, the timing interactions for inputting data into parameter input register 205, it will be recalled that this is controlled chiefly by a control gate 220 in response to the state of a parameter input latch 221. Of course, the state of the latch is controlled by the LDP signal applied to gate 233. The PC0 and DIV1 signals applied to gate 233 to assure that the parameters are loaded during the A cycle of a particular parameter count during IC0. The particular parameter and the parameter T-Time within the parameter count is controlled by LDP according to the portion **511*a* of timing PLA 511 (FIGS. 7*a* and 7*b*). The first parameter inputted (Energy) is four bits long and therefore LDP is initiated during time period T5 (as can be seen in FIGS. 7*a* and 7*b*). During parameter count 1, the repeat bit and pitch bits are inputted , this being six bits which are inputted according to LDP which comes up at time period T1. Of course, there four times periods difference between T1 and T5 but only two bits difference in the length of the inputted information. This occurs because it takes two time periods to input each bit into parameter input register 205 (which has two stages per each inputted bit) due to the fact that ROMs 12*a*–*12b* are preferably clocked at half the rate at that which synthesizer 10 is clocked. By clocking the ROM chips at half the rate, that the synthesizer 10 chip is clocked simplifies the addressing of the read-only-memories in the aforesaid ROM chips and yet, as can be seen, data is supplied to the synthesizer 10 in plenty of time for performing numerical operations thereon. Thus, in section 511*a* of timing PLA 511, LDP comes up at T1 when the corresponding parameter count indicates that a six bit parameter is to be inputted, comes up at T3 when the corresponding parameter count indicates that a five bit parameter is to be inputted, comes up at T5 when the corresponding parameter count indicates that a four bit parameter is to be inputted and comes up at time period T7 when the corresponding parameter count (EG parameter counts 9, 10, and 11) which correspond to a three bit coded parameter. ROMs 12***a–b* are signaled that the addressed parameter ROM is to output information when signaled via $I_0$ instruction pin, ROM control logic 217 and line 234 which provides information to ROM control logic 217 from latch 221.

Parameter Interpolator Logic Diagram

Figure 9A:
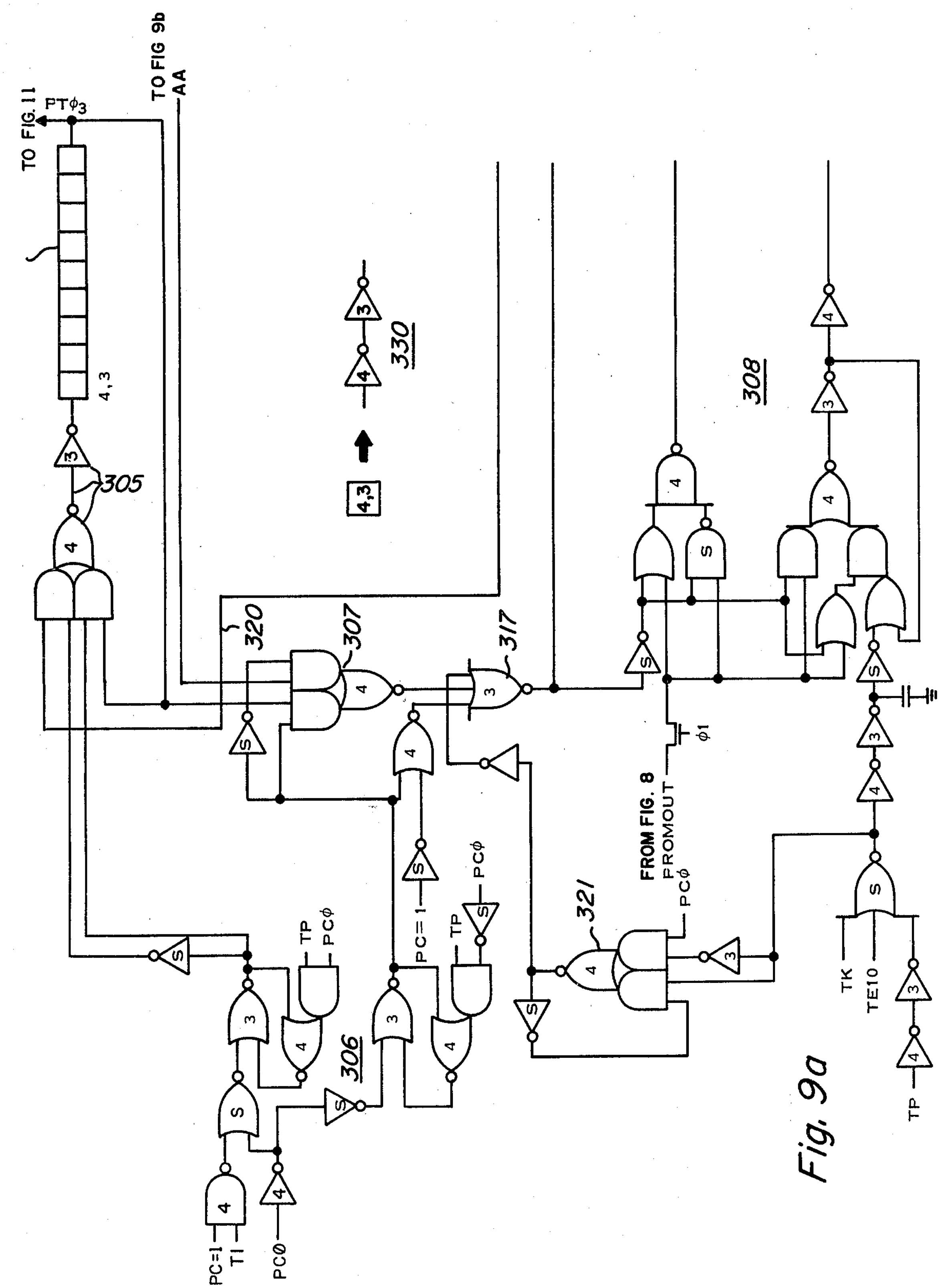
FIGS. 9*a* and 9*b* form a composite logic diagram of the iterpolator logics.
Figure 9A:
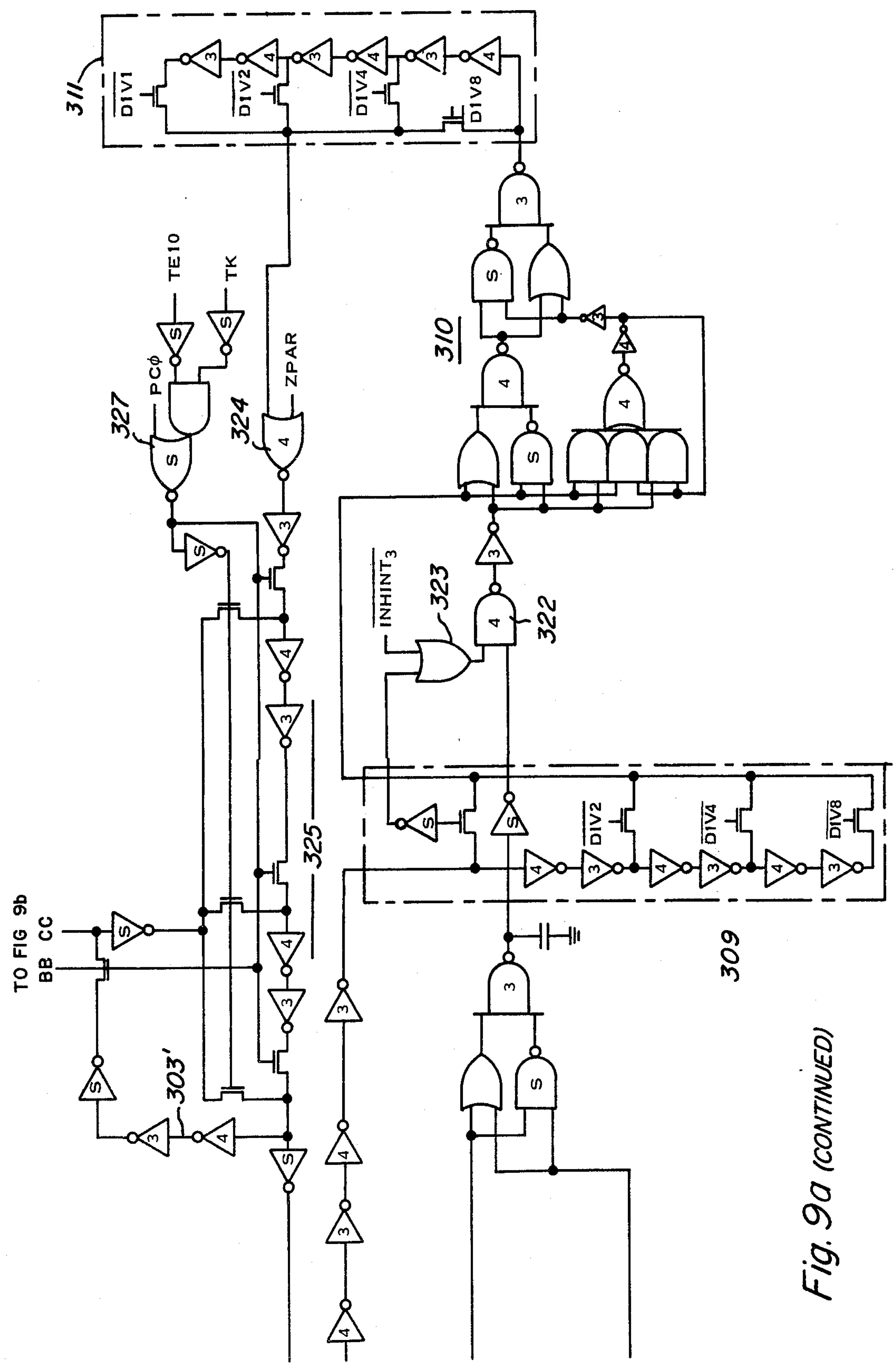
Figure 9B:
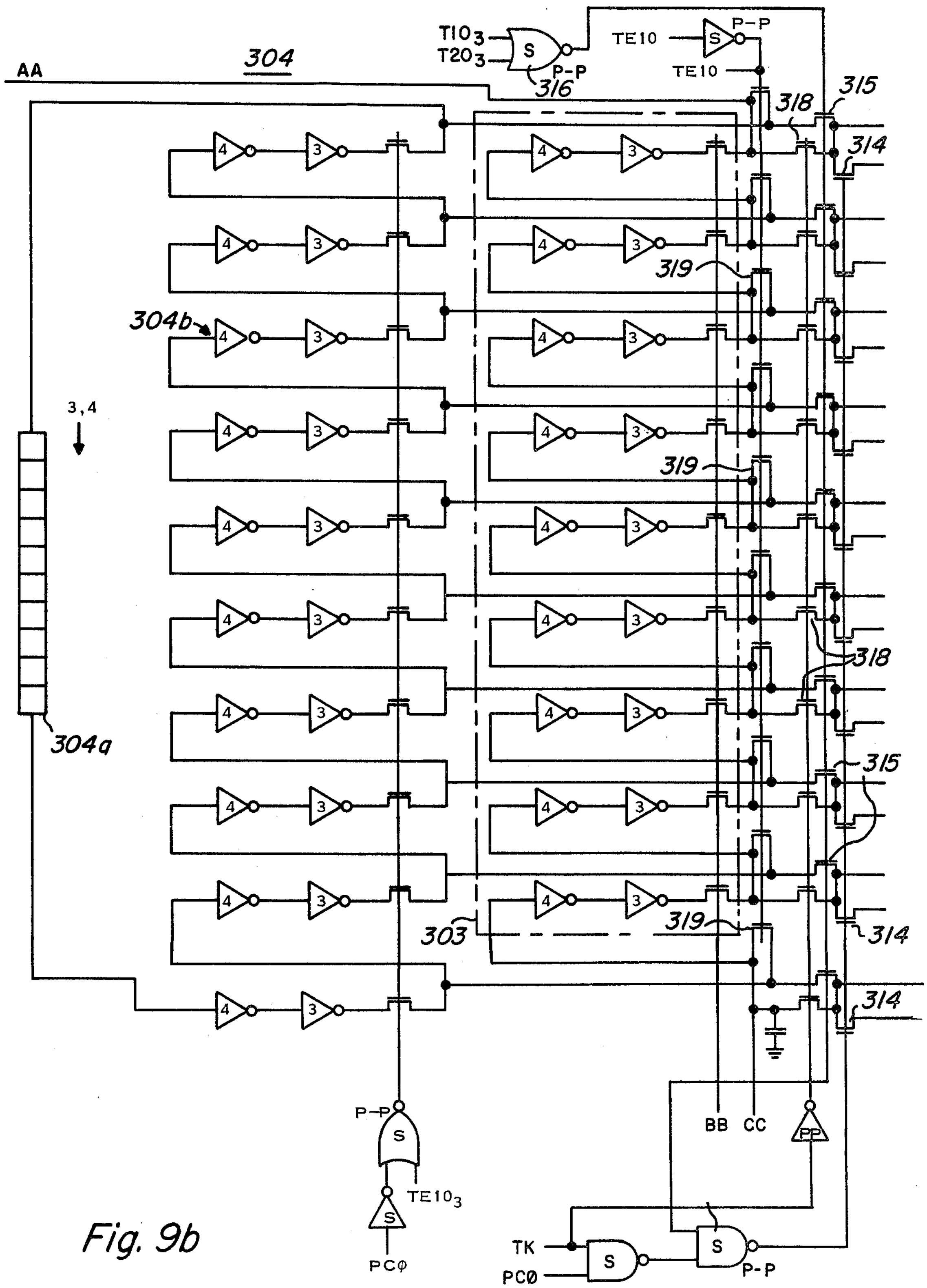
Figure 9B:
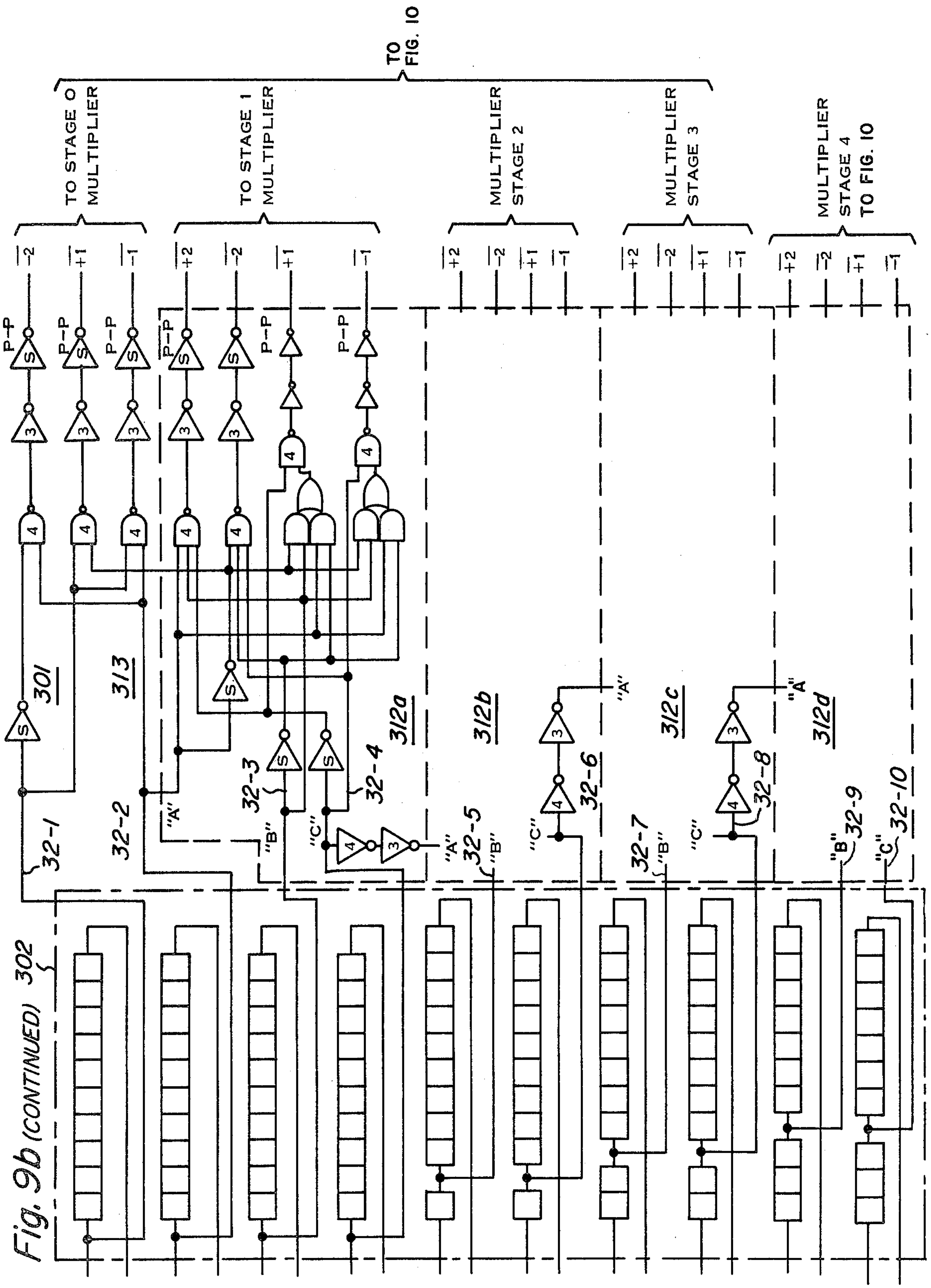

Referring now to FIGS. 9*a* and 9*b*, which form a composite diagram the parameter interpolator logic 23 is shown in detail. K-stack 203 comprises ten registers each of which store ten bits of information. Each small square represents one bit of storage, according to the convention depicted at numeral 330. The contents of each shift register is arranged to recirculate via recirculation gates 314 under control of a recirculation control gate 315. K-stack 302 stores speech coefficients K1–K9 and temporarily stores coefficient K10 or the energy parameter generally in accordance with the speech synthesis apparatus of FIG. 7 of U.S. patent application Ser. No. 807,461, since abandoned and continued in U.S. patent application Ser. No. 905,328, filed May 12, 1978. The data outputted from K-stack 302 to recoding logic 30 at various time periods is shown in Table VII. In Table III of U.S. patent application Ser. No. 807,461, since abandoned and continued in U.S. patent application Ser. No. 905,328, filed May 12, 1978, is shown the data outputted from the K-stack of FIG. 7 thereof. Table VII of this patent differs from Table III of the aforementioned patent because of (1) recoding logic 301 receives the same coefficient on lines 32-1 through 32-4, on lines 32-5 and 32-6, on lines 32-7 and 32-8 and on lines 32-9 and 32-10 because, as will be seen, recoding logic 301 responds to two bits of information for each bit which was responded to by the array multiplier of the aforementioned U.S. Patent; (2) because of the difference in time period nomenclature as was previously explained with reference to FIG. 5; and (3) because of the time delay associated with the recoding logic 301.

Figure 10A:
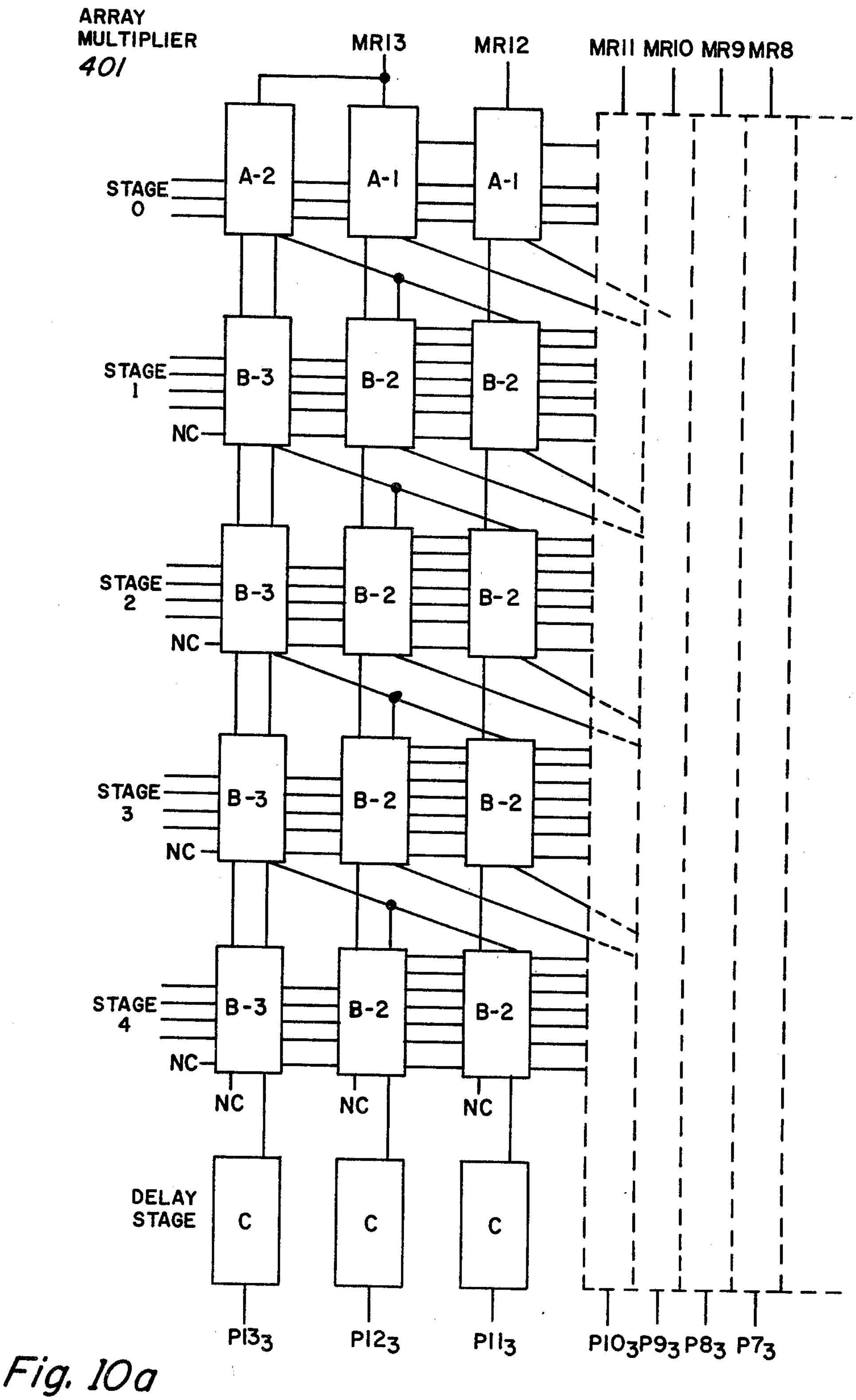
FIGS. 10*a*–10*b* form a composite logic diagram of the array multiplier.
Figure 10A:
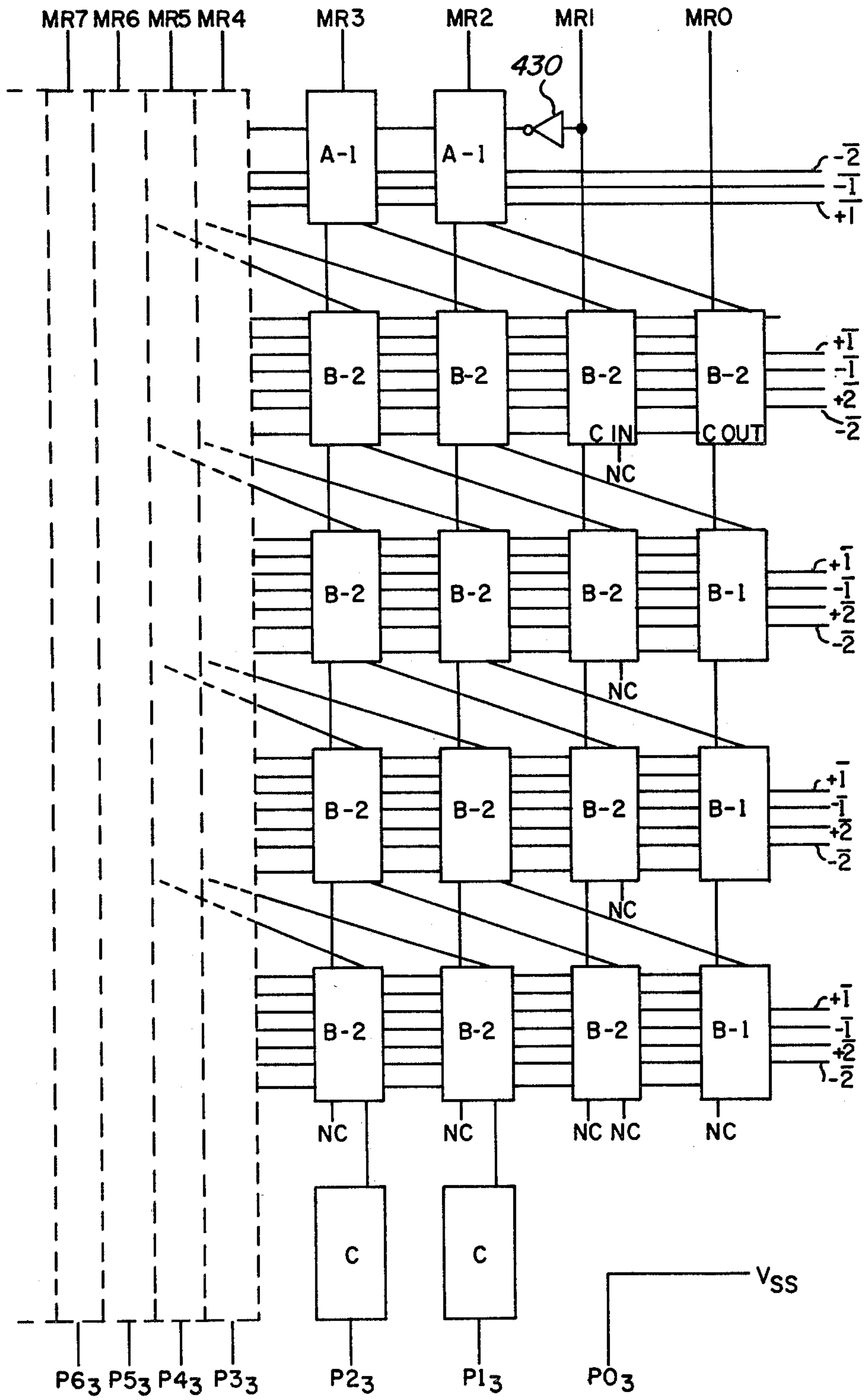
Figure 10B:
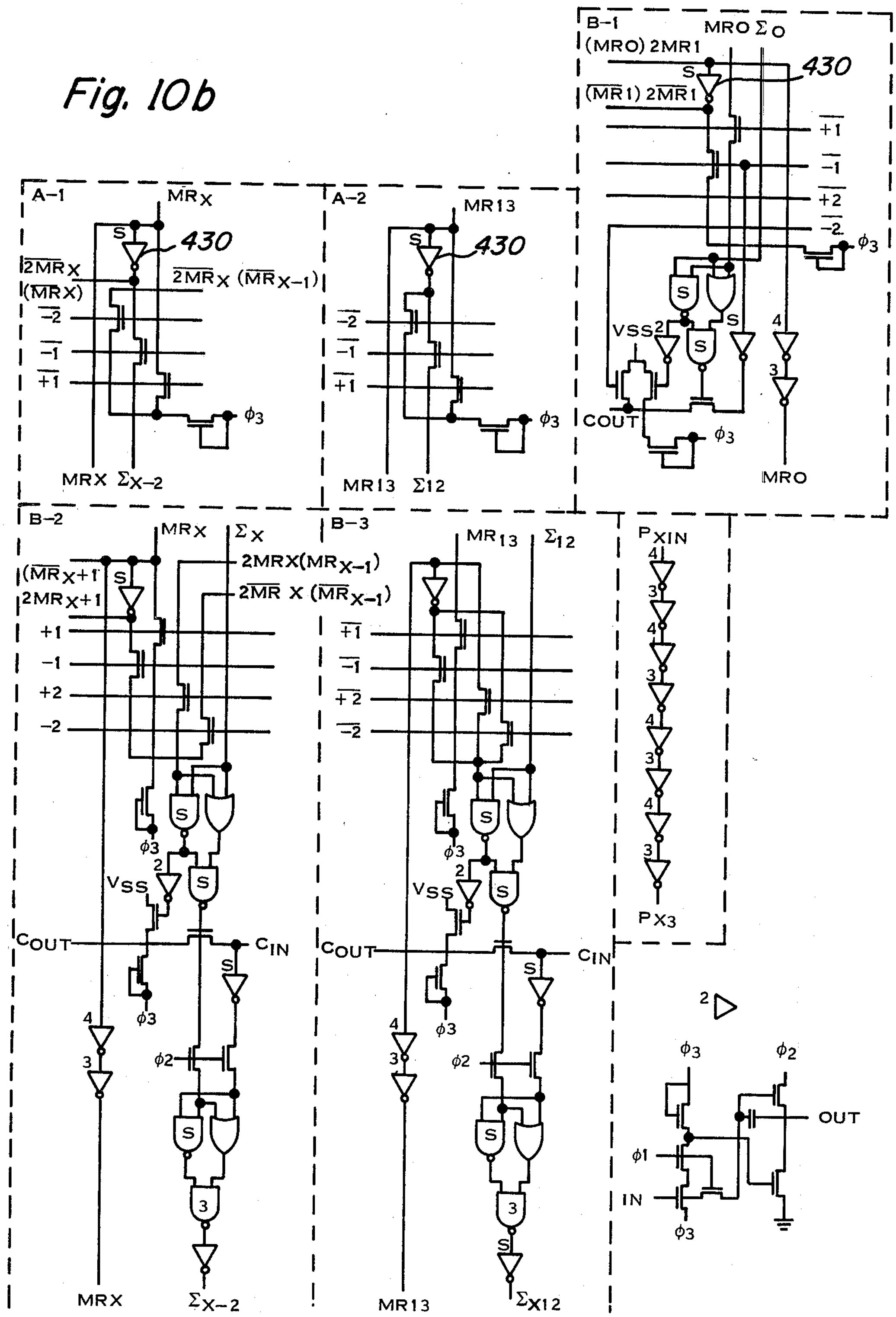

Recoding logic 301 couples K-stack 302 to array multiplier 401 (FIGS. 10*a* and 10*b*). Recording logic 301 includes four identical recoding stages 312*a–312d*, only one of which, 312*a*, is shown in detail. The first stage of the recoding logic, 313, differs from stages 312*a–312d* basically because there is, of course, no carry, such as occurs on input A in stages 312*a–312d*, from a lower order stage. Recoding logic outputs $\overline{+2}$, $\overline{-2}$, $\overline{+1}$ and $\overline{-1}$ to each stage of a five stage array multiplier 401, except for stage zero which receives only $\overline{-2}$, $\overline{+1}$ and $\overline{-1}$ outputs. Effectively recoding logic 301 permits array multiplier to process, in each stage thereof, two bits in lieu of one bit of information, using Booth's algorithm. Booth's algorithm is explained in "Theory and Application of Digital SIgnal Processing", published by Prentice-Hall 1975, at pp. 517–18.

The K10 coefficient and energy are stored in E10 loop 304. E10 loop preferably comprises a twenty stage serial shift register; ten stages 304*a* of E10 loop 304 are preferably coupled in series and another ten stages 304*b* which are also coupled in series but also have parallel outputs and inputs to K-stack 302. The appropriate parameter, either energy or the K10 coefficient, is transferred from E10 loop 304 to K-stack 302 via gates 315 which are responsive to a NOR gate 316 for transferring the energy parameter from E10 loop 304 to K-stack 302 at time period T10 and transferring coefficient K10 from E10 loop 304 to K-stack 302 at time period T20. NOR gate 306 also controls recirculation control gate 315 for inhibiting recirculation in K-stack 302 which data is being transferred.

KE10 transfer register 303 facilitates the transferring of energy or the K1–K10 speech coefficients which are stored in E10 loop 304 or K-stack 302 to adder 308 and delay circuit 309 via selector 307. Register 303 has nine stages provided by paired inverters and a tenth stage being effectively provided by selector 307 and gate 317 for facilitating the transfer of ten bits of information either from E10 loop 304 or K-stack 302. Data is transferred from K-stack 302 to register 303 via transfer gates 318 which are controlled by a Transfer K (TK) signal generated by decoder portion 511*b* of timing PLA 511 (FIGS. 7*a* and 7*b*). Since the particular parameter to be interpolated and thus shifted into register 303 depends upon the particular parameter count in which the synthesizer is operating and since the particular parameter available to be outputted from K-stack 302 is a function of particular time period the synthesizer is operating in, the TK signal comes up at T9 for the pitch parameter, T8 for the K1 parameter, T7 for the K2 parameter and so forth, as is shown in FIGS. 7*a* and 7*b*. The energy parameter or the K10 coefficient is clocked out of E10 loop 304 into register 303 via gates 319 in response to a TE10 signal generated by a timing PLA 511. After each interpolation, that is during the B cycle, data is transferred from register 303 into (1) K-stack 302 via gates 318 under control of signal TK, at which time recirculation gates 314 are turned off by gate 315, or (2) E10 loop 304 via gates 319.

A ten bit pitch parameter is stored in a pitch register 305 which includes a nine stage shift register as well as recirculation elements 305*a* which provide another bit of storage. The pitch parameter normally recirculates in register 305 via gate 305*a* except when a newly interpolated pitch parameter is being provided on line 320, as controlled by pitch interpolation control logics 306. The output of pitch 305 (PT0) or the output from register 303 is applied by selector 307 to gate 317. Selector 307 is also controlled by logics 306 for normally coupling the output of register 303 to gate 317 except when the pitch is to be interpolated. Logics 306 are responsive for outputting pitch to adder 308 and delay 309 during the A cycle of PC=1 and for returning the interpolated pitch value on line 320 on the B cycle of PC=1 to register 305. Gate 317 is responsive to a latch 321 for only providing pitch, energy or coefficient information to adder 308 and delay circuit 309 during the interpolation. Since the data is serially clocked, the information may be started to be clocked during an A portion and PC0 may switch to a logical one sometime during the transferring of the information from register 303 or 305 to adder 308 or delay circuit 309, and therefore, gate 317 is controlled by an A cycle latch 321, which latch is set with PC0 at the time a transfer coefficient (TK) transfer E10 (TE10) or transfer pitch (TP) signal is generated by timing PLA 511.

The output of gate 317 is applied to adder 308 and delay circuit 309. The delay in delay circuit 309 depends on the state of DIV1–DIV8 signals generated by interpolation counter 515 (FIGS. 7*a* and 7*b*). Since the data exits gate 317 least significant bit first, by delaying the data in delay circuit 309 a selective amount, and applying the output to adder 310 along with the output of subtractor 308, the more delay there is in circuit 309, the smaller the effective magnitude of the difference from subtractor 308 which is subsequently added back in by adder 310. Delay circuit 311 couples adder 310 back into register 303 and 305. Both delay circuits 309 and 303 can insert up to three bits of delay and when adder 309 is at its maximum delay 311 is at its minimum delay and visa-versa. A NAND gate 322 couples the output of subtractor 308 to the input of adder 310. Gate 322 is responsive to the output of an OR gate 323 which is in turn responsive to INHIBIT from inverted 236 (FIGS. 8*a–c*). Gates 322 and 323 act to zero the output from subtractor 308 when the INHIBIT signal comes up unless the interpolation counter is at IC0 in which case the present values in K-stack 302, E10 loop 304 and P register 305 are fully interpolated to their new target values in a one step interpolation. When an unvoiced frame (FIG. 6) is supplied to the speech synthesis chip, coefficients K5–K10 are set to zero by the action of gate 324 which couples delay circuit 311 to shift register 325 whose output is then coupled to gates 305*a* and 303'. Gate 324 is responsive to the zero parameter (ZPAR) signal generated by gate 237 (FIGS. 8*a–c*).

Gate 326 disables shifting in the 304*b* portion of E10 loop 304 when a newly interpolated value of energy or K10 is being inputted into portion 304*b* from register 303. Gate 327 controls the transfer gates coupling the stages of register 303, which stages are inhibited from serially shifting data therebetween when TK or TE10 goes high during the A cycle, that is, when register 303 is to be receiving data from either K-stack 302 or E10 loop 304 as controlled by transfer gates 318 or 319, respectively. The output of gates 327 is also connected to various stages of shift register 325 and to a gate coupling 303' with register 303. Whereby up top the three bits which may trail the ten most significant bits after an interpolation operation may be zeroed.

Array Multiplier Logic Diagram

FIGS. 10*a* and 10*b* form a composite logic diagram of array multiplier 401. Array multipliers are sometimes referred to as Pipeline Multipliers. For example, see "Pipeline Multiplier" by Granville E. Ott, published by the University of Missouri.

Array multiplier 401 has five stages, stage 0 through stage 4, and a delay stage. The delay stage is used in array multiplier 41 to give it the same equivalent delay as the array multiplier shown in U.S. Patent Application Ser. No. 807,461, since abandoned and continued in U.S. patent application Ser. No. 905,328, filed May 12, 1978. The input to array multiplier 401 is provided by signals $MR_0$–$MR_{13}$, from multiplier multiplexer 405. $MR_{13}$ is the most significant bit while $MR_0$ is the least significant bit. Another input to array multiplier are the aforementioned +2, −2, +1 and −1 outputs from recording logic 301 (FIGS. 8*a–c*). The output from array multiplier 401, $P_{13}$–$P_0$, is applied to summer multiplexer 402. The least significant bit thereof, P0, is in this embodiment always made a logical one because doing so establishes the mean of the truncation error as zero instead of $-\frac{1}{2}$ LSB which value would result from a simple truncation of a two's complement number.

Array multiplier 401 is shown by a plurality of box elements labeled A-1, A-2, B-1, B-2, B-3 or B-C. The specific logic elements making up these box elements are shown on the right-hand side of composite FIGS. 10*a*–10*b* in lieu of repetitively showing these elements and making up a logic diagram of FIG. 401, for simplicity sake. The A-1 and A-2 block elements make up stage zero of the array multiplier and thus are each responsive to the $\overline{-2}$, $\overline{+1}$ and $\overline{-1}$ signals outputted from decoder 313 and are further responsive to MR2–MR13. When multiplies occur in array multiplier 401, the most significant bit is always maintained in the left most column elements while the partial sums are continuously shifted toward the right. Inasmuch as each stage of array multiplier 401 operates on two binary bits, the partial sums, labeled Σn, are shifted to the right two places. Thus no A type blocks are provided for the MR0 and MR1 data inputs to the first stage. Also, since each block in array multiplier 401 is responsive to two bits of information from K-stack 302 received via recording logic 301, each block is also responsive to two bits from multiplier multiplexer 405, which bits are inverted by inverters 430, which bits are also supplied in true logic to the B type blocks.

Filter and Excitation Generator Logic Diagram

Figure 11A:
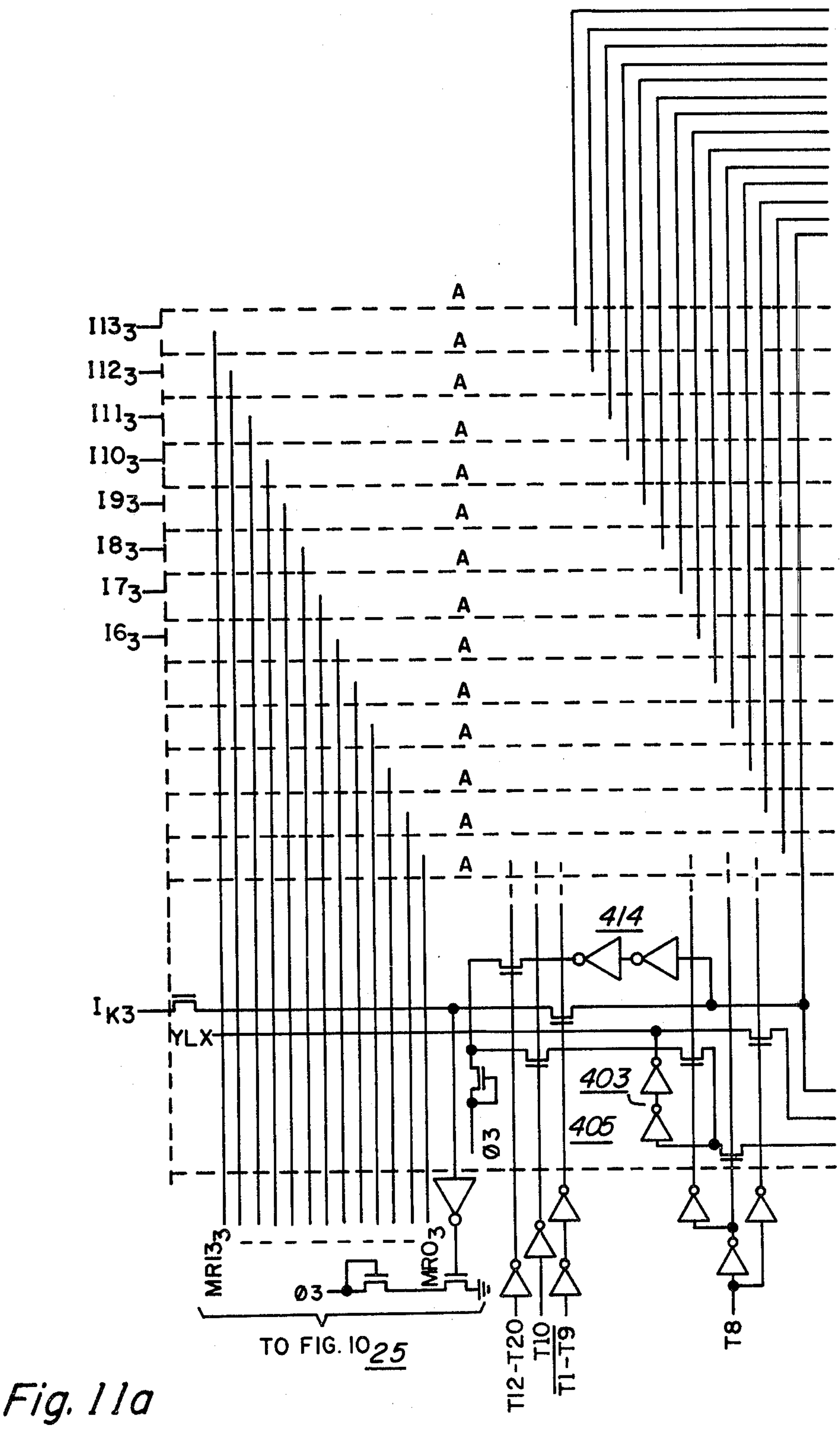
FIGS. 11*a* and 11*b* form a composite logic diagram of the speech synthesizer's lattice filter and excitation generator.
Figure 11A:
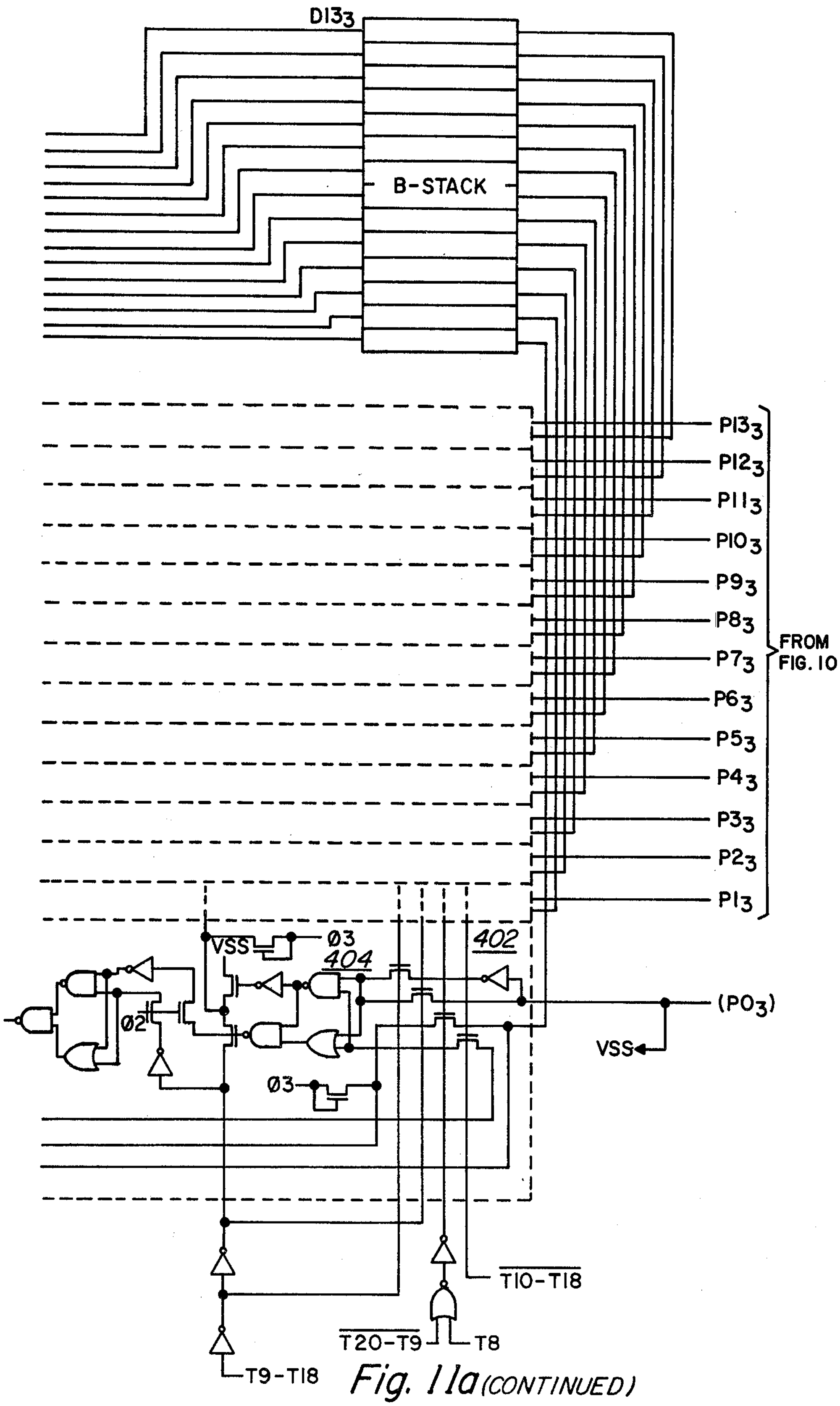
Figure 11B:
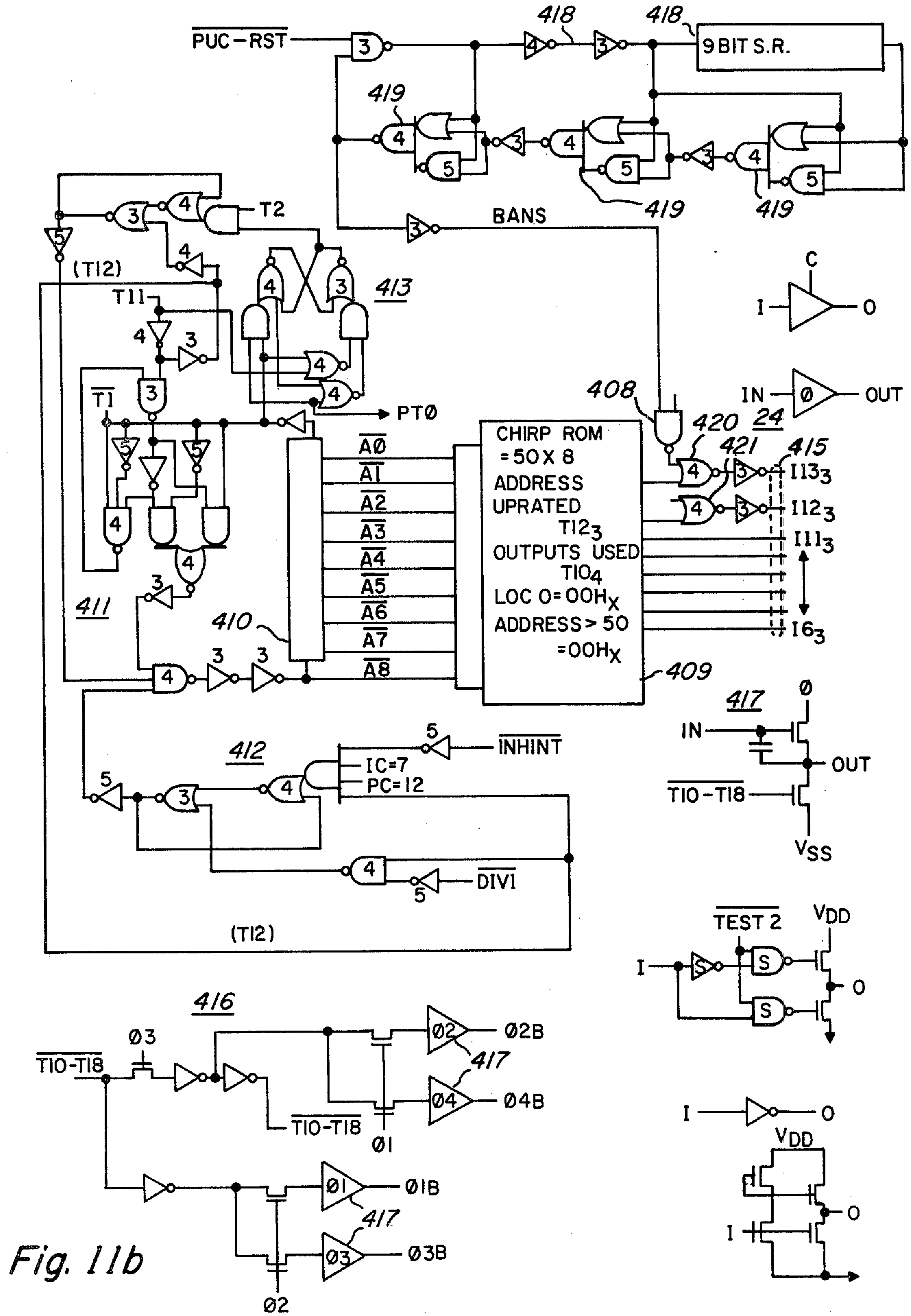
Figure 11B:
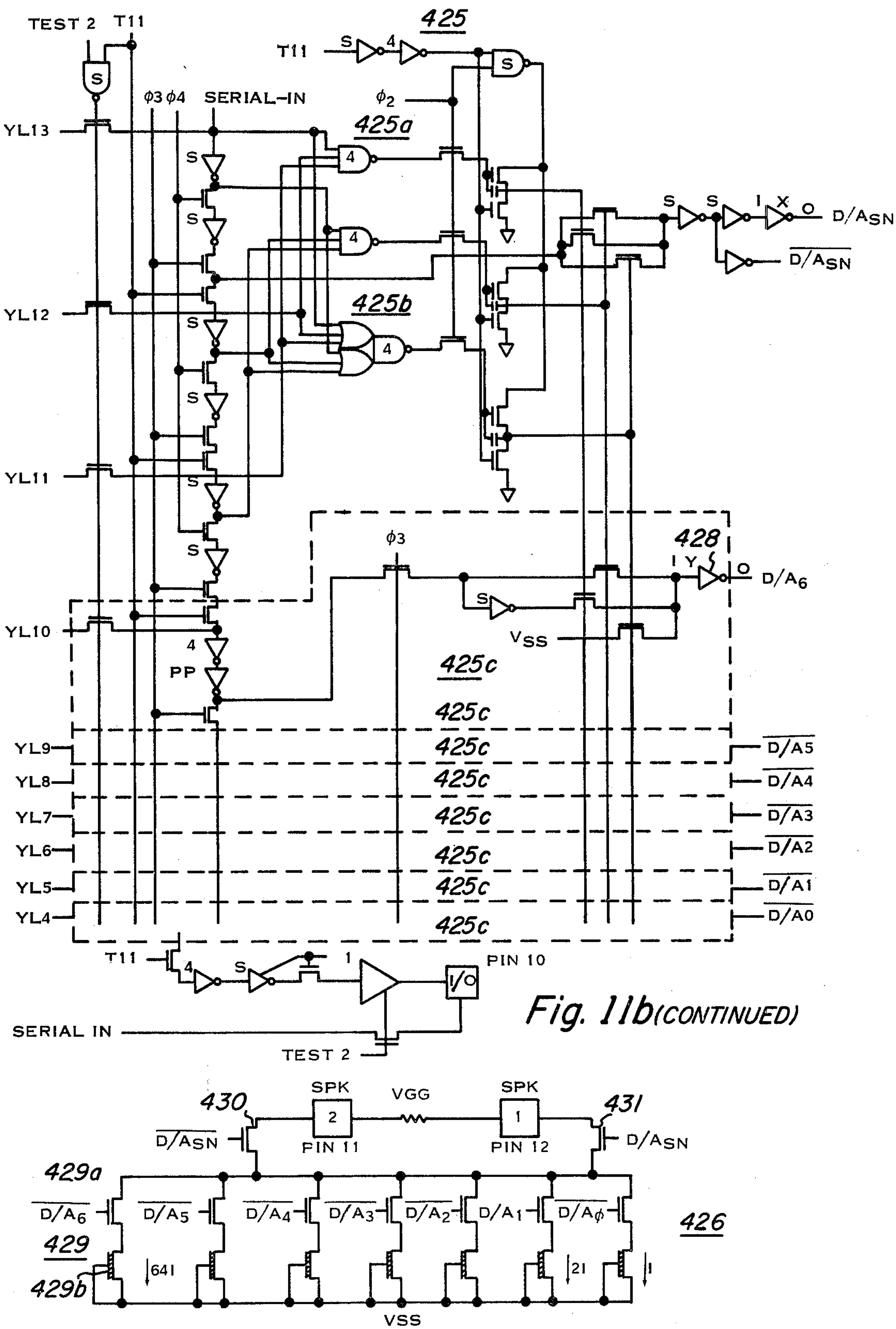

FIGS. 11*a*–11*b* form a composite, detailed logic diagram of lattice filter and excitation generator 24 (other than array multiplier 401) and output section 25. In filter and excitation generator 24 is a summer 404 which is connected to receive at one input thereof either the true or inverted output of array multiplier 401 (see FIGS. 10*a* and 10*b*) on lines P0–P13 via summer multiplexer 402. The other input of adder 404 is connected via summer multiplexer 402 to receive either the output of adder 404 (atT10–T18), the output of delay stack 406 on lines 440–453 at T20–T7 and T9), the output of Y-latch 403 (at T8) or a logical zero from Φ3 precharge gate 420 (at T19 when no conditional discharge is applied to this input). The reasons these signals are applied at these times can be seen from FIG. 8 of the aforementioned U.S. patent application Ser. No. 807,461, since abandoned and continued in U.S. patent application Ser. No. 905,328, filed May 12, 1978; it is to be remembered of coures, that the time period designations differs as discussed with reference to FIG. 5 hereof.

The output of adder 404 is applied to delay stack 406, multiplier multiplexer 405, one period delay gates 414 and summer multiplexer 402. Multiplier multiplexer 405 includes a one period delay gates 414 which are generally equivalent to one period delay 34' of FIG. 7 in U.S. patent application Ser. No. 807,461, since abandoned and continued in U.S. patent application Ser. No. 905,328, filed May 12, 1978. Y-latch 403 is connected to receive the output of delay stack 406. Multiplier multiplexer 405 selectively applies the output from Y-latch 403, one period delay gates 414, or the excitation signal on bus 415 to the input MR0–MR13 of array multiplier 401. The inputs D0–D13 to delay stack 406 are derived from the outputs of adders 404. The logics for summer multiplier 402, adder 404, Y-latch 403, multiplier multiplexer 405 and one period delay circuit 414 are only shown in detail for the least significant bit as enclosed by dotted line reference A. The thirteen most significant bits in the lattice filter also are provided by logics such as those enclosed by the reference A line, which logics are denoted by long rectangular phantom line boxes labeled "A". The logics for each parallel bit being processed in the lattice filter are not shown in detail for sake of clarity. The portions of the lattice filter handling bits more significant than the least significant bit differ from the logic shown for elements 402, 403, 404, 405, and 414 only with respect to the interconnections made with truncation logics 501 and bus 415 which connects to UV gate 408 and chirp ROM 409. In this respect, the output from UV gate 408 and chirp ROM 409 is only applied to inputs I13–I6 and therefore the input labeled $I_x$ within the reference A phantom line is not needed for the six least significant bits in the lattice filter. Similarly, the output from the Y-latch 403 is only applied for the ten most significant bits, $YL_{13}$ through $YL_4$, and therefore the connection labeled YLx within the reference line is not required for the four least significant bits in the lattice filter.

Delay stack 406 comprises 14 nine bit long shift registers, each stage of which comprise inverters clocked on Φ4 and Φ3 clocks. As is discussed is U.S. patent application Ser. No. 807,461, since abandoned and continued in U.S. patent application Ser. No. 905,328, filed May 12, 1978, the delay stack 406 which generally corresponds to shift register 35' of FIG. 7 of the aforementioned patent, is only shifted on certain time periods. This is accomplished by logics 416 whereby Φ1B–Φ4B clocks are generated from T10–T18 timing signal from PLA 512 (FIGS. *7a* and *7b*). The clock buffers 417 in circuit 416 are also shown in detail in FIGS. 11*a* and 11*b*.

Delay stack 406 is nine bits long whereas shift register 35' in FIG. 7 of U.S. patent application Ser. No. 807,461, since abandoned and continued in U.S. patent application Ser. No. 905,328, filed May 12, 1978, was eight bits long; this difference occurs because the input to delay stack 406 is shown as being connected from the output of adder 404 as opposed to the output of one period delay circuit 414. Of course, the input to delay stack 406 could be connected from the outputs of one period delay circuit 414 and the timing associated therewith modified to corespond with that shown in U.S. patent application Ser. No. 807,461, since abandoned and continued in U.S. patent application Ser. No. 905,328, filed May 12, 1978.

The data handled in delay stack 406, array multiplier 401, adder 402, summer multiplexer 402, Y-latch 403, and multiplier multiplexer 405 is preferably handled in two's complement notation.

Unvoiced generator 407 is a random noise generator comprising a shift register 418 with a feedback term supplied by feedback logics 419 for generating pseudorandom terms in shift register 418. An output is taken therefrom and is applied to UV gate 408 which is also responsive to OLDP from latch 208*d* (FIGS. 8*a* and 8*b*). Old pitch latch 208*d* controls gate 408 because pitch=0 latch 208*b* changes state immediately when the new speech parameters are inputted to register 205. However, since this occurs during interpolation count IC0 and since, during an unvoiced condition the new values are not interpolated into K-stack 302, E10 loop 304 and pitch register 305 until the following ICO, the speech excitation value cannot change from a periodic excitation from chirp ROM 409 to a random excitation from unvoiced generator 407 until eight interpolation cycles have occurred. Gate 420 nors the output of gate 408 into the most significant bit of the excitation signal, $I_{13}$, thereby effectively causing the sign bit to randomly change during unvoiced speech. Gate 421 effectively forces the most significant bit of the excitation signal, $I_{12}$, to a logical one during unvoiced speech conditions. Thus the combined effect of gates 408, 420 and 421 is to cause a randomly changing sign to be associated with a steady decimal equivalent value of 0.5 to be applied to the lattice filter and Filtering Excitation Generator 24.

Figure 14A:
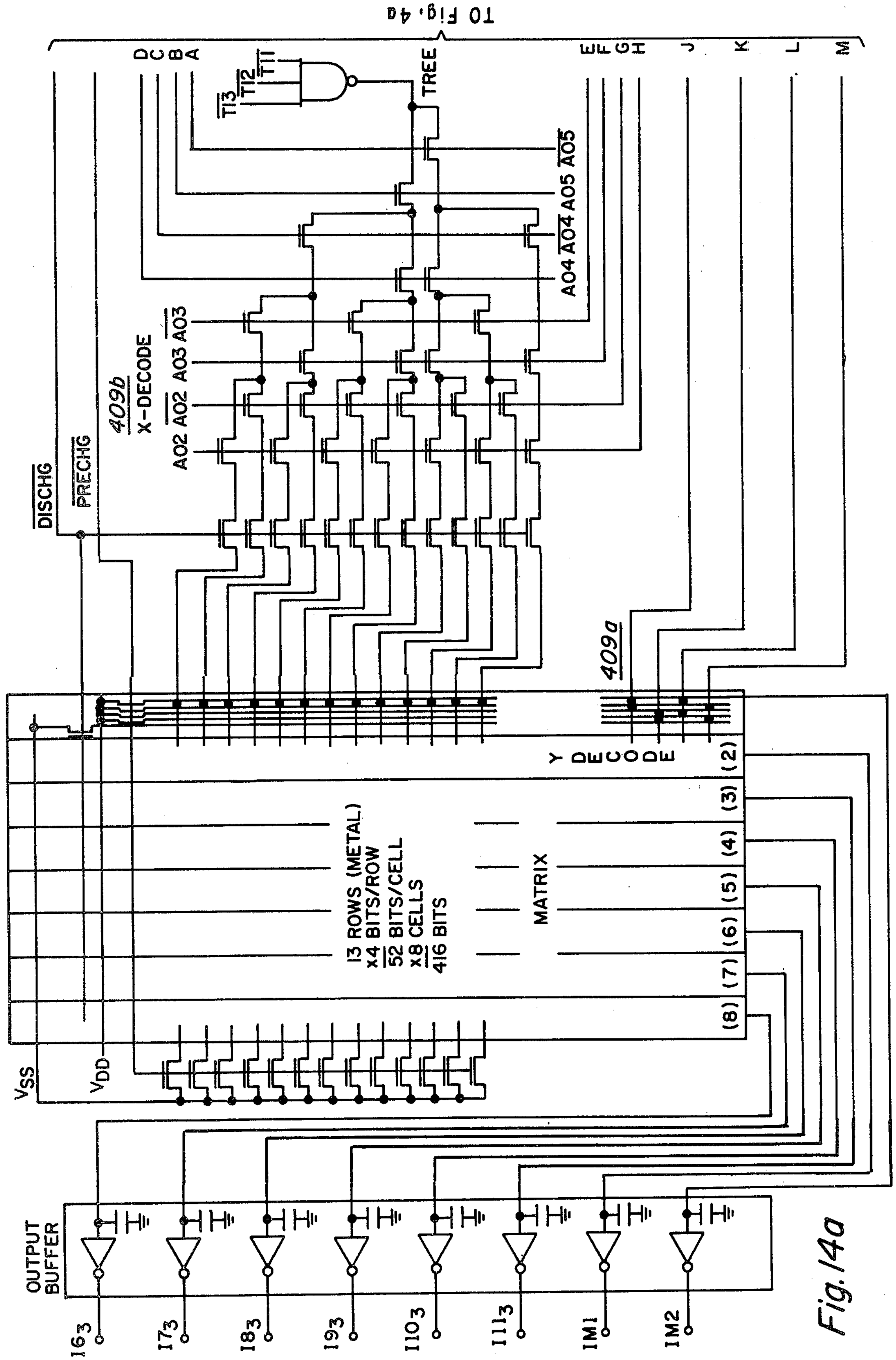
FIGS. 14*a*–14*b* form a composite diagram of the chirp ROM.
Figure 14B:
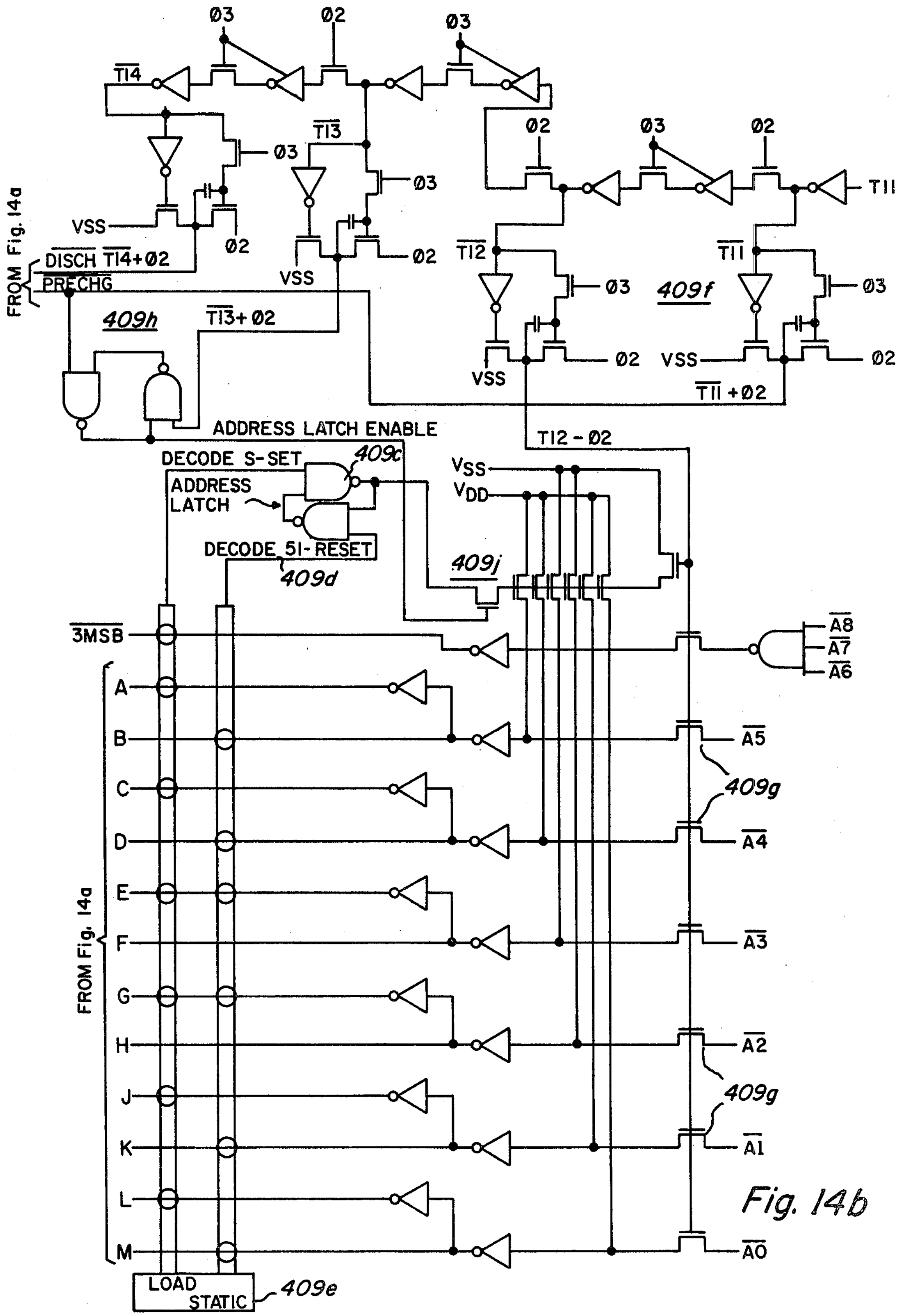

During voiced speech, chirp ROM 409 provides an eight bit output on lines $I_6$–$I_{13}$ to the lattice filter. This output comprises forty-one successively changing values which, when graphed, represent a chirp function. The contents of ROM 409 are listed in Table VIII; ROM 404 is set up to invert its outputs and thus the data is stored therein in complemented format. The chirp function value and the complemented value stored in the chirp ROM are expressed in two's complement hexadecimal notation. ROM 409 is addressed by an eight bit register 410 whose contents are normally updated during each cycle through the lattice filter by add one circuit 411. The output of register 410 is compared with the contents of pitch register 305 in a magnitude comparitor 403 for zeroing the contents of 410 when the contents of register 410 become equal to or greater than the contents of register 305. ROM 409, which is shown in greater detail in FIGS. 14*a*–14*b*, is arranged so that addresses greater than 110010 cause all zeroes to be outputted on lines $I_{13}$–$I_6$ to multiplier multiplexer 405. Zeros are also stored in address locations 41–51. Thus, the chirp may be expanded to occupy up to address location fifty, if desired.

Random Access Memory Logic Diagram

Figures 12A, 12B:
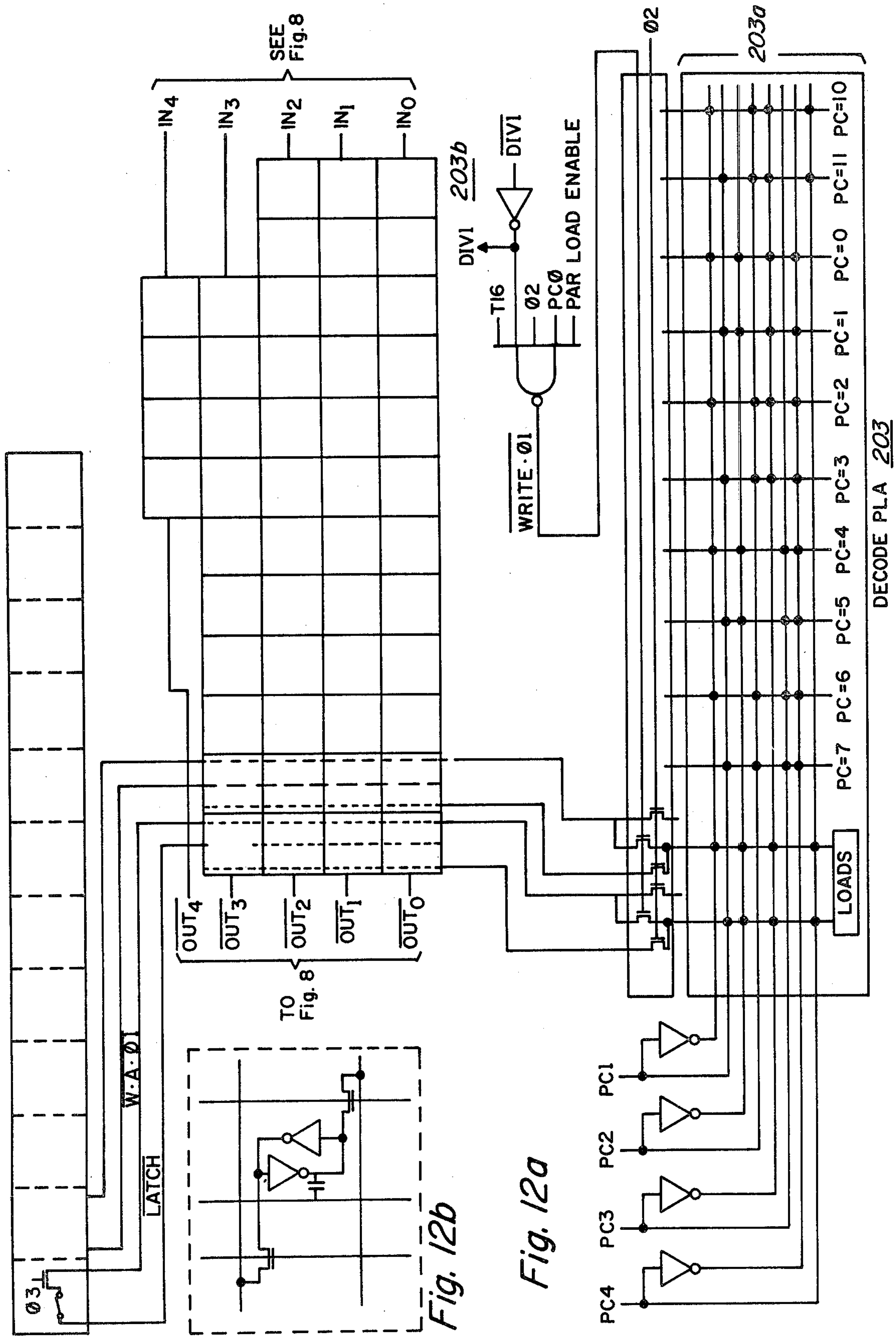
FIGS. 12*a* and 12*b* are schematic diagrams of the parameter RAM.

Referring now to FIGS. 12*a*–12*b*, there is shown a composite detailed logic diagram of RAM 203. RAM 203 is addressed by address on RC1–PC4, which address is decoded in a PLA 203*a* and defines which coded parameter is to be inputted into RAM 203. RAM 203 stores the twelve decoded parameters, the parameters having bit lengths varing between three bits and five bits according to the decoding scheme described with reference to FIG. 6. Each cell, reference B, of RAM 203 is shown in greater detail in FIG. 12*b*. Read/-Write control logic 203*b* is responsive to T1, DIV1, PC0 and parameter load enable for writing into the RAM 203 during the A cycle of each parameter count during interpolation count zero when enabled by parameter load enable from logics 238 (FIGS. 8*a*–*c*). Data is inputted to RAM 203 on lines IN0–IN4 from register 205 as shown in FIGS. 8*a* and 8*b* and data is outputted on lines OUT1–OUT5 to ROM 202 as is shown in the aforementioned figures.

Parameter Read-Only-Memory Logic Diagram

Figure 13A:
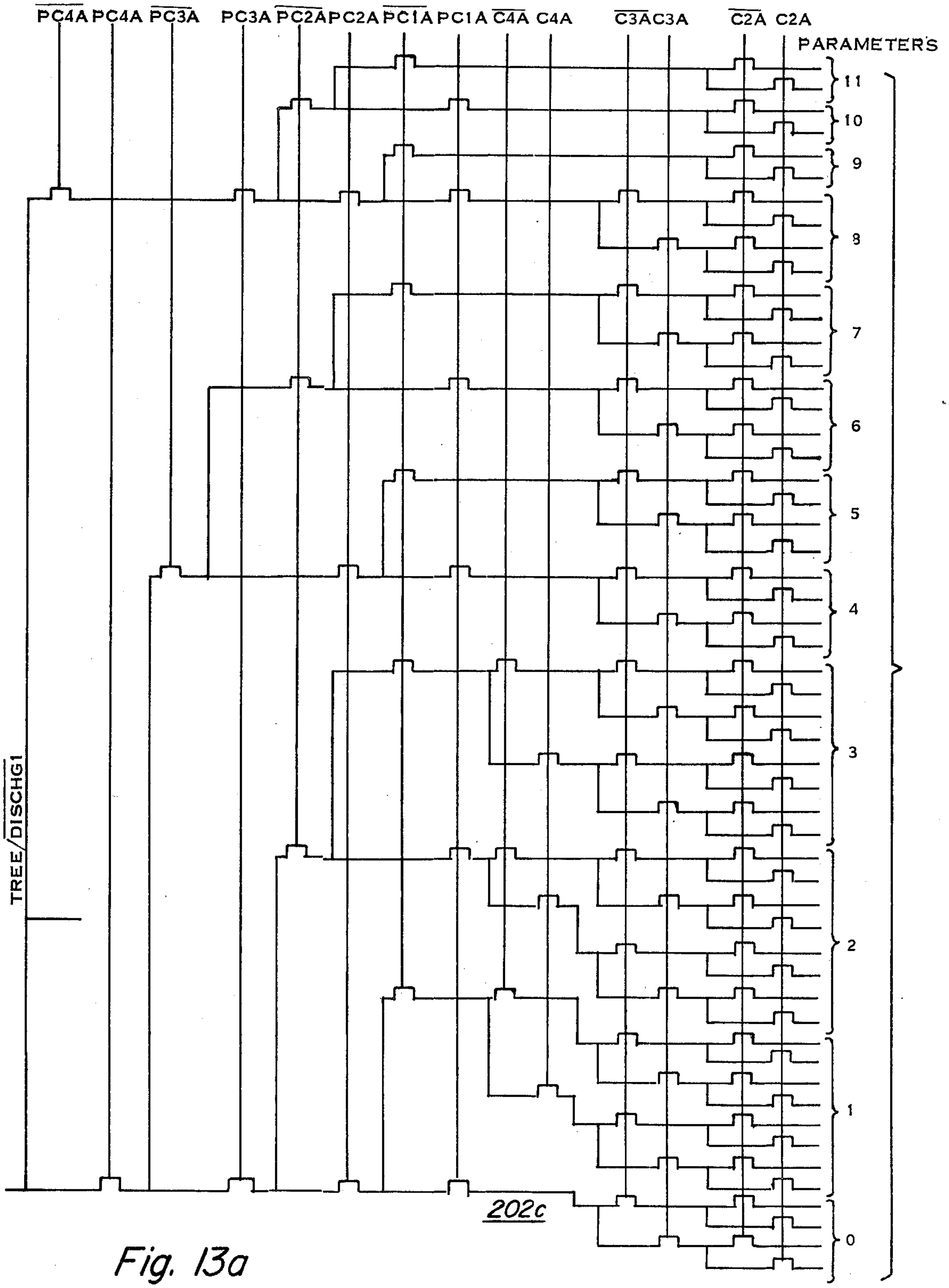
FIGS. 13*a* and 13*b* are schematic diagrams of the parameter ROM.
Figure 13B:
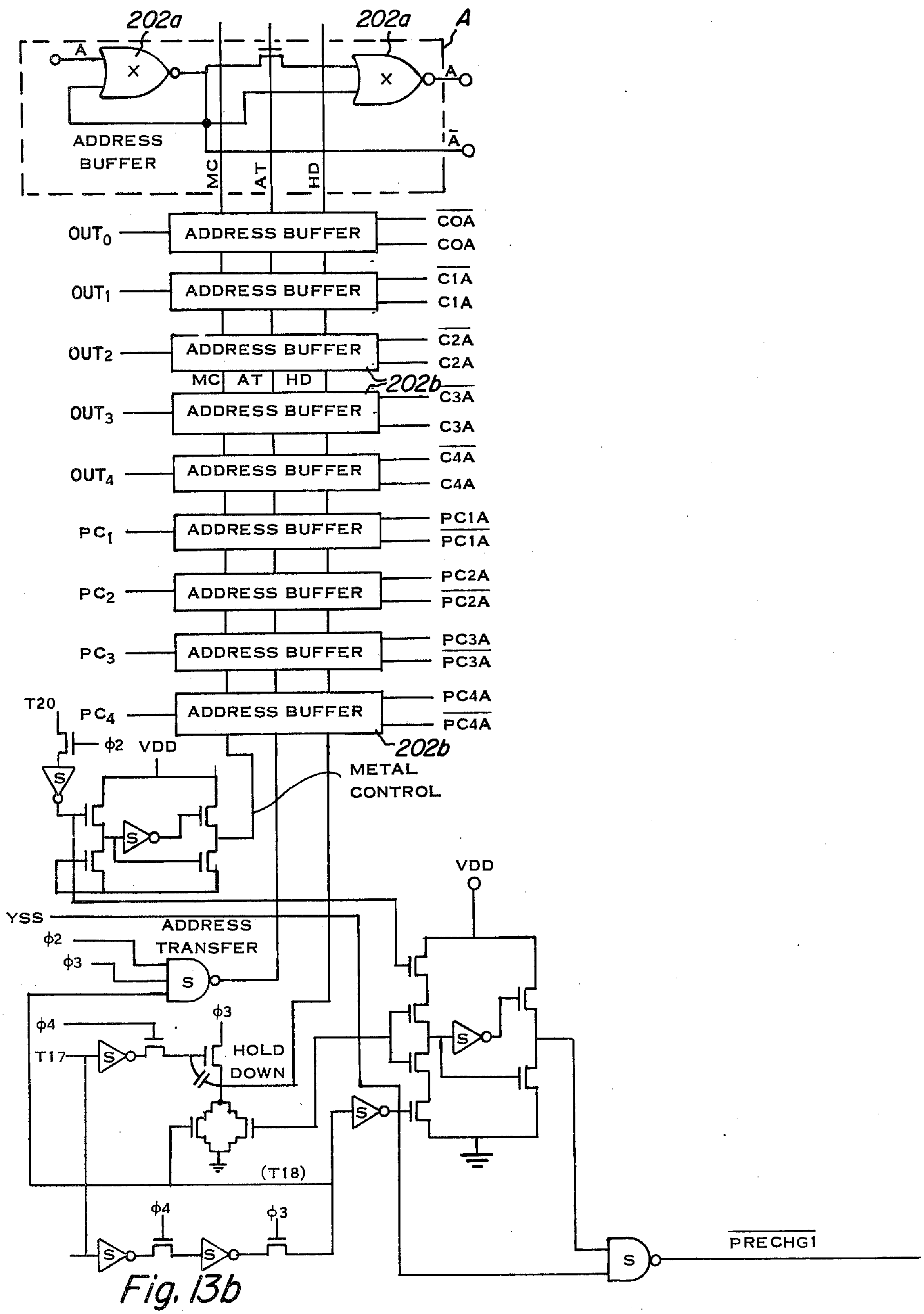

In FIGS. 13*a*–13*b*, there is shown a logic diagram of ROM 202. ROM 202 is preferably a virtual ground ROM of the type disclosed in U.S. Pat. No. 3,934,233. Address information from RAM 202 and from parameter counter 513 are applied to address buffers 202*b* which are shown in detail at reference A. The NOR gates 202*a* used in address buffers 202*b* are shown in detail at reference B. The outputs of the address buffers 202*b* are applied to an X-decoder 202*c* or to a Y-decoder 202*d*. The ROM is divided into ten sections labeled reference C, one of which is shown in greater detail. The outline for output line from each of the sections is applied to register 201 via inverters as shown in FIGS. 8*a* and 8*b*. X-decoder selects one of fifty-four X-decode lines while Y-decoder 202*d* test for the presence or nonpresence of a transistor cell between an adjacent pair of diffussion lines, as is explained in greater detail in the aforementioned U.S. Pat. No. 3,934,233. The data preferably stored in ROM 202 of this embodiment is listed in Table VI.

Chirp Read-Only-Memory Logic Diagram

FIGS. 14*a*–14*b* form a composite diagram of chirp ROM 409. ROM 409 is addressed via address lines $\overline{A_0}$–$\overline{A_8}$ from register 410 (FIGS. 11*a*–11*b*) and output information on lines $I_6$–$I_{11}$ to multiplier multiplexer 405 and lines $I_{m1}$ and $I_{m2}$ to gates 421 and 420, all which are shown in FIGS. 11*a* and 11*b*. As was previously discussed with reference to FIGS. 11a and 11b, chirp ROM outputs all zeros after a predetermined count is reached in register 410, which, in this case is the count equivalent to a decimal 51. ROM 409 includes a Y-decoder 409a which is responsive to the address on lines $\overline{A_0}$ and $\overline{A_1}$ (and $A_0$ and $A_1$) in an X-decoder 409b which is responsive to the address on lines $\overline{A_2}$ through $\overline{A_5}$ (and $A_2$–$A_5$).

ROM 409 also includes a latch 409c which is set when decimal 51 is detected on lines $\overline{A_0}$–$\overline{A_5}$ according to line 409c from a decoder 409e. Decoder 409e also decodes a logical zero on lines $\overline{A_0}$–$\overline{A_8}$ for resetting latch 409c. ROM 409 includes timing logics 409f which permit data to be clocked in via gates 409g at time period T12. At this time decoder 409e checks to determine whether either a decimal 0 or decimal 51 is occurring on address lines $\overline{A_0}$–$\overline{A_8}$. If either condition occur, latch 409c, which is a static latch, is caused to flip.

An address latch 409h is set at time period T13 and reset at time period T11. Latch 409h permits latch 409c to force a decimal 51 onto lines $\overline{A_0}$–$\overline{A_5}$ when latch 409c is set. Thus, for addresses greater than 51 address register 410, the address is first sampled at time period T12 to determine whether it has been reset to zero by reset logic 412 (FIGS. 12a–12b) for the purpose of resetting latch 409c and if the address has not been reset to zero then whatever address has been inputted on lines $\overline{A_0}$–$\overline{A_8}$ is written over by logics 409j at T13. Of course, at location 51 in ROM 409 will be stored all zeros on the output lines I6-I11, IM1 and IM2. Thus by the means of logics 409c, 409h and 409j addresses of a preselected value, in this case a decimal 51, are merely tested to determine whether a reset has occurred but are not permitted to address the array of ROM cells via decoders 409a and 409b. Addresses between a cecimal 0 and 50 address the ROM normally via decoders 409a and 409b. The ROM matrix is preferably of the virtual ground type described in U.S. Pat. No. 3,934,233. As aforementioned, the contents of ROM 409 are listed in Table VIII. The chirp function is located at addresses 00-40 while zeros are located at addresses 41-51.

Truncation Logic and Digital-To-Analog Converter

Turning again to FIGS. 11a and 11b, the truncation logic 425 and Digital-to-Analog (D/A) converter is shown in detail. Truncation logic 425 includes circuitry for converting the two's complement data on $YL_{1-3}$–$YL_{14}$ to sign magnitude data. Logics 425a test the MSB from Y-latch 403 on line $YL_{13}$ for the purpose of generating a sign bit and for controlling the two's complement to sign magnitude conversion accomplished by logics 425c. The sign bit is supplied in true and false logic on lines D/ASn and D/ASn to D/A converter 426.

Logics 425c convert the two's complement data from Y-latches 403 in lines $YL_{10}$–$YL_4$ to simple magnitude notation on lines $D/A_6$–$D/A_0$. Only the logics 425c associated with YL10 are shown in detail for sake of simplicity.

Logics 425b sample the $YL_{12}$ and $YL_{11}$ bits from the Y-latches 403 and perform a magnitude truncation function thereon by forcing outputs $D/A_6$ through $D/A_0$ to a logical zero (i.e., a value of one if the outputs were in true logic) wherever either $YL_{12}$ or $YL_{11}$ is a logical one and $YL_{13}$ is a logical zero, indicating that the value is positive or either $YL_{12}$ or $YL_{11}$ is a logical zero and $YL_{13}$ is a logical one, indicating that the value is negative (and complemented, of course). Whenever one of these conditions occurs, a logical zero appears on line 427 and Vss is thereby coupled to the output buffer 428 in each of logics 425c. The magnitude function effectively truncates the more significant bits on $YL_{11}$ and $YL_{12}$. It is realized that this is somewhat unorthodox truncation, since normally the less significant bits are truncated in most other circuits where truncation occurs. However, in this circuit, large positive or negative values are effectively clipped. More important digital speech information, which has smaller magnitudes, is effectively amplified by a factor of four by this truncation scheme.

Figure 23A:
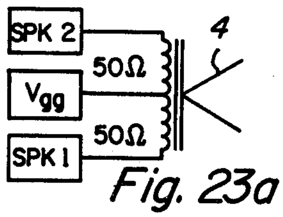
FIGS. 23a–23b depict embodiments of the voice coil connection.

The outputs $\overline{D/A_6}$–$\overline{D/A_0}$, along with $\overline{D/Asn}$ and D/Asn, are coupled to D/A converter 426. D/A converter 426 preferably has seven MOS devices 429 coupled to the seven lines $\overline{D/A_6}$ through $\overline{D/A_0}$ from truncation logics 425. Each device 429 preferably includes a MOS transistor whose gates is coupled to one of the lines $\overline{D/A_6}$–$\overline{D/A_0}$ and a series connected implanted load transistor 429b. Devices 429 are arranged, by controlling their length to width ratios, to act as current sources, the device 429 coupled to $\overline{D/A_6}$ sourcing twice as much current (when on) as the device 429 coupled to $\overline{D/A_5}$. Likewise the devices 429 coupled to $\overline{D/A_5}$ is capable of sourcing twice as much current as the device 429 coupled to $\overline{D/A_4}$. This two to one current sourcing capability similarly applies to the remaining devices 429 coupled to the remaining lines $\overline{D/A_3}$–$\overline{D/A_0}$. Thus, device 429 coupled to $\overline{D/A_1}$, is likewise capable of sourcing twice as much current as the device 429 coupled to $\overline{D/A_0}$, but only one-half of that source by the device 429 coupled to $\overline{D/A_2}$. All devices 429 are connected in parallel, one side of which are preferably coupled to Vss and the other side is preferably coupled to either side of the speaker 4 via transistors 430 and 431. Transistor 430 is controlled by $\overline{D/Asn}$ which is applied to its gates; transistor 431 is turned off and on in response to D/Asn. Thus, either transistor 430 or 431 is on depending on the state of the sign bit, D/Asn. The voice coil of speaker 4 preferably has a 100 ohm impedance and has a center tap connected to Vgg, as shown in FIG. 23a. Thus, the signals on lines $\overline{D/A_6}$–$\overline{DA_0}$ control the magnitude of current flow through the voice coil while the signals on lines D/Asn and $\overline{D/Asn}$ control the direction of that flow.

Figure 23B:
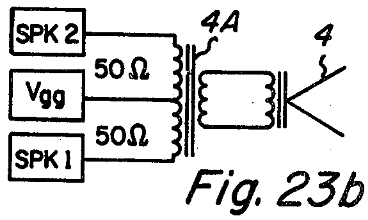

Alternatively to using a center-topped 100 ohm voice coil, a more conventional eight ohm speaker may be used along with a transformer having a 100 ohm center topped primary (connected to Vgg and transistors 430 and 431) and an eight ohm secondary (connected to the speaker's terminals), as shown in FIG. 23b.

It should now be appreciated by those skilled in the art that D/A converter 426 not only converts digital sign magnitude information on lines $\overline{D/A_6}$–$\overline{D/A_0}$ and D/Asn-$\overline{D/Asn}$ to an analog signal, but has effectively amplified this analog signal to sufficient levels to permit a speaker to be driven directly from the MOS synthesis chip 10 (or via the aforementioned transformer, if desired). Of course, those skilled in the art will appreciate that simple D/A converters, such as that disclosed here, will find use in other applications in addition to speech synthesis circuits.

THE SPEECH SYNTHESIZER CHIP

Figure 22:
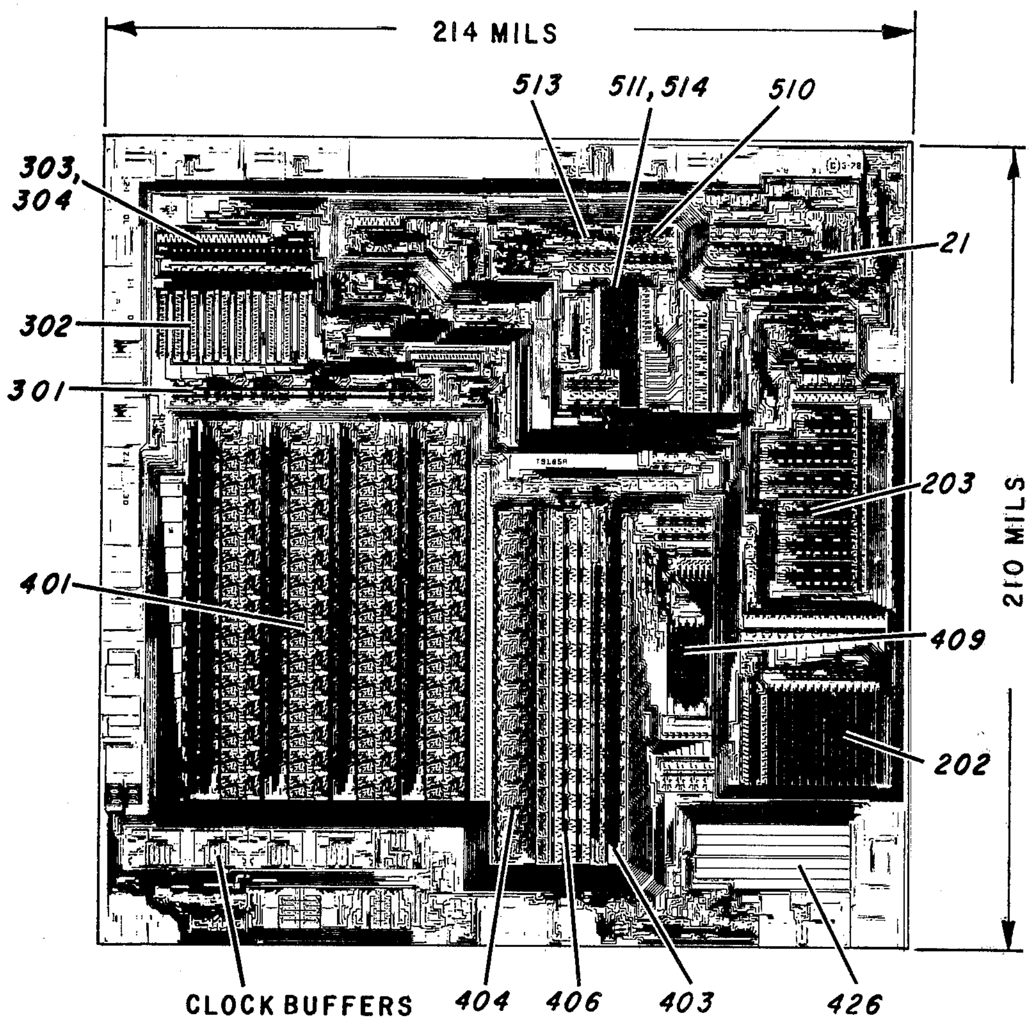
FIGS. 22 is a plan view of the synthesizer chip herein described, showing the metal mask or metal pattern, enlarged about fifty times.

In FIG. 22 a greatly enlarged plan view of a semiconductor chip which contains the entire system of FIGS. 4a and 4b is illustrated. The chip is only about two hundred fifteen mils (about 0.215 inches) on a side. In the example shown, the chip is manufactured by the P-channel metal gate process using the following design rules: metal line width 0.25 mil; metal line spacing 0.25 mil; diffusion line width 0.15 mil; and diffusion line spacing 0.30 mil. Of course, as design rules are tightened with the advent of electron beam mask production or slice writing, and other techniques, it will be possible to further reduce the size of the synthesizer chip. The size of the synthesizer chip can, of course also be reduced by not taking advantage of some of the features preferably used on the synthesizer chip.

The total active area of speech synthesizer chip 10 is approximately 45,000 square mils.

It will also be appreciated by those skilled in the art, that other MOS manufacturing techniques, such as N-channel, complementary MOS (CMOS) or silicon gate processes may alternatively be used.

The various parts of the system are labeled with the same reference numerals previously used in this description.

CONTROLLER LOGIC DIAGRAMS

The controller used in the learning aid is preferably a microprocessor of the type described in U.S. Pat. No. 4,074,355, with modifications which are subsequently described. U.S. Pat. No. 4,074,355 is hereby incorporated herein by reference. It is to be understood, of course, that other microprocessors, as well as future microprocessors, may well find use in applications such as the speaking learning aid described herein.

The microprocessor of U.S. Pat. No. 4,074,355 is an improved version of an earlier microprocessor described in U.S. Pat. No. 3,991,305. One of the improvements concerned the elimination of digit driver devices so that arrays of light emitting diodes (LED's) forming a display could be driven directly from the microprocessor. As a matter of design choice, the display used with this learning aid is preferably a vacuum fluorescent (VF) display device. Those skilled in the art will appreciate that when LED's are directly driven, the display segments are preferably sequentially actuated while the display's common character position electrodes are selectively actuated according to information in a display register or memory. When VF displays are utilized, on the other hand, the common character position electrodes are preferably sequentially actuated while the segments are selectively actuated according to information in the display register or memory. Thus, the microprocessor of U.S. Pat. No. 4,074,355 is preferably altered to utilize digit scan similar to that used in U.S. Pat. No. 3,991,305.

The microprocessor of U.S. Pat. No. 4,074,355 is a four bit processor and to process alphanumeric information, additional bits are required. By using six bits, which can represent $2^6$ or 64 unique codes, the twenty-six characters of the alphabet, ten numerals as well as several special characters can be handled with ease. In lieu of converting the microprocessor of U.S. Pat. No. 4,074,355 directly to a six bit processor, it was accomplished indirectly by software pairing the four bit words into eight bit bytes and transmitting six of those bits to the display decoder.

Referring now to FIGS. **15*a*–15*b***, which form a composite block diagram of the microprocessor preferably used in the learning aid, it should be appreciated that this block diagram generally corresponds with the block diagram of FIGS. *7a* and *7b* of U.S. Pat. No. 4,074,355; several modifications to provide the aforementioned features of six bit operation and VF display compatability are also shown. The numbering shown in FIGS. **15*a* and 15*b*** generally agrees with that of U.S. Patent 4,074,355. The modifications will now be described in detail.

Figure 13B:
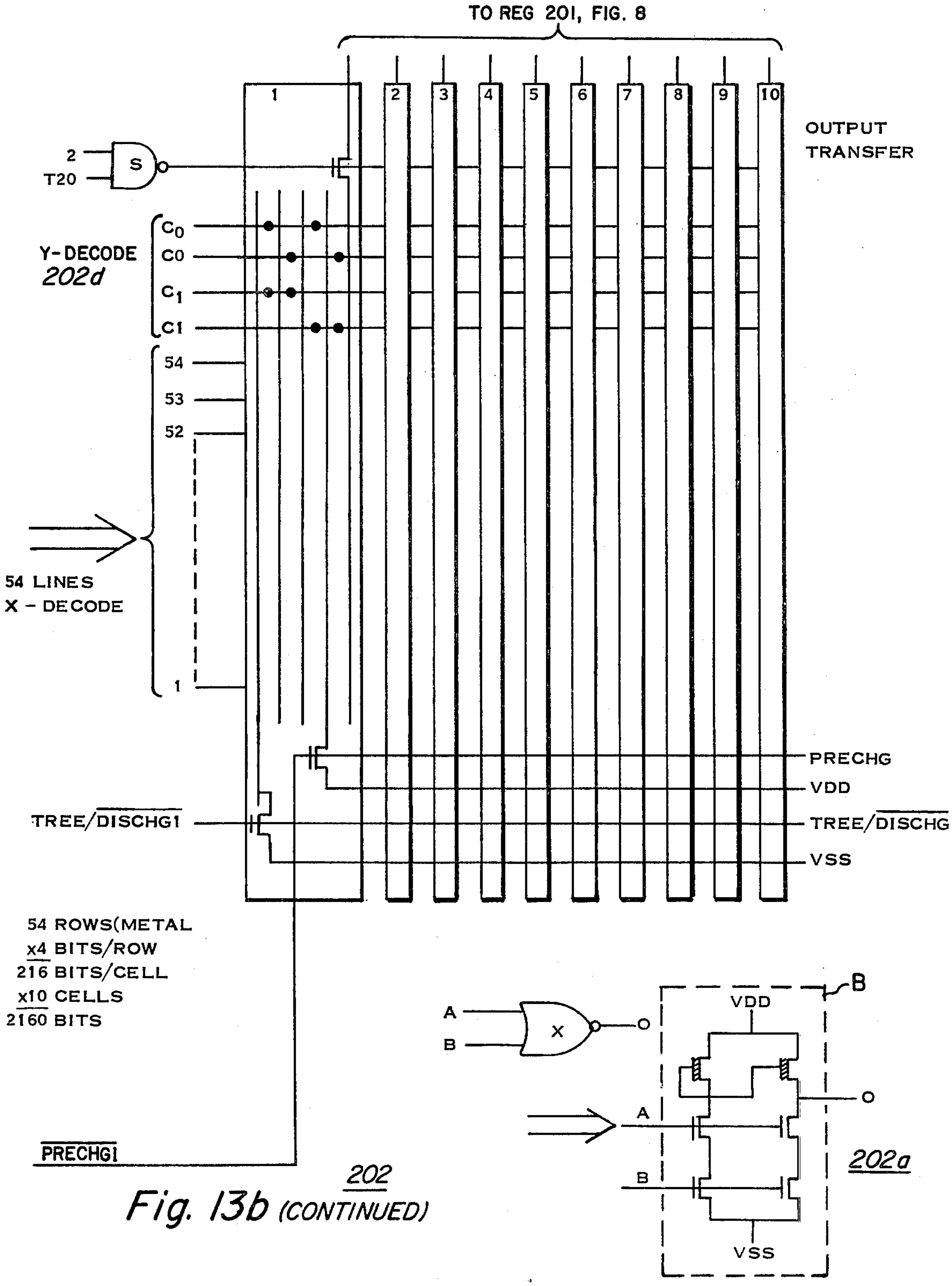
Figure 16A:
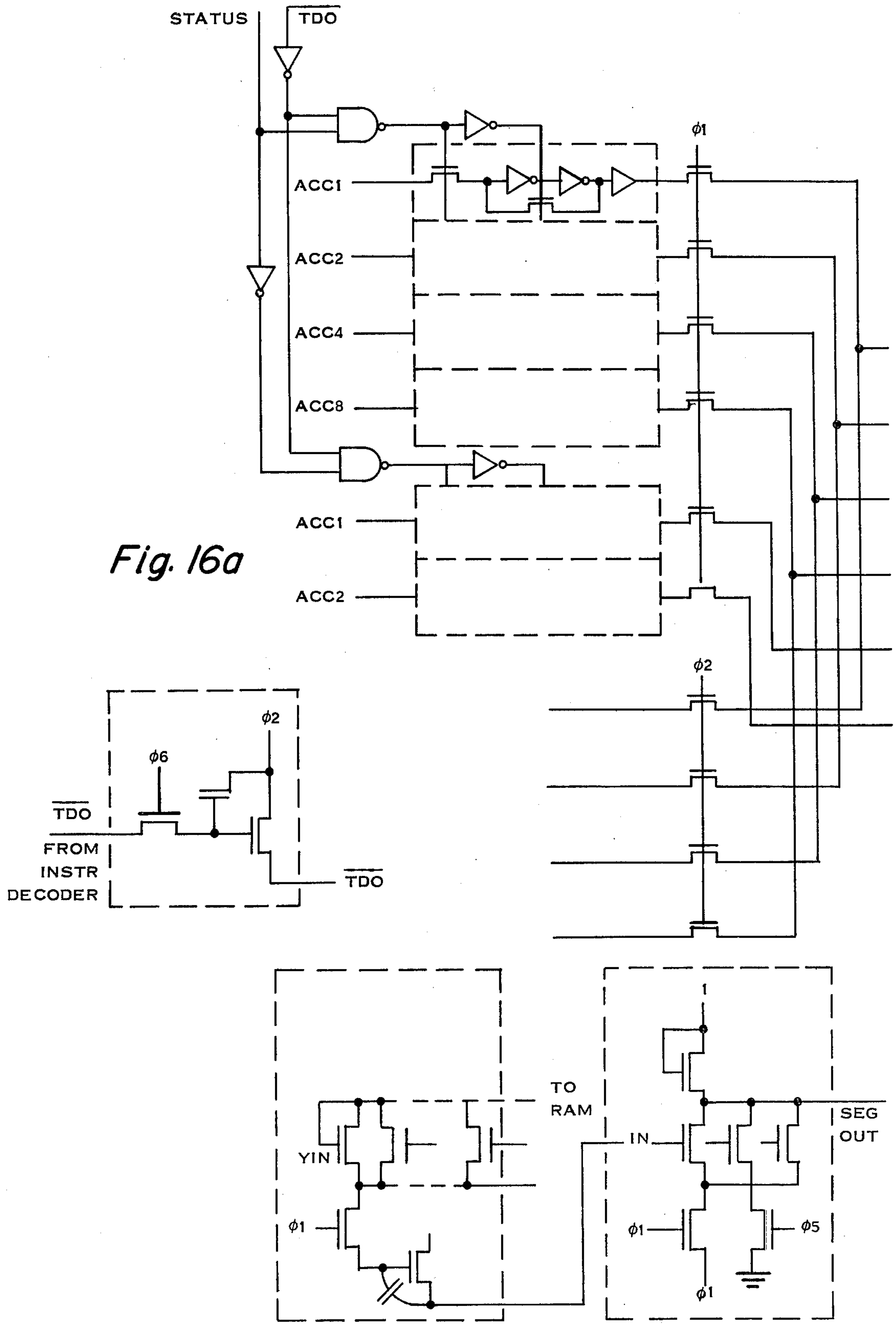
FIGS. 16a and 16b form a composite logic diagram of the segment decoder of the microprocessor.
Figure 16B:
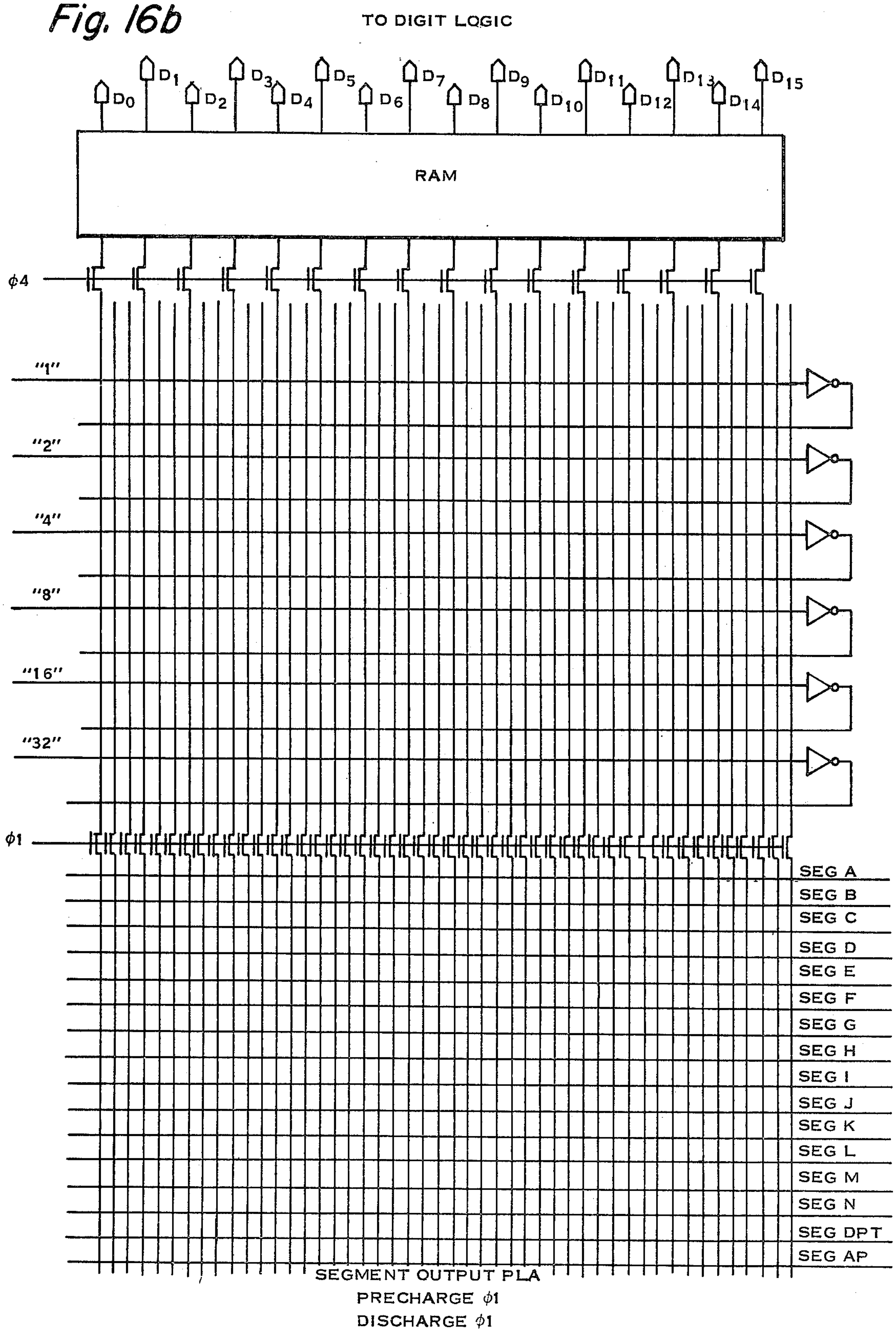
Figure 16B:
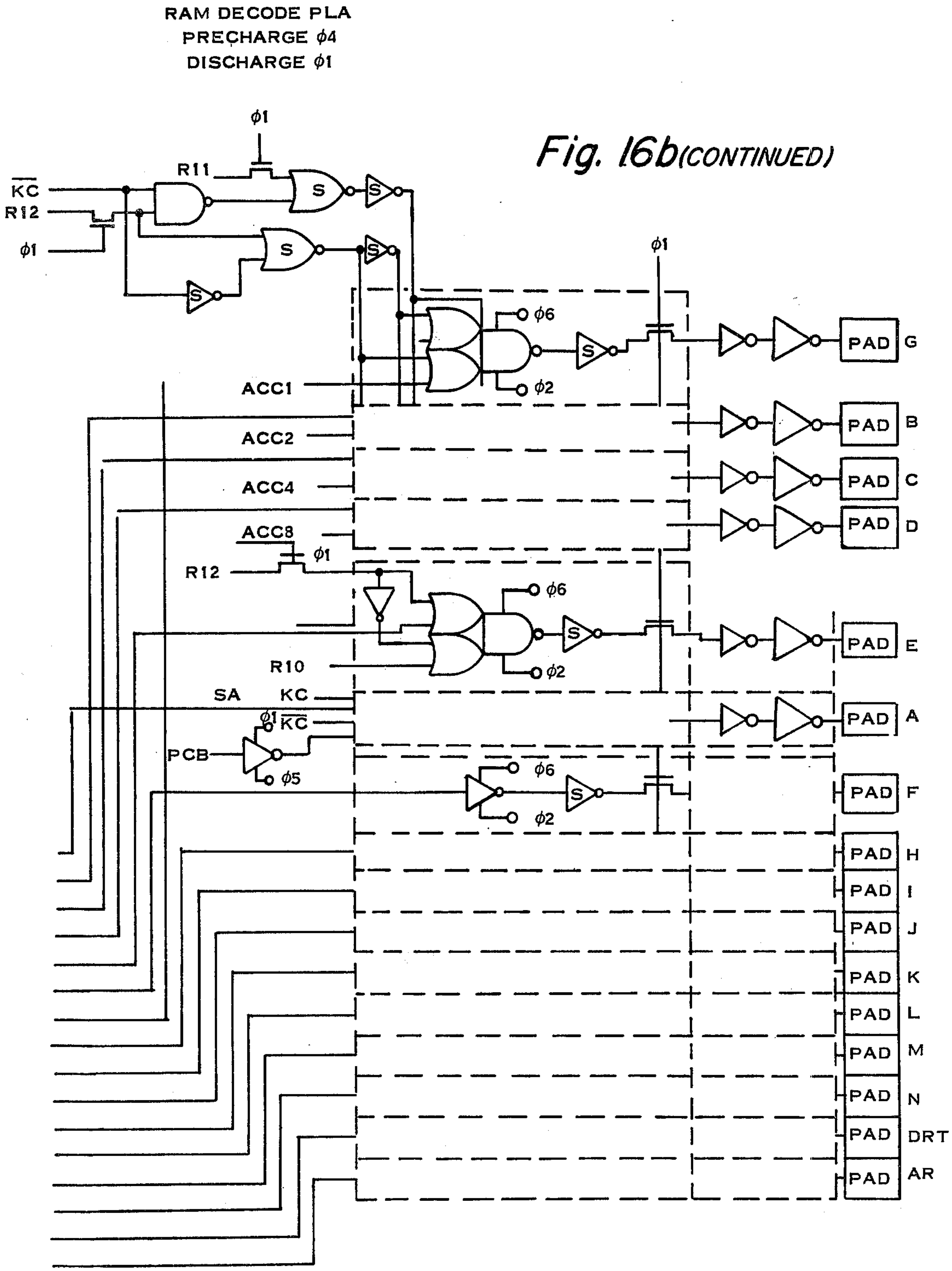

Referring now to the composite diagram formed by FIGS. **16*a*–16*b*, which replace FIG. 13 of U.S. Pat. No. 4,074,355, there can be seen the segment decoder and RAM address decoder 33-1 which decodes RAMY for addressing RAM 31 or ACC1-ACC8 for decoding segment information. Decoder 33-1 generally corresponds to decoder 33 in the aforementioned U.S. patent. The segment information is re-encoded into particular segment line information in output section 32-2 and outputted on bus 90 to segment drivers 91. Six bits of data from the processor's four bit accumulator 77 are decoded in decoder 33-1 as is now described. First, four bits on bus 86 are latched into accumulator latches 87-1 through 87-8 on a TD0 (Transfer Data Out) instruction when status is a logical one. Then, two bits on bus 86 (from lines 86-1 and 86-2) are latched into accumulator latches 87-16 and 86-32, respectively, on another TD0 instruction when status is a logical zero. Then the six bits in latches 87-1 through 87-32 is decoded in decoder 33-1. Segment drivers 91 may preferably be of one of three types, 91A, 91B or 91C as shown on FIGS. 16*a*–16*b*. The 91A type drivers permits the data on ACC1-ACC8 to be communicated externally via pins SEG G, SEG B, SEG C and SEG D. The 91B type driver coupled to pin SEG E permits the contents of digit register 94-10 to be communicated externally when digit register 94-12 is set. The 91B** type driver coupled to pin SEG A permits the contents of the program counter to be outputted during test operations.

Figure 17:
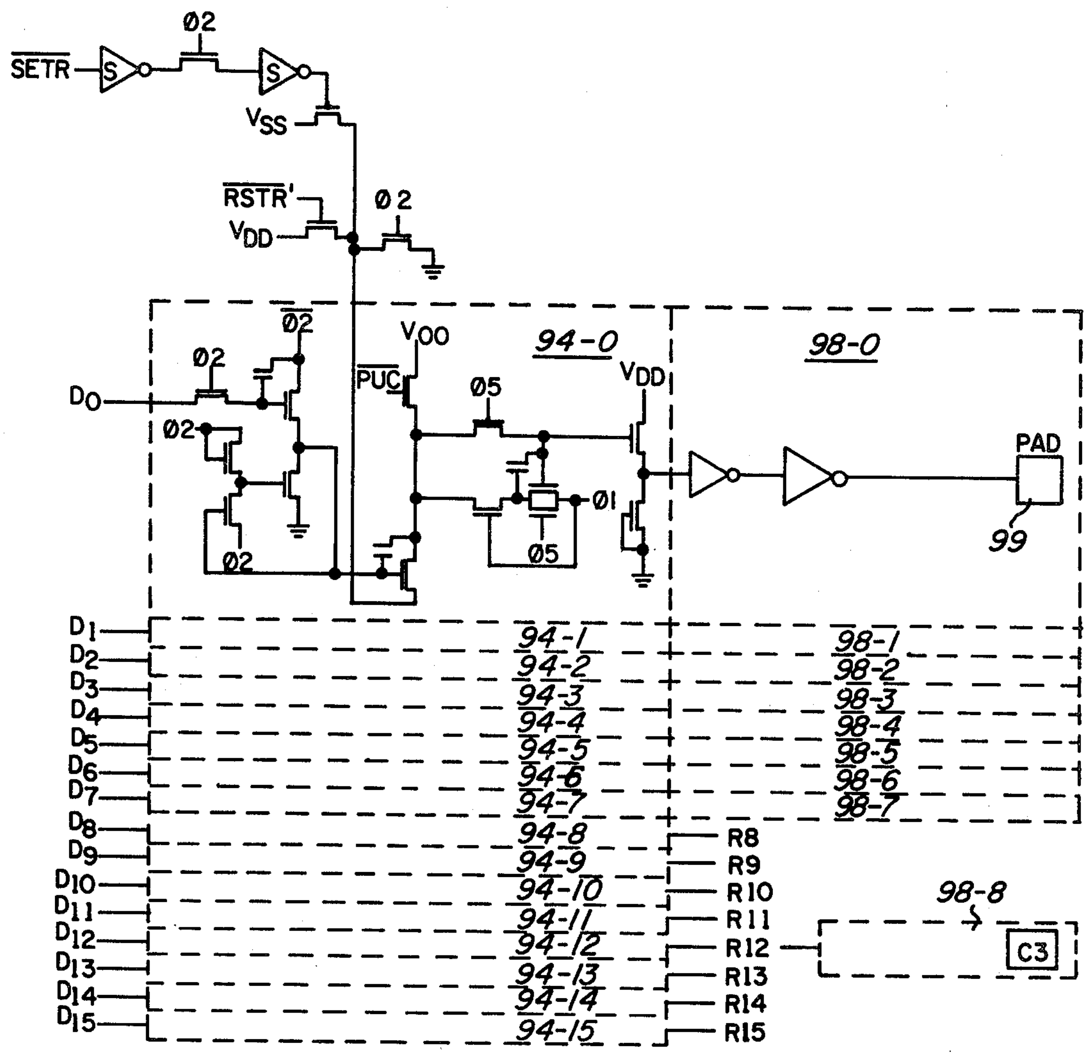
FIG. 17 depicts the digit output buffers and digit registers of the microprocessor.

The digit buffers registers and TD0 latches of FIG. 14 of U.S. Pat. No. 4,074,355 are also preferably replaced with the digit buffers registers of FIG. 17 herein inasmuch as (1) the DDIG signal is no longer used and (2) the digit latches (elements 97 in U.S. Pat. No. 4,074,355) are no longer used. For simplicity's sake, only one of the digit output buffer registers 94 is shown in detail. Further, since in this embodiment of the learning aid, display 2 preferably has eight character positions, eight output buffers 98-0 through 98-7 connect $D_0$–$D_7$ to the common electrodes of display 2 via registers 94-0 through 94-7 are shown in FIG. 17. An additional output buffer 98-8 communicates the contents of registers 94-12, which is the chip select signal, to synthesizer 10.

To facilitate bi-directional communication with synthesizer 10, the microprocessor of U.S. Pat. No. 4,074,355 is preferably modified to permit bi-directional communication on pins SEG G, SEG B, SEG C and SEG D. Thus, in FIG. 18, these SEG pins are coupled to the normal K lines, 112-1 through 112-8, via an input selector **111*a* for inputting information when digit registers 94-12 (R12) is set. Further, these pins are also coupled to ACC1-ACC8 via segment drivers 91A when digit registers 94-12 (R12) and 94-11 (R11) are set for outputting information in accumulator 77**.

Figure 18:
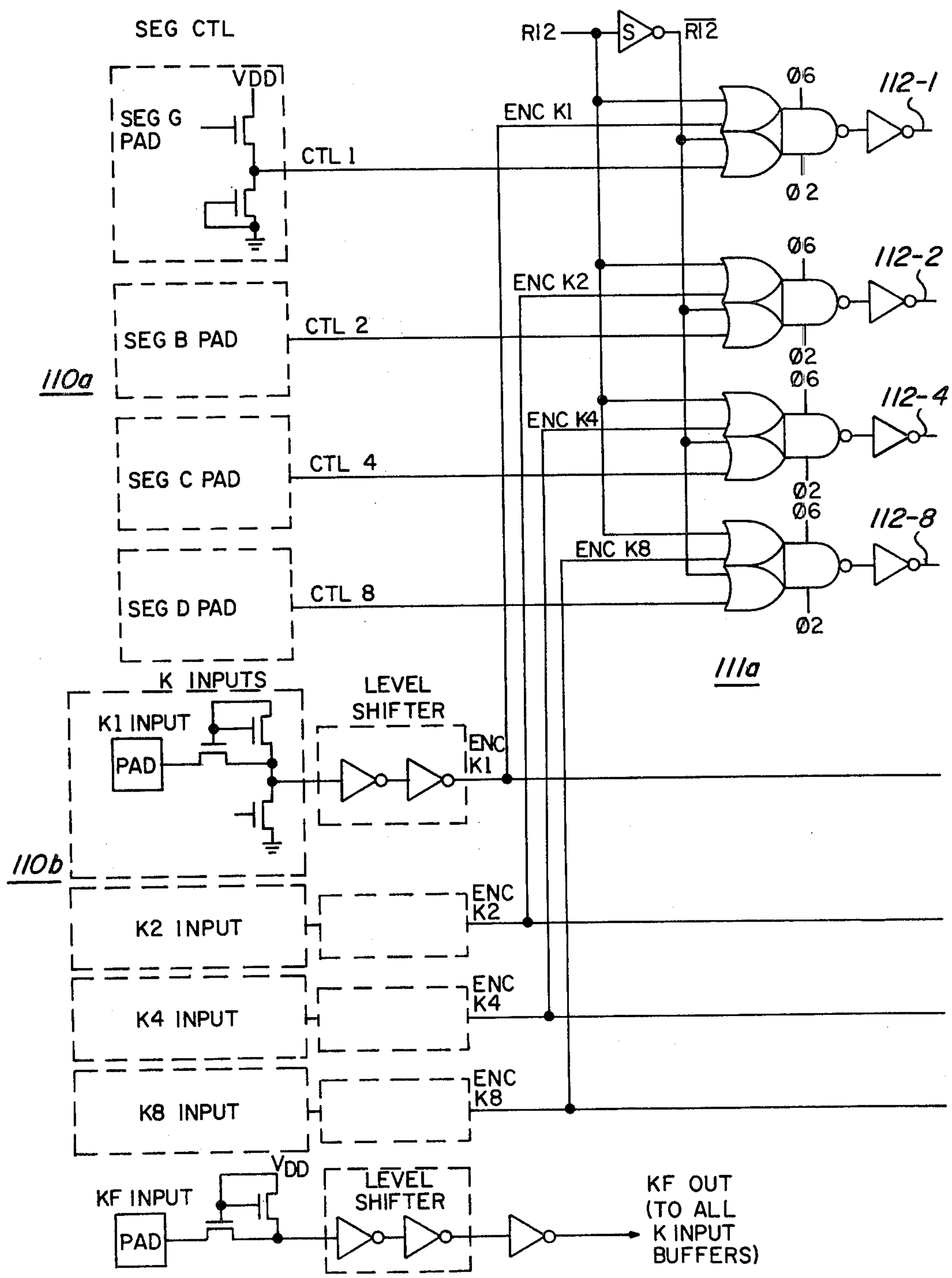
FIG. 18 depicts the KB selector circuit of the microprocessor.

Thus, when digit latch 94-12 (which communicates the chip select signal externally) is set, SEG E is coupled to R10 (digit registers 94-10) for communicating the PDC signal to synthesizer 10. Also, ACC1-ACC8 is outputted on SEG G and SEG B-SEG D, during the time R12 is and R11 are set. When R11 is a logical 0, i.e., is reset, segment drivers 91A are turned off and data may be read into CKB circuit 113 for receiving data from ROMs 12a–12b via synthesizer 10, for instance. FIG. 18 replaces the keyboard circuit 111 shown in FIG. 22 of U.S. Pat. No. 4,064,554.

Preferably, pins SEG G and SEG B-SEG D are coupled to CTL1-CTL8 pins of synthesizer 10, while pin SEG E is coupled to the PDC pin of synthesizer 10.

Figure 15A:
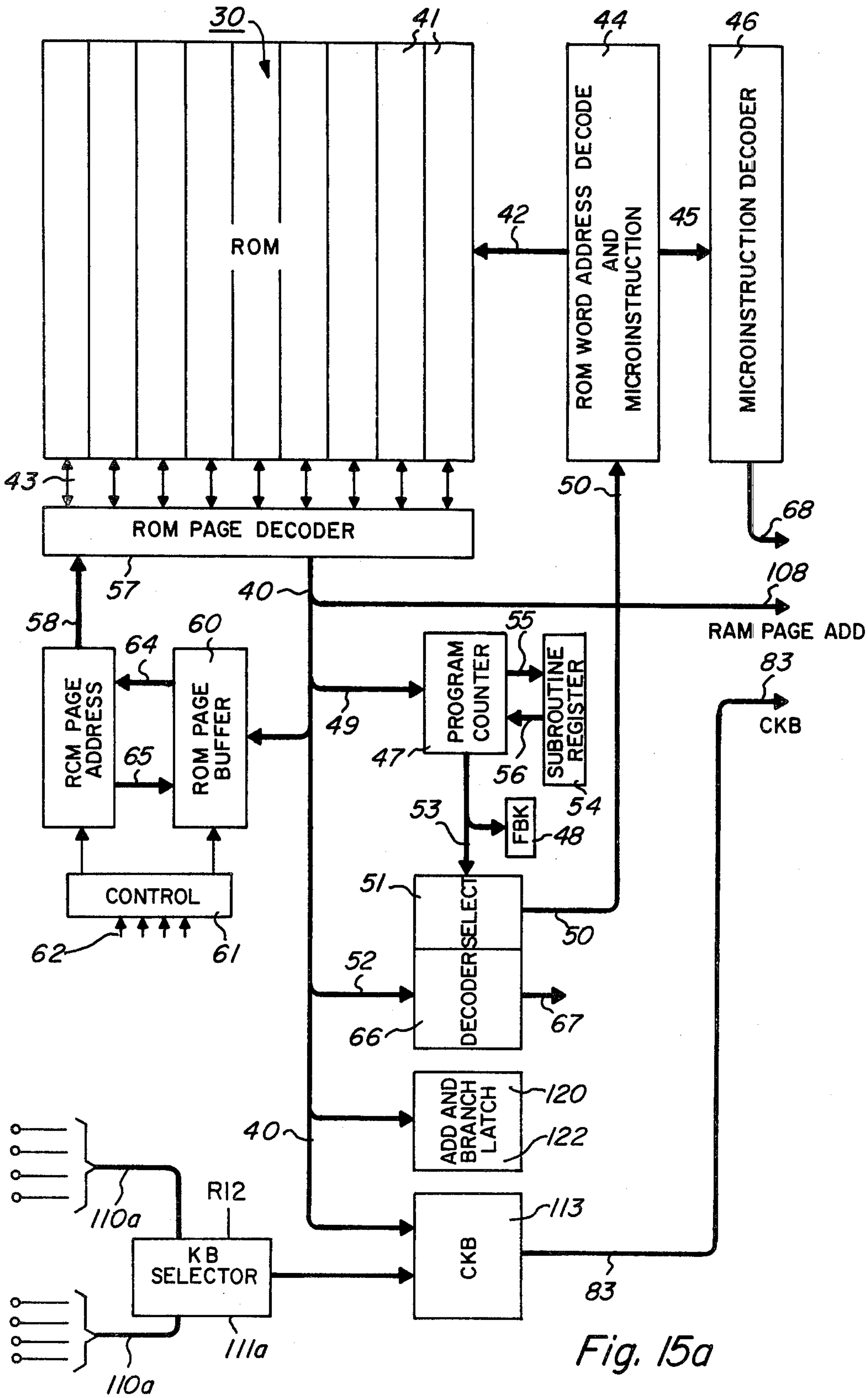
FIGS. 15*a*–15*b* form a composite block diagram of a microprocessor which may be utilized as the controller.
Figure 15B:
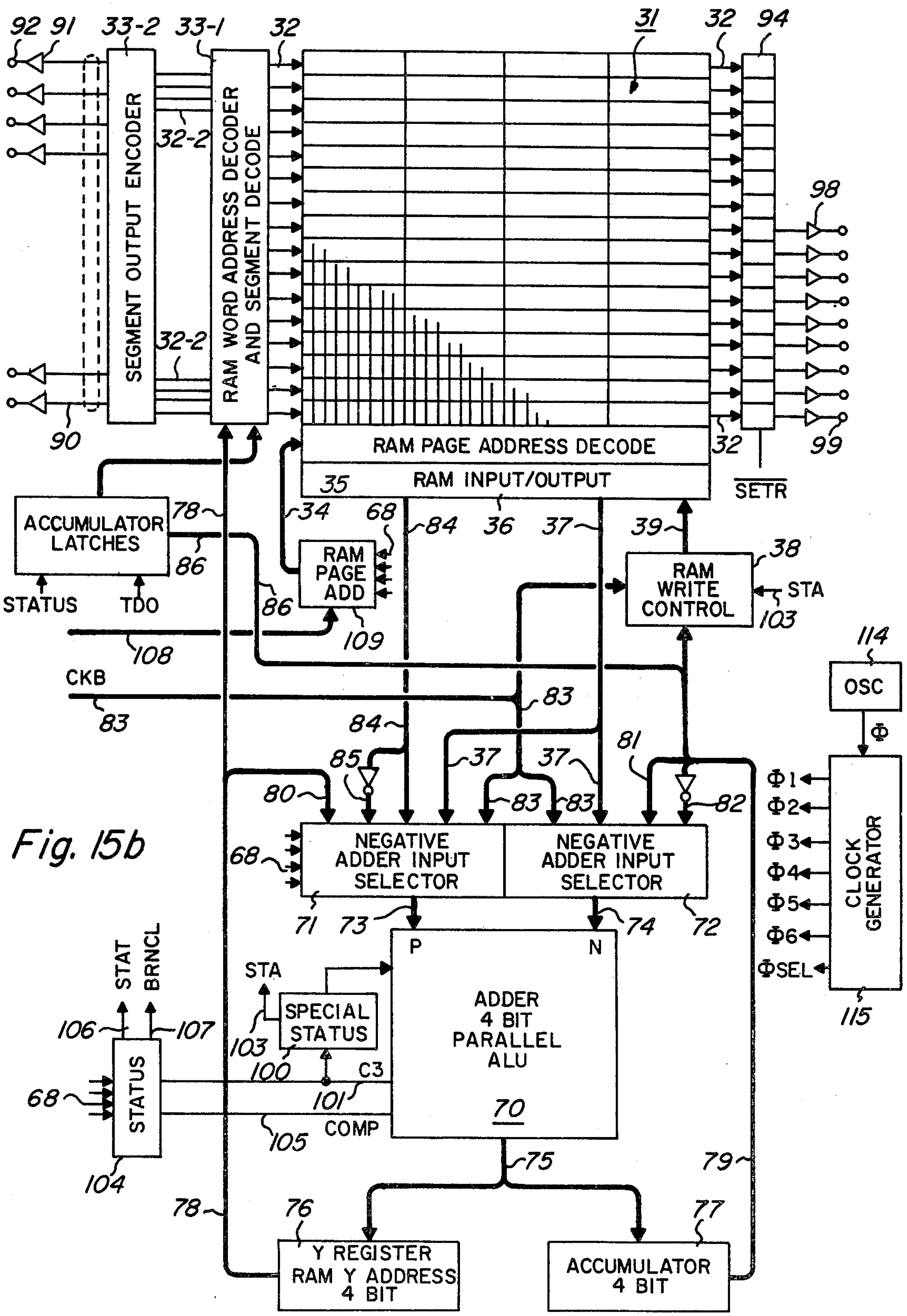

In Table IX (which comprises Tables 0 through IX-15) is listed the set of instructions which may be stored in the main Read-Only-Memory 30 of FIGS. 15a–15b to provide controller 11. Referring now to Table IX, ther are several columns of data which are, reading from left to right: PC (Program Counter), INST (Instruction), BRLN (Branch Line), Line and Source Statement (which includes Name, Title and Comments). In U.S. Pat. No. 4,074,355, it can be seen that main Read-Only-Memory 30 is addresed with a seven bit address in program counter 47 and a four bit address in a buffer 60. The address in buffer 60 is referred to as a page address in the main Read-Only-Memory. The instructions listed on Table IX-0 correspond to page zero in the microprocessor while the instructions listed in Table IX-1 are those on page one and so forth through to the instructions in Table IX-15 which are stored on page fifteen in the microprocessor.

The program counter 47 of the aforementioned microprocessor is comprised of a feedback shift register and therefore counts in a pseudorandom fashion, thus the addresses in the left-hand column of Table IX, which are expressed as a hexadecimal number, exhibit such pseudorandomness. If the instruction starting at page zero were read out sequentially from the starting position in the program counter (00) then the instructions would be read out in the order shown in Table IX. In the "Line" column is listed a sequentially increasing decimal number associated with each source statement and its instruction and program counter address as well as those lines in which only comments appear. The line number starts at line 55 merely for reasons of convenience not important here. When an instruction requiring either a branch or call is to be performed, the address to which the program counter will jump and the page number to which the buffer will jump, if required, is reflected by the binary code comprising the instruction or instructions performing the branch or call. For sake of convenience, however, the branch line column indicates the line number in Table IX to which the branch or call will be made. For example, the instruction on line 59 (page 0, Program Counter Address 0F) is a branch instruction, with a branch address of 1010111 (57 in hexadecimal). To facilitate finding the 57 address in the program counter, the branch line column directs the reader to line 80, where the 57 address is located.

READ-ONLY-MEMORY LOGIC DIAGRAMS

Figure 19:
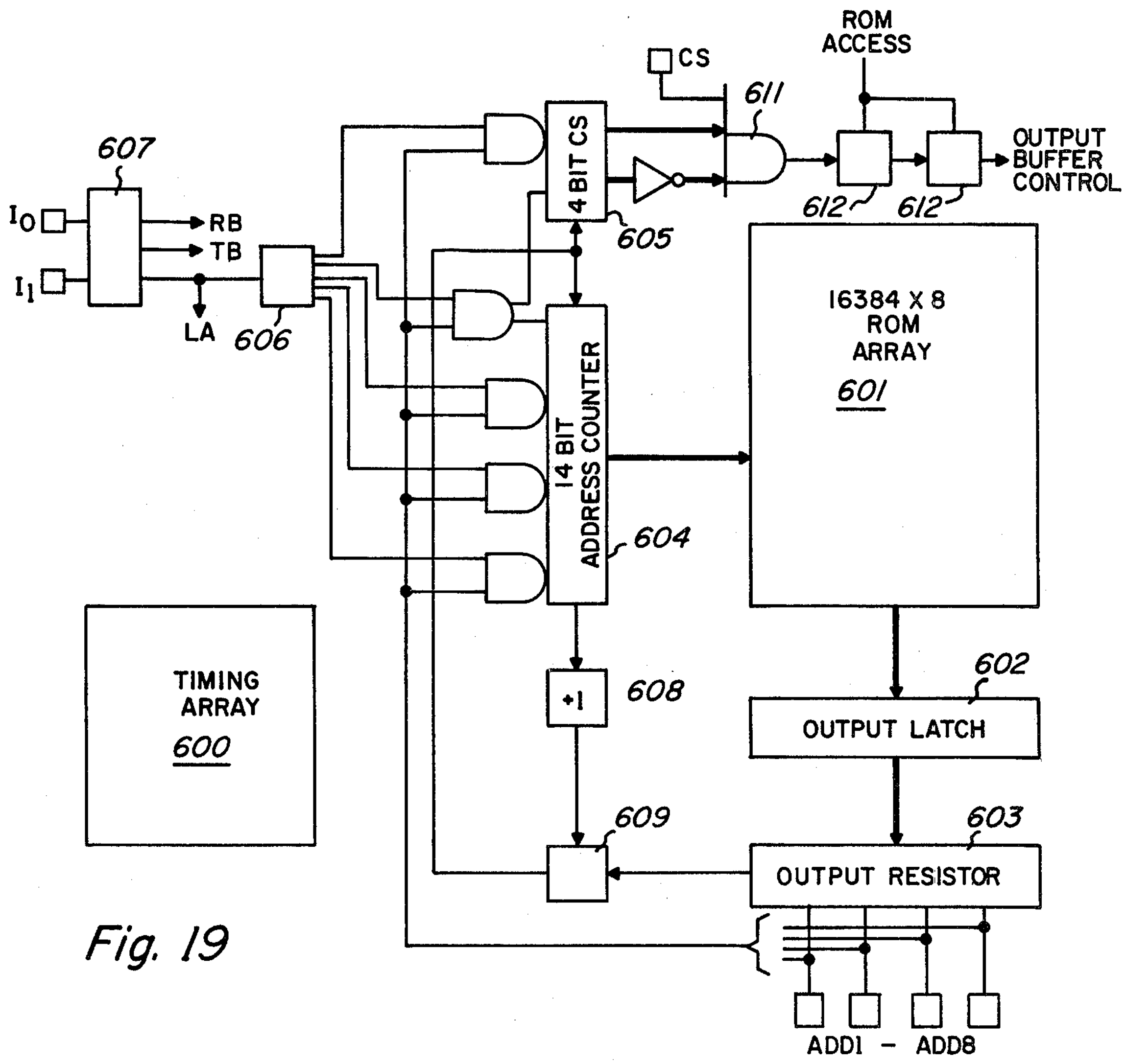
FIG. 19 is a block diagram of ROM's 12a, 12b, 13a or 13b.
Figure 20A:
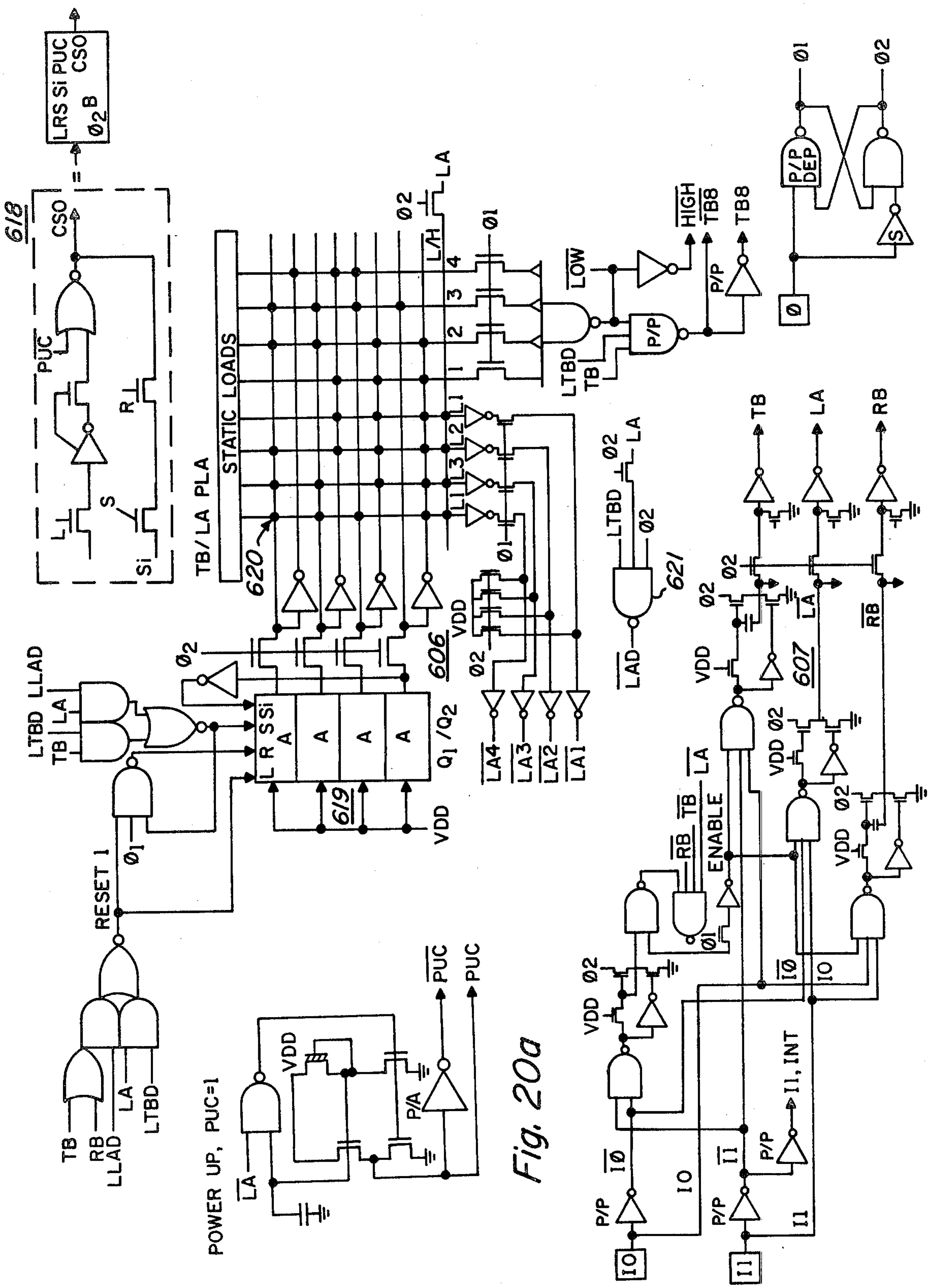
FIGS. 20a–20e form a composite logic diagram of the control logic for ROMs 12a, 12b, 13a or 13b.
Figure 20B:
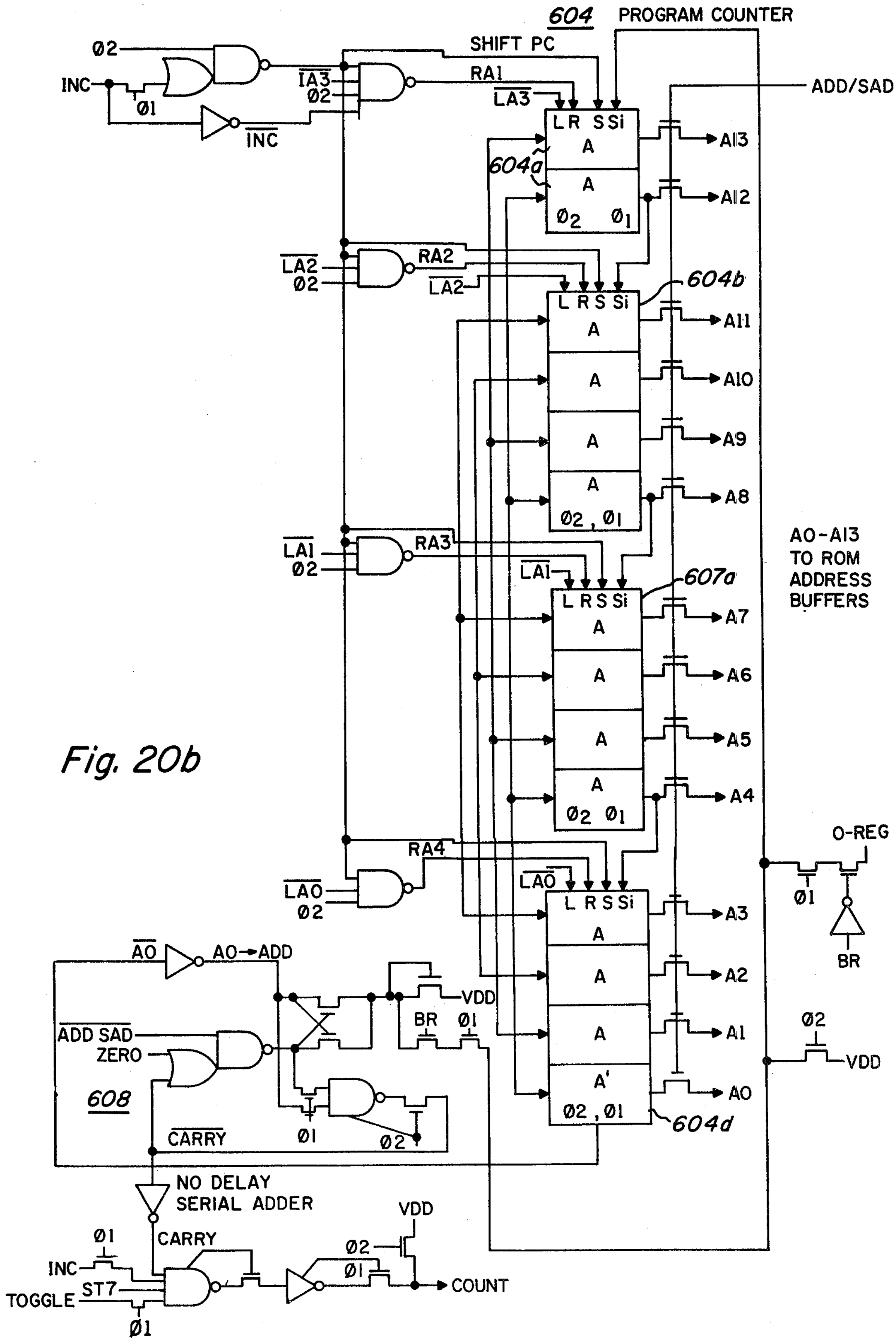
Figure 20C:
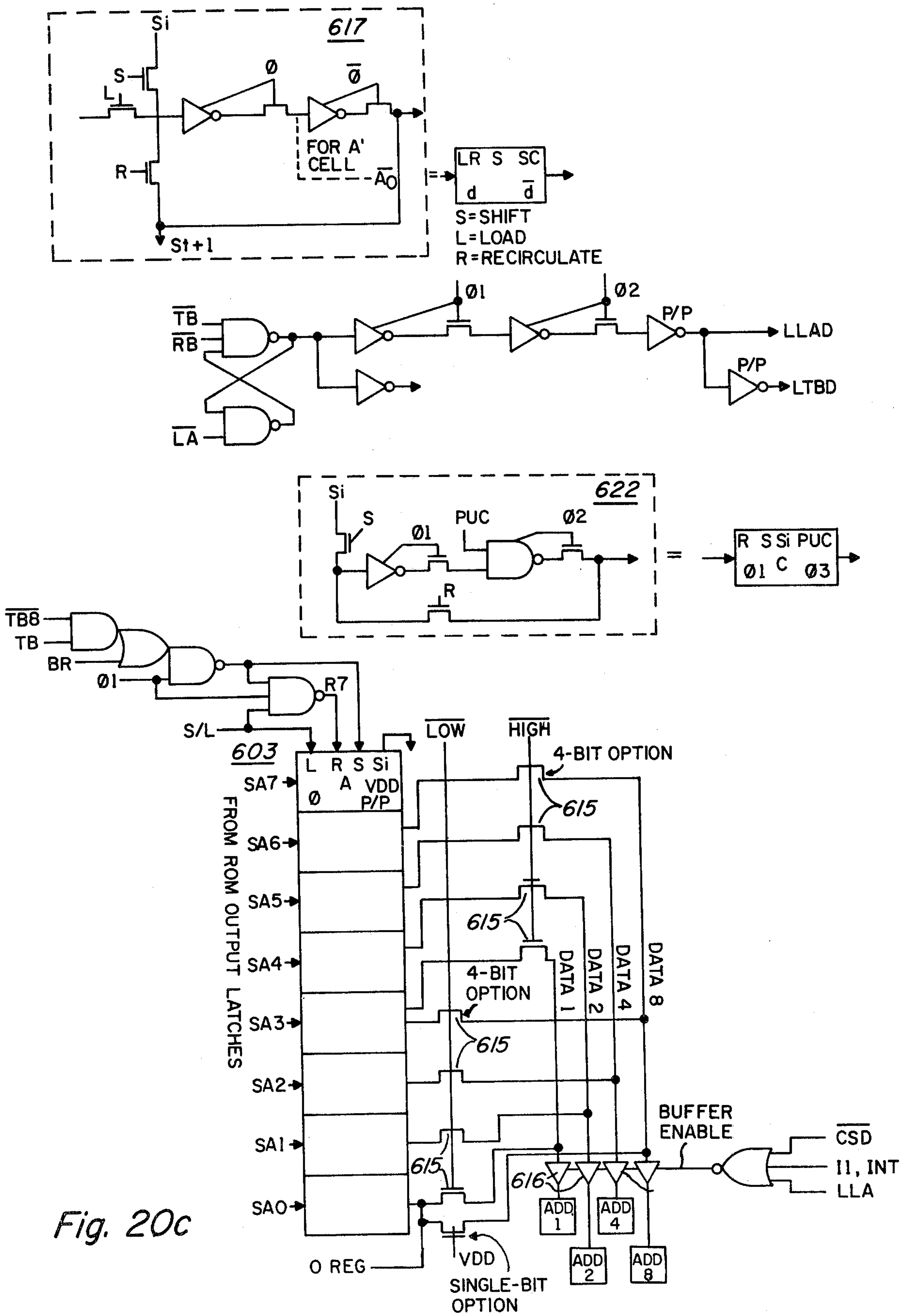
Figure 20D:
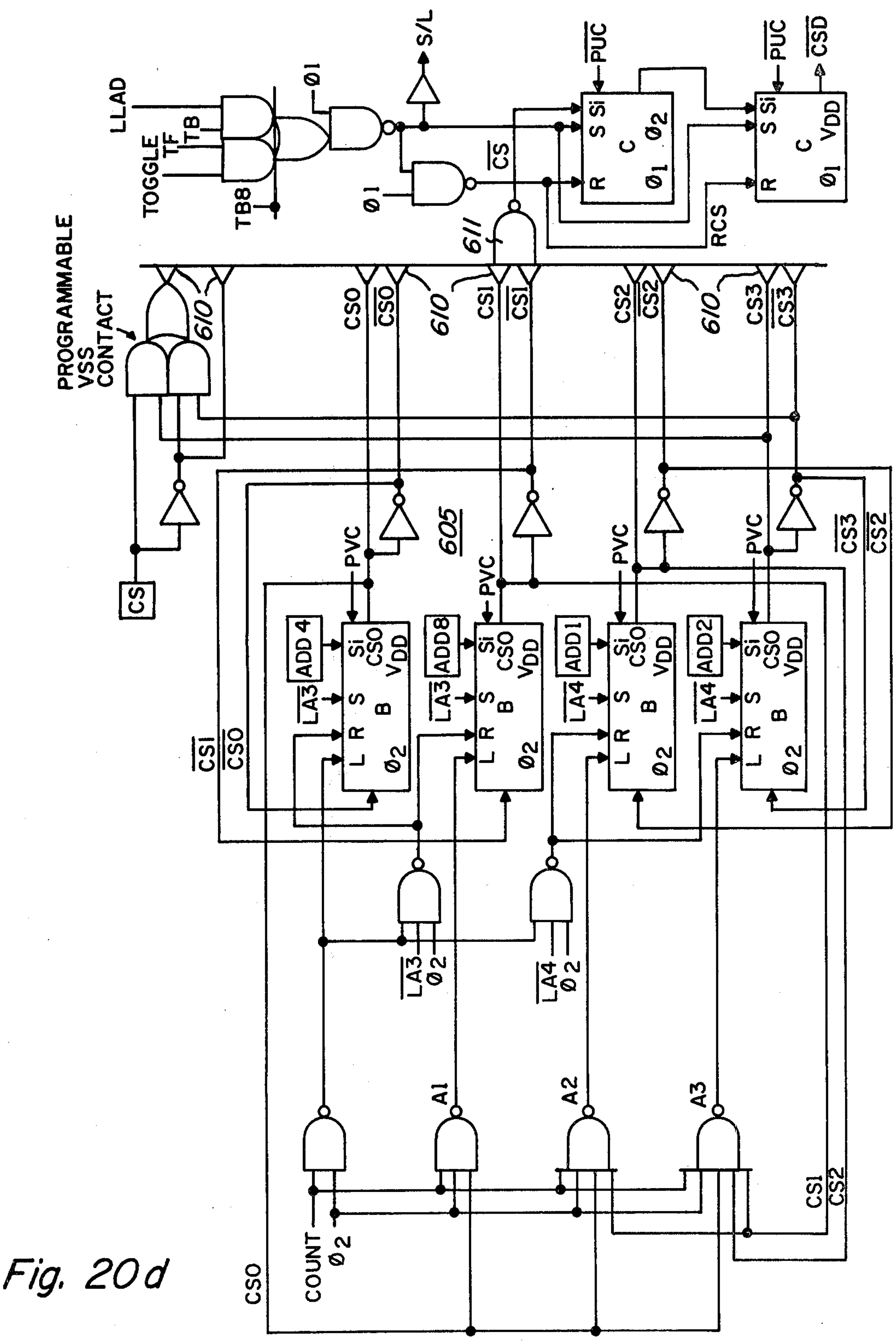
Figure 20E:
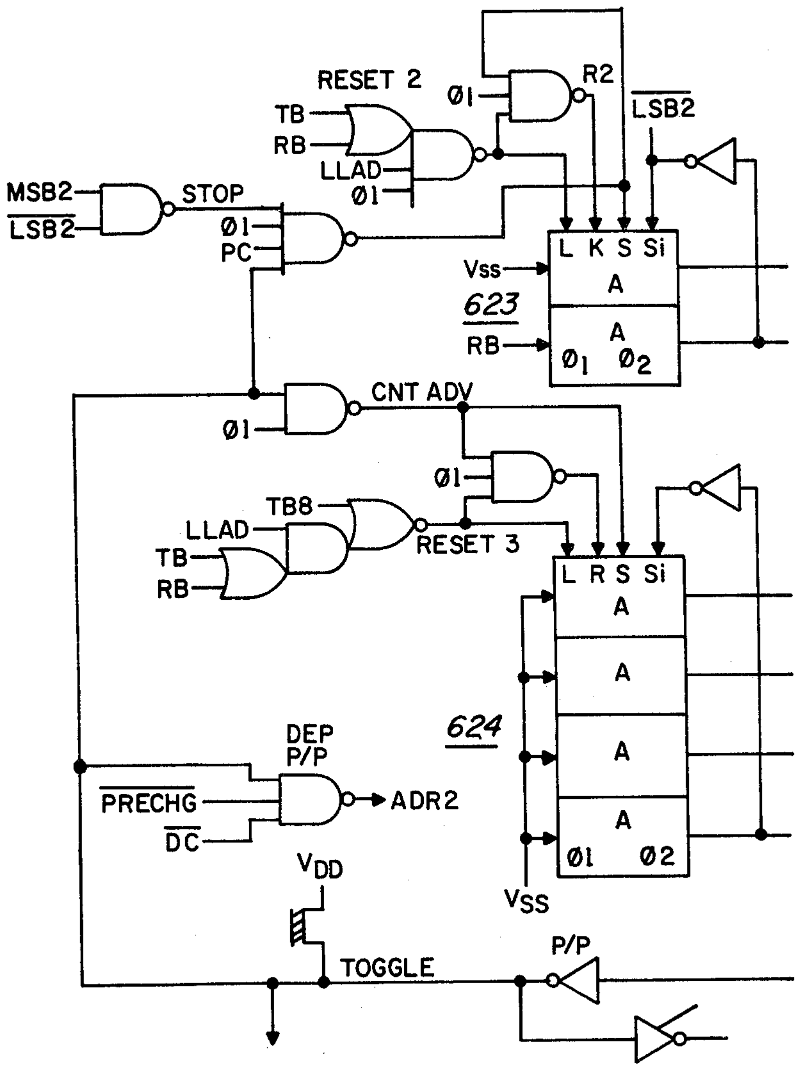
Figure 20E:
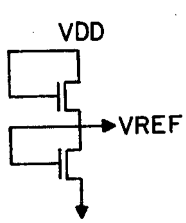
Figure 20E:
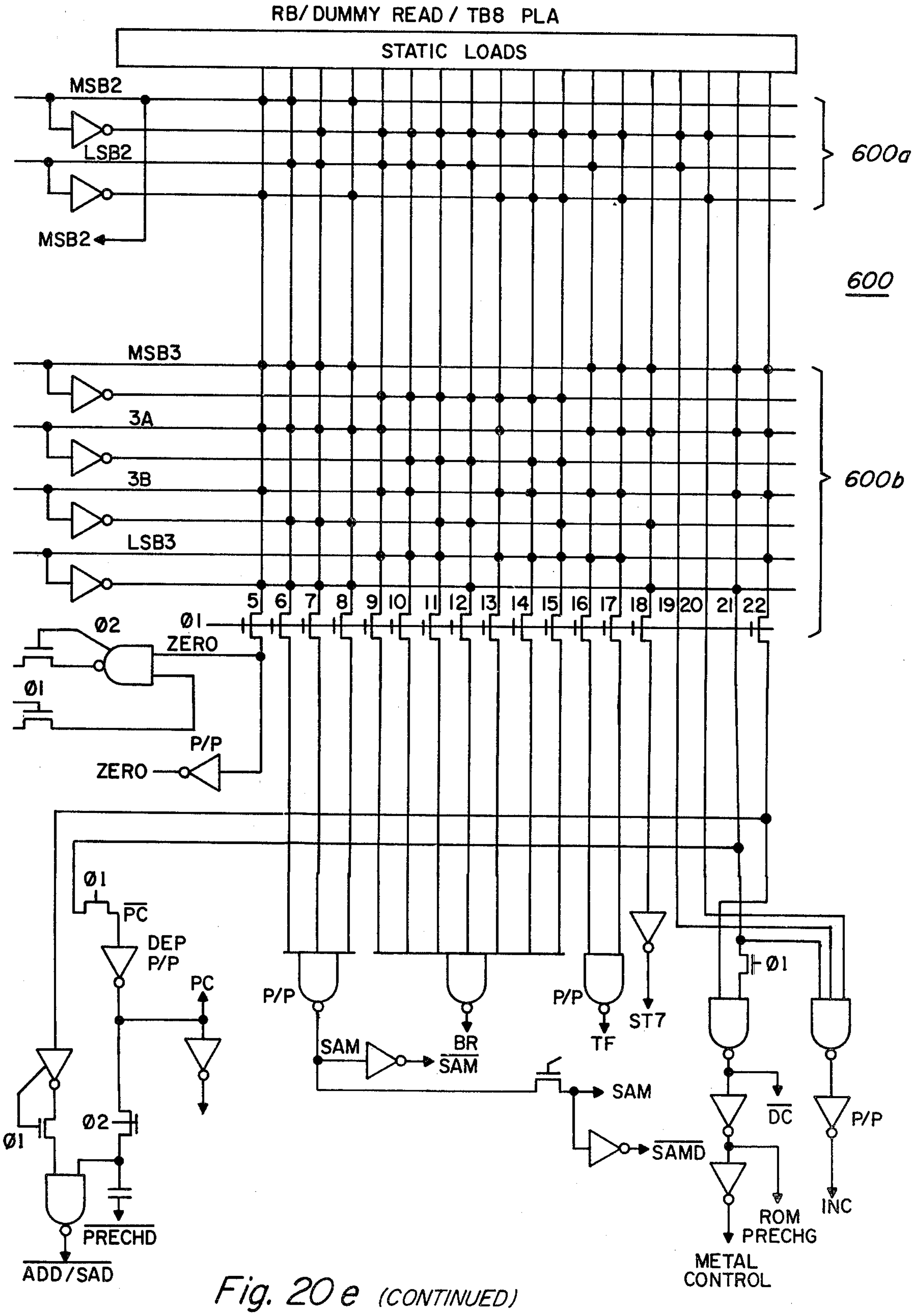

Read-Only-Memories 12a or 12b or 13a or 13b are shown in FIGS. 19, 20a, 20b, 21a and 21b. FIG. 19 is a block diagram of any one of these ROMs. FIGS. 20a and 20b form a composite logic diagram of the control logic for the ROMs while FIGS. 20a and 20b form a composite logic diagram of the X and Y address decoders and pictorially show the array of memory cells.

Referring now to FIG. 19, the RAM array 601 is arranged with eight output lines, one output line from each section of 16,384 bits. The eight output lines from ROM array 601 are connected via an output latch 602 to an eight bit output register 603. The output register 603 is interconnected with pins ADD1-ADD8 and arranged either to communicate the four high or low order bits from output register 603 via the four pins ADD-1-ADD8 or alternatively to communicate the bit serially from output register 603 via pin ADD1. The particular alternative used may be selective according to mask programmable gates.

ROM array 601 is addressed via a 14 bit address counter 604. The address counter 604 has associated therewith a four bit chip select counter 605. Addresses in address counter 604 and chip select counter 605 are loaded four bits at a time from pins ADD1-ADD8 in response to a decoded Load Address (LA) command. The first LA command loads the four least significant bits in address counter 604 (bits $A_0$–$A_3$), and subsequent LA commands load the higher order bits, ($A_4$–$A_7$, $A_8$–$A_{11}$ and $A_{12}$–$A_{13}$). During the fourth LA cycle the $A_{12}$ and $A_{13}$ bits are loaded at the same time the CS0 and CS1 bits in chip select counter 605 are loaded. Upon the fifth LA command the two most significant bits in chip select counter 605 are loaded from ADD1 and ADD2. A counter 606 counts consecutively received LA commands for indicating where the four bits on ADD1-ADD8 are to be inputted into counters 604 and/or 605.

Commands are sent to the ROM chip via $I_0$ and $I_1$ pins to a decoder 607 which outputs the LA command a TB (transfer bit) and a RB (read and branch) command.

Address register 604 and chip select register 605 have an add-one circuit 608 associated therewith for incrementing the address contained therein. When a carry occurs outside the fourteen bit number stored in address register 604 the carry is carried into shift select register 605 which may enable the chip select function if not previously enabled or disable the chip select function if previously enabled, for example. Alternatively, the eight bit contents of output register 603 may be loaded into address register 604 by means of selector 609 in response to an RB command. During an RB command, the first byte read out of array 601 is used as the lower order eight bits while the next successive byte is used for the higher order six bits in counter 604.

The output of chip select register 605 is applied via programmable connectors 610 to gate 611 for comparing the contents of chip select counter 605 with a preselected code entered by the programming of connectors 610. Gate 611 is also responsive to a chip select signal on the chip select pin for permitting the chip select feature to be based on either the contents of the four bit chip select register 605 and/or the state of the chip select bit on the CS pin. The output of gate 611 is applied to two delay circuits 612, the output of which controls the output buffers associated with outputting information from output register 603 to pins ADD1-ADD8. The delay imposed by delay circuits 612 effect the two byte delay in this embodiment, because the address information inputted on pins ADD1-ADD8 leads the data outputted in response thereto by the time to require to access ROM array 601. The CS pin is preferably used in the embodiment of the learning aid disclosed herein.

A timing PLA 600 is used for timing the control signals outputted to ROM array 601 as well as the timing of other control signals.

Referring now to the composite drawing formed by FIGS. 20a and 20b, output register 603 is formed by eight "A" bit latches, an exemplary one of which is shown at 617. The output of register 603 is connected in parallel via a four bit path controlled on $\overline{\text{LOW}}$ or $\overline{\text{HIGH}}$ signals to output buffers 616 for ADD1-ADD4 and 616a for ADD8. Buffers 616 and 616a are shown in detail on FIGS. 21a–21b.

Gates 615 which control the transferring of the parallel outputs from register 603 via in response to $\overline{\text{LOW}}$ and $\overline{\text{HIGH}}$ are preferably mask level programmble gates which are preferably not programmed when this chip is used with the learning aid described herein. Rather the data in register 603 is communicated serially via programmable gate 614 to buffer 616a and pin ADD8. The bits outputted to ADD1-ADD8 in response to a $\overline{\text{HIGH}}$ signal are driven from the third through sixth bits in register 603 rather that the fourth through seventh bits inasmuch as a serial shift will normally be accomplished between a $\overline{\text{LOW}}$ and $\overline{\text{HIGH}}$ signal.

Address register 604 comprises fourteen of the bit latches shown at 617. The address in address 604 on lines $A_0$–$A_{13}$ is communicated to the ROM X and Y address buffers shown on FIGS. 21a–21b. Register 604 is divided into four sections 601a–601d, the 601d section loading four bits from ADD1–ADD8 in response an $\overline{\text{LA0}}$ signal, the 601c section loading four bits from ADD1–ADD8 in response to an $\overline{\text{LA1}}$ signal and likewise for section 601b in response to an $\overline{\text{LA2}}$ signal. Section 601a is two bits in length and loads the ADD1 and ADD2 bits in response to an $\overline{\text{LA2}}$ signal. The chip select register 605 comprise four B type bit latches of the type shown at 618. The low order bits, CS0 and CS1 are loaded from ADD4 and ADD8 in response to an $\overline{\text{LA3}}$ signal while the high order bits CS2 and CS3 are loaded from ADD1 and ADD2 on an $\overline{\text{LA4}}$ signal. The $\overline{\text{LA0–LA4}}$ signals are generated by counter 606. Counter 606 includes a four bit register 619 comprised of four A bit latches 617. The output of the four bit counter 619 is applied to a PLA 620 for decoding the $\overline{\text{LA1–LA4}}$ signals. The $\overline{\text{LA0}}$ signal is generated by a NAND gate 621. As can be seen, the $\overline{\text{LA0}}$ signal comes up in response to an LA signal being decoded immediately after a TB signal. The gate 621 looks for a logical one on the LA signal and a logical one on an LTBD (latched transer bit delay) signal from latch 622. Decoder 607 decodes the $I_0$ and $I_1$ signals applied to pins $I_0$ and $I_1$ for decoding the TB, LA and RB control signals. The signals on the $I_0$ and $I_1$ pins are set out in Table X. Latch circuit 622 is responsive to LA, RB and TB for indicating whether the previously received instruction was either an LA or a TB or RB command.

In addition to counting successive LA commands, four bit counter 609 and PLA 620 are used to count successive TB commands. This is done because in this embodiment each TB command transfers one bit from register 603 on pin ADD8 to the synthesizer chip 10 and output register 603 is loaded once each eight successive TB commands. Thus, PLA 620 also generates a TB8 command for initiating a ROM array addressing sequence. The timing sequence of counter 619 and PLA 620 are set forth in Table XI. Of course, the $\overline{\text{LA1–LA4}}$ signal is only generated responsive to successive LA commands while the TB8 signals only generate in response to successive TB commands.

Figure 21A:
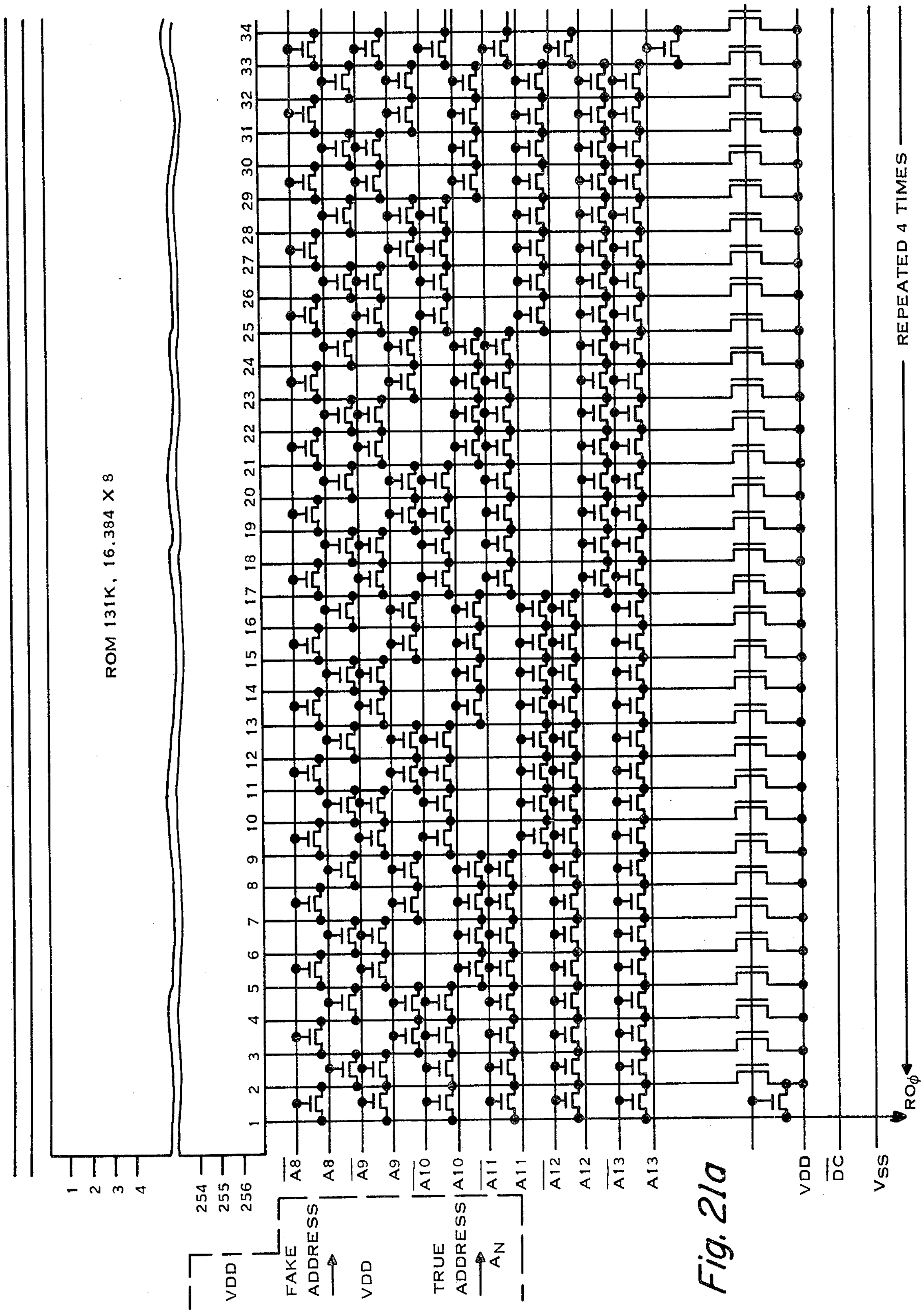
FIGS. 21a and 21b form a composite logic diagram of the X and Y address decoders and the array of memory cells.
Figure 21A:
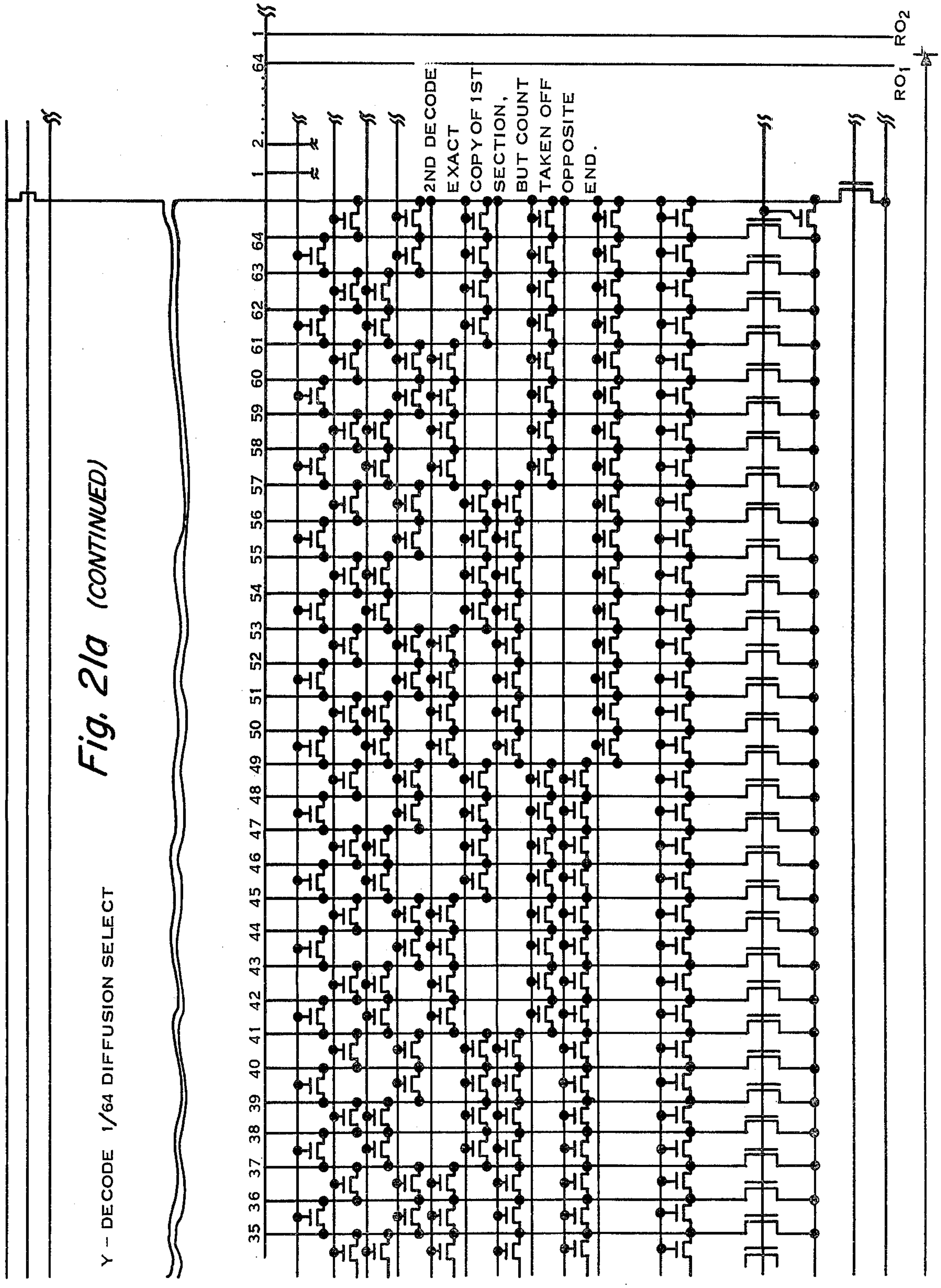
Figure 21A:
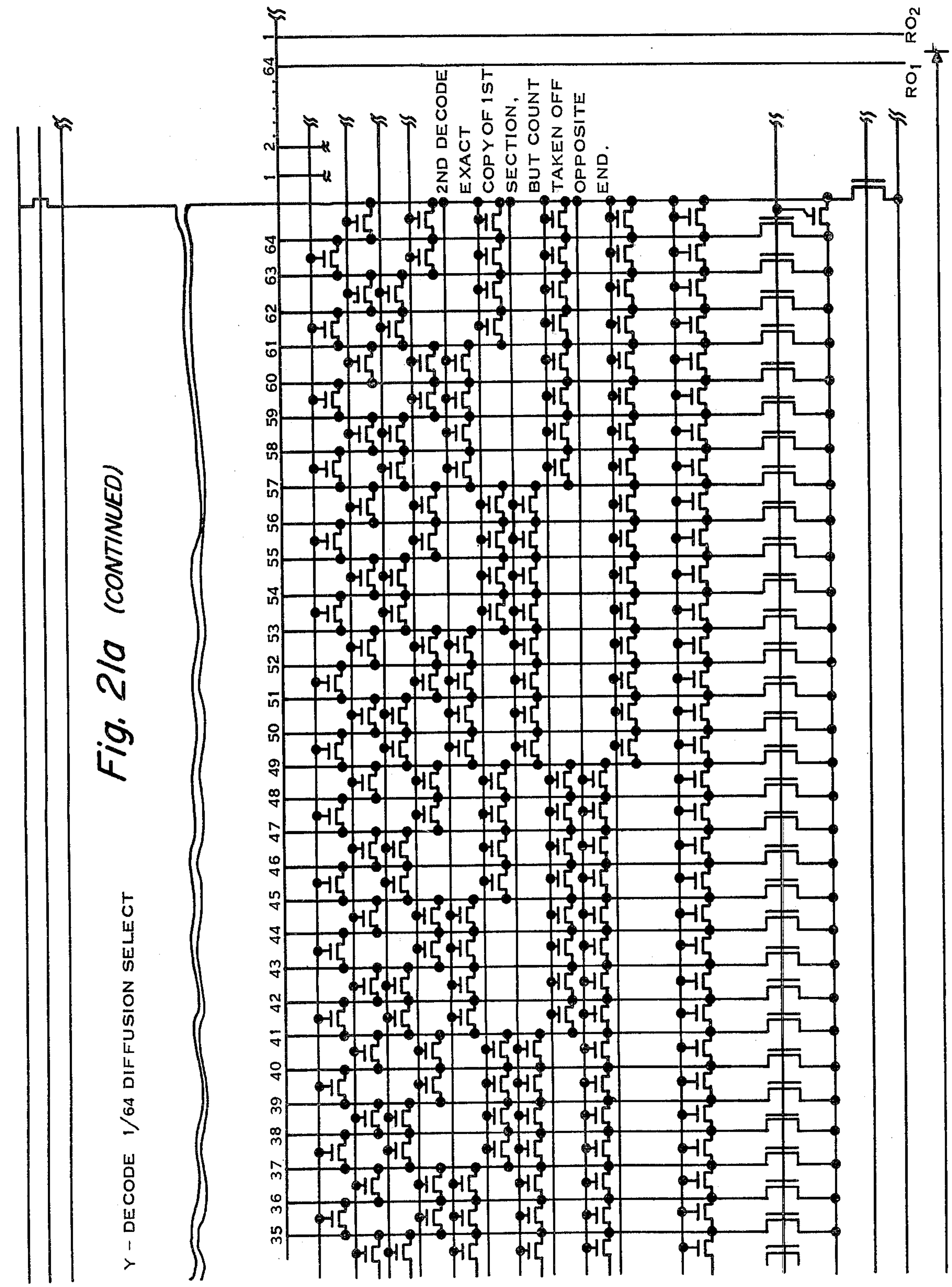
Figure 21B:
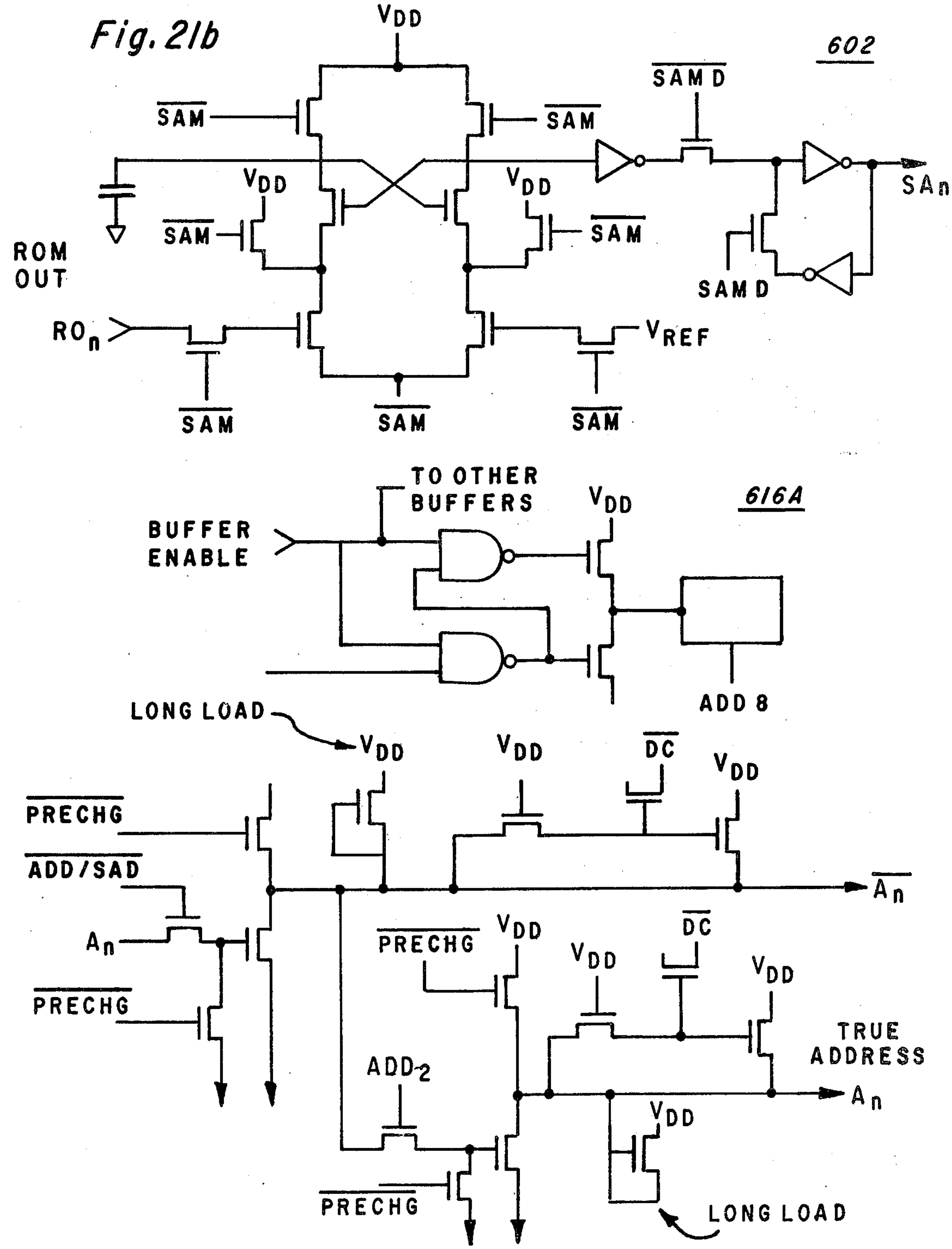
Figure 21B:
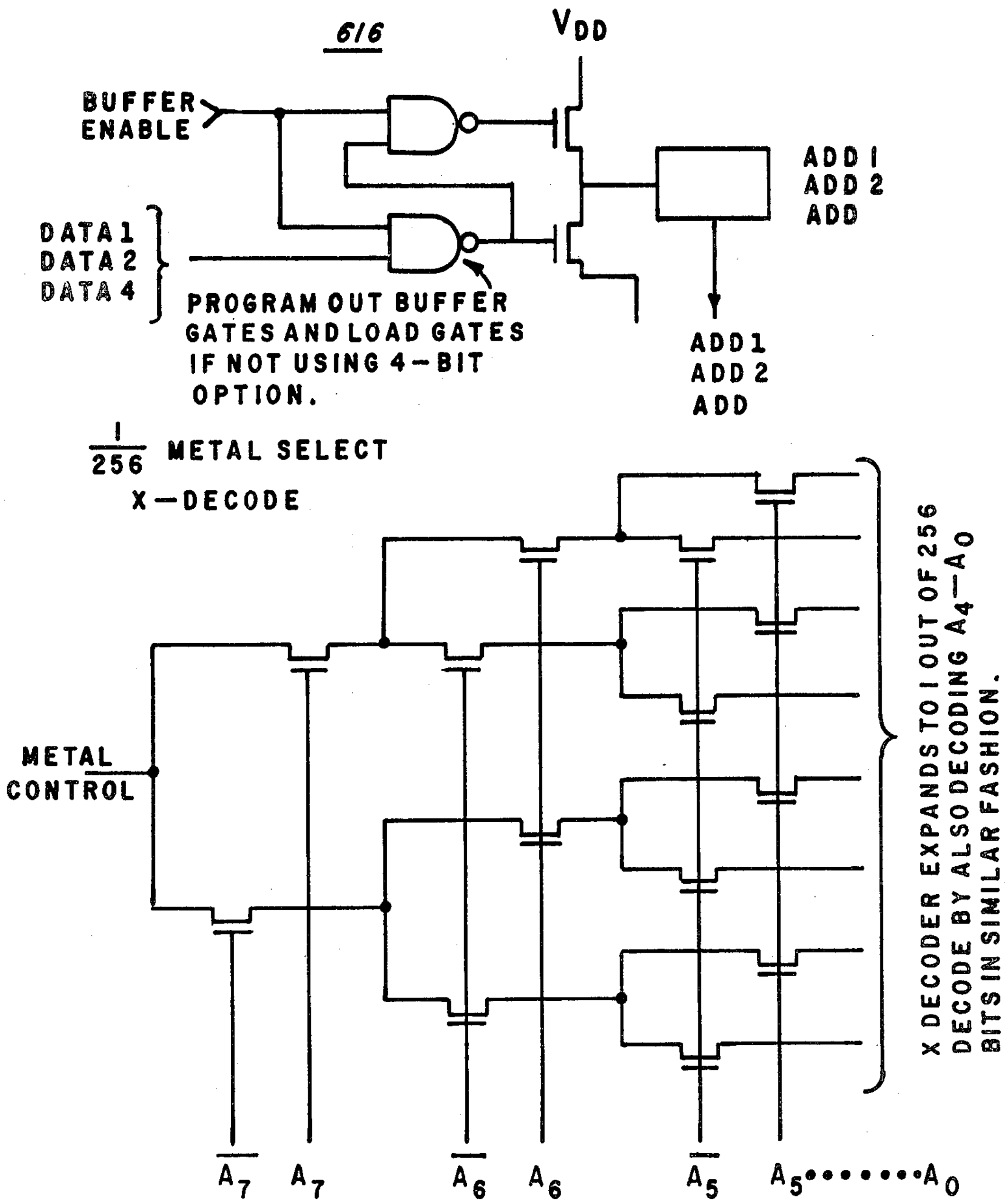

Add-one circuits 608 increments the number in program counter 604 in response to a TB command or an RB command. Since two successive bytes are used as a new address during an RB cycle, the card address and the present address incremented by one must be used to generate these two bytes. The output of add-one circuit 608 is applied via selector 609 for communicating the results of the incrementation back to the input of counter 604. Selector 609 permits the bits in output register 603 to be communicated to program counter 604 during an RB cycle as controlled by signal BR from array 600. Add-one circuit 608 is also coupled via COUNT to chip select counter 605 for incrementing the number stored therein whenever a CARRY would occur outside the fourteen bits stored in program counter 604. The output of chip select counter 605 is applied via programmable gate 610 to gate 611. The signal on the CS pin may also be applied to gate 611 or compared with the contents of CS3. Thus, gate 611 can test for either (1) the state of the CS signal, (2) a specific count in counter 605 or (3) a comparison between the state on the chip select and the state CS3 or (4) some combination of the foregoing, as may be controlled by those knowledgeable in the art according to how programmable links 610 are progrmmed during chip manufacture. The output of gate 611 is applied via two bit latches of the C type, which are shown at 622. Timing array 600 controls the timing of ROM sequencing during RB and TB sequences. Array 600 includes PLA sections 600a and 600b and counters 623 and 624. Counter 623 is a two bit counter comprising two A type bit latches shown at 617. Counter 63 counts the number of times a ROM access is required to carry out a particular instruction. For instance, a TB command requires one ROM access while an RB command requires three ROM accesses. Counter 624, which comprises four "A" type bit latches of the type shown at 617, counts through the ROM timing sequence for generating various control signals used in accessing ROM array 601. The timing sequence for a TB command is shown in Table XI which depicts the states in counter 623 and 624 in the signals generated in response thereto. A similar timing sequence for an RB command is shown in Table XIII. The various signals generated by PLA 600a and 600b will now be briefly described. The BR signal controls the transfer of two serial bits from the output register 603 to the program counter 604. The TF signal conrols the transfer of eight bits from the sense amp latch 602 (FIG. 21–21b) to output register 603 on lines SA0–SA7. INC controls the serial incrementing of the program counter, two bits for each INC signal generated. PC is the precharge signal for the ROM array and normally exists for approximately ten microseconds. The DC signal discharges the ROM 601 array and preferably lasts for approximately ten microseconds for each DC signal. This particular ROM array uses approximately seventy microseconds to discharge and thus seven DC signals are preferably generated during each addressing sequence. SAM gates the data outputted from the ROM into the sense amp latch 602 while SAD gates the address lines by gating the address from the program counter into the ROM address buffers 25 (FIGS. 21a–21b).

ALTERNATIVE EMBODIMENTS

Although the invention has been described with reference to a specific embodiment, this description is not meant to be construed in a limiting sense. Various modifications of the disclosed embodiment as well as alternative embodiments of the invention will become apparent to persons skilled in the art upon reference to the description of the invention. It is therefore contemplated that the appended claims will cover any such modifications or embodiments that fall within the true scope of the invention.

TABLE I

THE FOLLOWING SEQUENCE IS AN EXAMPLE OF THE LEARNING AID IN THE SPELLING MODE.

| KEY | DISPLAY | SPEAKER |
|---|---|---|
| COMPUSPELL | | 4 RANDOM TONES |
| | SPELL A | |
| B | SPELL B | B |
| C | SPELL C | C |
| D | SPELL D | D |
| P | SPELL D | P |
| A | SPELL A | A |
| GO | — | SPELL DO AS IN DO NOT |
| D | D- | D |
| O | DO- | O |
| ENTER | DO | THAT IS CORRECT, |
| | | NOW SPELL |
| | — | WAS |
| W | W- | W |
| U | WU- | U |
| S | WUS- | S |
| ERASE | — | |
| W | W- | W |
| A | WA- | A |
| S | WAS- | S |
| ENTER | WAS | THAT IS RIGHT, |
| | | NEXT SPELL |
| | — | ANY |
| A | A- | A |
| N | AN- | N |
| I | ANI- | I |
| ENTER | ANI | TRY AGAIN, |
| | — | ANY |
| | — | |
| REPEAT | — | ANY |
| REPEAT | — | ANY (½ SPEED) |
| E | E- | E |
| N | EN- | N |
| Y | ENY- | Y |
| ENTER | ENY | THAT IS INCORRECT, |
| | | THE CORRECT SPELLING |
| | | OF ANY IS |
| | A | A |
| | AN | N |
| | ANY | Y |
| | ANY | ANY |
| | | NOW TRY |
| | — | FULL |
| F | F- | F |
| U | FU- | U |
| L | FUL- | L |
| L | FULL- | L |
| | FULL | THAT IS CORRECT, |
| | | TRY SHOE |
| | | MEANING FOOTWEAR |
| | — | |
| S | S- | S |
| H | SH- | H |
| O | SHO- | YOU |
| E | SHOE- | E |
| ENTER | SHOE | YOUR ARE CORRECT, |
| | | SPELL COMB |
| C | C- | C |
| O | CO- | O |
| M | COM- | M |
| E | COME- | E |
| ENTER | COME | TRY AGAIN, |
| | — | COMB |
| C | C- | |
| O | CO- | |
| M | COM- | |
| B | COMB- | |
| ENTER | COMB | YOU ARE CORRECT, |
| | | NOW SPELL |
| | | FOUR AS IN |
| | — | THE NUMBER |
| F | F- | F |
| O | FO- | O |
| U | FOU- | U |
| R | FOUR- | R |
| ENTER | FOUR | THAT IS CORRECT, |
| | — | NEXT SPELL WHO |
| W | W- | W |

TABLE I-continued

THE FOLLOWING SEQUENCE IS AN EXAMPLE OF THE LEARNING AID IN THE SPELLING MODE.

| KEY | DISPLAY | SPEAKER |
|---|---|---|
| H | WH- | H |
| O | WHO- | O |
| ENTER | WHO | YOU ARE RIGHT, |
| | — | NOW TRY SOUP |
| S | S- | S |
| O | SO- | O |
| U | SOU- | U |
| P | SOUP- | P |
| ENTER | SOUP | THAT IS RIGHT, |
| | — | TRY MOST |
| M | M- | M |
| O | MO- | O |
| S | MOS- | S |
| T | MOST- | T |
| ENTER | MOST | YOU ARE CORRECT |
| | +8 −2 | 4 TONES |
| | +8 −2 | 4 TONES |
| | +8 −2 | HERE IS YOUR SCORE, |
| | | EIGHT CORRECT, TWO |
| | | DID NOT COMPUTE. |

TABLE II

LEARN MODE

| KEY | DISPLAY | SPEAKER |
|---|---|---|
| | BUSY | (1 SECOND PAUSE) |
| | | SAY IT |
| | | (2 SECOND PAUSE) |
| | | BUSY |
| | MANY | (1 SECOND PAUSE) |
| | | SAY IT |
| | | (2 SECOND PAUSE) |
| | | MANY |
| | CARRY | (1 SECOND PAUSE) |
| | | SAY IT |
| | | (2 SECOND PAUSE) |
| | | CARRY |
| | YOUR | (1 SECOND PAUSE) |
| | | SAY IT |
| | | (2 SECOND PAUSE) |
| | | YOUR |
| | WILD | (1 SECOND PAUSE) |
| | | SAY IT |
| | | (2 SECOND PAUSE) |
| | | WILD |
| | LOVE | (1 SECOND PAUSE) |
| | | SAY IT |
| | | (2 SECOND PAUSE) |
| | | LOVE |
| | BUSH | (1 SECOND PAUSE) |
| REPEAT } IGNORED | | SAY IT |
| REPEAT } IGNORED | | (2 SECOND PAUSE) |
| REPEAT } IGNORED | | BUSH |
| REPEAT } IGNORED | EARN | (1 SECOND PAUSE) |
| | | SAY IT |
| | | (2 SECOND PAUSE) |
| | | EARN |
| | — | SPELL MANY |
| M | M- | M |
| A | MA- | A |
| N | MAN- | N |
| Y | MANY- | Y |
| ENTER | MANY | YOU ARE CORRECT, |
| | — | NOW SPELL EARN |

THE LEARNING AID CONTINUES THROUGH THE REMAINING 9 WORDS AS IN THE SPELLING MODE.

TABLE III

IN THE WORD GUESSER MODE THE LEARNING AID RANDOMLY SELECTS A WORD FROM LEVEL C OR D AND DISPLAYS DASHES TO REPRESENT THE NUMBER OF LETTERS IN THE CHOSEN WORD.
THE USER TRIES TO GUESS THE WORD.
THE USER MUST COMPLETE THE WORD BEFORE MAKING SEVEN INCORRECT GUESSES.
THE FOLLOWING IS AN EXAMPLE OF THE FUNCTION OF THE LEARNING AID IN THE SPELLING MODE.

| KEY | DISPLAY | SPEAKER |
|---|---|---|
| HANGMAN | ——————— | 4 TONES |
| A | ——————— | |
| E | E E——E | 4 TONES |
| I | E E——E | |
| O | E E—O—E | 4 TONES |
| U | E E—O—E | |
| B | E E—O—E | |
| C | E E—O—E | |
| D | E E—O—E | |
| F | E E—O—E | |
| | EVERYONE | 4 TONES, I WIN |
| | ——————— | |
| A | ——————— | |
| E | ————E | 4 TONES |
| I | ————E | |
| O | —O——E | 4 TONES |
| U | —OU—E | 4 TONES |
| B | —OU—E | |
| C | COU—E | 4 TONES |
| R | COUR–E | 4 TONES |
| S | COURSE | 4 TONES |
| | COURSE | 4 TONES, YOU WIN |

TABLE IV

The synthesizer 10 includes interpolation logics to accomplish a nearly linear interpolation of all twelve speech parameters at eight points within each frame, that is, once each 2.5 msec. The parameters are interpolated one at a time as selected by the parameter counter. The interpolation logics calculate a new value of a parameter from its present value (i.e. the value currently stored in the K-stack, pitch register or E-10 loop) and the target value stored in encoded form in RAM 203 (and decoded by ROM 202). The value computed by each interpolation is listed below.

Where $P_i$ is the present value of the parameter,
$P_{i+1}$ is the new parameter value
$P_t$ is the target value
$N_i$ is an integer determined by the interpolation counter The values of $N_i$ for specific interpolation counts and the values $\frac{P_i - P_o}{P_t - P_o}$ ($P_o$ is initial parameter value) are as follows:

| INTERPOLATION COUNT | $N_i$ | $\frac{P_i - P_o}{P_t - P_o}$ |
|---|---|---|
| 1 | 8 | 0.125 |
| 2 | 8 | 0.234 |
| 3 | 8 | 0.330 |
| 4 | 4 | 0.498 |
| 5 | 4 | 0.623 |
| 6 | 2 | 0.717 |
| 7 | 2 | 0.859 |
| 0 | 1 | 1.000 |

TABLE V

"HELP"

```
0000
0100000000100110111010010111                                   }
0111000001                                                     }
1101100100100001010010000110011110001010100101010              }
1101100111                                                     }
1110100111                                                     }
1101101000011010111110101010010111100010010110 1               }
1101101000011100101110001100110110000100100011101              } HEL
1101100110100010101001101001111110110101010000110              }
1011100101                                                     }
1010100100011010011110001100111101110010001010110              }
1001100001                                                     }
1001011101                                                     }
1000011011                                                     }
0010011100001010010111011001111001010111001011011              }

0000
0000
0000
0111000000010100010111011 1000                                 }
0111000000010001010111011 0110                                 } P
0101000001                                                     }
0011000000010011001111010 0110                                 }
0010000000010010001011011 0101                                 }
0000
1111
```

ENERGY, PITCH, REPEAT, $K_1$, $K_2$, $K_3$, $K_4$, $K_5$, $K_6$, $K_7$, $K_8$, $K_9$, $K_{10}$

TABLE VI

| CODE | E | P | K1 | K2 | K3 | K4 | K5 | K6 | K7 | K8 | K9 | K10 |
|---|---|---|---|---|---|---|---|---|---|---|---|---|
| | | | | DECODED PARAMETERS | | | | | | | | |
| 00 | 000 | 000 | 208 | 2A3 | 273 | 28F | 2C1 | 2DE | 2DD | 326 | 31F | 34D |
| 01 | 000 | 029 | 20F | 288 | 293 | 2B2 | 2E2 | 304 | 300 | 37B | 363 | 386 |
| 02 | 001 | 02B | 213 | 2CF | 2B9 | 2D8 | 306 | 32F | 328 | 3DA | 3AE | 3C3 |
| 03 | 001 | 02D | 218 | 2F8 | 2F6 | 30H | 32D | 35D | 352 | 038 | 3FD | 001 |
| 04 | 002 | 02F | 229 | 304 | 31B | 341 | 358 | 38E | 380 | 098 | 04C | 03E |
| 05 | 003 | 031 | 229 | 321 | 356 | 37D | 386 | 3C2 | 3H0 | 0FB | 097 | 07B |
| 06 | 005 | 033 | 234 | 340 | 398 | 3BD | 3B6 | 3F7 | 3E1 | 131 | 0DC | 0B3 |

TABLE VI-continued

| CODE | E | P | K1 | K2 | K3 | K4 | K5 | K6 | K7 | K8 | K9 | K10 |
|---|---|---|---|---|---|---|---|---|---|---|---|---|
| | | | | DECODED PARAMETERS | | | | | | | | |
| 07 | 007 | 035 | 242 | 362 | 3DC | 3FF | 3E7 | 02C | 013 | 169 | 118 | OF7 |
| 08 | 00A | 037 | 255 | 384 | 023 | 040 | 018 | 061 | 045 | | | |
| 09 | 00F | 03A | 26B | 3A8 | 068 | 080 | 049 | 093 | 075 | | | |
| 0A | 015 | 03C | 286 | 3CD | 0A9 | 0BC | 079 | 0C2 | 0A3 | | | |
| 0B | 01F | 03F | 2A8 | 3F2 | 0E4 | 0F3 | 0A7 | 0FF | 0CE | | | |
| 0C | 02B | 042 | 20B | 017 | 119 | 123 | 0D2 | 116 | 0F6 | | | |
| 0D | 03D | 046 | 2FD | 03C | 146 | 14C | 0F9 | 139 | 118 | | | |
| 0E | 056 | 049 | 332 | 061 | 16C | 16F | 11D | 158 | 13C | | | |
| 0F | 000 | 04C | 36C | 085 | 18C | 18D | 13E | 173 | 159 | | | |
| 10 | | 04F | 3AA | 0A7 | | | | | | | | |
| 11 | | 053 | 3FB | 0D7 | | | | | | | | |
| 12 | | 057 | 02D | 0E6 | | | | | | | | |
| 13 | | 05A | 06E | 103 | | | | | | | | |
| 14 | | 05E | 0A8 | 11E | | | | | | | | |
| 15 | | 063 | 083 | 136 | | | | | | | | |
| 16 | | 067 | 115 | 14D | | | | | | | | |
| 17 | | 068 | 140 | 162 | | | | | | | | |
| 18 | | 070 | 165 | 174 | | | | | | | | |
| 19 | | 076 | 184 | 185 | | | | | | | | |
| 1A | | 078 | 19D | 194 | | | | | | | | |
| 1B | | 081 | 1B2 | 1A1 | | | | | | | | |
| 1C | | 086 | 1C3 | 1AD | | | | | | | | |
| 1D | | 08C | 1D0 | 1B7 | | | | | | | | |
| 1E | | 093 | 1DA | 1C1 | | | | | | | | |
| 1F | | 099 | 1E2 | 1FA | | | | | | | | |

TABLE VII

| K-STACK OUTPUT | | DATA OUTPUTTED FROM K-STACK 302 TO RECODING LOGIC 301 BY TIME PERIODS TIME PERIODS | | | | | | | | | | | | | | | | | | | |
|---|---|---|---|---|---|---|---|---|---|---|---|---|---|---|---|---|---|---|---|---|---|
| BIT | LINE | T8 | T9 | T10 | T11 | T12 | T13 | T14 | T15 | T16 | T17 | T18 | T19 | T20 | T21 | T22 | T23 | T24 | T25 | T26 | T27 |
| LSB | 32-1 | $K_2$ | $K_1$ | A | $K_9$ | $K_8$ | $K_7$ | $K_6$ | $K_5$ | $K_4$ | $K_3$ | $K_2$ | $K_1$ | $K_{10}$ | $K_9$ | $K_8$ | $K_7$ | $K_6$ | $K_5$ | $K_4$ | $K_3$ |
| | 32-2 | $K_2$ | $K_1$ | A | $K_9$ | $K_8$ | $K_7$ | $K_6$ | $K_5$ | $K_4$ | $K_3$ | $K_2$ | $K_1$ | $K_{10}$ | $K_9$ | $K_8$ | $K_7$ | $K_6$ | $K_5$ | $K_4$ | $K_3$ |
| | 32-3 | $K_2$ | $K_1$ | A | $K_9$ | $K_8$ | $K_7$ | $K_6$ | $K_5$ | $K_4$ | $K_3$ | $K_2$ | $K_1$ | $K_{10}$ | $K_9$ | $K_8$ | $K_7$ | $K_6$ | $K_5$ | $K_4$ | $K_3$ |
| | 32-4 | $K_2$ | $K_1$ | A | $K_9$ | $K_8$ | $K_7$ | $K_6$ | $K_5$ | $K_4$ | $K_3$ | $K_2$ | $K_1$ | $K_{10}$ | $K_9$ | $K_8$ | $K_7$ | $K_6$ | $K_5$ | $K_4$ | $K_3$ |
| | 32-5 | $K_3$ | $K_2$ | $K_1$ | $A$ | $K_9$ | $K_8$ | $K_7$ | $K_6$ | $K_5$ | $K_4$ | $K_3$ | $K_2$ | $K_1$ | $K_{10}$ | $K_9$ | $K_8$ | $K_7$ | $K_6$ | $K_5$ | $K_4$ |
| | 32-6 | $K_3$ | $K_2$ | $K_1$ | $A$ | $K_9$ | $K_8$ | $K_7$ | $K_6$ | $K_5$ | $K_4$ | $K_3$ | $K_2$ | $K_1$ | $K_{10}$ | $K_9$ | $K_8$ | $K_7$ | $K_6$ | $K_5$ | $K_4$ |
| | 32-7 | $K_4$ | $K_3$ | $K_2$ | $K_1$ | A | $K_9$ | $K_8$ | $K_7$ | $K_6$ | $K_5$ | $K_4$ | $K_3$ | $K_2$ | $K_1$ | $K_{10}$ | $K_9$ | $K_8$ | $K_7$ | $K_6$ | $K_5$ |
| | 32-8 | $K_4$ | $K_3$ | $K_2$ | $K_1$ | A | $K_9$ | $K_8$ | $K_7$ | $K_6$ | $K_5$ | $K_4$ | $K_3$ | $K_2$ | $K_1$ | $K_{10}$ | $K_9$ | $K_8$ | $K_7$ | $K_6$ | $K_5$ |
| | 32-9 | $K_5$ | $K_4$ | $K_3$ | $K_2$ | $K_1$ | A | $K_9$ | $K_8$ | $K_7$ | $K_6$ | $K_5$ | $K_4$ | $K_3$ | $K_2$ | $K_1$ | $K_{10}$ | $K_9$ | $K_8$ | $K_7$ | $K_6$ |
| MSB | 32-10 | $K_5$ | $K_4$ | $K_3$ | $K_2$ | $K_1$ | A | $K_9$ | $K_8$ | $K_7$ | $K_6$ | $K_5$ | $K_4$ | $K_3$ | $K_2$ | $K_1$ | $K_{10}$ | $K_9$ | $K_8$ | $K_7$ | $K_6$ |

TABLE VIII

| ADDRESS | CHIRP ROM CONTENTS CHIRP FUNCTION VALUE | STORED VALUE (COMPLEMENTED) |
|---|---|---|
| 00 | 00 | FF |
| 01 | 2A | D5 |
| 02 | D4 | 2B |
| 03 | 32 | CD |
| 04 | B2 | 4D |
| 05 | 12 | ED |
| 06 | 25 | DA |
| 07 | 14 | EB |
| 08 | 02 | FD |
| 09 | E1 | 1E |
| 10 | C5 | 3A |
| 11 | 02 | FD |
| 12 | 5F | A0 |
| 13 | 5A | A5 |
| 14 | 05 | FA |
| 15 | OF | FO |
| 16 | 26 | D9 |
| 17 | FC | 03 |
| 18 | A5 | 5A |
| 19 | A5 | 5A |
| 20 | D6 | 29 |
| 21 | DD | 22 |
| 22 | DC | 23 |
| 23 | FC | 03 |
| 24 | 25 | DA |
| 25 | 2B | D4 |
| 26 | 22 | DD |
| 27 | 21 | DE |

TABLE VIII-continued

| ADDRESS | CHIRP ROM CONTENTS CHIRP FUNCTION VALUE | STORED VALUE (COMPLEMENTED) |
|---|---|---|
| 28 | 0F | F0 |
| 29 | FF | 00 |
| 30 | F8 | 07 |
| 31 | EE | 11 |
| 32 | ED | 12 |
| 33 | EF | 10 |
| 34 | F7 | 08 |
| 35 | F6 | 09 |
| 36 | FA | 05 |
| 37 | 00 | FF |
| 38 | 03 | FC |
| 39 | 02 | FD |
| 40 | 01 | FE |

TABLE IX-0 LEARNING AID INSTRUCTION SET

| Address | Instruction | Branch Line | Line | Name | Title | | Comments |
|---|---|---|---|---|---|---|---|
| 0000 | [illegible] | | 0055 | KD5 | TAMZA | | ADD 5 TO KEY |
| 0001 | [illegible] | | 0056 | | ACACC | 6 | CODE EACH TIME |
| 0003 | [illegible] | | 0057 | | TCY | 14 | R-LINE POINTER IS DECREMENTED |
| 0007 | [illegible] | 0112 | 0058 | | CALL | ADDCARRY | |
| 000F | [illegible] | [illegible] | 0059 | | BRANCH | KD2 | |
| 001F | [illegible] | | 0060 | KEYDOWN | TCMIY | 0 | RESET DEBOUNCE COUNTER |
| 003F | [illegible] | | 0061 | | LDX | 1 | |
| 007F | [illegible] | | 0062 | | TCY | 14 | |
| 007E | [illegible] | | 0063 | | TAM | | |
| 007D | [illegible] | | 0064 | | MNEZ | | DOUBLE CHECK KEY DOWN |
| 007A | [illegible] | 0069 | 0065 | | BRANCH | KD1 | |
| 0077 | [illegible] | | 0066 | | LDX | 0 | |
| 006F | [illegible] | 0134 | 0067 | | BRANCH | CAR3 | KEY NOT DOWN |
| 005F | [illegible] | | 0068 | KD1 | LDX | 1 | |
| 003E | [illegible] | | 0069 | | TCMIY | 0 | |
| 007C | [illegible] | | 0070 | | TCMIY | 0 | |
| 0073 | [illegible] | | 0071 | | TCY | 13 | |
| 0078 | [illegible] | | 0072 | | TMY | | |
| 0067 | [illegible] | | 0073 | | RSTR | | RESET PRESENT R-LINE |
| 004F | [illegible] | | 0074 | | TCY | 13 | |
| 001E | [illegible] | | 0075 | | CLA | | |
| 003D | [illegible] | | 0076 | | ACACC | 6 | PUT 6 IN ACC |
| 007A | [illegible] | | 0077 | | KNEZ | | SEE IF KEY IS ON VSS |
| 0075 | [illegible] | 0068 | 0078 | | BRANCH | KD2 | VSS |
| 006B | [illegible] | | 0079 | | TMA | | |
| 0057 | [illegible] | | 0080 | KD2 | TAM | | * STORE 6 IF K=VSS |
| 002E | [illegible] | | 0081 | | TCY | 13 | |
| 005C | [illegible] | | 0082 | | DMAN | | |
| 0039 | [illegible] | 0055 | 0083 | | BRANCH | KD3 | |
| 0079 | [illegible] | | 0084 | SUMSIT | LDX | ONE | * BUMP ROUTINE TO CALCUL VALUE OF KP |
| 0061 | [illegible] | | 0085 | | TCY | VALUE | ** |
| 0043 | [illegible] | | 0086 | | TMA | | ** |
| 0006 | [illegible] | | 0087 | | ALEC | 2 | |
| 000D | [illegible] | 0096 | 0088 | | BRANCH | ARND+5 | |
| 001A | [illegible] | | 0089 | | ACACC | 15 | |
| 0037 | [illegible] | | 0090 | | ALEC | 3 | |
| 006E | [illegible] | 0096 | 0091 | | BRANCH | ARND+5 | |
| 005D | [illegible] | | 0092 | | ACACC | 13 | |
| 003A | [illegible] | | 0093 | | ALEC | 4 | |
| 0074 | [illegible] | 0096 | 0094 | | BRANCH | ARND+5 | |

TABLE IX-0 (Continued)

```
0069  01110101         0095            ACACC      10                      **
0053  01111111         0096  ARND+5    ACACC      MINUS1                  **
0026  01001000         0097            LDX        ZERO                    **
004C  01000111         0098            TCY        VALUE
0014  11111000   0112  0099            CALL       ADDCARRY
0031  01001111         0100  EVLBOUT   BL         KEYBEVL
0062  10001110   2282  0101
                       0102  * THIS ROUTINE USES ,CARRY, TO INCREMENT THE RANDOM NUMBER/TIMEOUT COUNTER
0045  01000011         0103  TIMEUP    TCY        12
001A  00001110         0104            KNEZ
0015  10011101   0128  0105            BRANCH     CAR2
0029  01001110         0106  TIMEUP1   LDX        3
0056  01000001         0107            TCY        8
002C  10000010   0116  0108            BRANCH     CARRYON
                       0109  *
                       0110  *   CARRY:  FOR ADDITION IN ROM ADDR SECTION OF RAM
                       0111  *
0058  00100101         0112  ADDCARRY  AMAAC
0030  10100001   0115  0113            BRANCH     CARRY
0060  10001011   0116  0114            BRANCH     NOCARRY
0041  00101101         0115  CARRY     TAMIYC                             CARRY
0002  00011010         0116  CARRYON   IMAC                               INCREMENT MEM IF CARRY
0005  10100001   0115  0117            BRANCH     CARRY
0003  00101111         0118  NOCARRY   TAM
0017  01011111         0119            RETN
002F  01000011         0120            TCY        12
005E  00101001         0121            TMA
003C  01110110         0122            ALEC       3                       CHECK TIMEOUT COUNTER
0078  10100111   0126  0123            BRANCH     CAR1
0071  01001011         0124  OFF       TCY        13
0063  00011110         0125            RSTR                               TURNS OFF CALCULATOR
0047  01001000         0126  CAR1      LDX        0
000E  10011110   0133  0127            BRANCH CAR3
0019  00101001         0128  CAR2      TMA
003A  01000101         0129  CAR4      TCY        10
0076  00010011         0130            TBIT1      3                       TEST DEBOUNCE COUNTER
006D  10111001   0135  0131            BRANCH     CAR5                    ACCEPT KEY IF COUNTER>7
0054  01100000         0132            TCMIY      0                       RESET DEBOUNCE COUNTER
0036  01001111         0133  CAR3      BL         DISP/KB1
006C  10111010   2245  0134
0059  01111011         0135  CAR5      ALEC       13                      *TEST TO SEE IF SPEECH IS
0032  10011110   0133  0136            BRANCH     CAR3                    *FINISHED (TEST TALK COUNTER=14)
0064  10001111   0060  0137            BRANCH     KEYDOWN
                       0138  *
```

TABLE IX-0 (Continued)

| | | | | | | | |
|---|---|---|---|---|---|---|---|
| | | | 0139 | * | | | |
| | | | 0140 | * | | | |
| | | | 0141 | * | | | |
| 0049 | 010010001 | | 0142 | GAME#3 | LDX | [illegible] | |
| 0012 | 001001110 | | 0143 | | TCY | 7 | |
| 0025 | 000101001 | | 0144 | | TMA | | |
| 004A | 011100111 | | 0145 | | ALEC | 6 | |
| 0014 | 101010010 | 0148 | 0146 | | BRANCH | FIRST | |
| 0023 | 100100001 | 0152 | 0147 | | BRANCH | GM3A | |
| 0052 | 001101110 | | 0148 | FIRST | TCMIY | 7 | |
| 0024 | 010100010 | | 0149 | | SBIT | 1 | |
| 0048 | 010001000 | | 0150 | | CALLL | CLEAR | |
| 0010 | 110111010 | 0236 | 0151 | | | | |
| 0021 | 010001010 | | 0152 | GM3A | CALLL | CURLEVL | |
| 0042 | 111101111 | 0769 | 0153 | | | | |
| 0041 | 001100000 | | 0154 | | TCMIY | 0 | |
| 0009 | 001100001 | | 0155 | | TCMIY | 8 | * TO 006C; 008C-008D |
| | | | 0156 | * | | | * CONTAIN ADDRESS FOR |
| | | | 0157 | * | | | * RANDOM LETTER TABLE |
| 0013 | 010000101 | | 0158 | | CALLL | MEMADDR | ADDRESS 0350 |
| 0027 | 111011000 | 1501 | 0159 | | | | |
| 004E | 010001110 | | 0160 | | CALLL | LOADRESS | * LOAD DATA FROM 0350 INTO |
| 001C | 111000010 | 1121 | 0161 | | | | |
| | | | 0162 | * | | | * ROM ADDRESS LOCATION |
| 0039 | 010011100 | | 0163 | | LDX | 3 | |
| 0072 | 001001001 | | 0164 | | TCY | 9 | |
| 0065 | 010100111 | | 0165 | | RBIT | 3 | |
| 004B | 000101001 | | 0166 | | TMA | | |
| 0016 | 010011000 | | 0167 | | LDX | 1 | * ADD |
| 0020 | 001001101 | | 0168 | | TCY | 11 | * TO |
| 005A | 111011000 | 0112 | 0169 | | CALL | ADDCARRY | * ROM ADDRESS |
| 0034 | 010011100 | | 0170 | | LDX | 3 | GET LSD OF RANDOM NUMBER |
| 0068 | 001000001 | | 0171 | | TCY | 8 | GET MSD OF RANDOM NUMBER |
| 0051 | 000101001 | | 0172 | | TMA | | |
| 0022 | 010011000 | | 0173 | | LDX | 1 | |
| 0044 | 001000101 | | 0174 | | TCY | 10 | |
| 0008 | 111011000 | 0112 | 0175 | | CALL | ADDCARRY | * ADD TO ROM ADDRESS |
| 0011 | 010000101 | | 0176 | | CALLL | MEMADDR | LOAD ADDRESS TO 0350 |
| 0023 | 111011000 | 1501 | 0177 | | | | |
| 0046 | 010001110 | | 0178 | | CALLL | OUTADDR2 | GET LSD OF RANDOM LETTER |
| 000C | 111000001 | 1063 | 0179 | | | | |
| 0019 | 010010000 | | 0180 | | LDX | 0 | |
| 0033 | 001000111 | | 0181 | | TCY | 14 | |

TABLE IX-0 (Continued)

```
0000  001011111        0182           TAM
0040  010001110        0183           CALLL   OUTAD042    GET MSD OF RANDOM LETTER
001A  111000001  1083  0184
0035  110010000        0185           LDX     0           * STORE
006A  001001111        0186           TCY     15          * LIKE A
0055  000101111        0187           TAM                 * KEYPRESS
002A  010010100        0188           LDX     2
0054  001110000        0189           TCMIY   0
0028  010001011        0190           BL      TRANSFER    ** SAYS LETTER AND
0050  101111111  1875  0191                               ** PUTS IT IS DISPLAY
                       0192   *
```

TABLE IX-1

```
                       0193           ORGPG   1
0000  000101101        0194 NOTFULL   TAMIYC
0001  001101000        0195           TCMIY   1
0003  001000111        0196           TCY     14
0007  000101001        0197           TMA
000F  001001101        0198           TCY     11
001F  000101010        0199           TMY
003F  010011000        0200           LDX     1
007F  000101101        0201           TAMIYC
007E  001100011        0202           TCMIY   12
007C  010010000        0203           LDX     0
0078  001001111        0204           TCY     NXT$DSP     **
0077  000110010        0205           IMAC                **
006F  000101111        0206           TAM                 **
005F  010000010        0207           BL      NOSTRANS    **
003E  100111100  0660  0208
                       0209   *
                       0210   *  GO ROUTINE--> DECIDES WHICH MODE YOUR IN AND BRANCHES
                       0211   *     TO THAT MODE, ELSE GOES TO DISP/KB.
                       0212   *
```

TABLE IX-1 (Continued)

| | | | | | | | |
|---|---|---|---|---|---|---|---|
| 0070 | 01001010 | | 0213 | GO | BL | RANDOM | |
| 0079 | 10000000 | 0753 | 0214 | | | | |
| 0073 | 01001001 | | 0215 | RANRTN | LDX | 8 | RAM |
| 0067 | 00100110 | | 0216 | | TCY | 6 | |
| 004F | 01010110 | | 0217 | | RBIT | 1 | |
| 001E | 00100001 | | 0218 | | TCY | 8 | SET GO MODE FLAG |
| 0030 | 01010010 | | 0219 | | SBIT | 1 | * |
| 007A | 00101110 | | 0220 | | TCY | 7 | TEST WHICH MODE |
| 0075 | 00101001 | | 0221 | | TMA | | |
| 006B | 01001010 | | 0222 | | LDX | 5 | |
| 0057 | 00100011 | | 0223 | | TCY | 13 | |
| 002E | 00110000 | | 0224 | | TCMIY | 0 | |
| 005C | 01001101 | | 0225 | | CALLL | CORR$SPL | |
| 0038 | 11000000 | 1582 | 0226 | | | | |
| 0070 | 01000110 | | 0227 | | LDP | 2 | |
| 0061 | 01110010 | | 0228 | | ALEC | 1 | SPELL? |
| 0043 | 10000010 | 0342 | 0229 | | BRANCH | USPELL | * |
| 0006 | 01000001 | | 0230 | | LDP | 8 | * |
| 000E | 01110100 | | 0231 | | ALEC | 3 | LEARN? |
| 001A | 10110001 | 1209 | 0232 | | BRANCH | ULRN+1 | |
| 0037 | 01001101 | | 0233 | | LDP | 11 | |
| 006E | 01110010 | | 0234 | | ALEC | 5 | GAME#1? |
| 005D | 10111110 | 1590 | 0235 | | BRANCH | CORR+1 | |
| 003A | 00100000 | | 0236 | CLEAR | TCY | 0 | |
| 0074 | 01010000 | | 0237 | HERE | LDX | 0 | |
| 0069 | 00110100 | | 0238 | | TCMIY | 1 | |
| 0053 | 00000100 | | 0239 | | DYN | | |
| 0026 | 01001100 | | 0240 | | LDX | 1 | |
| 004C | 00110101 | | 0241 | | TCMIY | 11 | |
| 0018 | 00101001 | | 0242 | | YNEC | 8 | |
| 0031 | 11111100 | 0237 | 0243 | | BRANCH | HERE | |
| 0062 | 00100000 | | 0244 | | TCY | 0 | |
| 0045 | 00110011 | | 0245 | | TCMIY | 12 | |
| 000A | 01001000 | | 0246 | | LDX | 0 | |
| 0015 | 00100101 | | 0247 | | TCY | 11 | |
| 0028 | 00110000 | | 0248 | | TCMIY | 0 | |
| 0056 | 01011111 | | 0249 | | RETN | | |
| 002C | 10111011 | 0215 | 0250 | REPLAY | BRANCH | RANRTN | |
| | | | 0251 | * | | | |
| | | | 0252 | * ENTER= ROUTINE TO PROCESS ENTER KEY DEPRESS | | | |
| | | | 0253 | * | | | |
| 0058 | 01001001 | | 0254 | ENTER | LDX | 8 | RAM |
| 0030 | 00101110 | | 0255 | | TCY | 7 | FLAG |

TABLE IX-1 (Continued)

| | | | | | | | |
|---|---|---|---|---|---|---|---|
| 0060 | 00111011 | | 0256 | | MNEZ | | SPELL MODE? |
| 0041 | 10000101 | 0259 | 0257 | | BRANCH | TST4A3 | NO |
| 0002 | 10100011 | 0273 | 0258 | | BRANCH | SPACE-3 | |
| 0005 | 00101010 | | 0259 | TST4A3 | TMY | | |
| 000B | 01011100 | | 0260 | | YNEC | 3 | SPELL IT MODE? |
| 0017 | 10011111 | 0263 | 0261 | | BRANCH | TST4A6 | NO |
| 002F | 10100011 | 0273 | 0262 | | BRANCH | SPACE-3 | |
| 005F | 01010110 | | 0263 | TST4A6 | YNEC | 6 | GAME 2 MODE? |
| 003E | 10100011 | 0273 | 0264 | | BRANCH | SPACE-3 | |
| 007D | 01000110 | | 0265 | | BL | CRYPTO | |
| 0071 | 10000000 | 0894 | 0266 | | | | |
| | | | 0267 | * | | | |
| | | | 0268 | * TEST FOR CURSER POSITION | | | |
| | | | 0269 | * FIRST POSITION? ---RETURN | | | |
| | | | 0270 | * ELSE, REPLACE CURSER WITH SPACE | | | |
| | | | 0271 | * | | | |
| | | | 0272 | * TEST FOR POSITION OF CURSER AND REPLACE WITH SPACE | | | |
| 0063 | 01001110 | | 0273 | SPACE-3 | TCY | 7 | LAST CHAR |
| 0047 | 01001100 | | 0274 | | LDX | 1 | |
| 000E | 00000110 | | 0275 | SPACE-2 | CLA | | ACC=8 |
| 001D | 01111101 | | 0276 | | ACACC | 11 | 1B=SPACE |
| 003B | 00001001 | | 0277 | | MNEA | | MEM=11? |
| 0076 | 10011001 | 0283 | 0278 | | BRANCH | CHAROR+ | NO |
| 006D | 01001000 | | 0279 | | LDX | 0 | YES |
| 005B | 00111011 | | 0280 | | MNEZ | | BLANK? |
| 0036 | 10010001 | 0296 | 0281 | | BRANCH | SPACE-1 | YES, GO TO SPACE-1 |
| 006C | 10100100 | 0293 | 0282 | | BRANCH | CHAR | ELSE, CHAR |
| 0059 | 01001100 | | 0283 | CHAROR+ | LDX | 1 | |
| 0032 | 01111000 | | 0284 | | ACACC | 1 | ACC=12 FOR CURSER |
| 0064 | 00001001 | | 0285 | | MNEA | | |
| 0049 | 10100100 | 0293 | 0286 | | BRANCH | CHAR | CHAR |
| 0012 | 01001000 | | 0287 | | LDX | 0 | TEST MSW |
| 0025 | 00111011 | | 0288 | | MNEZ | | CURSER |
| 004A | 10101001 | 0291 | 0289 | | BRANCH | CUR-1 | YES |
| 0014 | 10100100 | 0293 | 0290 | | BRANCH | CHAR | NO, THEN CHAR |
| 0029 | 01001100 | | 0291 | CUR-1 | LDX | 1 | LSW |
| 0052 | 01101101 | | 0292 | | TCMIY | 11 | |
| 0024 | 01111111 | | 0293 | CHAR | RETN | | |
| 004B | 01000010 | | 0294 | | BL | SPLENTER | GO TO SPELL ROUTINE |

TABLE IX-1 (Continued)

| | | | | | | | |
|---|---|---|---|---|---|---|---|
| 0018 | 101010111 | 0373 | 0295 | | | | |
| 0021 | 000000100 | | 0296 | SPACE-1 | LY: | | SEARCH FOR CURSER |
| 0042 | 010011000 | | 0297 | | LDX | 1 | * |
| 0001 | 100011110 | 0275 | 0298 | | BRANCH | SPACE-2 | * |
| | | | 0299 | * | | | |
| | | | 0300 | * | | | |
| | | | 0301 | * NOPHRASE LCADS ROM ADDR WITH SECOND WRONG RESPONSE | | | |
| | | | 0302 | * THEN CONTINUES TO NEXT WORD | | | |
| | | | 0303 | * | | | |
| 0009 | 010011100 | | 0304 | NOPHRASE | LDX | 3 | FLAG |
| 0013 | 001001011 | | 0305 | | TCY | 13 | * |
| 0027 | 001101100 | | 0306 | | TCMIY | 3 | |
| 004E | 010001010 | | 0307 | | CALLL | CURLEVL | |
| 001C | 111101111 | 0769 | 0308 | | | | |
| 0039 | 001100100 | | 0309 | | TCMIY | 2 | |
| 0072 | 001100110 | | 0310 | | TCMIY | 6 | |
| 0065 | 010000101 | | 0311 | SPK4 | CALLL | MEMADDR | |
| 004B | 111011000 | 1501 | 0312 | | | | |
| 0016 | 010001110 | | 0313 | | CALLL | LOADRESS | |
| 0020 | 111000010 | 1121 | 0314 | | | | |
| 005A | 010000101 | | 0315 | | CALLL | MEMADDR | |
| 0034 | 111011000 | 1501 | 0316 | | | | |
| 0066 | 010000011 | | 0317 | | BL | LNKSET | ALWAYS BRANCH |
| 0051 | 100111000 | 1751 | 0318 | | | | |
| 0022 | 010010100 | | 0319 | F-SCORE | LDX | 2 | RETNXBCH FLAG |
| 0044 | 001000111 | | 0320 | | TCY | 14 | |
| 000F | 001101000 | | 0321 | | TCMIY | 1 | |
| 0011 | 001100000 | | 0322 | | TCMIY | 0 | * |
| 0023 | 010001010 | | 0323 | | CALLL | CURLEVL | ZERO ROM ADDR |
| 0046 | 111101111 | 0769 | 0324 | | | | |
| 000C | 010000110 | | 0325 | | LDP | 6 | |
| 0019 | 011101001 | | 0326 | | ALEC | 9 | 10 CORRECT????? |
| 0033 | 100101111 | 0955 | 0327 | | BRANCH | F2 | NO. |
| 0060 | 010010000 | | 0328 | | LDX | 0 | |
| 0040 | 001000100 | | 0329 | | TCY | 2 | |
| 001A | 001100100 | | 0330 | | TCMIY | 2 | |
| 0035 | 010011000 | | 0331 | | LDX | 1 | ELCE-------- |
| 006A | 001001100 | | 0332 | | TCY | 1 | |
| 0055 | 001101000 | | 0333 | | TCMIY | 1 | |
| 002A | 001100000 | | 0334 | | TCMIY | 0 | |
| 0054 | 010010100 | | 0335 | | LDX | 2 | |
| 0028 | 001000111 | | 0336 | | TCY | 14 | |
| 0050 | 000110110 | | 0337 | | IMAC | | |
| 0020 | 010001101 | | 0338 | | BL | TONE22 | |
| 0043 | 101100111 | 1456 | 0339 | | | | |

TABLE IX-2

```
                           0340          ORGPG     2
                           0341  *
0000  01011010             0342  USPELL  COMXA                      ADDRESS DAM
0001  00100010             0343          TCY       4
0003  00110000             0344          TCMIY     0
0007  01000100             0345  USPELL+1 CALLL    CLEAR            * BLANK DISPLAY - INPUT CURSER
000F  11011101       0236  0346
                           0347  *  LOAD PHRASE INTO ROM ADDRESS REG
001F  01000101             0348  DISSPELL CALLL    CURLEVL
003F  11110111       0769  0349
007F  00110010             0350          TCMIY     4
007E  00110110             0351          TCMIY     6
007D  01011010             0352  ADDCTR  COMXA                      ADDRESS DAM
007B  00100010             0353          TCY       4                PHRASE COUNTER-->ACC
0077  00101001             0354          TMA                        *
006F  01001100             0355          LDX       1
005F  00100101             0356          TCY       10
003E  01011111             0357          RETN
007C  01000000             0358          CALLL     ADDCARRY
0079  11101100       0112  0359
                           0360  *  SET UP WORD ADDRESS IN LNK/EOT
0073  01001010             0361          LDX       2
0067  00101111             0362          TCY       15
004F  00110101             0363          TCMIY     9
001F  01000101             0364          CALLL     MEMADDR
003D  11101100       1501  0365
007A  01001110             0366          CALLL     LOADRESS
0075  11100010       1121  0367
006B  10101011       0423  0368          BRANCH    WBIT3
                           0369  *
                           0370  *  SPLENTER- BEGINS BY COMPARING CORRECT SPELLING BUFFER
                           0371  *          TO DISPLAY BUFFER
                           0372  *
0057  00100000             0373  SPLENTER TCY      0                FIRST LETTER--LSW
002E  01001110             0374  SPLNTR+1 LDX      3                *
005C  00010101             0375          TMA
0038  01001100             0376          LDX       1                DISPLAY BUFFER
0070  00000101             0377          MNEA                       SAME?
0061  10110110       0425  0378          BRANCH    MISS1
0043  01001010             0379          LDX       2                YES, TEST MSW
0006  00000110             0380          CLA
0000  00010000             0381          TBIT      0
```

TABLE IX-2 (Continued)

| | | | | | | | |
|---|---|---|---|---|---|---|---|
| 0013 | 10111111 | 0384 | 0382 | | BRANCH | CONXT1 | |
| 0037 | 10111101 | 0385 | 0383 | | BRANCH | CONXT2 | |
| 006F | 00111100 | | 0384 | CONXT1 | ACACC | 1 | |
| 0057 | 01001000 | | 0385 | CONXT2 | LDX | 0 | |
| 003A | 00000001 | | 0386 | | MNEA | | SAME? |
| 0074 | 10110110 | 0425 | 0387 | | BRANCH | MISS1 | |
| 0069 | 00000110 | | 0388 | | CLA | | |
| 0053 | 01011111 | | 0389 | | RETN | | |
| 0026 | 00000101 | | 0390 | | IYC | | NEXT LETTER |
| 004C | 00110001 | | 0391 | | YNEC | 8 | |
| 0018 | 10010111 | 0370 | 0392 | | BRANCH | SPLNTR+1 | NO |
| | | | 0393 | * | SPELLING IS CORRECT | | |
| 0031 | 01011010 | | 0394 | | COMXA | | ADDRESS DAM |
| 0062 | 00100110 | | 0395 | | TCY | 6 | FLAG |
| 0045 | 00010000 | | 0396 | | TBIT | 0 | BIT 0-->0=FIRST TRY |
| 0004 | 10010011 | 0400 | 0397 | | BRANCH | NBIT | * 1-->MORE TN ONE |
| 0015 | 01010000 | | 0398 | | SBIT | 0 | |
| | | | 0399 | * | BEGIN LOADING PRAISE PHRASE | | |
| 002B | 01001100 | | 0400 | NBIT | LDX | 3 | |
| 0056 | 00101011 | | 0401 | | TCY | 13 | FLAG |
| 002C | 00110100 | | 0402 | | TCMIY | 1 | |
| 0058 | 01011010 | | 0403 | | COMXA | | |
| 0030 | 00100100 | | 0404 | | TCY | 1 | |
| 0060 | 00110000 | | 0405 | | TCMIY | 0 | |
| 0041 | 01001100 | | 0406 | | LDX | 2 | |
| 0002 | 00101111 | | 0407 | | TCY | 15 | |
| 0005 | 00110100 | | 0408 | | TCMIY | 3 | |
| 000B | 01000010 | | 0409 | | CALLL | CURLEVL | |
| 0017 | 11110111 | 0769 | 0410 | | | | |
| 002F | 00110001 | | 0411 | | TCMIY | 8 | |
| 005E | 00110100 | | 0412 | | TCMIY | 5 | |
| 003C | 11111101 | 0352 | 0413 | | CALL | ADDCTR | |
| 0078 | 01110110 | | 0414 | | ALEC | 6 | |
| 0071 | 10111110 | 0421 | 0415 | | BRANCH | NBIT2 | |
| 0063 | 01011010 | | 0416 | | COMXA | | |
| 0047 | 00100010 | | 0417 | | TCY | 4 | |
| 000E | 00110000 | | 0418 | | TCMIY | 0 | |
| 001C | 00000110 | | 0419 | | CLA | | |
| 0038 | 01011010 | | 0420 | | COMXA | | |
| 0070 | 01000000 | | 0421 | NBIT2 | LDP | 0 | |
| 0061 | 111 111 | 112 | 0422 | | CALL | ADDCARRY | |
| 0054 | 10 010 | | 0423 | NBIT3 | BL | ADDCTR6 | |
| 003E | 1 1 11001 | 0704 | 0424 | | | | |

TABLE IX-2 (Continued)

| | | | | | | | |
|---|---|---|---|---|---|---|---|
| 006C | 000000110 | | 0425 | MISS1 | CLA | | |
| 0059 | 001110011 | | 0426 | | ACACC | 12 | |
| 0032 | 010010000 | | 0427 | | LDX | 0 | |
| 0064 | 010111111 | | 0428 | | RETN | | |
| 0049 | 010000101 | | 0429 | | BL | MISSPELL | |
| 0012 | 100111001 | 1546 | 0430 | | | | |
| 0025 | 010001000 | | 0431 | F3 | CALLL | CLEAR | CLEAR DISPLAY |
| 004A | 110111010 | 0236 | 0432 | | | | |
| 0014 | 010010001 | | 0433 | | LDX | 8 | |
| 0029 | 001000001 | | 0434 | | TCY | 8 | |
| 0052 | 010100001 | | 0435 | | SBIT | 2 | |
| 0024 | 010100110 | | 0436 | | RBIT | 1 | |
| 0048 | 001001000 | | 0437 | | TCY | 1 | |
| 0010 | 010010000 | | 0438 | | LDX | 0 | |
| 0021 | 001100100 | | 0439 | | TCMIY | 2 | |
| 0042 | 001001110 | | 0440 | | TCY | 7 | |
| 0004 | 001100100 | | 0441 | | TCMIY | 2 | |
| 0009 | 010011000 | | 0442 | | LDX | 1 | |
| 0013 | 001000000 | | 0443 | | TCY | 0 | |
| 0027 | 001101011 | | 0444 | | TCMIY | 13 | |
| 004F | 001000110 | | 0445 | | TCY | 6 | |
| 001C | 001100111 | | 0446 | | TCMIY | 14 | |
| 0039 | 010011010 | | 0447 | | LDX | 5 | |
| 0072 | 001001011 | | 0448 | | TCY | 13 | |
| 0065 | 000101001 | | 0449 | | TMA | | |
| 0046 | 010011000 | | 0450 | | LDX | 1 | |
| 0016 | 001001110 | | 0451 | | TCY | 7 | |
| 0020 | 000101111 | | 0452 | | TAM | | |
| 005A | 010001110 | | 0453 | | CALLL | FL2 | |
| 0034 | 110001100 | 1145 | 0454 | | | | |
| 0068 | 010011000 | | 0455 | | LDX | 1 | |
| 0051 | 001001000 | | 0456 | | TCY | 1 | |
| 0022 | 000101111 | | 0457 | | TAM | | |
| 0044 | 010001000 | | 0458 | | BL | F-SCORE | |
| 0008 | 100100010 | 0319 | 0459 | | | | |
| | | | 0460 | * LEARN MODE BEGINS HERE | | | |
| | | | 0461 | * | | | |
| 0011 | 010010001 | | 0462 | SPELL | LDX | 6 | |
| 0023 | 001001110 | | 0463 | | TCY | 7 | |
| 0046 | 001100000 | | 0464 | | TCMIY | 0 | |
| 000C | 101001101 | 0469 | 0465 | | BRANCH | SPELL9 | |

TABLE IX-2 (Continued)

| | | | | | | |
|---|---|---|---|---|---|---|
| 0019 | 010010001 | | 0466 | LEARN | LDX | 8 |
| 0033 | 001001110 | | 0467 | | TCY | 7 |
| 0066 | 001100100 | | 0468 | | TCMIY | 2 |
| 0040 | 010001111 | | 0469 | SPELL9 | BL | DSP7 |
| 001A | 101110000 | 2188 | 0470 | | | |
| 0035 | 001111100 | | 0471 | MISS3 | ACACC | 3 |
| 006A | 000101111 | | 0472 | | TAM | |
| 0055 | 010000010 | | 0473 | | LDP | 4 |
| 002A | 011100110 | | 0474 | | ALEC | 6 |
| 0054 | 100101100 | 0680 | 0475 | | BRANCH | NOSTRANS |
| 002B | 010001100 | | 0476 | | BL | TWIN |
| 0050 | 100101100 | 0541 | 0477 | | | |

TABLE IX-3

| | | | | | | | |
|---|---|---|---|---|---|---|---|
| | | | 0478 | | ORGPG | 3 | |
| 0000 | 010010100 | | 0479 | GAME#1 | LDX | 2 | |
| 0001 | 000000110 | | 0480 | | CLA | | |
| 0003 | 001001011 | | 0481 | | TCY | 13 | |
| 0007 | 000101111 | | 0482 | | TAM | | CLEAR GUESS COUNTER |
| 000F | 010011100 | | 0483 | | LDX | 3 | |
| 001F | 001100111 | | 0484 | | TCMIY | 14 | HANGMAN FLAG |
| 003F | 001000101 | | 0485 | | TCY | 10 | |
| 007F | 000100000 | | 0486 | | TBIT | 0 | * TEST RANDOM COUNTER |
| 007E | 101111011 | 0489 | 0487 | | BRANCH | HANG2 | * BIT AND PUT 2 OR 3 |
| 007D | 001111000 | | 0488 | | ACACC | 1 | * IN ACC |
| 007B | 001110100 | | 0489 | HANG2 | ACACC | 2 | * |
| 0077 | 010011000 | | 0490 | | LDX | 1 | |
| 006F | 001001111 | | 0491 | | TCY | 15 | * STORE 2 OR 3 IN LEVEL |
| 005F | 000101111 | | 0492 | | TAM | | * OF DIFFICULTY |
| 003E | 010010001 | | 0493 | | LDX | 8 | DAM |
| 007C | 001001110 | | 0494 | | TCY | 7 | |
| 0079 | 001101010 | | 0495 | | TCMIY | 5 | SET HANGMAN MODE |
| 0073 | 010001010 | | 0496 | | BL | CURLEVL | |
| 0067 | 101101111 | 0769 | 0497 | | | | |

TABLE IX-3 (Continued)

```
                              0498   * 'RANDOM' GENERATES A RANDOM WORD,
                              0499   * PUTS IT IN THE CORRECT SPELLING
                              0500   * BUFFER AND RETURNS TO 'HANG'
004F 010001000                0501   HANG      CALLL     CLEAR          PUT BLANKS IN DISPLAY
001F 110111010      0236      0502
003D 001000001                0503             TCY       8
007A 000000100                0504   HANG3     DYN
0075 010000100                0505             CALLL     SPLNTR+1       * COMPARE DISPLAY DIGIT TO
0068 110101110      0374      0506                                      * DIGIT IN CORRECT
0057 011100000                0507             ALEC      0              * SPELLING BUFFER
002F 101111010      0504      0508             BRANCH    HANG3
                              0509   * FINDS THE FIRST DIGIT THAT IS NOT A
                              0510   * BLANK, STARTING FROM THE RIGHT SIDE;
                              0511   * THE ROUTINE BELOW THEN PUTS CURSORS IN
                              0512   * THE DIGITS CORRESPONDING TO LETTERS
005C 010011000                0513             LDX       1
0038 000101100                0514   HANG4     TAMDYN
0070 100111000      0514      0515             BRANCH    HANG4
0061 010001101                0516   SONG      BL        TONES
0043 101000111      1657      0517
                              0518   * IF THE HANGMAN FLAGS ARE SET UP, LETTER
                              0519   * KEYS GO TO 'HANG1' AFTER SPEAKING THE LETTER
                              0520   ** THIS ROUTINE COMPARES LETTER ENTERED TO CORRECT SPELLING
0006 001001011                0521   HANG1     TCY       13             * BIT 1= WORD NOT COMPLETE
000D 010010000                0522             LDX       0              * BIT 0=CORRECT LETTER
001B 001100000                0523             TCMIY     0
0037 001000001                0524             TCY       8
006E 010100011                0525   HANG5     SBIT      3              BIT IS SET AFTER EACH DIGIT IS COMPARED
0050 000000100                0526             DYN
003A 101011011      0562      0527             BRANCH    HANG6          COMPARISONS ARE COMPLETE
0074 001000001                0528             TCY       8              RESET BIT 3 IN EACH DIGIT
0069 010100111                0529   HANG10    RBIT      3
0053 000000100                0530             DYN
0026 101101001      0529      0531             BRANCH    HANG10
004C 001001011                0532             TCY       13
0018 000100000                0533             TBIT      0              WAS THE LETTER CORRECT?
0031 101100011      0555      0534             BRANCH    HANG11
0062 010010100                0535             LDX       2              NO
0045 000110010                0536             IMAC                     * ADD 1 TO INCORRECT
0004 000101111                0537             TAM                      * GUESS COUNTER
```

TABLE IX-3 (Continued)

| | | | | | | | |
|---|---|---|---|---|---|---|---|
| 0015 | 010001111 | | 0538 | | LDP | 15 | |
| 002B | 011100110 | | 0539 | | ALEC | 6 | |
| 0056 | 100101100 | 2219 | 0540 | | BRANCH | DISP/KB | |
| 002C | 010011000 | | 0541 | IWIN | LDX | 1 | |
| 0058 | 001000101 | | 0542 | | TCY | 10 | |
| 0030 | 001100000 | | 0543 | | TCMIY | 0 | |
| 0060 | 001101110 | | 0544 | | TCMIY | 7 | |
| 0041 | 001100000 | | 0545 | IWIN1 | TCMIY | 0 | |
| 0002 | 001100000 | | 0546 | | TCMIY | 0 | |
| 0005 | 001001111 | | 0547 | | TCY | 15 | |
| 0008 | 010010100 | | 0548 | | LDX | 2 | |
| 0017 | 001100000 | | 0549 | | TCMIY | 0 | |
| 002F | 010010001 | | 0550 | | LDX | 8 | CLEAR HANGMAN |
| 005E | 001000001 | | 0551 | | TCY | 8 | |
| 003C | 010100110 | | 0552 | | RBIT | 1 | |
| 0078 | 010000101 | | 0553 | | BL | LOADDISP | |
| 0071 | 101111001 | 1456 | 0554 | | | | |
| 0063 | 000100010 | | 0555 | HANG11 | TBIT | 1 | |
| 0047 | 101100001 | 0516 | 0556 | | BRANCH | SONG | |
| 000E | 001000101 | | 0557 | YOUWIN | TCY | 10 | YES |
| 001D | 010011000 | | 0558 | | LDX | 1 | |
| 0038 | 001100100 | | 0559 | | TCMIY | 2 | |
| 0076 | 001101110 | | 0560 | | TCMIY | 7 | * 'YOU WIN' |
| 006D | 101000001 | 0545 | 0561 | | BRANCH | IWIN1 | |
| 0058 | 010000100 | | 0562 | HANG6 | CALLL | SPLNTR+1 | *CHECK IF CORRECT |
| 0036 | 110101110 | 0374 | 0563 | | | | |
| 006C | 011100000 | | 0564 | | ALEC | 0 | *LETTER HAS ALREADY |
| 0059 | 101101110 | 0525 | 0565 | | BRANCH | HANG5 | *BEEN ENTERED IN EACH DIGIT |
| 0032 | 001001111 | | 0566 | | TCY | 15 | NO |
| 0064 | 000101001 | | 0567 | FINDIT | TMA | | PUT LETTER CODE IN ACC |
| 0049 | 001000001 | | 0568 | | TCY | 8 | * FIND THE FIRST LETTER |
| 0012 | 000000100 | | 0569 | HANG7 | DYN | | * THAT HASN,T YET |
| 0025 | 000100011 | | 0570 | | TBIT | 3 | * BEEN ENTERED |
| 004A | 100010010 | 0569 | 0571 | | BRANCH | HANG7 | * CORRECTLY |
| 0019 | 010111111 | | 0572 | | RETN | | * |
| 0029 | 000101111 | | 0573 | | TAM | | STORE LETTER CODE |
| 0052 | 001000111 | | 0574 | | TCY | 14 | *GET OTHER HALF OF |
| 0024 | 010001100 | | 0575 | | CALLL | FINDIT | *LETTER CODE AND STORE IT |
| 0048 | 111100100 | 0567 | 0576 | | | | |
| 0010 | 010011000 | | 0577 | | LDX | 1 | * |

TABLE IX-3 (Continued)

```
0021  000101111         0578                TAM                      *
0042  010000100         0579                CALLL     SPLNTR+1       CHECK TO SEE IF
0004  110101110  0374   0580
0009  011100000         0581                ALEC      0              NEW LETTER MATCHES
0013  100101101  0591   0582                BRANCH    HANG8
0027  010011000         0583                LDX       1              * DOES NOT MATCH
004E  000101011         0584                TYA                      * PUT BLANK BACK
001C  001100011         0585                TCMIY     12             * IN DISPLAY
0039  010010000         0586                LDX       0
0072  001001011         0587                TCY       13
0065  010100010         0588                SBIT      1              SET FLAG FOR WORD NOT COMPLETE
0048  000101000         0589                TAY
0016  100110100  0593   0590                BRANCH    HANG9          BET
0020  000101011         0591      HANG8     TYA                      CORRECT LETTER GUESS
005A  001001011         0592                TCY       13             *
0034  010100000         0593      HANG9     SBIT      0              * CORRECT LETTER FLAG IF Y=13
0068  000101000         0594                TAY
0051  101101110  0525   0595                BRANCH    HANG5
                        0596      *
                        0597      *  NXTWORD--RESETS FLAGS, INCREMENTS COUNTERS AND POINTERS
                        0598      *
0022  010110010         0599      NXTWORD   CUMX8                    *
0044  001000010         0600                TCY       4              INCREMENT PHRASE COUNTER
0008  000101001         0601                TMA
0011  001110100         0602                ACACC     2
0023  011100001         0603                ALEC      8
0046  100011001  0606   0604                BRANCH    NXT2
000C  000000110         0605                CLA
0019  000101111         0606      NXT2      TAM
0033  001000110         0607                TCY       6              RESET BITS FLAG6
0066  010100100         0608                RBIT      0
004D  010100110         0609                RBIT      1
001A  001000000         0610                TCY       0              INCREMENT RWE POINTER
0035  000110010         0611                IMAC                     *
006A  000101111         0612                TAM                      *
0055  000101010         0613                TMY                      *
002A  010000100         0614                LDP       2
0054  001010101         0615                YNEC      10             *
0028  100000111  0345   0616                BRANCH    USPELL+1
0050  010000100         0617                BL        F3
0020  100100101  0431   0618
```

TABLE IX-4

```
                          0619             ORGPG     4
0000  010001000           0620   GAME#2    CALLL     CLEAR        PUTS BLANKS AND CURSOR IN DISPLAY
0001  110111010   0236    0621
0003  010010001           0622             LDX       8            DAM
0007  001001110           0623             TCY       7
000F  001100110           0624             TCMIY     6            SET MODE FOR CODE BREAKER
001F  010100010           0625             SBIT      1            SET GO FLAG
003F  010001101           0626             BL        TONES
007F  101000111   1657    0627
                          0628   *
007E  010010001           0629   DIFFSLV   LDX       8
007D  001001110           0630             TCY       SEVEN        **
007B  000101001           0631             TMA
0077  010010000           0632             LDX       0
006F  001000000           0633             TCY       0
005F  001101000           0634   BLANKM    TCMIY     1
003F  001010001           0635             YNEC      8
007C  101011111   0634    0636             BRANCH    BLANKM
0079  001001000           0637             TCY       1
0073  011100000           0638             ALEC      0
0067  101000011   0656    0639             BRANCH    LZEROS
                          0640   *
004F  001100000           0641             TCMIY     0            A
001F  001000010           0642             TCY       4
003D  001100000           0643             TCMIY     0            I
                          0644   *
007A  010011000           0645             LDX       ONE          **
0075  001000000           0646             TCY       DISPLAY      **
006B  001100100           0647             TCMIY     2            S
0057  001100000           0648             TCMIY     0            A
002E  001100001           0649             TCMIY     8            Y
005C  001101101           0650             TCMIY     11
0038  001100001           0651             TCMIY     8            I
0070  001101100           0652             TCMIY     3            T
0061  101110100   0665    0653             BRANCH    BLANK
                          0654   *
                          0655   *
0043  001100000           0656   LZEROS    TCMIY     0            PUT ,SPELL, IN DISPLAY
0006  001011010           0657             YNEC      5
000D  101000011   0656    0658             BRANCH    LZEROS
                          0659   *
001B  010011000           0660             LDX       ONE          **
```

TABLE IX-4 (Continued)

```
0037  001000000         0661            TCY     DISPLAY      **
006E  001100100         0662            TCMIY   LSW$S        **
0050  001101111         0663            TCMIY   LSW$P        **
003A  001100010         0664            TCMIY   LSW$E        **
0074  001101101         0665  BLANK     TCMIY   11
0069  001010001         0666            YNEC    8
0053  101110100   0665  0667            BRANCH  BLANK
0026  001001111         0668  PUT$LVL   TCY     LEVEL        * PUT LEVEL IN DISPLAY
004C  000101001         0669            TMA                  **
001B  001001110         0670            TCY     7
0031  000101111         0671            TAM                  **
                        0672  *
0062  010010000         0673            LDX     ZERO         **
0045  001100000         0674            TCMIY   0
                        0675  *
000A  010110010         0676            COMX8                * CLEAR GO FLAG
0015  001000001         0677            TCY     FLAG2        **
002B  001100000         0678            TCMIY   0
0056  010111111         0679            RETN                 **
002C  010010000         0680  NUS$TRANS LDX     0            CALCULATE LETTER ADDRESS
0058  001001111         0681            TCY     15
0030  000101001         0682            TMA
0060  010011000         0683            LDX     1
0041  001000011         0684            TCY     12
0002  001100000         0685            TCMIY   0
0005  001100000         0686            TCMIY   0
000B  001001101         0687            TCY     11
0017  000101111         0688            TAM
002F  010000000         0689            CALLL   ADDCARRY
005E  111011000   0112  0690
003C  010010000         0691            LDX     0
0078  001000111         0692            TCY     14
0071  000101001         0693            TMA
0063  010011000         0694            LDX     1
0047  001000101         0695            TCY     10
000E  000101111         0696            TAM
001D  010000000         0697            CALLL   ADDCARRY
003B  111011000   0112  0698
0076  000000110         0699            CLA
006D  001110011         0700            ACACC   12
005B  001000101         0701            TCY     10
0036  010000000         0702            CALLL   ADDCARRY
006C  111011000   0112  0703
0059  010000101         0704  ADDCTR6   CALLL   MEMADDR
```

TABLE IX-4 (Continued)

```
0052  111011000  1501  0765
0064  010001110        0706             CALL     LOADRESS
0049  111000010  1121  0707
0012  010000111        0708             BL       ADDWDS2
0025  100001010  2057  0709
004A  010010100        0710  RETNSHCH  LDX      2            RETNSHCH FLAG=ACC
0014  001001111        0711            TCY      15           *
0029  000101001        0712            TMA
0052  010001111        0713            LDP      15
0024  011101000        0714            ALEC     1            SPELL?
0048  100101100  2219  0715            BRANCH   DISP/KB
0010  010001101        0716            LDP      11
0021  011100100        0717            ALEC     2
0042  101000010  1680  0718            BRANCH   NXTTONE
0004  010001100        0719            LDP      3
0009  011101100        0720            ALEC     3            NXTWORD?
0013  100100010  0599  0721            BRANCH   NXTWORD
0027  010000101        0722            LDP      10
004E  011100010        0723            ALEC     4            NEG?
001C  100001001  1540  0724            BRANCH   NSPEL3
0039  010000001        0725            LDP      8
0072  011101010        0726            ALEC     5            SAY IT?
0065  101100011  1232  0727            BRANCH   DISLP=5
0048  010001001        0728            LDP      9
0016  011100110        0729            ALEC     6            SPEAK LETTER?
0020  101110110  1372  0730            BRANCH   LET+4
005A  010001100        0731            LDP      3
0034  011101110        0732            ALEC     7
0068  100000110  0521  0733            BRANCH   HANG1
0051  011100001        0734            ALEC     8
0022  100000000  0479  0735            BRANCH   GAME#1
0044  010000101        0736            LDP      10
0008  011101001        0737            ALEC     9
0011  101101010  1570  0738            BRANCH   ADDCTR2
0023  010000001        0739            LDP      8
0046  011100101        0740            ALEC     10
000C  101100011  1232  0741            BRANCH   DISLP=5
                       0742  *   TSTBIT2==>USED IN LOADING LNK/EDT TO TEST FOR 3 WORDS OF ZERO
                       0743  *         1 WORD OF 0001
                       0744  *
0019  010110010        0745  TSTBIT2   COMXB                 DAM REG
0033  001000100        0746            TCY      2
0066  010100110        0747            RBIT     1
0040  010100101        0748            RBIT     2
001A  010110010        0749            COMXB
0035  010111111        0750            RETN
```

TABLE IX-5

```
                                 0751             ORGPG     5                      **
                                 0752   *  STORE SEED NUMBER
0000  010010010                  0753   RANDOM    LDX       4
0001  001000101                  0754             TCY       10
0003  000000110                  0755             CLA
0007  010001111                  0756             CALLL     FIL$LOOP
000F  110101110      2183        0757
001F  001001110                  0758             TCY       7
003F  010010001                  0759             LDX       8
007F  010001110                  0760             LDP       7
007E  000100000                  0761             TBIT      0
007D  101110011      1039        0762             BRANCH    LDPREV
007B  010100000                  0763             SBIT      0
0077  010001010                  0764             LDP       5
                                 0765   *  CURLEVL==>
                                 0766   *  STORES NUMBER OF ENTRIES IN CURRENT LEVEL
                                 0767   *  INTO RAM
                                 0768   *
006F  001000101                  0769   CURLEVL   TCY       10
005F  010011000                  0770             LDX       1
                                 0771   *   ZERO OUT ROM ADDR
003E  001100000                  0772             TCMIY     0
007C  001100000                  0773             TCMIY     0
0079  001100000                  0774             TCMIY     0
0073  001100000                  0775             TCMIY     0
0067  001000101                  0776             TCY       10
004F  010111111                  0777             RETN
                                 0778   *  FIND DIFFICULTY LEVEL
001E  001001111                  0779             TCY       15
003D  000101001                  0780             TMA
007A  001000101                  0781             TCY       10
0075  000101111                  0782             TAM
006B  010000111                  0783             CALLL     ADDB
0057  110001100      2139        0784
002E  010000101                  0785             CALLL     MEMADDR
005C  111011000      1501        0786
                                 0787   *  OUTPUT # OF ENTRIES IN THIS LEVEL
0038  010001110                  0788             CALLL     OUTADDR2
0070  111000001      1083        0789
0061  001001111                  0790             TCY       15
0043  010011010                  0791             LDX       5
0006  000101111                  0792             TAM
```

TABLE IX-5 (Continued)

| | | | | | | |
|---|---|---|---|---|---|---|
| 000D | 010001110 | | 0793 | | CALL | OUTADDR2 |
| 0018 | 111000001 | 1083 | 0794 | | | |
| 0037 | 001001111 | | 0795 | | TCY | 15 |
| 006E | 010010010 | | 0796 | | LDX | 4 |
| 005D | 000101111 | | 0797 | | TAM | |
| 005A | 010011010 | | 0798 | | LDX | 5 |
| 0074 | 000000111 | | 0799 | | DMAN | |
| 0069 | 100011000 | 0804 | 0800 | | BRANCH | DECMEM |
| 0053 | 000101111 | | 0801 | | TAM | |
| 0026 | 010010010 | | 0802 | | LDX | 4 |
| 004C | 000000111 | | 0803 | | DMAN | |
| 0018 | 000101111 | | 0804 | DECMEM | TAM | |
| 0031 | 010011100 | | 0805 | | LDX | 3 |
| 0062 | 001000001 | | 0806 | | TCY | 8 |
| 0045 | 000101001 | | 0807 | | TMA | |
| 000A | 010011010 | | 0808 | | LDX | 5 |
| 0015 | 001000000 | | 0809 | | TCY | 0 |
| 002B | 000101111 | | 0810 | | TAM | |
| 0056 | 010011100 | | 0811 | | LDX | 3 |
| 002C | 001001001 | | 0812 | | TCY | 9 |
| 0058 | 000101001 | | 0813 | | TMA | |
| 0030 | 010010010 | | 0814 | | LDX | 4 |
| 0060 | 001000000 | | 0815 | | TCY | 0 |
| 0041 | 000101111 | | 0816 | | TAM | |
| | | | 0817 | * DETERMINE IF SEED IS '>' NUMBER OF ENTRIES | | |
| 0002 | 001001111 | | 0816 | DECLOOP | TCY | 15 |
| 0005 | 000000001 | | 0819 | | ALEM | |
| 000B | 101111000 | 0825 | 0820 | | BRANCH | RANOK |
| 0017 | 001000000 | | 0821 | | TCY | 0 |
| 002F | 001111100 | | 0822 | | ACACC | 3 |
| 005E | 000101111 | | 0823 | | TAM | |
| 003C | 100000010 | 0818 | 0824 | | BRANCH | DECLOOP |
| 0078 | 000001001 | | 0825 | RANOK | MNEA | |
| 0071 | 101011001 | 0837 | 0826 | | BRANCH | RANOK2 |
| 0063 | 001000000 | | 0827 | | TCY | 0 |
| 0047 | 010011010 | | 0828 | | LDX | 5 |
| 000F | 000101001 | | 0829 | | TMA | |
| 0010 | 001001111 | | 0830 | DECLOOP3 | TCY | 15 |
| 003B | 000000001 | | 0831 | | ALEM | |
| 0076 | 101011001 | 0837 | 0832 | | BRANCH | RANOK2 |
| 006D | 001000000 | | 0833 | | TCY | 0 |
| 005B | 001111100 | | 0834 | | ACACC | 3 |
| 0036 | 000101111 | | 0835 | | TAM | |

TABLE IX-5 (Continued)

| | | | | | | |
|---|---|---|---|---|---|---|
| 006C | 100011101 | 0830 | 0836 | | BRANCH | DECLOOP3 |
| 0059 | 010110010 | | 0837 | RANOK2 | COMX8 | |
| | | | 0838 | * ZERO RWE POINTER | | |
| 0032 | 001000000 | | 0839 | | TCY | 0 |
| 0064 | 001100000 | | 0840 | | TCMIY | 0 |
| 0049 | 010011010 | | 0841 | RPLOOP | LDX | 5 |
| 0012 | 010001101 | | 0842 | | CALLL | RCOMX8 |
| 0025 | 111001100 | 1631 | 0843 | | | |
| 004A | 000101001 | | 0844 | | TMA | |
| 0014 | 000000101 | | 0845 | | IYC | |
| 0029 | 001111000 | | 0846 | | ACACC | 1 |
| 0052 | 110101000 | 0888 | 0847 | | CALL | INCARRY |
| 0024 | 000101100 | | 0848 | | TAMDYN | |
| 0048 | 010010010 | | 0849 | | LDX | 4 |
| 0010 | 000101001 | | 0850 | | TMA | |
| 0021 | 000000101 | | 0851 | | IYC | |
| 0042 | 000010101 | | 0852 | | AMAAC | |
| 0004 | 000101111 | | 0853 | | TAM | |
| 0009 | 010001101 | | 0854 | RANARND | CALLL | RCOMX8 |
| 0013 | 111001100 | 1631 | 0855 | | | |
| 0027 | 000101001 | | 0856 | | TMA | |
| 004E | 001001111 | | 0857 | | TCY | 15 |
| 001C | 000000001 | | 0858 | | ALEM | |
| 0039 | 101100101 | 0861 | 0859 | | BRANCH | RANCNT |
| 0072 | 101000100 | 0870 | 0860 | | BRANCH | ZRORAND |
| 0065 | 000001001 | | 0861 | RANCNT | MNEA | |
| 004B | 101100110 | 0878 | 0862 | | BRANCH | RANCOMP |
| 0016 | 010011010 | | 0863 | | LDX | 5 |
| 002D | 010001101 | | 0864 | | CALLL | RCOMX8 |
| 005A | 111001100 | 1631 | 0865 | | | |
| 0034 | 000101001 | | 0866 | | TMA | |
| 0068 | 001001111 | | 0867 | | TCY | 15 |
| 0051 | 000000001 | | 0868 | | ALEM | |
| 0022 | 101100110 | 0878 | 0869 | | BRANCH | RANCOMP |
| 0044 | 010001101 | | 0870 | ZRORAND | CALLL | RCOMX8 |
| 0008 | 111001100 | 1631 | 0871 | | | |
| 0011 | 001100000 | | 0872 | | TCMIY | 0 |
| 0023 | 000000100 | | 0873 | | DYN | |
| 0046 | 010010010 | | 0874 | | LDX | 4 |
| 000C | 001100000 | | 0875 | | TCMIY | 0 |
| 0019 | 001100000 | | 0876 | | TCMIY | 0 |

TABLE IX-5 (Continued)

```
0033  101001001  0841  0877             BRANCH    RPLOOP
0066  001000000        0878  RANCOMP    TCY       0
                       0879  *  COMPARE RANDOM # TO # OF ENTRIES
0040  010110010        0880             COMXB
001A  000110010        0881             IMAC
0035  000101111        0882             TAM
006A  011101001        0883             ALEC      9
0055  101001001  0841  0884             BRANCH    RPLOOP
002A  010001110        0885             BL        RANSTOP
0054  100000000  1021  0886
                       0887  *
0028  000101111        0888  INCARRY    TAM
0050  010010010        0889             LDX       4
0020  000110010        0890             IMAC
0040  010111111        0891             RETN
```

TABLE IX-6

```
                       0892             ORGPG     6               **
                       0893  ****       CODE      BREAKER         ******
0000  010001000        0894  CRYPTO     CALLL     SPACE=3         ELIMINATE CURSOR FROM DISPLAY
0001  111100011  0273  0895
0003  001000000        0896             TCY       0
0007  010010000        0897  CRY1       LDX       0
000F  000110011        0898             MNEZ                      TEST MSB OF DISPLAY CHARACTER
001F  100111101  0915  0899             BRANCH    CRY2            BRANCH IF MSB=1
003F  010011000        0900  COMPL      LDX       1
007F  000110010        0901             IMAC                      * COMPLEMENT THE LSD OF
007E  000110001        0902             CPAIZ                     * THE DISPLAYED LETTER
007D  010111111        0903             RETN
007B  011101001        0904             ALEC      9               * IF A CHARACTER CODE
0077  100111110  0908  0905             BRANCH    CRY3            * PAST 'Z' HAS BEEN
006F  001110110        0906             ACACC     6               * CREATED, ADD 6 TO GET A LETTER
005F  101010111  0919  0907             BRANCH    CRY6            RET
003E  000101111        0908  CRY3       TAM                       STORE COMPLEMENT OF LSD
007C  010010000        0909  CRY5       LDX       0
0079  001101000        0910             TCMIY     1               SET MSB TO 1
0073  001010001        0911  CRY4       YNEC      8               ARE ALL LETTERS FINISHED?
0067  100000111  0897  0912             BRANCH CRY1               NO, CONTINUE
```

TABLE IX-6 (Continued)

```
004F  010001101         0913  CRY12   BL      TONES
001E  101000111   1657  0914
0030  010000110         0915  CRY2    CALLL   COMPL
007A  110111111   0900  0916
0075  011101010         0917          ALEC    5          * TEST FOR CODES OTHER
0068  101111100   0909  0918          BRANCH  CRY5       * THAN LETTERS AND SKIP THEM
0057  000101111         0919  CRY6    TAM
002E  010010000         0920          LDX     0
005C  001100000         0921          TCMIY   0          SET MSB TO ZERO
0038  101110011   0911  0922          BRANCH  CRY4       RET
0070  010011100         0923  CLUE    LDX     3
0061  001000001         0924          TCY     8
0043  000101001         0925          TMA                GET HEX RANDOM NUMBER
0006  011101110         0926          ALEC    7          * IF NUMBER IS GREATER
0000  100110111   0929  0927          BRANCH  CLUE1      * THAN 7, ADD 8
001B  001110001         0928          ACACC   8          *
0037  000101000         0929  CLUE1   TAY                SET Y RANDOMLY 0- 7
006E  000000100         0930  CLUE2   DYN                * LOOK FOR FIRST
005D  101110100   0933  0931          BRANCH  YOK
003A  001001110         0932          TCY     7
0074  010000100         0933  YOK     CALLL   SPLNTR+1   * LETTER THAT HASN'T
0069  110101110   0374  0934
0053  011100000         0935          ALEC    0          * BEEN CORRECTLY ENTERED
0026  101101110   0930  0936          BRANCH  CLUE2
004C  010010100         0937          LDX     2
0018  000100000         0938          TBIT    0          MSB IS A ONE?
0031  100000101   0952  0939          BRANCH  CLUE3      YES
0062  010011100         0940  GETIT   LDX     3          NO
0045  000101001         0941          TMA                * GET LSD OF LETTER
000A  010010000         0942          LDX     0          * FROM CORRECT SPELLING
0015  001000111         0943          TCY     14         * BUFFER AND PUT IT IN
002B  000101101         0944          TAMIYC             * KEY CODE
0056  010111111         0945          RETN
002C  001100000         0946          TCMIY   0          SET MSB=0
0058  001001011         0947  CLUE4   TCY     13
0030  010010100         0948          LDX     2
0060  000101001         0949          TMA
0041  010000100         0950          BL      MISS3
0002  100110101   0471  0951
0005  111100010   0940  0952  CLUE3   CALL    GETIT
000B  001101000         0953          TCMIY   1          SET MSB=1
0017  101011000   0947  0954          BRANCH  CLUE4      RET
002F  000101000         0955  F2      TAY
005E  001010000         0956          YNEC    0
```

TABLE IX-6 (Continued)

| | | | | | | | |
|---|---|---|---|---|---|---|---|
| 003C | 101001111 | 0913 | 0957 | | BRANCH | CRY12 | |
| 0078 | 010010000 | | 0958 | | LDX | 0 | 10 |
| 0071 | 001001010 | | 0959 | | TCY | 5 | |
| 0063 | 001101000 | | 0960 | | TCMIY | 1 | |
| 0047 | 001100100 | | 0961 | | TCMIY | 2 | |
| 000E | 001100100 | | 0962 | | TCMIY | 2 | |
| 001D | 010011000 | | 0963 | | LDX | 1 | |
| 003B | 001001010 | | 0964 | | TCY | 5 | |
| 0076 | 001100111 | | 0965 | | TCMIY | 14 | |
| 0060 | 001101000 | | 0966 | | TCMIY | 1 | |
| 005B | 001100000 | | 0967 | | TCMIY | 0 | |
| 0036 | 101001111 | 0913 | 0968 | | BRANCH | CRY12 | |
| 006C | 010011100 | | 0969 | F5 | LDX | 3 | |
| 0059 | 001001011 | | 0970 | | TCY | 13 | LNK/EOT VALUE |
| 0032 | 001100000 | | 0971 | | TCMIY | 0 | |
| 0064 | 010011000 | | 0972 | F2LOOP | LDX | 1 | |
| 0049 | 001000101 | | 0973 | | TCY | 10 | |
| 0012 | 001100100 | | 0974 | | TCMIY | 2 | |
| 0025 | 001100010 | | 0975 | | TCMIY | 4 | |
| 004A | 001100000 | | 0976 | | TCMIY | 0 | |
| 0014 | 001100000 | | 0977 | | TCMIY | 0 | |
| 0029 | 010011010 | | 0978 | | LDX | 5 | |
| 0052 | 001001011 | | 0979 | | TCY | 13 | # OF CORRECT SCORES |
| 0024 | 000101001 | | 0980 | | TMA | | |
| 0048 | 000010101 | | 0981 | | AMAAC | | CORRY? |
| 0010 | 101001101 | 1012 | 0982 | | BRANCH | NOF2 | |
| 0021 | 010011000 | | 0983 | | LDX | 1 | |
| 0042 | 001000101 | | 0984 | | TCY | 10 | |
| 0004 | 000010101 | | 0985 | | AMAAC | | |
| 0009 | 101101010 | 1015 | 0986 | | BRANCH | NOF3 | |
| 0013 | 000101111 | | 0987 | | TAM | | |
| 0027 | 010111111 | | 0988 | FINL2 | RETN | | |
| 004F | 010000101 | | 0989 | | CALLL | MEMADDR | |
| 001C | 111011000 | 1501 | 0990 | | | | |
| 0039 | 010001110 | | 0991 | | CALLL | LOADRESS | LOAD ADDRESS |
| 0072 | 111000010 | 1121 | 0992 | | | | |
| 0065 | 010011000 | | 0993 | | LDX | 1 | |
| 004B | 010000011 | | 0994 | | CALLL | TRANS-1 | STORE N DAM |
| 0016 | 110100011 | 1856 | 0995 | | | | |
| 002D | 010001001 | | 0996 | | BL | F4 | |

TABLE IX-6 (Continued)

| | | | | | | |
|---|---|---|---|---|---|---|
| 005A 101001101 | 1422 | 0997 | | | | |
| 0034 001000101 | | 0998 | FINL3 | TCY | 10 | |
| 0068 010011000 | | 0999 | FINL6 | LDX | 1 | |
| 0051 000101001 | | 1000 | | TMA | | |
| 0022 010010010 | | 1001 | | LDX | 4 | |
| 0044 000101101 | | 1002 | | TAMIYC | | |
| 0008 001010111 | | 1003 | | YNEC | 14 | |
| 0011 101101000 | 0999 | 1004 | | BRANCH | FINL6 | |
| 0023 010001010 | | 1005 | | CALLL | CURLEVL | |
| 0046 111101111 | 0769 | 1006 | | | | |
| 000C 001100010 | | 1007 | | TCMIY | 4 | |
| 0019 001101110 | | 1008 | | TCMIY | 7 | |
| 0033 010001000 | | 1009 | | BL | SPK4 | |
| 006D 101100101 | 0311 | 1010 | | | | |
| | | 1011 | * | | | |
| 0040 010011000 | | 1012 | NOF2 | LDX | 1 | |
| 001A 001000101 | | 1013 | | TCY | 10 | |
| 0035 000010101 | | 1014 | | AMAAC | | |
| 006A 000101101 | | 1015 | NOF3 | TAMIYC | | |
| 0055 000110010 | | 1016 | | IMAC | | |
| 002A 000101111 | | 1017 | | TAM | | |
| 0054 100100111 | 0988 | 1018 | | BRANCH | FINL2 | |

TABLE IX-7

| | | | | | | |
|---|---|---|---|---|---|---|
| | | 1019 | | ORGPG | 7 | ** |
| | | 1020 | * LOADED 10 VALUES *STORE LAST VALUE | | | |
| 0000 001100000 | | 1021 | RANSTOP | TCMIY | 0 | |
| 0001 001000101 | | 1022 | | TCY | 10 | |
| 0003 010011010 | | 1023 | | LDX | 5 | |
| 0007 000101001 | | 1024 | | TMA | | |
| 000F 001000111 | | 1025 | | TCY | 14 | |
| 001F 000101111 | | 1026 | | TAM | | |
| 003F 010010010 | | 1027 | | LDX | 4 | |
| 007F 001000101 | | 1028 | | TCY | 10 | |
| 007E 000101001 | | 1029 | | TMA | | |
| 007D 001000111 | | 1030 | | TCY | 14 | |
| 007B 000101111 | | 1031 | | TAM | | |
| 0077 010011010 | | 1032 | RSCRAM2 | LDX | 5 | |
| 006F 111110000 | 1052 | 1033 | | CALL | RSCRAM | |

IX-7 (Continued)

```
005F  010010010        1034                LDX      4
003E  111110000  1052  1035                CALL     RSCRAM
007C  010001000        1036                HL       RANRTN
0079  101110011  0215  1037
                       1038   *  LDPREV==> LOADS NEXT VALUE NTO RWE
0073  001000111        1039   LDPREV       TCY      14
0067  010010010        1040                LDX      4
004F  000101001        1041                TMA
001E  001000000        1042                TCY      0
003D  000101111        1043                TAM
007A  001000111        1044                TCY      14
0075  010011010        1045                LDX      5
006B  000101001        1046                TMA
0057  001000000        1047                TCY      0
002E  000101111        1048                TAM
005C  010001010        1049                LDP      5
0038  101011001  0837  1050                BRANCH   RANOK2
                       1051   *  SCRAMBLES RWE WORDS
0070  001000000        1052   RSCRAM       TCY      0
0061  000101001        1053                TMA
0043  001000110        1054                TCY      6
0006  000000011        1055                XMA
000D  001000000        1056                TCY      0
001B  000101101        1057                TAMIYC
0037  000101001        1058                TMA
006E  001001110        1059                TCY      7
005D  000000011        1060                XMA
003A  001001000        1061                TCY      1
0074  000101101        1062                TAMIYC
0069  000101001        1063                TMA
0053  001001010        1064                TCY      5
0026  000000011        1065                XMA
004C  001000100        1066                TCY      2
0018  000101101        1067                TAMIYC
0031  000101001        1068                TMA
0062  001000001        1069                TCY      8
0045  000000011        1070                XMA
000A  001001100        1071                TCY      3
0015  000101101        1072                TAMIYC
002B  000101001        1073                TMA
0056  001001001        1074                TCY      9
002C  000000011        1075                XMA
005A  001000010        1076                TCY      4
0030  000000011        1077                XMA
0060  010111111        1078                RETN
```

TABLE IX-7 (Continued)

```
                           1079   *
                           1080   *    OUTADDR2:
                           1081   *    LOADS 4 BITS INTO K=LINES USING PDC AND OUTPUT 4 BITS
                           1082   *
0041  001000011            1083   OUTADDR2 TCY      12            ** CHIP SELECT
0002  000001101            1084            SETR                   **
0005  001001101            1085            TCY      11            L/R = 0
0008  000001101            1086            SETR
0017  001000101            1087            TCY      10
002F  000000110            1088            CLA                    ACC=OUTPUT 4 BITS COMMAND
005F  001110001            1089            ACACC    EIGHT         **
003C  000001101            1090            SETR                   **
0078  000110110            1091            RSTR                   **
0071  000001101            1092            SETR                   **
0063  000110110            1093            RSTR                   **
0047  000001101            1094            SETR                   **
000E  000110110            1095            RSTR                   **
0010  000001101            1096            SETR                   **
003B  000110110            1097            RSTR                   **
0076  000000110            1098            CLA                    **
006D  001110010            1099            ACACC    FOUR          **
005B  000001101            1100            SETR                   1ST PDC LOADS COMMAND
0036  000110110            1101            RSTR                   *
006C  001001101            1102            TCY      11
0059  000110110            1103            RSTR
0032  001000101            1104            TCY      10
0064  000001101            1105            SETR                   2ND PDC APPLIES SR TO K=LINES
0049  000110110            1106            RSTR                   *
0012  001110000            1107            ACACC    0
0025  000001000            1108            TKA                    LOAD INTO ACC
004A  000001101            1109            SETR                   3RD PDC DISCONNECTS SR
0014  000110110            1110            RSTR                   *
0029  001001101            1111            TCY      11
0052  000001101            1112            SETR
0024  010010100            1113            LDX      2
0048  000100011            1114            TBIT     3
0010  101001011     1131   1115            BRANCH   LSHIFT=1
0021  010111111            1116            RETN
                           1117   *
                           1118   *   END OF OUTADDR2 SUBROUTINE
                           1119   *
                           1120   *
```

TABLE IX-7 (Continued)

| | | | | | | | |
|---|---|---|---|---|---|---|---|
| 0042 | 001001101 | | 1121 | LOADRESS | TCY | 11 | |
| 0004 | 010010100 | | 1122 | | LDX | 2 | |
| 0009 | 010100011 | | 1123 | | SBIT | 3 | * |
| 0013 | 001000101 | | 1124 | | TCY | 10 | |
| 0027 | 000000110 | | 1125 | | CLA | | |
| 004E | 001111100 | | 1126 | | ACACC | 3 | |
| 001C | 010010100 | | 1127 | | LDX | 2 | MEMORY FOR LOOP |
| 0039 | 000101110 | | 1128 | LOADR+1 | TAMZA | | |
| 0072 | 010011000 | | 1129 | | LDX | 1 | |
| 0065 | 101000001 | 1083 | 1130 | | BRANCH | OUTADDR2 | |
| 004B | 001001011 | | 1131 | LSHIFT-1 | TCY | 13 | |
| 0016 | 010011000 | | 1132 | | LDX | 1 | |
| 002D | 000000011 | | 1133 | LSHIFT | XMA | | SHIFT ROUTINE |
| 005A | 000000100 | | 1134 | | DYN | | * |
| 0034 | 001011001 | | 1135 | | YNEC | 9 | * |
| 0068 | 100111101 | 1133 | 1136 | | BRANCH | LSHIFT | * |
| 0051 | 001000101 | | 1137 | | TCY | 10 | TEST LOOP COUNT |
| 0022 | 010010100 | | 1138 | | LDX | 2 | * |
| 0044 | 000000111 | | 1139 | | DMAN | | * |
| 0008 | 100111001 | 1128 | 1140 | | BRANCH | LOADR+1 | * |
| 0011 | 001001101 | | 1141 | | TCY | 11 | |
| 0023 | 010100111 | | 1142 | | RBIT | 3 | |
| 0046 | 010111111 | | 1143 | | RETN | | |
| | | | 1144 | * | | | |
| 000C | 010011010 | | 1145 | FL2 | LDX | 5 | |
| 0019 | 001001011 | | 1146 | | TCY | 13 | |
| 0033 | 000000110 | | 1147 | | CLA | | |
| 0066 | 001110101 | | 1148 | | ACACC | 10 | |
| 004D | 000000011 | | 1149 | | XMA | | |
| 001A | 000110000 | | 1150 | | SAMAN | | |
| 0035 | 000101111 | | 1151 | | TAM | | |
| 006A | 010111111 | | 1152 | | RETN | | |
| 0055 | 001000110 | | 1153 | ROM | TCY | 6 | |
| 002A | 010010001 | | 1154 | | LDX | 8 | |
| 0054 | 000101001 | | 1155 | | TMA | | |
| 0028 | 001110001 | | 1156 | | ACACC | 8 | |
| 0050 | 000101111 | | 1157 | | TAM | | |
| 0020 | 010001111 | | 1158 | | BL | DISP/KB | |
| 0040 | 100101100 | 2219 | 1159 | | | | |

TABLE IX-8

```
                         1160          ORGPG     8
                         1161  *
                         1162  *  CALADDR==> STICKS ADDRESS WANTED INTO LNK/EDT
                         1163  *
0000  001000111          1164  CALADDR TCY       14
0001  001100101          1165          TCMIY     10
0003  001001001          1166          TCY       9
0007  010011000          1167          LDX       1
000F  000101001          1168          TMA
001F  001111111          1169          ACACC     15
003F  010110010          1170          COMX8                 ADDRESS DAM
007F  000101111          1171          TAM
007E  001000101          1172          TCY       10
007D  000101001          1173  TMAA    TMA
007B  010011000          1174          LDX       1
0077  000101101          1175          TAMIYC
006F  010110010          1176          COMX8                 ADDRESS DAM
005F  001010111          1177          YNEC      14
003E  101111101   1173   1178          BRANCH    TMAA
007C  111001111   1183   1179  CALL+2  CALL      CAL+1
0079  010011110          1180          LDX       7
0073  000101111          1181          TAM                   STORE WORD
0067  010110010          1182          COMX8                 ADDRESS DAM
004F  001000111          1183  CAL+1   TCY       14          GET Y POINTER
001E  000110010          1184          IMAC                  *
003D  000101111          1185          TAM                   *
007A  000101010          1186          TMY                   *
0075  000000100          1187          DYN
006B  000101001          1188          TMA
0057  001001001          1189  OUT$RTN TCY       9           GET LNK/EDT POINTER
002E  000101010          1190          TMY                   *
005C  010110010          1191          COMX8                 EXIT DAM
0038  010111111          1192          RETN
0070  010010110          1193          LDX       6           STORE WORD
0061  000101111          1194          TAM                   *
0043  010110010          1195          COMX8                 ADDRESS DAM
0006  001001001          1196          TCY       9
000D  000110010          1197          IMAC
001B  000101111          1198          TAM
0037  001000111          1199          TCY       14
006F  000101010          1200          TMY
005D  001010111          1201          YNEC      14          Y=14? IF YES,
003A  101111100   1179   1202          BRANCH    CALL+2      LOAD 2 MSW
```

TABLE IX-8 (Continued)

| | | | | | | | |
|---|---|---|---|---|---|---|---|
| 0074 | 001000100 | | 1203 | | TCY | 2 | |
| 0069 | 010100101 | | 1204 | | RBIT | 2 | |
| 0053 | 010011000 | | 1205 | | LDX | 1 | |
| 0026 | 001001001 | | 1206 | | TCY | 9 | |
| 004C | 010000011 | | 1207 | | BL | LNKCNT2 | |
| 0018 | 101101100 | 1798 | 1208 | | | | |
| 0031 | 010011100 | | 1209 | ULRN+1 | LDX | 3 | |
| 0062 | 001001011 | | 1210 | | TCY | 13 | |
| 0045 | 001101010 | | 1211 | | TCMIY | 5 | |
| 000A | 010001101 | | 1212 | ULRN+2 | BL | CORR+1 | |
| 0015 | 101111110 | 1590 | 1213 | | | | |
| | | | 1214 | * | | | * CALCULATES ADDRESS |
| | | | 1215 | * | | | * LOADS CSB |
| 002B | 001100000 | | 1216 | DISLP-1 | TCMIY | 0 | |
| 0056 | 010000101 | | 1217 | | BL | LOADDISP | |
| 002C | 101111001 | 1456 | 1218 | | | | |
| 0058 | 010000111 | | 1219 | DISLP7 | CALLL | SPEAK+1 | |
| 0030 | 110000001 | 2010 | 1220 | | | | |
| 0060 | 010000011 | | 1221 | | CALLL | TRANS-1 | |
| 0041 | 110100011 | 1836 | 1222 | | | | |
| 0002 | 010010100 | | 1223 | DISLP+2 | LDX | 2 | |
| 0005 | 001001111 | | 1224 | | TCY | 15 | * |
| 000B | 001101010 | | 1225 | | TCMIY | 5 | |
| 0017 | 010001010 | | 1226 | | CALLL | CURLEVL | |
| 002F | 111101111 | 0769 | 1227 | | | | |
| 005E | 001100111 | | 1228 | | TCMIY | 14 | |
| 003C | 001100110 | | 1229 | | TCMIY | 6 | |
| 0078 | 010000010 | | 1230 | | BL | ADDCTR6 | |
| 0071 | 101011001 | 0704 | 1231 | | | | |
| 0063 | 001001111 | | 1232 | DISLP-5 | TCY | 15 | |
| 0047 | 010110010 | | 1233 | | COMX8 | | ADDRESS DAM |
| 000E | 001101111 | | 1234 | | TCMIY | 15 | |
| 001D | 010110010 | | 1235 | DISPLOOP | COMX8 | | EXIT DAM |
| 003B | 001000111 | | 1236 | | TCY | 14 | |
| 0076 | 010011100 | | 1237 | | LDX | 3 | |
| 006D | 010100000 | | 1238 | | SBIT | 0 | |
| 005B | 010001111 | | 1239 | | BL | DISP/KB | |
| 0036 | 100101100 | 2219 | 1240 | | | | |
| 006C | 010110010 | | 1241 | DISLP+1 | COMX8 | | ADDRESS DAM |
| 0059 | 001001111 | | 1242 | | TCY | 15 | LOOP |
| 0032 | 000000111 | | 1243 | | DMAN | | * |

TABLE IX-8 (Continued)

| | | | | | | | |
|---|---|---|---|---|---|---|---|
| 0064 | 000101111 | | 1244 | | TAM | | * |
| 0049 | 000110011 | | 1245 | | MNEZ | | * |
| 0012 | 100011101 | 1235 | 1246 | | BRANCH | DISPLOOP | * ELSE |
| 0025 | 001000111 | | 1247 | | TCY | 14 | |
| 004A | 010011100 | | 1248 | | LDX | 3 | |
| 0014 | 010100100 | | 1249 | | RBIT | 0 | |
| 0029 | 010010001 | | 1250 | | LDX | 8 | |
| 0052 | 010001001 | | 1251 | | LDP | 9 | |
| 0024 | 001000100 | | 1252 | | TCY | 2 | |
| 0048 | 000100011 | | 1253 | | TBIT | 3 | |
| 0010 | 101010011 | 1341 | 1254 | | BRANCH | LET4 | |
| 0021 | 000100001 | | 1255 | | TBIT | 2 | |
| 0042 | 101001010 | 1385 | 1256 | | BRANCH | RESTO2 | |
| 0004 | 010000001 | | 1257 | | LDP | 8 | |
| 0009 | 010010100 | | 1258 | | LDX | 2 | |
| 0013 | 001001111 | | 1259 | | TCY | 15 | |
| 0027 | 000101001 | | 1260 | | TMA | | |
| 004E | 011101001 | | 1261 | | ALEC | 9 | |
| 001C | 101110010 | 1264 | 1262 | | BRANCH | DISP8 | |
| 0039 | 101101000 | 1271 | 1263 | | BRANCH | DISP5 | |
| 0072 | 001100101 | | 1264 | DISP8 | TCMIY | 10 | |
| 0065 | 010011000 | | 1265 | | LDX | 1 | |
| 0048 | 010110010 | | 1266 | | COMXB | | ADDRESS DAM |
| 0016 | 010000011 | | 1267 | DISP9 | CALLL | TRANS=1 | |
| 002D | 110100011 | 1836 | 1268 | | | | |
| 005A | 010000111 | | 1269 | | BL | ADDWDS2 | |
| 0034 | 100001010 | 2057 | 1270 | | | | |
| 0068 | 010001001 | | 1271 | DISP5 | CALLL | DELAY2 | |
| 0051 | 110100111 | 1398 | 1272 | | | | |
| 0022 | 010110010 | | 1273 | | COMXB | | |
| 0044 | 001000000 | | 1274 | | TCY | 0 | INCREMENT RWE POINTER |
| 0008 | 000110010 | | 1275 | | IMAC | | * |
| 0011 | 000101101 | | 1276 | | TAMIYC | | |
| 0023 | 001100000 | | 1277 | | TCMIY | 0 | |
| 0046 | 011101001 | | 1278 | | ALEC | 9 | |
| 000C | 101010000 | 1291 | 1279 | | BRANCH | DISP6 | |
| 0019 | 001000000 | | 1280 | | TCY | 0 | |
| 0033 | 001100000 | | 1281 | | TCMIY | 0 | |
| 0066 | 001100000 | | 1282 | | TCMIY | 0 | |
| 004D | 010011010 | | 1283 | | LDX | 5 | |
| 001A | 010001110 | | 1284 | | CALLL | RSCRAM | |
| 0035 | 111110000 | 1052 | 1285 | | | | |

TABLE IX-8 (Continued)

```
006A  010010010                        LDX      4
0055  010001110                        CALLL    RSCRAM
002A  111110000  1052
0054  010000100                        BL       USPELL+1
0028  100000111  0345
0050  010001001            DISP6       CALLL    DELAY2
0020  110100111  1398
0040  100110001  1209                  BRANCH   ULRN+1
```

TABLE IX-9

```
                                       ORGPG    4
                           *
                           *  LETTER-->TRANSFERS LETTERS TO BE SPOKEN, FROM THE CSB
                           *    INTO THE LINK/EDIT AND THEN CALCULATES THE ADDRESS FOR L/E.
                           *
0000  001001111            LETTER      TCY      15
0001  000000110                        CLA
0003  010000111                        CALLL    RETURN4
0007  110000100  2113
000F  010001000                        CALLL    CLEAR
001F  110111010  0236
003F  001001000                        TCY      1
007F  010110010                        COMX8                        *
007E  001100000                        TCMIY    0                   *
007D  001001111                        TCY      15
007B  001101000                        TCMIY    1
0077  010011100            LETTER+1    LDX      3                   LOAD LSW -->ACC
006F  001001000                        TCY      1                   *
005F  010001101                        CALLL    COMX8               *
003E  110011000  1632
007C  000101001                        TMA                          *
0079  010011110                        LDX      7                   STORE IN LNK/EDT
0073  001000000                        TCY      0                   *
0067  000101111                        TAM                          *
004F  010010100                        LDX      2                   MSW
001E  001001000                        TCY      1                   GET Y POINTER
003D  010001101                        CALLL    COMX8               *
```

TABLE IX-9 (Continued)

```
007A 110011000  1632 1321
0075 000101001       1322          TMA              LOAD MSW
0068 010000101       1323          LDP      10
0057 000100001       1324          TBIT     2       LAST LETTER?
002E 111010011  1485 1325          CALL     SETBIT2 YES, SETBIT2
005C 010001111       1326          LDP      15
003B 000100011       1327          TBIT     3       SYLLABLE?
0070 111010101  2291 1328          CALL     SETBIT3 SET SYLLABLE FLAG
0061 001000000       1329          TCY      0       *
0043 010010110       1330          LDX      6       *
0006 000101111       1331          TAM              *
000D 010100101       1332          RBIT     2
001B 010100111       1333          RBIT     3
                     1334   *  CALCULATE ADDRESS OF LETTER
0037 001000100       1335          TCY      2       FLAG WORD
006E 010010001       1336          LDX      8
0050 010000001       1337          LDP      8
003A 000100011       1338          TBIT     3       SYLLABLE?
0074 100011101  1235 1339          BRANCH   DISPLOOP
0069 010001001       1340          LDP      9
0053 001000000       1341   LET4   TCY      0
0026 010010110       1342          LDX      6
004C 000101001       1343          TMA
0018 000010101       1344          AMAAC            MULTIPLY BY 2
0031 000101111       1345          TAM
0062 010011110       1346          LDX      7       *
0045 000101001       1347          TMA
000A 000010101       1348          AMAAC
0015 111000010  1394 1349          CALL     TLETTER CARRY, GO TO TLETTER
002B 000101111       1350          TAM
0056 010011110       1351          LDX      7
002C 000101001       1352          TMA
0058 001110011       1353          ACACC    12
0030 111000010  1394 1354          CALL     TLETTER
0060 000101111       1355          TAM
                     1356   *  LOADS LETTER ADDRESS INTO FOM ADDR AREA (RAM)
0041 010000111       1357          CALLL    SPEAK+1
0002 110000001  2010 1358
0005 010011100       1359          LDX      3       FLAG
000B 001001011       1360          TCY      13      *
0017 001100011       1361          TCMIY    12
002F 010010100       1362          LDX      2       FLAG
```

TABLE IX-9 (Continued)

```
005E  001001111                 TCY      15                       *
003C  001100110                 TCMIY    6
0078  001001000                 TCY      1
0071  010001101                 CALLL    COMX8
0063  110011000   1632
0047  010000101                 CALLL    DPLOAD
000E  111110011   1457
0010  010000010                 BL       ADDCTR6
0038  101011001   0704
0076  001000100        LET+4    TCY      2
                       *   SPEAKS LETTER
0060  010110010                 COMX8                             *
005B  010100111                 RBIT     3
0036  000100001                 TBIT     2                        *
006C  100010010   1383          BRANCH   RESTO
0059  001001000                 TCY      1
0032  000110010                 IMAC                              BUMP POINTER FOR CSB
0064  000101111                 TAM                               *
0049  101110111   1310          BRANCH   LETTER+1                 GET NEXT LETTER--ALWAYS B.
                       *   RESTORE LNK/EDT POINTER AND RETURN     TO CONTINUE SPEAKING
0012  010000001        RESTO    BL       DISLP-5
0025  101100011   1232
004A  010100101        RESTO2   RBIT     2
0014  010010100                 LDX      2
0029  001001111                 TCY      15
0052  001101100                 TCMIY    3
0024  001001000                 TCY      1
0048  010110010                 COMX8
0010  010000101                 BL       REPT2
0021  100000011   1439
                       *   INCREMENT WHEN OVERFLOW OCCURS
0042  000101111        TLETTER  TAM
0004  010010110                 LDX      6
0009  000110010                 IMAC
0013  010111111                 RETN
0027  000000110        DELAY2   CLA
004E  010010100                 LDX      2                        DELAY BUFFER--RAM
001C  001000001                 TCY      8                        *
0039  001100000                 TCMIY    0                        CLEAR
0072  001100000                 TCMIY    0                        *
0065  001100000                 TCMIY    0
004B  001000001                 TCY      8
```

TABLE IX-9 (Continued)

| | | | | | | | |
|---|---|---|---|---|---|---|---|
| 0016 | 000101111 | | 1405 | DELAY2+1 | TAM | | |
| 002D | 000110010 | | 1406 | | IMAC | | |
| 005A | 101101000 | 1409 | 1407 | | BRANCH | PLUSONE | |
| 0034 | 100010110 | 1405 | 1408 | | BRANCH | DELAY2+1 | |
| 0068 | 000101101 | | 1409 | PLUSONE | TAMIYC | | |
| 0051 | 000110010 | | 1410 | | IMAC | | |
| 0022 | 100010001 | 1414 | 1411 | | BRANCH | WORD3 | |
| 0044 | 000101100 | | 1412 | | TAMDYN | | |
| 0008 | 100010110 | 1405 | 1413 | | BRANCH | DELAY2+1 | |
| 0011 | 000101101 | | 1414 | WORD3 | TAMIYC | | |
| 0023 | 000110010 | | 1415 | | IMAC | | |
| 0046 | 101100110 | 1420 | 1416 | | BRANCH | QUIT | |
| 000C | 000101100 | | 1417 | | TAMDYN | | |
| 0019 | 000000100 | | 1418 | | DYN | | |
| 0033 | 100010110 | 1405 | 1419 | | BRANCH | DELAY2+1 | |
| 0066 | 010111111 | | 1420 | QUIT | RETN | | |
| | | | 1421 | * | | | |
| 004D | 010001110 | | 1422 | F4 | CALLL | FL2 | STORE # OF WRONG RESPONSES |
| 001A | 110001100 | 1145 | 1423 | | | | |
| 0035 | 010000110 | | 1424 | | CALLL | F2LOOP | |
| 006A | 111100100 | 0972 | 1425 | | | | |
| 0055 | 010000101 | | 1426 | | CALLL | MEMADDR | |
| 002A | 111011000 | 1501 | 1427 | | | | |
| 0054 | 010001110 | | 1428 | | CALLL | LOADRESS | |
| 002B | 111000010 | 1121 | 1429 | | | | |
| 0050 | 010000110 | | 1430 | | BL | FINL3 | |
| 0020 | 100110100 | 0998 | 1431 | | | | |

TABLE IX-10

```
                              1432          ORGPG     10
                              1433   *
                              1434   *  REPEAT ROUTINE-->REPEATS PHRASE PREVIOUSLY SPOKEN
                              1435   *          TWO REPEATS OR MORE CAUSES PHRASE TO BE SPOKEN SLOWER
                              1436   *
0000  010010100               1437   REPEAT    LDX       2
0001  001001111               1438             TCY       15
0003  001100000               1439   REPT2     TCMIY     0
0007  010011000               1440             LDX       1
000F  001000101               1441             TCY       10
001F  010110010               1442   RPT+1     COMX8                        DAM REG
003F  000101001               1443             TMA                          STORE WORD-->ACC
007F  010110010               1444             COMX8                        EXIT DAM
007E  000101101               1445             TAMIYC
007D  001010111               1446             YNEC      14                 *
007B  100011111   1442        1447             BRANCH    RPT+1              *
0077  010110010               1448             COMX8
006F  001001000               1449             TCY       1
005F  001100000               1450             TCMIY     0
003E  010000111               1451             BL        ADDWDS2
007C  100001010   2057        1452
                              1453   *    LDADDISP-->
                              1454   *    SUBROUTINE TO DISPLAY WORD BEING USED IN LEARN MODE
                              1455   *
0079  001000000               1456   LOADDISP  TCY       0                  INITIALIZE Y/POINTER
0073  010011100               1457   DPLOAD    LDX       3                  TRANSFER LSW'S
0067  000101001               1458             TMA                          *
004F  010011000               1459             LDX       1                  *
001E  000101111               1460             TAM                          *
003D  010010100               1461             LDX       2                  TRANSFER MSW'S
007A  000101001               1462             TMA                          *
0075  010010000               1463             LDX       0                  *
006B  000101111               1464             TAM
0057  010111111               1465             RETN
002E  000100000               1466             TBIT      0
005C  101100001   1470        1467             BRANCH    LDONE
0038  001100000               1468             TCMIY     0
0070  101000011   1471        1469             BRANCH    LDONE+1
0061  001101000               1470   LDONE     TCMIY     1
0043  001010001               1471   LDONE+1   YNEC      8
0006  101110011   1457        1472             BRANCH    DPLOAD             NO, LOOP--ELSE,
000D  010010001               1473             LDX       8
```

TABLE IX-10 (Continued)

```
0018 001001110              TCY      7
0037 000101010              TMY
006E 010000001              LDP      8
0050 001011010              YNEC     5
0034 101011000 1219         BRANCH   DISLP7
0074 010000010              BL       ADDCTR6
0069 101011001 0704
                    *
                    *
                    *  SETBIT2 = SUBROUTINE TO USE DAM REG FOR FLAG PURPOSES
                    *
0053 010110010      SETBIT2 COMX8                DAM REG
0026 001000100              TCY      2
004C 010100001              SBIT     2           TEST BIT 2
0018 001001000              TCY      1
0031 000101010              TMY
0062 010110010              COMX8                EXIT DAM
0045 010111111              RETN
                    *
000A 010110010      SETBIT1 COMX8
0015 001000100              TCY      2
002B 010100010              SBIT     1
0056 010110010              COMX8
002C 010111111              RETN
                    *
                    * MEMLOOP= LOADS ADDRESS INTO ROM ADDRESS, 4 BITS AT A TIME
                    *
005B 001000011      MEMADDR TCY      12          CHIP SELECT
0030 000001101              SETR
0060 001001101              TCY      11          L/R = 1 (INPUT)
0041 000001101              SETR                 R11 = 1
0002 001000101              TCY      10
0005 000000110              CLA
000B 001111100              ACACC    3           FOR LOOP COUNT, ACC = 3
0017 010010100              LDX      2           MEMORY FOR LOOP (SAVE ADDR)
002F 000101110      MEMLOOP TAMZA
005E 010011000              LDX      1
003C 001110100              ACACC    TWO
0078 000001101              SETR                 LOADS COMMAND
0071 000110110              RSTR                 *
0063 000101001              TMA                  4 BITS OF ADDR ==>ACC
0047 001110000              ACACC    0
```

TABLE IX-10 (Continued)

```
000E  000001101         1516                  SETR                    LOADS DATA
0010  000110110         1517                  RSTR                    *
0038  001001011         1518                  TCY     13
0076  000000011         1519    SHIFTUP       XMA                     SHIFT ROUTINE      *
006D  000000100         1520                  DYN                     *    SHIFT UP IN    *
005B  001011001         1521                  YNEC    9               *    SAME REGISTER  *
0036  101110110   1519  1522                  BRANCH  SHIFTUP         * * * * * * * * * * *
006C  001000101         1523                  TCY     10              ORIGINAL WORD
0059  010010100         1524                  LDX     2               REG=6
0032  000000111         1525                  DMAN                    MEM-1,==> ACC  LOOP
0064  100101111   1509  1526                  BRANCH  MEMLOOP
0049  000101111         1527                  TAM
0012  001111100         1528                  ACACC   3
0025  000001101         1529                  SETR
004A  000110110         1530                  RSTR
0014  000000110         1531                  CLA
0029  000001101         1532                  SETR
0052  000110110         1533                  RSTR
0024  010011000         1534    MEMDRED       LDX     ONE     * DUMMY READ TO SETUP MEMORY ADDRESS
0048  001000101         1535                  TCY     TEN             **
0010  001110001         1536                  ACACC   EIGHT           **
0021  000001101         1537                  SETR                    **
0042  000110110         1538                  RSTR                    **
0004  010111111         1539                  RETN
0009  010001000         1540    MSPEL3        CALLL   CLEAR
0013  110111010   0236  1541
0027  010001001         1542                  CALLL   DELAY2
004E  110100111   1398  1543
001C  100000000   1437  1544                  BRANCH  REPEAT
                        1545    *  SPELLING IS INCORRECT
0039  010111111         1546    MISSPELL      RETN
0072  010110010         1547                  COMX8
0065  001000110         1548                  TCY     6               FLAG
004B  010001000         1549                  LDP     1
0016  000100010         1550                  TBIT    1               BIT 1==>0=FIRST TRY
002D  100001001   0304  1551                  BRANCH  NOPHRASE        BIT 1==>1=SECOND TRY
005A  010100010         1552                  SBIT    1               *
                        1553    *  LOAD NEGATIVE RESPONSE INTO L/E
0034  010011010         1554    SCORE         LDX     5
0068  001001011         1555                  TCY     13
0051  000110010         1556                  IMAC
0022  000101111         1557                  TAM
```

TABLE IX-10 (Continued)

```
0044  010011100          1558          LDX      3
0008  001001011          1559          TCY      13                 FLAG
0011  001100100          1560          TCMIY    2
0023  010001010          1561          CALLL    CURLEVL
0046  111101111   0769   1562
000C  000000101          1563          IYC
0019  001100110          1564          TCMIY    6
0033  010010100          1565          LDX      2                  FLAG
0066  001001111          1566          TCY      15                 *
004D  001100010          1567          TCMIY    4
001A  010001000          1568          BL       SPK4
0035  101100101   0311   1569
006A  001100000          1570  ADDCTR2 TCMIY    0                  FOR RETN$BCH
0055  010011100          1571          LDX      3
002A  001001011          1572          TCY      13
0054  001100010          1573          TCMIY    4
0028  010001101          1574          BL       CORR+1
0050  101111110   1590   1575
                         1576  *
```

TABLE IX-11

```
                         1577             ORGPG    11
                         1578  *
                         1579  *  POINTERS DAM=WORD 0==> RANDOM WORD ENTRY POINTER
                         1580  *  POINTER DAM=WORD 1 ==> CORRECR SPELLING BUFFER POINTER
                         1581  *
0000  010110010          1582  CORR$SPL COMX8                       DAM REG=POINTER
0001  001000000          1583          TCY      0
0003  001100000          1584          TCMIY    0                  ZEROS OUT POINTER
0007  001100000          1585          TCMIY    0
000F  001100000          1586          TCMIY    0
001F  001100000          1587          TCMIY    0
003F  010110010          1588          COMX8                       OUT OF DAM REG
007F  010111111          1589          RETN
007E  010001010          1590  CORR+1  CALLL    CURLEVL
007D  111101111   0769   1591
007B  001001111          1592          TCY      15
0077  000101001          1593          TMA
006F  000010101          1594          AMAAC
```

TABLE IX-11 (Continued)

```
005F  001110010        1595           ACACC    4
003E  001000101        1596           TCY      10
007C  000101111        1597           TAM
0079  010000111        1598           CALLL    ADDB
0073  110001100  2139  1599
0067  010000101        1600           CALLL    MEMADDR
004F  111011000  1501  1601
001E  010001110        1602           CALLL    LOADRESS
003D  111000010  1121  1603
                       1604  *
                       1605  *  RESIDENT:
                       1606  *     LOOP TO TRANSFER ADDRESS FROM RESIDENT (RAM) TO ADDRESS
                       1607  *     REGION (RAM)
                       1608  *
007A  001001110        1609  RESIDENT TCY      7                 OLD BLKCSB ROUTINE
0075  000000110        1610  CSB2     CLA
006B  001111000        1611           ACACC    1
0057  010010100        1612           LDX      2
002E  000101111        1613           TAM
005C  010011100        1614           LDX      3
0038  001110101        1615           ACACC    10
0070  000101100        1616           TAMDYN
0061  101110101  1610  1617           BRANCH   CSB2
0043  010011000        1618           LDX      1
0006  001000001        1619           TCY      8
000D  001100100        1620           TCMIY    2
001B  010011010        1621  ADRSCALC LDX      5                 LSW
0037  111001100  1631  1622           CALL     RCOMX8
006F  000101001        1623  ADD2ROM  TMA                        READY FOR ADDITION
005D  010011000        1624           LDX      1                 LSW OF ROM ADDR REGION
003A  001000101        1625           TCY      10
0074  010000000        1626           CALLL    ADDCARRY
0069  111011000  0112  1627
0053  010010010        1628           LDX      4
0026  001000000        1629           TCY      0                 *
                       1630  *
004C  001000000        1631  RCOMX8   TCY      0
0018  010110010        1632  COMX8    COMX8
0031  000101010        1633           TMY
0062  010110010        1634           COMX8
0045  010111111        1635           RETN
000A  000101001        1636           TMA
```

TABLE IX-11 (Continued)

| | | | | | | | |
|---|---|---|---|---|---|---|---|
| 0015 | 010011000 | | 1637 | | LDX | 1 | ROM ADDR REGION |
| 002B | 001001101 | | 1638 | | TCY | 11 | * |
| 0056 | 010000000 | | 1639 | | CALLL | ADDCARRY | |
| 002C | 111011000 | 0112 | 1640 | | | | |
| 0058 | 001000001 | | 1641 | | TCY | 8 | * |
| 0030 | 000000111 | | 1642 | | DMAN | | ADD2ROM TO BE EXECUTED TWICE |
| 0060 | 000101111 | | 1643 | | TAM | | * |
| 0041 | 000110011 | | 1644 | | MNEZ | | |
| 0002 | 100011011 | 1621 | 1645 | | BRANCH | ADRSCALC | |
| 0005 | 010000101 | | 1646 | | CALLL | MEMADDR | |
| 000B | 111011000 | 1501 | 1647 | | | | |
| 0017 | 010001110 | | 1648 | | CALLL | LOADRESS | |
| 002F | 111000010 | 1121 | 1649 | | | | |
| 005E | 010000101 | | 1650 | | CALLL | MEMADDR | |
| 003C | 111011000 | 1501 | 1651 | | | | |
| | | | 1652 | * | | | |
| 0078 | 010000011 | | 1653 | | BL | OUTADDR | |
| 0071 | 100000000 | 1723 | 1654 | | | | |
| | | | 1655 | * | | | |
| 0063 | 000101111 | | 1656 | TONE22 | TAM | | |
| 0047 | 010001010 | | 1657 | TONES | CALLL | CURLEVL | |
| 000E | 111101111 | 0769 | 1658 | | | | |
| 001D | 001100001 | | 1659 | | TCMIY | 8 | |
| 003B | 001101110 | | 1660 | | TCMIY | 7 | * |
| 0076 | 010011100 | | 1661 | | LDX | 3 | |
| 006D | 001000001 | | 1662 | | TCY | 8 | |
| 005A | 010100100 | | 1663 | | RBIT | 0 | |
| 0036 | 010100111 | | 1664 | | RBIT | 3 | |
| 006C | 001010001 | | 1665 | | TBA | | |
| 0059 | 010011000 | | 1666 | | LDX | 1 | |
| 0032 | 001000101 | | 1667 | | TCY | 10 | |
| 0064 | 000010101 | | 1668 | | AMAAC | | |
| 0049 | 100100100 | 1676 | 1669 | | BRANCH | TONCARRY | |
| 0012 | 000101111 | | 1670 | TONE3 | TAM | | |
| 0025 | 010010100 | | 1671 | | LDX | 2 | |
| 004A | 001001111 | | 1672 | | TCY | 15 | |
| 0014 | 001100100 | | 1673 | | TCMIY | 2 | |
| 0029 | 010000010 | | 1674 | | BL | ADDCTR6 | |
| 0052 | 101011001 | 0704 | 1675 | | | | |
| 0024 | 000101101 | | 1676 | TONCARRY | TAMIYC | | |
| 0048 | 000110010 | | 1677 | | IMAC | | |
| 0010 | 000101111 | | 1678 | | TAM | | |

TABLE IX-11 (Continued)

| | | | | | | |
|---|---|---|---|---|---|---|
| 0021 | 100010010 | 1670 | 1679 | | BRANCH | TONE3 |
| 0042 | 001001110 | | 1680 | NXTTONE | TCY | 7 |
| 0004 | 010010001 | | 1681 | | LDX | 8 |
| 0009 | 000101010 | | 1682 | | TMY | |
| 0013 | 001011010 | | 1683 | | YNEC | 5 |
| 0027 | 101100101 | 1669 | 1684 | | BRANCH | CRY24 |
| 004E | 010010100 | | 1685 | | LDX | 2 |
| 001C | 001001111 | | 1686 | | TCY | 15 |
| 0039 | 001101110 | | 1687 | | TCMIY | 7 |
| 0072 | 101001011 | 1692 | 1688 | | BRANCH | TONESCOR |
| 0065 | 001100000 | | 1689 | CRY24 | TCMIY | 0 |
| | | | 1690 | * RETURN TO ROUTINE | | |
| | | | 1691 | * | | |
| 004B | 010010001 | | 1692 | TONESCOR | LDX | 8 |
| 0016 | 001000001 | | 1693 | | TCY | 8 |
| 0020 | 000100001 | | 1694 | | TBIT | 2 |
| 005A | 101010001 | 1698 | 1695 | | BRANCH | TON12 |
| 0034 | 010001111 | | 1696 | | BL | DISP/KB |
| 006B | 100101100 | 2219 | 1697 | | | |
| 0051 | 010010100 | | 1698 | TON12 | LDX | 2 |
| 0022 | 001000111 | | 1699 | | TCY | 14 |
| 0044 | 000000111 | | 1700 | | DMAN | |
| 000B | 101100011 | 1656 | 1701 | | BRANCH | TONE22 |
| 0011 | 010010001 | | 1702 | | LDX | 8 |
| 0023 | 001000001 | | 1703 | | TCY | 8 |
| 0046 | 010100101 | | 1704 | | RBIT | 2 |
| 000C | 010011010 | | 1705 | | LDX | 5 |
| 0019 | 001001011 | | 1706 | | TCY | 13 |
| 0035 | 000101001 | | 1707 | | TMA | |
| 0066 | 010011000 | | 1708 | | LDX | 1 |
| 0040 | 010000110 | | 1709 | | LDP | 6 |
| 001A | 011101001 | | 1710 | | ALEC | 9 |
| 0035 | 101101100 | 0969 | 1711 | | BRANCH | FS |
| 006A | 010001010 | | 1712 | | CALLL | CURLEVL |
| 0055 | 111101111 | 0769 | 1713 | | | |
| 002A | 001100110 | | 1714 | | TCMIY | 6 |
| 0054 | 001101110 | | 1715 | | TCMIY | 7 |
| 002B | 010000010 | | 1716 | | BL | ADDCTR6 |
| 0050 | 101011001 | 0704 | 1717 | | | |

TABLE IX-12

```
                          1718              ORGPG     12
                          1719   *
                          1720   *   OUTADDR-
                          1721   *      LOADS CORRECT SPELLING BUFFER WITH ACTUAL SPELLING CODE
                          1722   *
0000  010001110           1723   OUTADDR   CALLL     OUTADDR2
0001  111000001    1083   1724
0003  010011100           1725             LDX       3
0007  001001000           1726             TCY       1                         *
000F  010001101           1727             CALLL     COMX8
001F  110011000    1632   1728
003F  000101111           1729             TAM
007F  010001110           1730             CALLL     OUTADDR2                  PDC FOR OUTPUT COMMAND
007E  111000001    1083   1731
007D  010010100           1732             LDX       2
007B  001001000           1733             TCY       1
0077  010001101           1734             CALLL     COMX8
006F  110011000    1632   1735
005F  010000101           1736             LDP       10
003E  000101111           1737             TAM
007C  000100001           1738             TBIT      2                         END OF SPELLING?
0079  110001010    1493   1739             CALL      SETBIT1
0073  010000011           1740             LDP       12
0067  010110010           1741             COMX8
004F  001001000           1742             TCY       1
001E  000110010           1743             IMAC                                INCREMENT COR SPEL POINTER
003D  000101111           1744             TAM
007A  001000100           1745             TCY       2
0075  000100010           1746             TBIT      1                         TEST FLAG
006B  100111000    1751   1747             BRANCH    LNK$ET
0057  100101110    1749   1748             BRANCH    EXDAM2
002E  010110010           1749   EXDAM2    COMX8
005C  100000000    1723   1750             BRANCH    OUTADDR                   ADDR--> ALWAYS BRANCH
0038  000000110           1751   LNK$ET    CLA
0070  001001001           1752             TCY       9
0061  010011000           1753             LDX       1
0043  000101111           1754   LNK$ET+1  TAM
0006  010001110           1755             CALLL     OUTADDR2                  PDC FOR OUTPUT 4 BITS
000D  111000001    1083   1756
001B  010000101           1757             LDP       10
0037  011100000           1758             ALEC      0
006E  111010011    1485   1759             CALL      SETBIT2
```

TABLE IX-12 (Continued)

| | | | | | | | |
|---|---|---|---|---|---|---|---|
| 0050 | 010000011 | | 1760 | | LDP | 12 | |
| 003A | 011100000 | | 1761 | | ALEC | 0 | |
| 0074 | 101001100 | 1766 | 1762 | | BRANCH | LNKON | |
| 0069 | 010000101 | | 1763 | | LDP | 10 | |
| 0053 | 011101000 | | 1764 | | ALEC | 1 | |
| 0026 | 110001010 | 1493 | 1765 | | CALL | SETBIT1 | |
| 004C | 010000011 | | 1766 | LNKON | CALLL | LNKPTR2 | |
| 0018 | 111011110 | 1785 | 1767 | | | | |
| 0031 | 010001110 | | 1768 | | CALLL | OUTADDR2 | PDC |
| 0062 | 111000001 | 1083 | 1769 | | | | |
| 0045 | 010000010 | | 1770 | | LDP | 4 | |
| 000A | 001111111 | | 1771 | | ACACC | 15 | |
| 0015 | 110011001 | 0745 | 1772 | | CALL | TSTBIT2 | |
| 002B | 001111000 | | 1773 | | ACACC | 1 | |
| 0056 | 010000111 | | 1774 | | CALLL | LNKPTR | |
| 002C | 111101000 | 2130 | 1775 | | | | |
| 0058 | 000110010 | | 1776 | | IMAC | | |
| 0030 | 000101111 | | 1777 | | TAM | | * |
| 0060 | 010001110 | | 1778 | | CALLL | OUTADDR2 | PDC'S |
| 0041 | 111000001 | 1083 | 1779 | | | | |
| 0002 | 010000010 | | 1780 | | LDP | 4 | |
| 0005 | 001111111 | | 1781 | | ACACC | 15 | |
| 000B | 110011001 | 0745 | 1782 | | CALL | TSTBIT2 | |
| 0017 | 010000011 | | 1783 | | LDP | 12 | |
| 002F | 001111000 | | 1784 | | ACACC | 1 | |
| 005E | 010011000 | | 1785 | LNKPTR2 | LDX | 1 | |
| 003C | 001001001 | | 1786 | | TCY | 9 | * |
| 007B | 000101010 | | 1787 | | TMY | | * |
| 0071 | 010011110 | | 1788 | | LDX | 7 | |
| 0063 | 000101111 | | 1789 | | TAM | | STORE WORD |
| 0047 | 001000101 | | 1790 | | TCY | 10 | R10 |
| 000E | 010111111 | | 1791 | | RETN | | |
| 0010 | 010001110 | | 1792 | | CALLL | OUTADDR2 | |
| 003E | 111000001 | 1083 | 1793 | | | | |
| 0076 | 011100000 | | 1794 | | ALEC | 0 | |
| 006D | 101100100 | 1801 | 1795 | | BRANCH | LNKEND | |
| 005B | 010000111 | | 1796 | LNKCNT | CALLL | LNKPTR | |
| 0036 | 111101000 | 2130 | 1797 | | | | |
| 006C | 000110010 | | 1798 | LNKCNT2 | IMAC | | |
| 0059 | 101000010 | 1813 | 1799 | | BRANCH | ENDSPEL | GO TO ENDSPEL |
| 0032 | 101000011 | 1754 | 1800 | | BRANCH | LNK$ET+1 | ELSE |
| 0064 | 010110010 | | 1801 | LNKEND | COMX8 | | |

TABLE IX-12 (Continued)

```
0049  001000100          1802                TCY      2
0012  000100010          1803                TBIT     1
0025  100000100   1814   1804                BRANCH   ENDSPEL1
004A  000100001          1805                TBIT     2
0014  101010010   1808   1806                BRANCH   LNK4
0029  101011011   1796   1807                BRANCH   LNKCNT
0052  000100000          1808   LNK4         TBIT     0
0024  100010001   1833   1809                BRANCH   F9
0048  010100000          1810                SBIT     0
0010  010000001          1811                BL       CALADDR
0021  100000000   1164   1812
0042  010110010          1813   ENDSPEL      COMX8                           ADDRESS DAM
0003  001000100          1814   ENDSPEL1     TCY      2
0009  001100000          1815                TCMIY    0
0013  010011100          1816                LDX      3
0027  001001011          1817                TCY      13
004E  000101001          1818                TMA
001C  010000111          1819                LDP      14
0039  011101100          1820                ALEC     3
0072  100000000   2009   1821                BRANCH   SPEAK
0065  010000011          1822                LDP      12
004B  011100010          1823                ALEC     4                      'SPELL'
0016  100101010   1847   1824                BRANCH   USPELL3
0020  010000001          1825                LDP      8
005A  011101010          1826                ALEC     5                      'SAY IT'
0034  100101011   1216   1827                BRANCH   DISLP=1
0068  010001100          1828                LDP      3
0051  011100111          1829                ALEC     14
0022  101001111   0501   1830                BRANCH   HANG
0044  010001111          1831                BL       DISP/KB
0008  100101100   2219   1832
0011  010010010          1833   F9           LDX      4
                         1834   *   TRANS-->STORES CALCULATED ADDRESS IN DAM FOR USE IN LINK/EDIT
                         1835   *
0023  001000101          1836   TRANS-1      TCY      10
0046  000101001          1837   TRANS        TMA                             LOAD ACC
000C  010110010          1838                COMX8
0019  000101101          1839                TAMIYC
0033  010110010          1840                COMX8
0066  001010111          1841                YNEC     14
004D  101000110   1837   1842                BRANCH   TRANS
001A  010111111          1843                RETN
```

TABLE IX-12 (Continued)

```
0055  010110010         1844              LDMXB
006A  010000001         1845              BL        CALADDR
0055  100000000   1164  1846
002A  010000111         1847  USPELL3     CALLL     SPEAK+1
0054  110000001   2010  1848
0028  010000011         1849              CALLL     TRANS-1
0050  110100011   1836  1850
0020  010000111         1851              BL        SPEAK
0040  100000000   2009  1852
```

TABLE IX-13

```
                        1853              ORGPG     13
                        1854  *
                        1855  *
                        1856  *
                        1857  *           THE FOLLOWING ROUTINE DIRECTS THE PROGRAM FLOW ACCORDING TO THE
                        1858  *           KEY PRESSED,
                        1859  *
0000  000100010         1860  KEY00       TBIT      1
0001  100111011   1933  1861              BRANCH    KEY2
0003  010010001         1862  KEY0        LDX       8                     * LETTER KEYS
0007  001000001         1863              TCY       8
000F  000100010         1864              TBIT      1                     TEST GO FLAG
001F  101011111   1875  1865              BRANCH    TRANSFER
003F  001001110         1866              TCY       7
007F  000100001         1867              TBIT      2                     TEST FOR MODE OTHER THAN SPELL
                        1868  *                                           *  OR LEARN
007E  101011111   1875  1869              BRANCH    TRANSFER
007D  011101100         1870              ALEC      3                     A,B,C,D?
007B  101100001   1892  1871              BRANCH    KEY12
0077  010000010         1872  KEY13       BL        DIFFSLV               CHANGE LEVL IN DISPLAY
006F  101111110   0629  1873
                        1874  *
005F  001001110         1875  TRANSFER    TCY       7
003E  010010001         1876              LDX       8
007C  000101010         1877              TMY
0079  001011010         1878              YNEC      5
0073  100011110   1882  1879              BRANCH    TRANS3
0067  010000010         1880              BL        NOSTRANS
004F  100101100   0680  1881
```

TABLE IX-13 (Continued)

| | | | | | | | |
|---|---|---|---|---|---|---|---|
| 001E | 001001111 | | 1882 | TRANS3 | TCY | 15 | |
| 003D | 010010000 | | 1883 | | LDX | 0 | |
| 007A | 000101001 | | 1884 | | TMA | | |
| 0075 | 001001101 | | 1885 | | TCY | 11 | |
| 006B | 000101010 | | 1886 | | TMY | | |
| 0057 | 010001000 | | 1887 | | LDP | 1 | |
| 002E | 001010001 | | 1888 | | YNEC | 8 | |
| 005C | 100000000 | 0194 | 1889 | | BRANCH | NOTFULL | |
| 0038 | 010001011 | | 1890 | | LDP | 13 | |
| 0070 | 100010100 | 1946 | 1891 | | BRANCH | NOP | |
| 0061 | 001001111 | | 1892 | KEY12 | TCY | 15 | * STORE |
| 0043 | 010011000 | | 1893 | | LDX | 1 | * NEW |
| 0006 | 000101111 | | 1894 | | TAM | | * DIFFICULTY LEVEL |
| 000D | 101110111 | 1872 | 1895 | | BRANCH | KEY13 | |
| 001B | 011100101 | | 1896 | KEY1 | ALEC | 10 | * MSD=1 |
| 0037 | 101000111 | 1930 | 1897 | | BRANCH | KEY15 | |
| 006E | 011100111 | | 1898 | | ALEC | 14 | |
| 005D | 101101001 | 1902 | 1899 | | BRANCH | KEY7 | |
| 003A | 010000010 | | 1900 | | BL | GAME#2 | KEY=1F * CODEBREAKER |
| 0074 | 100000000 | 0620 | 1901 | | | | |
| 0069 | 011101011 | | 1902 | KEY7 | ALEC | 13 | |
| 0053 | 100011000 | 1906 | 1903 | | BRANCH | KEY8 | |
| 0026 | 010001100 | | 1904 | | BL | GAME#1 | KEY=1E * HANGMAN |
| 004C | 100000000 | 0479 | 1905 | | | | |
| 0018 | 010010001 | | 1906 | KEY8 | LDX | 8 | |
| 0031 | 001001110 | | 1907 | | TCY | 7 | |
| 0062 | 000101010 | | 1908 | | TMY | | PUT MODE # IN Y |
| 0045 | 011101101 | | 1909 | | ALEC | 11 | |
| 000A | 101000001 | 1918 | 1910 | | BRANCH | KEY14 | |
| 0015 | 001011010 | | 1911 | | YNEC | 5 | * CHECK MODE -- |
| 002B | 100101100 | 1914 | 1912 | | BRANCH | K10A | * IGNORE ERASE AND |
| 0056 | 100010100 | 1946 | 1913 | | BRANCH | NOP | |
| 002C | 001000001 | | 1914 | K10A | TCY | 8 | |
| 0058 | 000100010 | | 1915 | | TBIT | 1 | TEST GO FLAG |
| 0030 | 100000101 | 1921 | 1916 | | BRANCH | KEY10 | |
| 0060 | 100010100 | 1946 | 1917 | | BRANCH | NOP | |
| 0041 | 010001110 | | 1918 | KEY14 | BL | ROM | |
| 0002 | 101010101 | 1153 | 1919 | | | | |
| | | | 1920 | * | | | * HANGMAN MODE |
| 0005 | 011100011 | | 1921 | KEY10 | ALEC | 12 | |
| 000B | 100010001 | 1974 | 1922 | | BRANCH | ERASE | KEY=1C * ERASE |
| 0017 | 001001110 | | 1923 | | TCY | 7 | |
| 002F | 000101010 | | 1924 | | TMY | | |

TABLE IX-13 (Continued)

```
005F  001011110         1925                 YNEC     7          * IGNORE ENTER
003C  101110001   1928  1926                 BRANCH   KEY9       * IN RANDOM LETTER
0078  100010100   1946  1927                 BRANCH   NOP        * MODE
0071  010001000         1928   KEY9          BL       ENTER      KEY=1D * ENTER
0063  101011000   0254  1929
0047  000101011         1930   KEY15         TYA                 PUT 15 IN ACC
000E  010001011         1931                 BL       KEY0       * LETTERS Q-Z
001D  100000011   1862  1932
003B  010010001         1933   KEY2          LDX      8          MSD=2
0076  001001110         1934                 TCY      7
006D  011101100         1935                 ALEC     3
005B  101010010   1949  1936                 BRANCH   KEY3
0036  011100110         1937                 ALEC     6
006C  101110010   1962  1938                 BRANCH   KEY6
0059  000101010         1939                 TMY                 PUT MODE IN Y
0032  001011010         1940                 YNEC     5          * IGNORE CLUE
0064  100010100   1946  1941                 BRANCH   NOP        * KEY UNLESS
0049  010000110         1942                 LDP      6
0012  001000001         1943                 TCY      8          * IN HANGMAN MODE
0025  000100010         1944                 TBIT     1          * AND GO FLAG
004A  101110000   0923  1945                 BRANCH   CLUE
0014  010001111         1946   NOP           BL       DISP/KB    * ENTER KEYS IN
0029  100101100   2219  1947
                        1948   *                                 KEY=27 * CLUE
0052  011100100         1949   KEY3          ALEC     2
0024  100100001   1953  1950                 BRANCH   KEY4
0048  010000000         1951                 BL       OFF        KEY=23 * OFF
0010  101110001   0124  1952
0021  011101000         1953   KEY4          ALEC     1
0042  100010011   1957  1954                 BRANCH   KEY5
0004  010000100         1955                 BL       SPELL
0009  100010001   0462  1956
0013  010000000         1957   KEY5          LDP      0
0027  011100000         1958                 ALEC     0
004E  101001001   0142  1959                 BRANCH   GAME#3     KEY=20 * RANDOM LETTER
001C  010000100         1960                 BL       LEARN      KEY=21 * LEARN
0039  100011001   0466  1961
0072  000100001         1962   KEY6          TBIT     2          * TEST FOR MODES OTHER
0065  100010100   1946  1963                 BRANCH   NOP        * THAN SPELL OR LEARN
004B  011100010         1964   KT6           ALEC     4
0016  101000100   1972  1965                 BRANCH   K17
002D  001000001         1966                 TCY      8
```

TABLE IX-13 (Continued)

| | | | | | | | |
|---|---|---|---|---|---|---|---|
| 005A | 000100010 | | 1967 | | TBIT | 1 | GO FLAG |
| 0034 | 100001100 | 1977 | 1968 | | BRANCH | K19 | |
| 0068 | 011101010 | | 1969 | | ALEC | 5 | REPLAY? |
| 0051 | 101001101 | 1981 | 1970 | | BRANCH | K23 | |
| 0022 | 100010100 | 1946 | 1971 | | BRANCH | NOP | |
| 0044 | 010001000 | | 1972 | K17 | BL | GO | KEY=24 * GO |
| 0008 | 101111100 | 0213 | 1973 | | | | |
| 0011 | 010001000 | | 1974 | ERASE | CALLL | CLEAR | |
| 0023 | 110111010 | 0236 | 1975 | | | | |
| 0046 | 100010100 | 1946 | 1976 | | BRANCH | NOP | |
| 000C | 011101010 | | 1977 | K19 | ALEC | 5 | |
| 0019 | 100100000 | 1990 | 1978 | | BRANCH | K21 | |
| 0033 | 010000101 | | 1979 | | BL | REPEAT | |
| 0066 | 100000000 | 1437 | 1980 | | | | |
| 0040 | 010010000 | | 1981 | K23 | LDX | 0 | |
| 001A | 001000000 | | 1982 | | TCY | 0 | |
| 0035 | 000110011 | | 1983 | | MNEZ | | |
| 006A | 100101010 | 1986 | 1984 | | BRANCH | K20 | |
| 0055 | 100010100 | 1946 | 1985 | | BRANCH | NOP | |
| 002A | 010011000 | | 1986 | K20 | LDX | 1 | |
| 0054 | 001110001 | | 1987 | | ACACC | 8 | ACC=13 AFTER THIS INSTRUCTION |
| 0028 | 000001001 | | 1988 | | MNEA | | |
| 0050 | 100010100 | 1946 | 1989 | | BRANCH | NOP | |
| 0020 | 010001000 | | 1990 | K21 | BL | REPLAY | |
| 0040 | 100101100 | 0250 | 1991 | | | | |

TABLE IX-14

```
                                ORGPG     14
                     ************************************************************************
                     * SPEAK                                                                *
                     * ROUTINE TO CONTROL SPEECH TO AND FROM SYNTHESIZER                    *
                     *                                                                      *
                     * IF SS--SET, SPEAK WAS CALLED                                         *
                     * IF SS--RESET, MEMADDR WAS CALLED                                     *
                     *                                                                      *
                     * IF SS=1, ADDRESSES ARE TRANSFERED FROM FILES 6 AND 7 TO FILE         *
                     * 1, WORDS 10-13, ELSE IF SS=0, ADDRESS IS IN FILE 1 PRIOR TO CALL     *
                     *                                                                      *
                     * 2 POINTERS USED                                                      *
                     *     1) LINK/EDIT POINTER FOR WORDS IN FILES 6 AND 7                  *
                     *     2) ROM ADDR POINTER FOR WORDS IN FILE 1.                         *
                     *                                                                      *
                     ************************************************************************
                     *                                                                      *
0000  010110101      SPEAK     SEAC
0001  010011000      SPEAK+1   LDX      1
0003  001000001                TCY      8
0007  001100101                TCMIY    10              INITIALIZE ROM ADDR POINTER
000F  001100000                TCMIY    0               INITIALIZE LNK/EDT POINTER
001F  001001001      SPKLOP-1  TCY      9
003F  000101010      SPKLOOP   TMY
007F  010011110                LDX      7               GET WORD FROM LNK/EDT
007E  000101001                TMA                      LOAD WORD IN ACC
007D  010011000                LDX      1               POINTER
007B  001000001                TCY      8               *
0077  000101010                TMY                      *
006F  000101111                TAM                      STORE WORD
005F  001000001                TCY      8               BUMP POINTER
003E  000110010                IMAC                     *
007C  000101111                TAM                      *
0079  001001001                TCY      9               GET FILE FOR NEXT WORD
0073  000101010                TMY
0067  000000000                COMX                     FILE 6
004F  000101001                TMA                      WORD--ACC
001E  000000000                COMX                     FILE 1
003D  001000001                TCY      8               POINTER
007A  000101010                TMY                      *
0075  000101111                TAM                      STORE WORD
006B  001001001                TCY      9               BUMP LNK/EDT POINTER
```

TABLE IX-14 (Continued)

```
0057  000110010         2034           IMAC                        IF > 15, RETURN
002E  100100001   2111  2035           BRANCH    RETURN
005C  000101111         2036           TAM                         STORE INCREMENT
0038  001000001         2037           TCY       8                 BUMP ROM AREA POINTER
0070  000110010         2038           IMAC                        *
0061  000101110         2039           TAMZA
0043  000101010         2040           TMY                         *
0006  001010111         2041           YNEC      14                IS Y = 14?
000D  100011111   2014  2042           BRANCH    SPKLOP-1
001B  010111111         2043           RETN                        YES, CONTINUE
0037  001000101         2044           TCY       10
006E  010000111         2045  ADDWDS   LDP       14
005D  000010101         2046           AMAAC
003A  100001010   2057  2047           BRANCH    ADDWDS2
0074  010000111         2048           LDP       14
0069  000000101         2049           IYC                         LOOP COUNT
0053  001010111         2050           YNEC      14                *
0026  101101110   2045  2051           BRANCH    ADDWDS            *
004C  011101000         2052           ALEC      1
0018  100100001   2111  2053           BRANCH    RETURN            IF YES, RETURN
0031  010001001         2054           LDP       9
0062  011100100         2055           ALEC      2                 ACC-->2?
0045  100000000   1299  2056           BRANCH    LETTER
000A  010000101         2057  ADDWDS2  CALLL     MEMADDR
0015  111011000   1501  2058
                        2059  *        ROM ADDRESSING SUBROUTINE:                          *
                        2060  *        ASSUMES X AND Y HAVE BEEN DEFINED PRIOR TO CALLING  *
                        2061  *                                                            *
                        2062  *                                                            *
                        2063  *        LOADS ADDRESS INTO ROM ADDRESS AREA                 *
                        2064  *        ALL R LINES, ETC.... REMAIN THE SAME AS WHEN        *
                        2065  *        ENTERING SUBROUTINE.                                *
                        2066  *                                                            *
                        2067  *************************************************************
                        2068  *                                                            *
                        2069  *                                                            *
                        2070  *        END OF ROUTINE
                        2071  *
002B  001000011         2072  MEMADDR2 TCY       12                CS , GIVING SYN, COMMANDS
0056  000001101         2073           SETR                        R12 = 1
002C  000000110         2074           CLA
0058  001110101         2075  SPKREG   ACACC     TEN
```

TABLE IX-14 (Continued)

```
0030  001000101         2076            TCY      10
0060  000001101         2077            SETR
0041  000110110         2078            RSTR                  *
0002  000000110         2079  SPKREG+1  CLA
0005  001000011         2080            TCY      12
0008  000001101         2081            SETR
0017  001000101         2082            TCY      10
002F  001110111         2083            ACACC    14
005E  000001101         2084            SETR                  1ST PDC LOADS COMMAND
003C  000110110         2085            RSTR                  *
0078  001001101         2086            TCY      11
0071  000110110         2087            RSTR
0063  001000101         2088            TCY      10
0047  000001101         2089            SETR                  2ND PDC APPLIES TALK TO CTL8
000E  000110110         2090            RSTR                  *
0010  001110000         2091            ACACC    0
003B  000001000         2092            TKA
0076  000001101         2093            SETR                  3RD PDC RELEASES OUTPUT
006D  000110110         2094            RSTR                  *
005B  001001101         2095            TCY      11
0036  000001101         2096            SETR
006C  010011100         2097            LDX      3
0059  001001111         2098            TCY      15
0032  000101111         2099            TAM
0064  000100000         2100            TBIT     0
0049  101011010   2125  2101            BRANCH   BITSET0
0012  010011000         2102            LDX      1
0025  001000001         2103            TCY      8
004A  001100101         2104            TCMIY    10
0014  000010010         2105            CCLA
0029  011100000         2106            ALEC     ZERO
0052  101001000   2109  2107            BRANCH   RETS
0024  100011111   2014  2108            BRANCH   SPKLOP-1
0048  010011000         2109  RETS      LDX      1
0010  001000001         2110            TCY      8
0021  000101110         2111  RETURN    TAMZA                 ACC = ZERO
0042  001001111         2112            TCY      15
0004  010010110         2113  RETURN4   LDX      SIX
0009  000101111         2114            TAM
0013  010011110         2115            LDX      SEVEN
0027  000101100         2116            TAMDYN
004E  100000100   2113  2117            BRANCH   RETURN4
```

TABLE IX-14 (Continued)

| | | | | | | | |
|---|---|---|---|---|---|---|---|
| 001C | 010111111 | | 2118 | | RETN | | |
| 0039 | 010110100 | | 2119 | RETURN+1 | REAC | | |
| 0072 | 001001111 | | 2120 | RETURN+2 | TCY | 15 | TALK BIT |
| 0065 | 010011100 | | 2121 | | LDX | 3 | * |
| 0048 | 010100100 | | 2122 | | RBIT | 0 | * |
| 0016 | 010000010 | | 2123 | | BL | RETNSBCH | |
| 002D | 101001010 | 0710 | 2124 | | | | |
| 005A | 010001111 | | 2125 | BITSET0 | LDP | 15 | |
| 0034 | 100101100 | 2219 | 2126 | | BRANCH | DISP/KB | |
| | | | 2127 | * | | | |
| | | | 2128 | * | END OF SPEECH CONTROL SUBROUTINE | | |
| | | | 2129 | * | | | |
| 0068 | 010011000 | | 2130 | LNKPTR | LDX | 1 | POINTER FOR LNK/EDT |
| 0051 | 001001001 | | 2131 | | TCY | 9 | * |
| 0022 | 000101010 | | 2132 | | TMY | | * |
| 0044 | 010010110 | | 2133 | | LDX | 6 | |
| 0008 | 000101111 | | 2134 | | TAM | | STORE WORD |
| 0011 | 010011000 | | 2135 | | LDX | 1 | POINTER |
| 0023 | 001001001 | | 2136 | | TCY | 9 | * |
| 0046 | 010111111 | | 2137 | | RETN | | |
| | | | 2138 | * | | | |
| 000C | 001000110 | | 2139 | ADD8 | TCY | 6 | |
| 0019 | 010010001 | | 2140 | | LDX | 8 | |
| 0033 | 000100011 | | 2141 | | TBIT | 3 | |
| •0066 | 100011010 | 2144 | 2142 | | BRANCH | RADD8 | |
| 0040 | 101010101 | 2147 | 2143 | | BRANCH | RADD2 | |
| 001A | 010011000 | | 2144 | RADD8 | LDX | 1 | |
| 0035 | 001001011 | | 2145 | | TCY | 13 | |
| 006A | 001100001 | | 2146 | | TCMIY | 8 | |
| 0055 | 010111111 | | 2147 | RADD2 | RETN | | |

TABLE IX-15

```
                          2148          ORGPG     15
                          2149   *
                          2150   *                POWER UP / CLEAR ROUTINE
                          2151   *
                          2152   *      THIS ROUTINE SETS UP INITIAL CONDITIONS IN RAM
                          2153   *
                          2154   *
                          2155   *
0000  001001111           2156   START    TCY       FIFTEEN        * RESET ALL R-LINES
0001  000110110           2157   LOOP$ST  RSTR                     **
0003  000000100           2158            DYN                      **
0007  100000001    2157   2159            BRANCH    LOOP$ST        **
000F  001001011           2160            TCY       13
001F  000001101           2161            SETR
003F  001001111           2162            TCY       15
007F  010111111           2163            RETN                     **
007E  000000110           2164            CLA                      **
007D  010010001           2165            LDX       8
007B  110101110    2183   2166            CALL      FIL$LOOP       **
0077  010011110           2167            LDX       SEVEN          **
006F  110101110    2183   2168            CALL      FIL$LOOP       **
005F  010010110           2169            LDX       SIX            **
003E  110101110    2183   2170            CALL      FIL$LOOP       **
007C  010011010           2171            LDX       FIVE           **
0079  110101110    2183   2172            CALL      FIL$LOOP       **
0073  010010010           2173            LDX       FOUR           **
0067  110101110    2183   2174            CALL      FIL$LOOP       **
004F  010011100           2175            LDX       THREE          **
001E  110101110    2183   2176            CALL      FIL$LOOP       **
003D  010010100           2177            LDX       TWO            **
007A  110101110    2183   2178            CALL      FIL$LOOP       **
0075  010011000           2179            LDX       ONE            **
006B  110101110    2183   2180            CALL      FIL$LOOP       **
0057  010010000           2181            LDX       ZERO           **
                          2182   *
002E  000101100           2183   FIL$LOOP TAMDYN                   * ROUTINE FILLS FILE WITH CONTENTS
005C  100101110    2183   2184            BRANCH    FIL$LOOP       **OF ACC.
0038  010111111           2185            RETN                     **
                          2186   *
```

TABLE IX-15 (Continued)

```
                          2187  *
0070  010001000           2188  DSP7     CALLL    CLEAR
0061  110111010    0236   2189
                          2190  *
0043  010000010           2191           CALLL    DIFFSLV         * DISPLAY DIFF LEVEL A - SPELL MODE
0006  111111110    0629   2192
000D  000000110           2193           CLA
0018  001001101           2194           TCY      11
0037  000110110           2195           RSTR
006E  001000011           2196           TCY      12
005D  000001101           2197           SETR
003A  001000101           2198           TCY      10
0074  000001101           2199           SETR
0069  000110110           2200           RSTR
0053  000001101           2201           SETR
0026  000110110           2202           RSTR
004C  001001101           2203           TCY      11
0018  000001101           2204           SETR
0031  001000101           2205           TCY      10
0062  000001101           2206           SETR
0045  000110110           2207           RSTR
000A  010000101           2208           CALLL    MEMORED
0015  110100100    1534   2209
002B  010001101           2210           BL       TONES
0056  101000111    1657   2211
                          2212  *
                          2213  *
                          2214  *                 KEYBOARD SCAN / DISPLAY ROUTINE
                          2215  *
                          2216  *        THIS ROUTINE DISPLAYS THE CONTENTS OF 'DISPLAY BUFFER' AND
                          2217  *        CHECKS FOR A KEYPRESS.
                          2218  *
002C  010011100           2219  DISP/KB  LDX      3
0058  001001101           2220           TCY      11
0030  001100000           2221           TCMIY    0               RESET TIMEOUT COUNTER
0060  000110110           2222           RSTR                     RESET R12 TO ENABLE DISPLAY
0041  001100000           2223           TCMIY    0
0002  000000110           2224           CLA
0005  001000011           2225  DSP1     TCY      12
0008  010010000           2226           LDX      0
0017  000101101           2227           TAMIYC                   STORE DEBOUNCE COUNTER; SET Y=0
002F  001100000           2228           TCMIY    0               RESET R-LINE POINTER
```

TABLE IX-15 (Continued)

| | | | | | | | |
|---|---|---|---|---|---|---|---|
| 005E | 001001111 | | 2229 | | TCY | 15 | |
| 003C | 000001101 | | 2230 | | SETR | | R=15, TURN ON FILAMENT |
| 0078 | 001000000 | | 2231 | | TCY | 0 | |
| 0071 | 010011000 | | 2232 | DSP2 | LDX | 1 | * |
| 0063 | 000101001 | | 2233 | | TMA | | * |
| 0047 | 010110000 | | 2234 | | TDO | | * LOAD SEGMENT PLA |
| 000E | 010010000 | | 2235 | | LDX | 0 | * |
| 0010 | 000101001 | | 2236 | | TMA | | * |
| 003B | 000001001 | | 2237 | | MNEA | | * |
| 0076 | 010110000 | | 2238 | | TDO | | * |
| 0060 | 000001101 | | 2239 | | SETR | | TURN ON NEW R=LINE |
| 005B | 001001111 | | 2240 | | TCY | 15 | |
| 0036 | 000110110 | | 2241 | | RSTR | | R=15, TURN OFF FILAMENT |
| 006C | 010000000 | | 2242 | | BL | TIMEUP | * INCREMENT RANDOM NUMBER GENERATOR/ |
| 0059 | 101000101 | 0103 | 2243 | | | | |
| | | | 2244 | * | | | * TIMEOUT COUNTER |
| 0032 | 001001011 | | 2245 | DISP/KB1 | TCY | 13 | |
| 0064 | 000110010 | | 2246 | | IMAC | | INCREMENT R=LINE POINTER |
| 0049 | 000101111 | | 2247 | | TAM | | |
| 0012 | 001001111 | | 2248 | | TCY | 15 | |
| 0025 | 000001101 | | 2249 | | SETR | | TURN ON FILAMENT |
| 004A | 000101000 | | 2250 | | TAY | | |
| 0014 | 000000100 | | 2251 | | DYN | | |
| 0029 | 000110110 | | 2252 | | RSTR | | RESET LAST R=LINE |
| 0052 | 000000101 | | 2253 | | TYC | | |
| 0024 | 001010001 | | 2254 | | YNEC | 8 | SCAN COMPLETE? |
| 0048 | 101110001 | 2232 | 2255 | | BRANCH | DSP2 | NO |
| 0010 | 001001111 | | 2256 | | TCY | 15 | YES |
| 0021 | 000110110 | | 2257 | | RSTR | | RESET FILAMENT |
| 0042 | 010000000 | | 2258 | | CALLL | TIMEUP1 | INCREMENT RANDOM NUMBER/TIMEOUT COUNTER |
| 0004 | 110101011 | 0106 | 2259 | | | | |
| | | | 2260 | * | | | ONE EXTRA TIME. TOTAL=9 PER DISPLAY SCAN |
| 0009 | 010010000 | | 2261 | | LDX | 0 | |
| 0013 | 001000101 | | 2262 | | TCY | 10 | |
| 0027 | 000110010 | | 2263 | | IMAC | | INCREMENT DEBOUNCE COUNTER |
| 004E | 100111001 | 2266 | 2264 | | BRANCH | DSP3 | |
| 001C | 000101111 | | 2265 | | TAM | | |
| 0039 | 001000011 | | 2266 | DSP3 | TCY | 12 | |
| 0072 | 000110010 | | 2267 | | IMAC | | |

TABLE IX-15 (Continued)

```
0065  011100101         2268            ALEC     10              CONTINUE DISPLAY IF<8
004B  100000101   2225  2269            BRANCH   DSP1
0016  010000111         2270            LDP      14
002D  001001111         2271            TCY      15
005A  010011100         2272            LDX      3
0034  000100000         2273            TBIT     0
0068  101011000   2075  2274            BRANCH   SPKREG + 1      TEST TALK
0051  010000001         2275            LDP      8
0022  001000111         2276            TCY      14
0044  000101011         2277            TYA                      SET ACC=14
0008  000100000         2278            TBIT     0
0011  101101100   1241  2279            BRANCH   DISLP+1
0023  010001111         2280            LDP      15
0046  100000101   2225  2281            BRANCH   DSP1            RET
000C  010010000         2282  KEYSEVL   LDX      0
0019  001000111         2283            TCY      14              * PUT LSD OF KEY CODE
0033  000101001         2284            TMA                      * IN ACC
0066  001001111         2285            TCY      15
004D  010001011         2286            LDP      13
0014  000100000         2287            TBIT     0
0035  100011011   1896  2288            BRANCH   KEY1
006A  100000000   1860  2289            BRANCH   KEY00
                        2290  *
0055  010010001         2291  SETBIT3   LDX      8
002A  001000100         2292            TCY      2
0054  010100011         2293            SBIT     3               SET BIT 3
002B  010111111         2294            RETN
                        2295  *
                        2296            END
```

TABLE X

| $I_0/I_1$ COMMANDS | | |
|---|---|---|
| $I_0$ | $I_1$ | |
| 0 | 0 | No Operation |
| 0 | 1 | Load Address (LA) |
| 1 | 0 | Transfer Bit (TB) |
| 1 | 1 | Read and Branch (RB) |

TABLE XI

| Counter 619/PLA 620 Timing Sequence | | |
|---|---|---|
| STEP | COUNTER CONTENTS (HEX) | SIGNALS GENERATED |
| 1 | 0 | $\overline{LA1}$, TB8 |
| 2 | 8 | $\overline{LA2}$ |
| 3 | C | $\overline{LA3}$ |
| 4 | E | $\overline{LA4}$ |
| 5 | F | |
| 6 | 7 | |
| 7 | 3 | |
| 8 | 1 | |

TABLE XII

| TB8 READ SEQUENCE | | | |
|---|---|---|---|
| STEP | COUNTER 623 CONTENTS (BINARY) | COUNTER 624 CONTENTS (HEX) | SIGNALS GENERATED |
| 1 | 10 | F | SAD, INC |
| 2 | 10 | E | DC, INC |
| 3 | 10 | C | DC, INC |
| 4 | 10 | 8 | DC, INC |
| 5 | 10 | 0 | DC, INC |
| 6 | 10 | 1 | DC, INC |
| 7 | 10 | 3 | SAM, DC, INC |
| 8 | 10 | 7 | PC, $\overline{ZERO}$ |

TABLE XIII

| TB8 READ SEQUENCE | | | |
|---|---|---|---|
| STEP | COUNTER 623 CONTENTS (BINARY) | COUNTER 624 CONTENTS (HEX) | SIGNALS GENERATED |
| 1 | 11 | F | SAD, INC |
| 2 | 11 | E | DC, INC |
| 3 | 11 | C | DC, INC |
| 4 | 11 | 8 | DC, INC |
| 5 | 11 | 0 | DC, INC |
| 6 | 11 | 1 | DC, INC |
| 7 | 11 | 3 | SAM, DC, INC |
| 8 | 11 | 7 | PC |
| 9 | 01 | F | SAD, TF |
| 10 | 01 | E | BR, PC |
| 11 | 01 | C | BR, DC |
| 12 | 01 | 8 | BR, DC |
| 13 | 01 | 0 | BR, DC |
| 14 | 01 | 1 | DC |
| 15 | 01 | 3 | SAM, DC |
| 16 | 01 | 7 | PC |
| 17 | 00 | F | SAD, TF |
| 18 | 00 | E | BR |
| 19 | 00 | C | BR |
| 20 | 00 | 8 | BR |
| 21 | 00 | 0 | |
| 22 | 00 | 1 | |
| 23 | 00 | 3 | |
| 24 | 00 | 7 | PC |
| 25 | 10 | F | SAD, INC |
| 26 | 10 | E | DC, INC |
| 27 | 10 | C | DC, INC |
| 28 | 10 | 8 | DC, INC |
| 29 | 10 | 0 | DC, INC |
| 30 | 10 | 1 | DC, INC |
| 31 | 10 | 3 | SAM, DC, INC |
| 32 | 10 | 7 | PC, $\overline{ZERO}$ |

What is claimed is:

1. A digital filter speech synthesis circuit responsive to a plurality of digital values representing filter coefficients, said circuit comprising:
   (a) a voiced/unvoiced excitation generator for generating voiced and unvoiced excitation signals;
   (b) a first memory for storing said plurality of digital values;
   (c) a multiplier circuit;
   (d) first circuit means for coupling said first memory and said multiplier circuit;
   (e) an arithmetic circuit having an input coupled to said multiplier circuit;
   (f) a second memory for storing data outputted from said arithmetic circuit;
   (g) second circuit means for selectively coupling the outputs of said second memory, said arithmetic circuit and said excitation signals to an input of said multiplier circuit; and
   (h) digital-to-analog converter means, coupled to said multipier circuit, for selectively converting the output of said multiplier circuit to analog signals representative of speech.

2. The speech synthesis circuit according to claim 1, wherein said second memory includes first and second delay circuit means, the delay associated with said second delay circuit means being longer than the delay associated with said first delay circuit means and wherein said second circuit means selectively couples the outputs of said first and second delay circuit means to said multiplier circuit.

3. The speech synthesis circuit according to claim 2, wherein said second memory further includes latch storage means for temporarily storing data outputted from said arithmetic circuit and wherein said second circuit means further selectively couples the output of said latch storage means to said multiplier circuit.

4. The speech synthesis circuit according to claim 3, wherein an amplification factor associated with said excitation signal is stored in said first memory along with said digital values.

5. The speech synthesis circuit according to claim 4, wherein each one of the digital values is updated once during a plurality of cycles, wherein the excitation signal is updated each cycle, wherein each cycle includes a plurality of time periods and wherein the multiplier circuit initiates a new multiply operation every time period and takes a plurality of time periods to complete a multiply operation.

6. The speech synthesis circuit according to claim 5, wherein said first circuit means includes recoding logic means for performing Booth's algorithm upon the digital values being communicated from said first memry to said multiplier circuit.

7. A speech synthesis integrated circuit device comprising:
   (a) a voiced/unvoiced excitation generator;
   (b) receiving means for receiving signals indicative of
      (i) voiced/unvoiced speech,
      (ii) pitch,
      (iii) amplitude, and
      (iv) filter coefficients;
   (c) a digital linear predictive filter;
   (d) first means, coupled to said receiving meand and said voiced/unvoiced excitation generator, for applying said signals indicative of voice/unvoiced speech and pitch to said voiced/unvoiced excitation generator;

(e) second means, coupled to said voiced/unvoiced excitation generator and said digital linear predictive filter, for applying the output of said voiced/unvoiced excitation generator to an input of said digital filter;

(f) third means, coupled to said receiving means and said digital linear predictive filter for applying said signals indicative of amplitude and filter coefficients to said digital filter;

(g) a single multiplier circuit, within said digital filter, for selectively multiplying said output of said voiced/unvoiced generator means by said signals indicative of amplitude and filter coefficients; and (h) digital-to-analog converter means for converting the output of said multiplier circuit to an analog signal representative of speech.

8. The device according to claim 7, wherein said first and second means include interpolator logic means for interpolating the most recently received signals indicative of pitch, amplitude and filter coefficients with previously received signals indicative of pitch, amplitude and filter coefficients, respectively.

9. The device according to claim 8, wherein said receiving means includes a decoder means for receiving said signals in a predetermined coded format and for decoding the same before they are communicated via said first and second means.

10. The device according to claim 9, further including synchronous timing means for generating predetermined, fixed timing signals indicative of when said signals are to be received by said receiving means, said timing means being coupled to said receiving means for controlling when said receiving means receives said signals.

11. The apparatus according to claims 7 or 9, wherein said voiced/unvoiced excitation generator includes a voiced excitation generator response to said pitch signal for repetitively generating a preselected function at a repetition rate related to the magnitude of said pitch signal and an unvoiced excitation generator comprising a random number generator.

* * * * *